(12) United States Patent
Pashazadeh

(10) Patent No.: US 12,543,496 B2
(45) Date of Patent: *Feb. 3, 2026

(54) ORGANIC MOLECULES FOR OPTOELECTRONIC DEVICES

(71) Applicant: Samsung Display Co., Ltd., Yongin-si (KR)

(72) Inventor: Ramin Pashazadeh, Bruchsal (DE)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/553,169

(22) PCT Filed: Apr. 7, 2022

(86) PCT No.: PCT/EP2022/059250
§ 371 (c)(1),
(2) Date: Sep. 28, 2023

(87) PCT Pub. No.: WO2022/214587
PCT Pub. Date: Oct. 13, 2022

(65) Prior Publication Data
US 2024/0215439 A1    Jun. 27, 2024

(30) Foreign Application Priority Data

Apr. 9, 2021 (EP) ...................... 21167701

(51) Int. Cl.
*H10K 85/60* (2023.01)
*C07D 403/10* (2006.01)
(Continued)

(52) U.S. Cl.
CPC ......... *H10K 85/654* (2023.02); *C07D 403/10* (2013.01); *C07D 403/14* (2013.01);
(Continued)

(58) Field of Classification Search
CPC ............ C09K 11/06; C09K 2211/1007; C09K 2211/1018; H10K 85/654; H10K 85/6572; C07D 403/10; C07D 403/14
(Continued)

(56) References Cited

U.S. PATENT DOCUMENTS 10,435,390 B2   10/2019 Jung et al.
10,981,930 B2    4/2021 Danz et al.
(Continued)

FOREIGN PATENT DOCUMENTS

DE   102016115853 A1    3/2018
EP      3392247 A1   10/2018
(Continued)

OTHER PUBLICATIONS

Translation of KR20210010409A (Year: 2025).*
International Search Report for corresponding Application No. PCT/EP2022/059250 dated Jul. 19, 2022, 2pp.

*Primary Examiner* — Tri V Nguyen
(74) *Attorney, Agent, or Firm* — Womble Bond Dickinson (US) LLP

(57) ABSTRACT

The invention relates to an organic molecule for the application in optoelectronic devices. According to the invention, the organic molecule has
a first chemical moiety with a structure of Formula I:

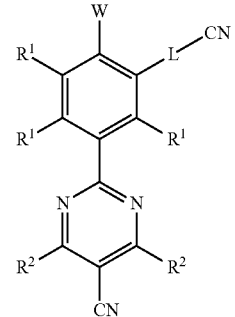

Formula I and
a second chemical moiety with a structure of Formula II:

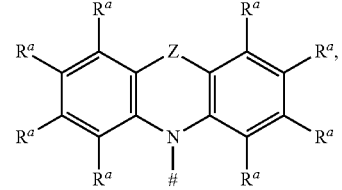

Formula II wherein W is the binding site of a single bond linking the first chemical moiety to the second chemical moiety,
L is selected from a direct bond and a linking group with a structure of Formula BN-I:

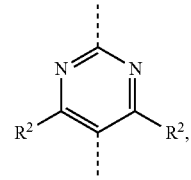

Formula BN-I wherein the dashed lines denote the binding sites as indicated in Formula I, and # represents the binding site of the first chemical moiety to the second chemical moiety.

19 Claims, 2 Drawing Sheets

(51) Int. Cl.
*C07D 403/14* (2006.01)
*C09K 11/02* (2006.01)
*C09K 11/06* (2006.01)
*H10K 50/12* (2023.01)

(52) U.S. Cl.
CPC .............. *C09K 11/02* (2013.01); *C09K 11/06* (2013.01); *H10K 85/6572* (2023.02); *C09K 2211/1007* (2013.01); *C09K 2211/1018* (2013.01); *H10K 50/12* (2023.02)

(58) Field of Classification Search
USPC .................................................. 252/500, 511

See application file for complete search history.

(56) References Cited

U.S. PATENT DOCUMENTS

| | | | |
|---|---|---|---|
| 11,005,048 | B2 | 5/2021 | Zink et al. |
| 11,358,951 | B2 | 6/2022 | Miyata et al. |
| 2018/0170914 | A1 | 6/2018 | Miyata et al. |
| 2021/0135119 | A1* | 5/2021 | Cheng .................. C07D 519/00 |
| 2024/0188430 | A1 | 6/2024 | Pashazadeh |
| 2024/0208948 | A1 | 6/2024 | Pashazadeh |

FOREIGN PATENT DOCUMENTS

| | | |
|---|---|---|
| JP | 2018-513115 A | 5/2018 |
| JP | 2019-023183 A | 2/2019 |
| JP | 2019-533739 A | 11/2019 |
| JP | 2024-513136 A | 3/2024 |
| JP | 2024-513552 A | 3/2024 |
| KR | 10-2021-0010409 A | 1/2021 |
| WO | 2016181846 A1 | 11/2016 |
| WO | 2019-191665 A1 | 10/2019 |

* cited by examiner

ORGANIC MOLECULES FOR OPTOELECTRONIC DEVICES

CROSS-REFERENCE TO RELATED APPLICATIONS

This application is a U.S. National Phase Patent Application of International Patent Application Number PCT/EP2022/059250, filed on Apr. 7, 2022, which claims priority to European Patent Application Number 21167701.8, filed on Apr. 9, 2021, the entire content of all of which is incorporated herein by reference.

The invention relates to light-emitting organic molecules and their use in organic light-emitting diodes (OLEDs) and in other optoelectronic devices.

DESCRIPTION

The object of the present invention is to provide molecules which are suitable for use in optoelectronic devices.

This object is achieved by the invention which provides a new class of organic molecules.

According to the invention, the organic molecules are purely organic molecules, i.e., they do not contain any metal ions in contrast to metal complexes known for the use in optoelectronic devices. The organic molecules of the invention, however, may include metalloids, in particular, B, Si, Sn, Se, and/or Ge.

The organic molecules according to the invention preferably exhibit emission maxima in the sky blue, green, or yellow spectral range, preferably in the green spectral range. The organic molecules preferably exhibit emission maxima between 470 and 580 nm, preferably between 490 and 560 nm, more preferably between 500 and 560 nm, even more preferably between 510 and 550 nm, and most preferably between 520 and 540 nm. The photoluminescence quantum yields of the organic molecules according to the invention are preferably equal to or higher than 10%, more preferably equal to or higher than 20%, even more preferably equal to or higher than 30%, in particular equal to or higher than 40%, and particularly preferably equal to or higher than 50%. The molecules of the invention exhibit in particular thermally activated delayed fluorescence (TADF). The use of the molecules according to the invention in an optoelectronic device, for example, an organic light-emitting diode (OLED), leads to higher efficiency of the device. Corresponding OLEDs have a higher stability than OLEDs with known emitter materials and comparable color and/or by employing the molecules according to the invention in an OLED display, a more accurate reproduction of visible colors in nature, i.e., a higher resolution in the displayed image, is achieved. In particular, the molecules can be used in combination with a fluorescence emitter to enable so-called hyper-fluorescence.

ORGANIC MOLECULES ACCORDING TO THE INVENTION

The organic molecules according to the invention include or consist of
a first chemical moiety including or consisting of a structure of Formula I:

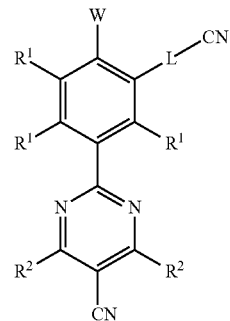

Formula I and
a second chemical moiety, including or consisting of a structure of Formula

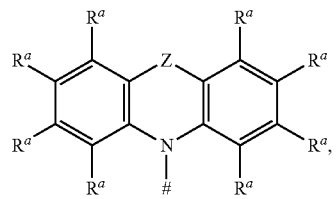

Formula II wherein
the first chemical moiety is linked to the second chemical moiety via a single bond,
W is the binding site of a single bond linking the first chemical moiety to the second chemical moiety,
L is selected from a direct bond and a linking group, which consists of a structure of Formula BN-L

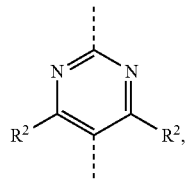

Formula BN-I wherein the dashed lines denote the binding sites as indicated in Formula I,
# represents the binding site of the first chemical moiety to the second chemical moiety;
Z is at each occurrence independently from each other selected from the group consisting of a direct bond, $CR^3R^4$, $C=CR^3R^4$, $C=O$, $C=NR^3$, $NR^3$, O, $SiR^3R^4$, S, S(O), and $S(O)_2$;
$R^1$ and $R^2$ are at each occurrence independently from each other selected from the group consisting of hydrogen; deuterium (D); CN; $CF_3$; phenyl;
$C_1$-$C_5$-alkyl,
wherein one or more hydrogen atoms are optionally substituted by deuterium;
$C_2$-$C_8$-alkenyl,
wherein one or more hydrogen atoms are optionally substituted by deuterium;
$C_2$-$C_8$-alkynyl, wherein one or more hydrogen atoms are optionally substituted by deuterium;

$C_6$-$C_{18}$-aryl,
which is optionally substituted with one or more substituents $R^6$; and $C_3$-$C_{17}$-heteroaryl,
which is optionally substituted with one or more substituents $R^6$;

$R^a$, $R^3$ and $R^4$ are at each occurrence independently from each other selected from the group consisting of hydrogen;

deuterium;

$N(R^5)_2$;

$OR^5$;

$Si(R^5)_3$;

$B(OR^5)_2$;

$OSO_2R^5$;

$CF_3$;

CN;

F;

Br;

I;

$C_1$-$C_{40}$-alkyl,
which is optionally substituted with one or more substituents $R^5$ and
wherein one or more non-adjacent $CH_2$-groups are optionally substituted by $R^5C=CR^5$, $C\equiv C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR^5$, O, S, or $CONR^5$;

$C_1$-$C_{40}$-alkoxy,
which is optionally substituted with one or more substituents $R^5$ and
wherein one or more non-adjacent $CH_2$-groups are optionally substituted by $R^5C=CR^5$, $C\equiv C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR^5$, O, S, or $CONR^5$;

$C_1$-$C_{40}$-thioalkoxy,
which is optionally substituted with one or more substituents $R^5$ and
wherein one or more non-adjacent $CH_2$-groups are optionally substituted by $R^5C=CR^5$, $C\equiv C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR^5$, O, S, or $CONR^5$;

$C_2$-$C_{40}$-alkenyl,
which is optionally substituted with one or more substituents $R^5$ and
wherein one or more non-adjacent $CH_2$-groups are optionally substituted by $R^5C=CR^5$, $C\equiv C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR^5$, O, S, or $CONR^5$;

$C_2$-$C_{40}$-alkynyl,
which is optionally substituted with one or more substituents $R^5$ and
wherein one or more non-adjacent $CH_2$-groups are optionally substituted by $R^5C=CR^5$, $C\equiv C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR^5$, O, S, or $CONR^5$;

$C_6$-$C_{60}$-aryl,
which is optionally substituted with one or more substituents $R^5$; and $C_3$-$C_{57}$-heteroaryl,
which is optionally substituted with one or more substituents $R^5$;

$R^5$ is at each occurrence independently from each other selected from the group consisting of hydrogen; deuterium; $N(R^6)_2$; $OR^6$; $Si(R^6)_3$; $B(OR^6)_2$; $OSO_2R^6$; $CF_3$; CN; F; Br; I;

$C_1$-$C_{40}$-alkyl,
which is optionally substituted with one or more substituents $R^6$ and
wherein one or more non-adjacent $CH_2$-groups are optionally substituted by $R^6C=CR^6$, CC, $Si(R^6)_2$, $Ge(R^6)_2$, $Sn(R^6)_2$, $C=O$, $C=S$, $C=Se$, $C=NR^6$, $P(=O)(R^6)$, SO, $SO_2$, $NR^6$, O, S, or $CONR^6$;

$C_1$-$C_{40}$-alkoxy,
which is optionally substituted with one or more substituents $R^6$ and
wherein one or more non-adjacent $CH_2$-groups are optionally substituted by $R^6C=CR^6$, $C\equiv C$, $Si(R^6)_2$, $Ge(R^6)_2$, $Sn(R^6)_2$, $C=O$, $C=S$, $C=Se$, $C=NR^6$, $P(=O)(R^6)$, SO, $SO_2$, $NR^6$, O, S, or $CONR^6$;

$C_1$-$C_{40}$-thioalkoxy,
which is optionally substituted with one or more substituents $R^6$ and
wherein one or more non-adjacent $CH_2$-groups are optionally substituted by $R^6C=CR^6$, CC, $Si(R^6)_2$, $Ge(R^6)_2$, $Sn(R^6)_2$, $C=O$, $C=S$, $C=Se$, $C=NR^6$, $P(=O)(R^6)$, SO, $SO_2$, $NR^6$, O, S, or $CONR^6$;

$C_2$-$C_{40}$-alkenyl,
which is optionally substituted with one or more substituents $R^6$ and
wherein one or more non-adjacent $CH_2$-groups are optionally substituted by $R^6C=CR^6$, $C\equiv C$, $Si(R^6)_2$, $Ge(R^6)_2$, $Sn(R^6)_2$, $C=O$, $C=S$, $C=Se$, $C=NR^6$, $P(=O)(R^6)$, SO, $SO_2$, $NR^6$, O, S, or $CONR^6$;

$C_2$-$C_{40}$-alkynyl,
which is optionally substituted with one or more substituents $R^6$ and
wherein one or more non-adjacent $CH_2$-groups are optionally substituted by $R^6C=CR^6$, $C\equiv C$, $Si(R^6)_2$, $Ge(R^6)_2$, $Sn(R^6)_2$, $C=O$, $C=S$, $C=Se$, $C=NR^6$, $P(=O)(R^6)$, SO, $SO_2$, $NR^6$, O, S, or $CONR^6$;

$C_6$-$C_{60}$-aryl,
which is optionally substituted with one or more substituents $R^6$; and $C_3$-$C_{57}$-heteroaryl,
which is optionally substituted with one or more substituents $R^6$;

$R^6$ is at each occurrence independently from each other selected from the group consisting of hydrogen; deuterium; OPh (Ph=phenyl); $CF_3$; CN; F;

$C_1$-$C_5$-alkyl,
wherein one or more hydrogen atoms are optionally, independently from each other substituted by deuterium, CN, $CF_3$, or F;

$C_1$-$C_5$-alkoxy,
wherein one or more hydrogen atoms are optionally, independently from each other substituted by deuterium, CN, $CF_3$, or F;

$C_1$-$C_5$-thioalkoxy,
wherein one or more hydrogen atoms are optionally, independently from each other substituted by deuterium, CN, $CF_3$, or F;

$C_2$-$C_5$-alkenyl,
wherein one or more hydrogen atoms are optionally, independently from each other substituted by deuterium, CN, $CF_3$, or F;

$C_2$-$C_5$-alkynyl,
wherein one or more hydrogen atoms are optionally, independently from each other substituted by deuterium, CN, $CF_3$, or F;

$C_6$-$C_{18}$-aryl,
which is optionally substituted with one or more $C_1$-$C_5$-alkyl substituents;

$C_3$-$C_{17}$-heteroaryl,
which is optionally substituted with one or more $C_1$-$C_5$-alkyl substituents;
$N(C_6$-$C_{18}$-aryl$)_2$;
$N(C_3$-$C_{17}$-heteroaryl$)_2$; and
$N(C_3$-$C_{17}$-heteroaryl)($C_6$-$C_{18}$-aryl);
wherein the substituents $R^a$, $R^3$, $R^4$, or $R^5$, independently from each other, optionally form a mono- or polycyclic, aliphatic, aromatic, or heteroaromatic ring system with one or more substituents $R^a$, $R^3$, $R^4$, or $R^5$.

In one embodiment of the invention, the organic molecules include or consist of a structure selected from the group consisting of Formula IIIa, Formula IIIb, and Formula IIIc:

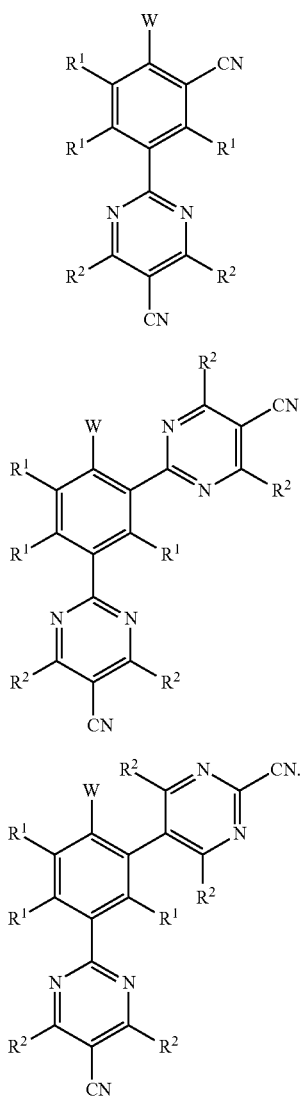

Formula IIIa

Formula IIIb

Formula IIIc

In a preferred embodiment of the invention, the organic molecules include or consist of a structure selected from the group consisting of Formula IIIa and Formula IIIb.

In one embodiment, $R^1$ and $R^2$ are at each occurrence independently from each other selected from the group consisting of hydrogen; deuterium; CN; $CF_3$; phenyl;
$C_1$-$C_5$-alkyl;
$C_6$-$C_{18}$-aryl,
which is optionally substituted with one or more substituents $R^6$; and
$C_3$-$C_{17}$-heteroaryl,
which is optionally substituted with one or more substituents $R^6$;

In one embodiment, $R^1$ and $R^2$ are at each occurrence independently from each other selected from the group consisting of hydrogen, deuterium, CN, $CF_3$, phenyl,
$C_1$-$C_5$-alkyl, and
$C_6$-$C_{18}$-aryl, which is optionally substituted with one or more substituents $R^6$.

In one embodiment, $R^1$ and $R^2$ is independently from each other selected from the group consisting of H, D, methyl, CN, $CF_3$, and phenyl.

In one embodiment, $R^1$ and $R^2$ is at each occurrence independently from each other selected from the group consisting of H, methyl, and phenyl.

In one embodiment, $R^1$ is H at each occurrence.
In one embodiment, $R^2$ is H at each occurrence.
In one embodiment, $R^1$ and $R^2$ are H at each occurrence.

In a further embodiment of the invention, the second chemical moiety includes or consists of a structure of Formula IIa:

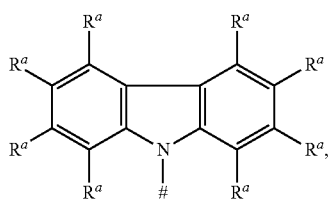

Formula IIa wherein # and $R^a$ are defined as above.

In one embodiment of the invention, at least one $R^a$ is not hydrogen.

In one embodiment of the invention, $R^a$ is at each occurrence independently from each other selected from the group consisting of:
hydrogen,
deuterium,
Me,
$^i$Pr,
$^t$Bu,
CN,
$CF_3$,
Ph, which is optionally substituted with one or more substituents independently from each other selected from the group consisting of Me, $^i$Pr, $^t$Bu, CN, $CF_3$, and Ph,
pyridinyl, which is optionally substituted with one or more substituents independently from each other selected from the group consisting of Me, $^i$Pr, $^t$Bu, CN, $CF_3$, and Ph,
pyrimidinyl, which is optionally substituted with one or more substituents independently from each other selected from the group consisting of Me, $^i$Pr, $^t$Bu, CN, $CF_3$, and Ph,
carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, CF$_3$, and Ph, and N(Ph)$_2$, which is optionally substituted with one or more substituents independently from each other selected from the group consisting of Me, $^i$Pr, $^t$Bu, CN, CF$_3$, and Ph, wherein two or more adjacent substituents R$^a$ may form attachment points for a ring system selected from the group consisting of:

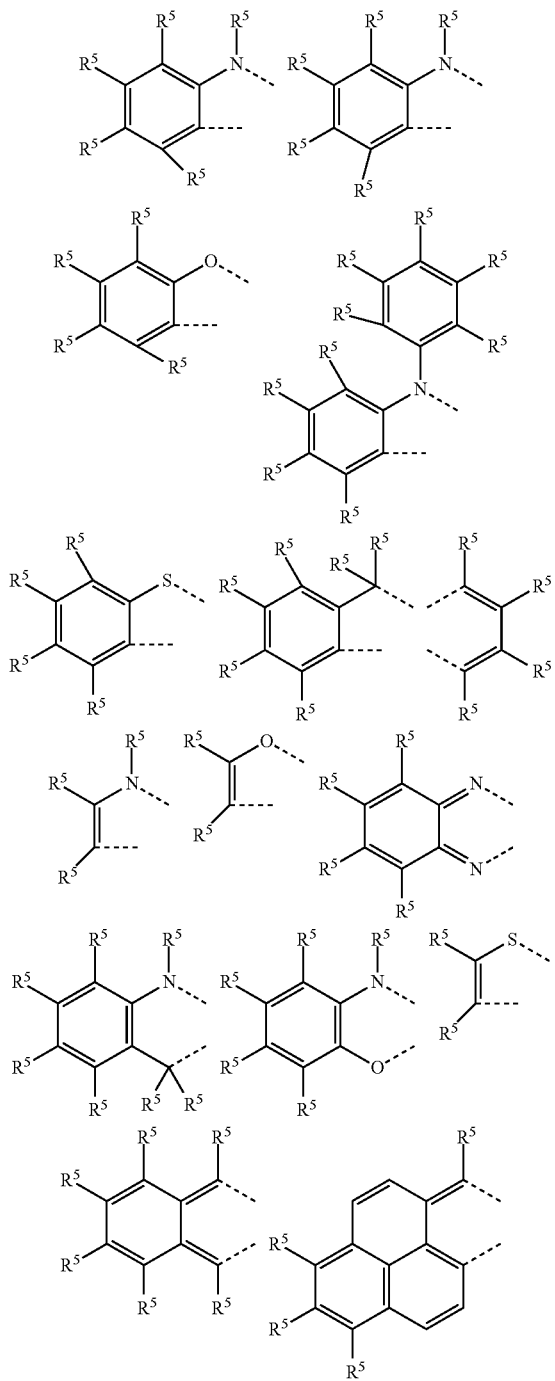

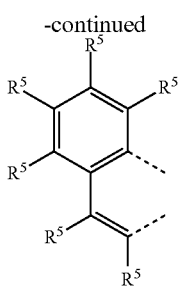

wherein each dashed line indicates a direct bond connecting one of the above shown ring systems to the positions of two adjacent substituents R$^a$ such that a ring system of the group shown above is fused to the second chemical moiety as shown in Formula II.

In a further embodiment of the invention, R$^a$ is at each occurrence independently from each other selected from the group consisting of:
hydrogen,
Me,
$^i$Pr,
$^t$Bu,
CN,
CF$_3$,
Ph, which is optionally substituted with one or more substituents R$^5$,
pyridinyl, which is optionally substituted with one or more substituents R$^5$,
pyrimidinyl, which is optionally substituted with one or more substituents R$^5$,
carbazolyl, which is optionally substituted with one or more substituents R$^5$,
triazinyl, which is optionally substituted with one or more substituents R$^5$, and
N(Ph)$_2$, which is optionally substituted with one or more substituents R$^5$;
wherein any two of the groups R$^a$ positioned adjacent to each other are optionally bonded to each other and form a ring system selected from a group consisting of:

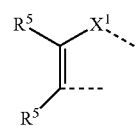

wherein X$^1$ is S, O, or NR$^5$.

In a further embodiment of the invention, R$^a$ is at each occurrence independently from each other selected from the group consisting of:
hydrogen,
Me,
$^i$Pr,
$^t$Bu,
CN,
CF$_3$,
Ph, which is optionally substituted with one or more substituents independently from each other selected from the group consisting of Me, $^i$Pr, $^t$Bu, CN, CF$_3$, and Ph,
pyridinyl, which is optionally substituted with one or more substituents independently from each other selected from the group consisting of Me, $^i$Pr, $^t$Bu, CN, CF$_3$, and Ph, pyrimidinyl, which is optionally substituted with one or more substituents independently from each other selected from the group consisting of Me, $^i$Pr, $^t$Bu, CN, CF$_3$, and Ph, carbazolyl, which is optionally substituted with one or more substituents independently from each other selected from the group consisting of Me, $^i$Pr, $^t$Bu, CN, CF$_3$, and Ph, triazinyl, which is optionally substituted with one or more substituents independently from each other selected from the group consisting of Me, $^i$Pr, $^t$Bu, CN, CF$_3$, and Ph, and N(Ph)$_2$, which is optionally substituted with one or more substituents independently from each other selected from the group consisting of Me, $^i$Pr, $^t$Bu, CN, CF$_3$, and Ph, wherein any two of the groups R$^a$ positioned adjacent to each other are optionally bonded to each other and form a ring system selected from a group consisting of:

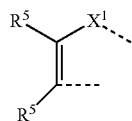

wherein X$^1$ is S, O, or NR$^5$.

In a further embodiment of the invention, R$^a$ is at each occurrence independently from each other selected from the group consisting of:
hydrogen,
Me,
$^i$Pr,
$^t$Bu,
CN,
CF$_3$,
Ph, which is optionally substituted with one or more substituents independently from each other selected from the group consisting of Me, $^i$Pr, $^t$Bu, CN, CF$_3$, and Ph,
pyridinyl, which is optionally substituted with one or more substituents independently from each other selected from the group consisting of Me, $^i$Pr, $^t$Bu, CN, CF$_3$, and Ph,
pyrimidinyl, which is optionally substituted with one or more substituents independently from each other selected from the group consisting of Me, $^i$Pr, $^t$Bu, CN, CF$_3$, and Ph,
carbazolyl, which is optionally substituted with one or more substituents independently from each other selected from the group consisting of Me, $^i$Pr, $^t$Bu, CN, CF$_3$, and Ph,
triazinyl, which is optionally substituted with one or more substituents independently from each other selected from the group consisting of Me, $^i$Pr, $^t$Bu, CN, CF$_3$, and Ph, and
N(Ph)$_2$, which is optionally substituted with one or more substituents independently from each other selected from the group consisting of Me, $^i$Pr, $^t$Bu, CN, CF$_3$, and Ph,
wherein any two of the groups R$^a$ positioned adjacent to each other are optionally bonded to each other and form a ring system selected from a group consisting of:

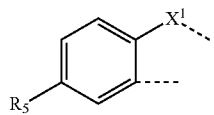

wherein X$^1$ is S, O, or NR.

In a further embodiment of the invention, R$^a$ is at each occurrence independently from each other selected from the group consisting of:
hydrogen,
Me,
$^i$Pr,
$^t$Bu,
CN,
CF$_3$,
Ph, which is optionally substituted with one or more substituents independently from each other selected from the group consisting of Me, $^i$Pr, $^t$Bu, CN, CF$_3$, and Ph,
pyridinyl, which is optionally substituted with one or more substituents independently from each other selected from the group consisting of Me, $^i$Pr, $^t$Bu, CN, CF$_3$, and Ph,
pyrimidinyl, which is optionally substituted with one or more substituents independently from each other selected from the group consisting of Me, $^i$Pr, $^t$Bu, CN, CF$_3$, and Ph,
carbazolyl, which is optionally substituted with one or more substituents independently from each other selected from the group consisting of Me, $^i$Pr, $^t$Bu, CN, CF$_3$, and Ph,
triazinyl, which is optionally substituted with one or more substituents independently from each other selected from the group consisting of Me, $^i$Pr, $^t$Bu, CN, CF$_3$, and Ph, and
N(Ph)$_2$, which is optionally substituted with one or more substituents independently from each other selected from the group consisting of Me, $^i$Pr, $^t$Bu, CN, CF$_3$, and Ph,
wherein any two of the groups R$^a$ positioned adjacent to each other are optionally bonded to each other and form a ring system selected from a group consisting of the following two:

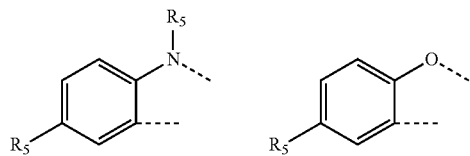

In a further embodiment of the invention, R$^a$ is at each occurrence independently from each other selected from the group consisting of:
hydrogen,
Me,
$^i$Pr,
$^t$Bu,
CN,
CF$_3$,
Ph, which is optionally substituted with one or more substituents independently from each other selected from the group consisting of Me, $^i$Pr, $^t$Bu, CN, CF$_3$, and Ph, pyridinyl, which is optionally substituted with one or more substituents independently from each other selected from the group consisting of Me, $^i$Pr, $^t$Bu, CN, CF$_3$, and Ph, pyrimidinyl, which is optionally substituted with one or more substituents independently from each other selected from the group consisting of Me, $^i$Pr, $^t$Bu, CN, CF$_3$, and Ph, carbazolyl, which is optionally substituted with one or more substituents independently from each other selected from the group consisting of Me, $^i$Pr, $^t$Bu, CN, CF$_3$, and Ph, triazinyl, which is optionally substituted with one or more substituents independently from each other selected from the group consisting of Me, $^i$Pr, $^t$Bu, CN, CF$_3$, and Ph, and N(Ph)$_2$.

In a further embodiment of the invention, R$^a$ is at each occurrence independently from each other selected from the group consisting of:

hydrogen,
Me,
$^i$Pr,
$^t$Bu,
CN,
CF$_3$,
Ph, which is optionally substituted with one or more substituents independently from each other selected from the group consisting of Me, $^i$Pr, $^t$Bu, CN, CF$_3$, and Ph,
pyridinyl, which is optionally substituted with one or more substituents independently from each other selected from the group consisting of Me, $^i$Pr, $^t$Bu, CN, CF$_3$, and Ph,
pyrimidinyl, which is optionally substituted with one or more substituents independently from each other selected from the group consisting of Me, $^i$Pr, $^t$Bu, CN, CF$_3$, and Ph, and
triazinyl, which is optionally substituted with one or more substituents independently from each other selected from the group consisting of Me, $^i$Pr, $^t$Bu, CN, CF$_3$, and Ph.

In one embodiment of the invention, R$^5$ is at each occurrence independently from each other selected from the group consisting of:

hydrogen,
Me,
$^i$Pr,
$^t$Bu,
CN,
CF$_3$,
Ph, which is optionally substituted with one or more substituents independently from each other selected from the group consisting of Me, $^i$Pr, $^t$Bu, CN, CF$_3$, and Ph,
pyridinyl, which is optionally substituted with one or more substituents independently from each other selected from the group consisting of Me, $^i$Pr, $^t$Bu, CN, CF$_3$, and Ph,
pyrimidinyl, which is optionally substituted with one or more substituents independently from each other selected from the group consisting of Me, $^i$Pr, $^t$Bu, CN, CF$_3$, and Ph,
carbazolyl, which is optionally substituted with one or more substituents independently from each other selected from the group consisting of Me, $^i$Pr, $^t$Bu, CN, CF$_3$, and Ph, triazinyl, which is optionally substituted with one or more substituents independently from each other selected from the group consisting of Me, $^i$Pr, $^t$Bu, CN, CF$_3$, and Ph, and N(Ph)$_2$ which is optionally substituted with one or more substituents independently from each other selected from the group consisting of Me, $^i$Pr, $^t$Bu, CN, CF$_3$, and Ph, wherein two or more adjacent substituents R$^5$, or one or more substituent R$^5$ adjacent to one or more substituents R$^a$, may be replaced by a ring system selected from the group consisting of:

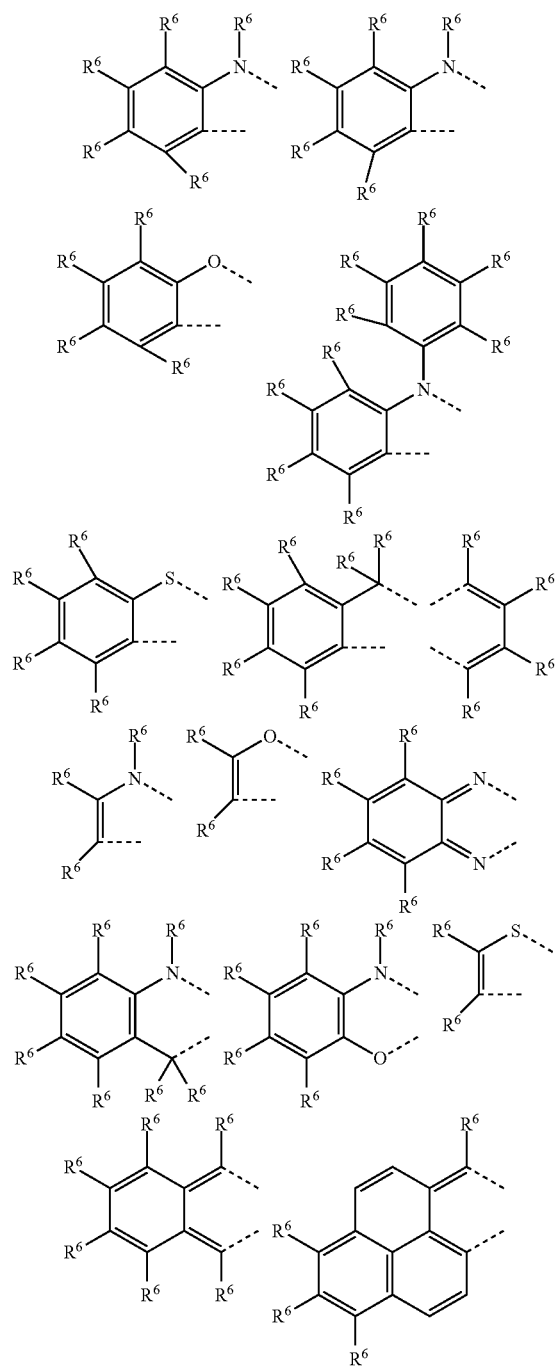

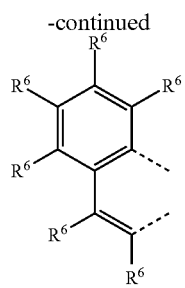

wherein each dashed line indicates a direct bond connecting one of the above shown fused ring systems to the positions, to which the adjacent substituents $R^5$, or $R^5$ and $R^a$, that are replaced by the fused ring system are bonded.

In certain embodiments of the invention, $R^5$ is at each occurrence independently from each other selected from the group consisting of:
hydrogen,
Me,
$^iPr$,
$^tBu$,
CN,
$CF_3$,
Ph, which is optionally substituted with one or more substituents independently from each other selected from the group consisting of Me, $^iPr$, $^tBu$, CN, $CF_3$, and Ph,
pyridinyl, which is optionally substituted with one or more substituents independently from each other selected from the group consisting of Me, $^iPr$, $^tBu$, CN, $CF_3$, and Ph,
pyrimidinyl, which is optionally substituted with one or more substituents independently from each other selected from the group consisting of Me, $^iPr$, $^tBu$, CN, $CF_3$, and Ph,
carbazolyl, which is optionally substituted with one or more substituents independently from each other selected from the group consisting of Me, $^iPr$, $^tBu$, CN, $CF_3$, and Ph,
triazinyl, which is optionally substituted with one or more substituents independently from each other selected from the group consisting of Me, $^iPr$, $^tBu$, CN, $CF_3$, and Ph, and
$N(Ph)_2$ which is optionally substituted with one or more substituents independently from each other selected from the group consisting of Me, $^iPr$, $^tBu$, CN, $CF_3$, and Ph.

In a preferred embodiment of the invention, $R^5$ is at each occurrence independently from each other selected from the group consisting of:
hydrogen,
$C_1$-$C_{40}$-alkyl, which is optionally substituted with one or more substituents $R^6$
$C_3$-$C_{57}$-heteroaryl, which is optionally substituted with one or more substituents $R^6$, and
$C_6$-$C_{60}$-aryl, which is optionally substituted with one or more substituents $R^6$.

In certain embodiments of the invention, $R^5$ is at each occurrence independently from each other selected from the group consisting of:
hydrogen,
$C_1$-$C_{40}$-alkyl, which is optionally substituted with one or more substituents $R^6$, and
$C_6$-$C_{60}$-aryl, which is optionally substituted with one or more substituents $R^6$.

In certain embodiments of the invention, $R^5$ is at each occurrence independently from each other selected from the group consisting of:
hydrogen,
$C_1$-$C_4$-alkyl, which is optionally substituted with one or more substituents $R^6$, and
Phenyl (Ph), which is optionally substituted with one or more substituents $R^6$.

In certain embodiments of the invention, $R^5$ is at each occurrence independently from each other selected from the group consisting of:
hydrogen,
Me,
$^iPr$,
$^tBu$,
CN,
$CF_3$, and
Ph, which is optionally substituted with one or more substituents independently from each other selected from the group consisting of Me, $^iPr$, $^tBu$, CN, $CF_3$, and Ph.

In one embodiment of the invention, the second chemical moiety includes or consists of a structure of Formula IIa-1, a structure of Formula IIa-2, a structure of Formula IIa-3 or a structure of Formula IIa-4:

Formula IIa-1

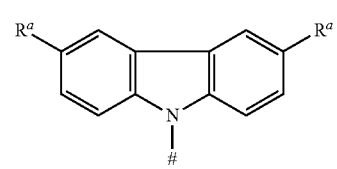

Formula IIa-2

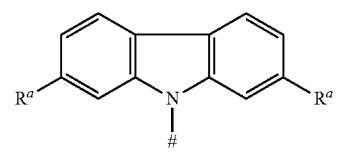

Formula IIa-3

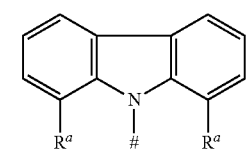

Formula IIa-4

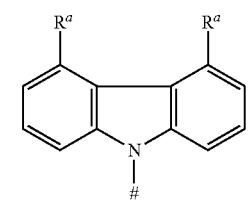

In a further embodiment of the invention, the second chemical moiety includes or consists of a structure of Formula IIb-1, a structure of Formula IIb-2, a structure of Formula IIb-3 or a structure of Formula IIb-4:

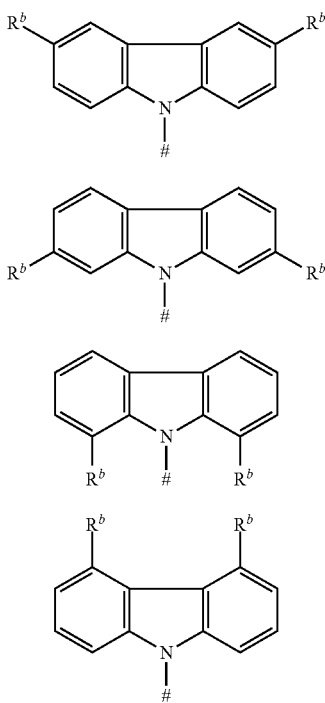

Formula IIb-1

Formula IIb-2

Formula IIb-3

Formula IIb-4 wherein
$R^b$ is at each occurrence independently from each other selected from the group consisting of:
deuterium;
$N(R^5)_2$;
$OR^5$;
$Si(R^5)_3$;
$B(OR^5)_2$;
$OSO_2R^5$;
$CF_3$;
CN;
F;
Br;
I;
$C_1$-$C_{40}$-alkyl,
which is optionally substituted with one or more substituents $R^5$ and
wherein one or more non-adjacent $CH_2$-groups are optionally substituted by $R^5C$=$CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S, or $CONR^5$;
$C_1$-$C_{40}$-alkoxy,
which is optionally substituted with one or more substituents $R^5$ and
wherein one or more non-adjacent $CH_2$-groups are optionally substituted by $R^5C$=$CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S, or $CONR^5$;
$C_1$-$C_{40}$-thioalkoxy,
which is optionally substituted with one or more substituents $R^5$ and
wherein one or more non-adjacent $CH_2$-groups are optionally substituted by $R^5C$=$CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S, or $CONR^5$;
$C_2$-$C_{40}$-alkenyl,
which is optionally substituted with one or more substituents $R^5$ and
wherein one or more non-adjacent $CH_2$-groups are optionally substituted by $R^5C$=$CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S, or $CONR^5$;
$C_2$-$C_{40}$-alkynyl,
which is optionally substituted with one or more substituents $R^5$ and
wherein one or more non-adjacent $CH_2$-groups are optionally substituted by $R^5C$=$CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S, or $CONR^5$;
$C_6$-$C_{60}$-aryl,
which is optionally substituted with one or more substituents $R^5$; and
$C_3$-$C_{57}$-heteroaryl,
which is optionally substituted with one or more substituents $R^5$;
apart from that, the aforementioned definitions apply.

In an additional embodiment of the invention, the second chemical moiety includes or consists of a structure of Formula IIc-1, a structure of Formula IIc-2, a structure of Formula IIc-3, or a structure of Formula IIc-4:

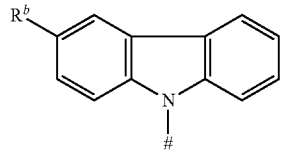

Formula IIc-1

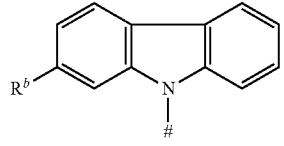

Formula IIc-2

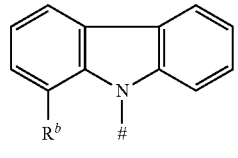

Formula IIc-3

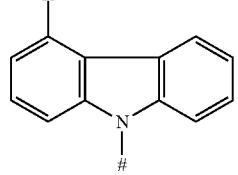

Formula IIc-4 wherein the aforementioned definitions apply.

In a further embodiment of the invention, $R^b$ is at each occurrence independently from each other selected from the group consisting of:
Me;
$^iPr$;
$^tBu$;
CN;
$CF_3$;
Ph, which is optionally substituted with one or more substituents independently from each other selected from the group consisting of Me, $^iPr$, $^tBu$, CN, $CF_3$, and Ph;

pyridinyl, which is optionally substituted with one or more substituents independently from each other selected from the group consisting of Me, $^i$Pr, $^t$Bu, CN, CF$_3$, and Ph;

carbazolyl, which is optionally substituted with one or more substituents independently from each other selected from the group consisting of Me, $^i$Pr, $^t$Bu, CN, CF$_3$, and Ph;

triazinyl, which is optionally substituted with one or more substituents independently from each other selected from the group consisting of Me, $^i$Pr, $^t$Bu, CN, CF$_3$, and Ph; and N(Ph)$_2$.

In a further embodiment of the invention, R$^b$ is at each occurrence independently from each other selected from the group consisting of:

Me;
$^i$Pr;
$^t$Bu;
CN;
CF$_3$;
Ph, which is optionally substituted with one or more substituents independently from each other selected from the group consisting of Me, $^i$Pr, $^t$Bu, CN, CF$_3$, and Ph;

pyridinyl, which is optionally substituted with one or more substituents independently from each other selected from the group consisting of Me, $^i$Pr, $^t$Bu, CN, CF$_3$, and Ph;

pyrimidinyl, which is optionally substituted with one or more substituents independently from each other selected from the group consisting of Me, $^i$Pr, $^t$Bu, CN, CF$_3$, and Ph; and triazinyl, which is optionally substituted with one or more substituents independently from each other selected from the group consisting of Me, $^i$Pr, $^t$Bu, CN, CF$_3$, and Ph.

In a further embodiment of the invention, R$^b$ is at each occurrence independently from each other selected from the group consisting of:

Me;
$^t$Bu;
Ph, which is optionally substituted with one or more substituents independently from each other selected from the group consisting of Me, $^i$Pr, $^t$Bu, CN, CF$_3$, and Ph;

carbazolyl, which is optionally substituted with one or more substituents independently from each other selected from the group consisting of Me, $^i$Pr, $^t$Bu, CN, CF$_3$, and Ph; and triazinyl, which is optionally substituted with one or more substituents independently from each other selected from the group consisting of Me, $^i$Pr, $^t$Bu, CN, CF$_3$, and Ph.

In a further embodiment of the invention, R$^b$ is at each occurrence independently from each other selected from the group consisting of:

Me;
$^t$Bu;
Ph, which is optionally substituted with one or more substituents independently from each other selected from the group consisting of Me, $^i$Pr, $^t$Bu, CN, CF$_3$, and Ph; and triazinyl, which is optionally substituted with one or more substituents independently from each other selected from the group consisting of Me, $^i$Pr, $^t$Bu, CN, CF$_3$, and Ph.

In one embodiment, the second chemical moiety includes or consists of a structure of the following structures:

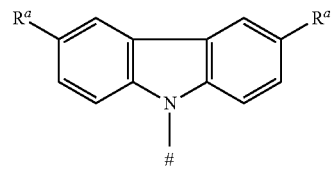

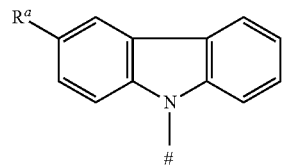

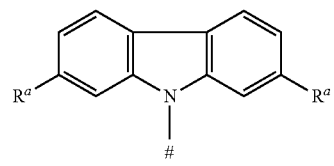

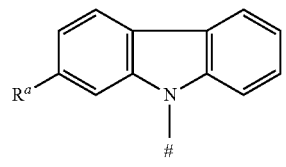

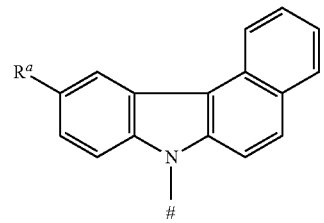

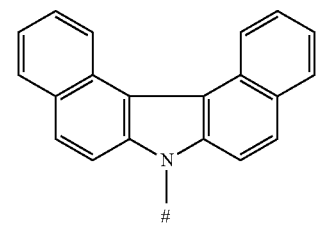

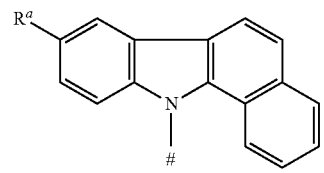

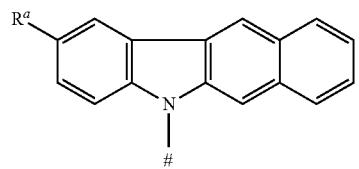

-continued
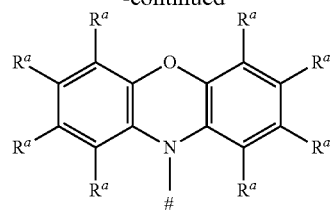
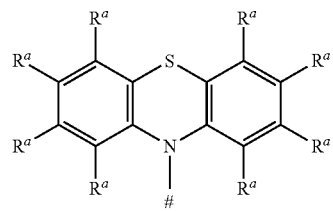
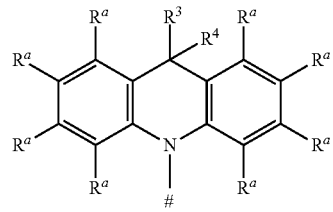
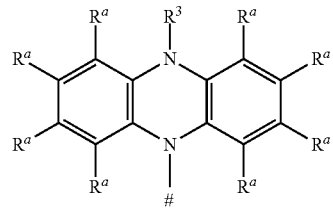
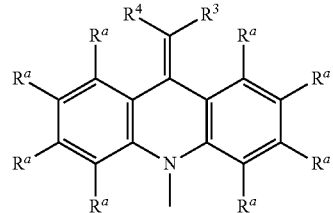
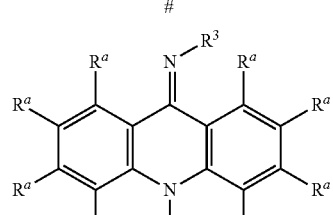
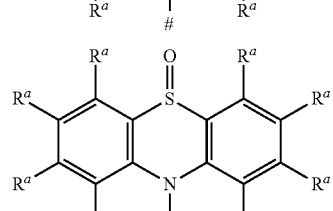
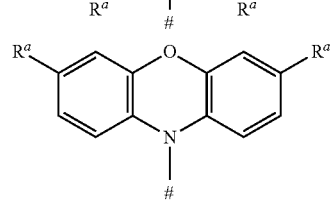
-continued
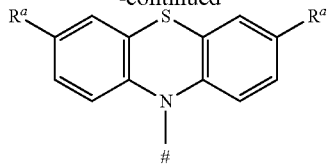
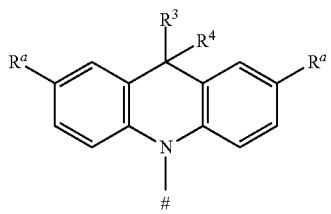
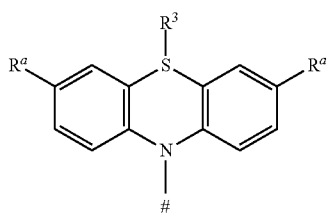
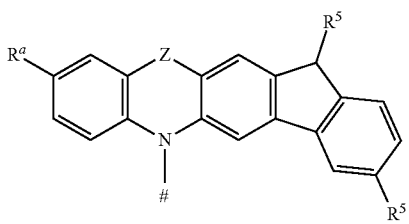
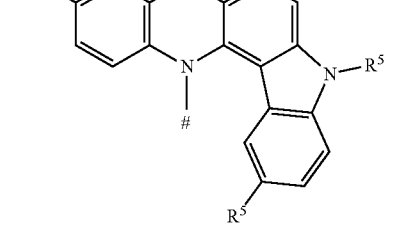
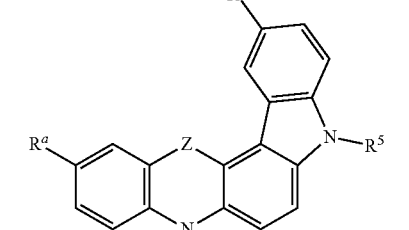
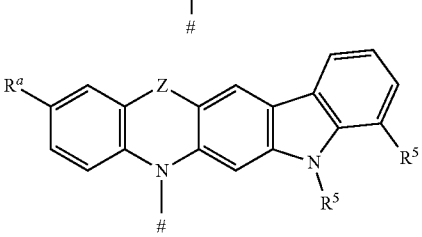

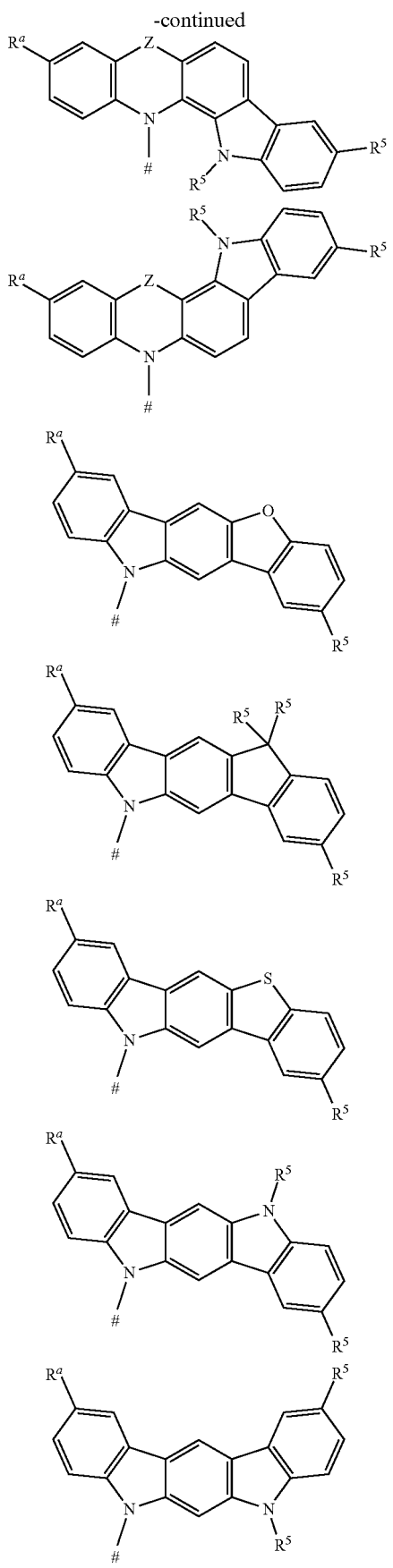
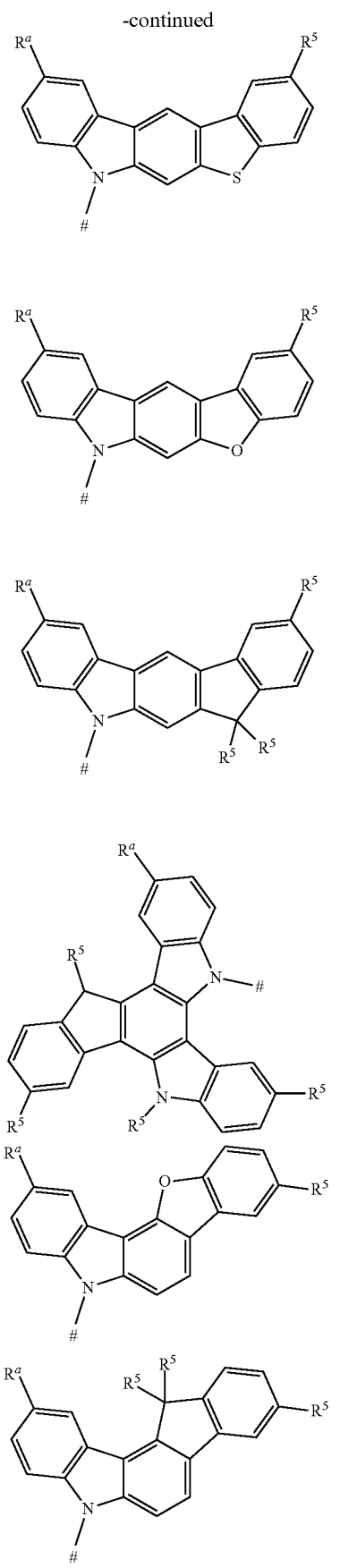

-continued
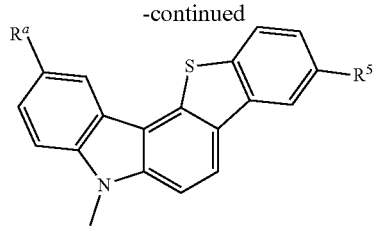
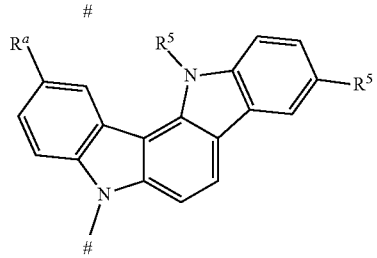
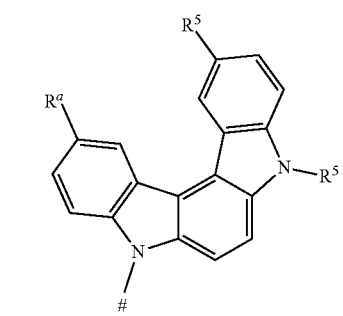
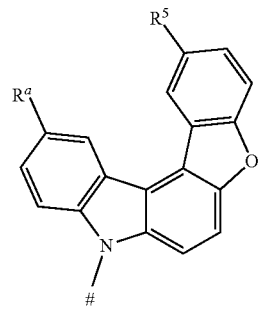
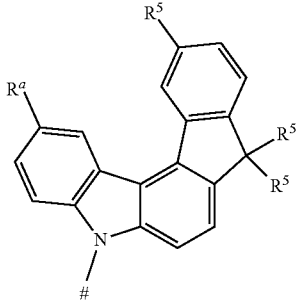
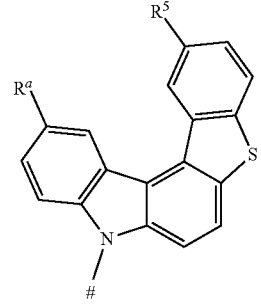
-continued
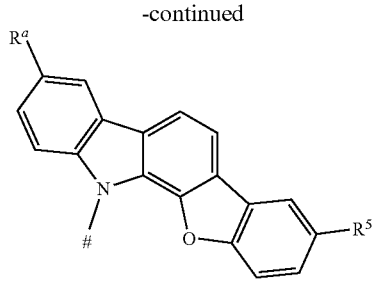
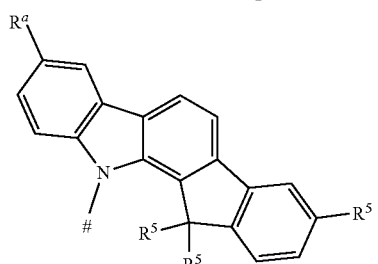
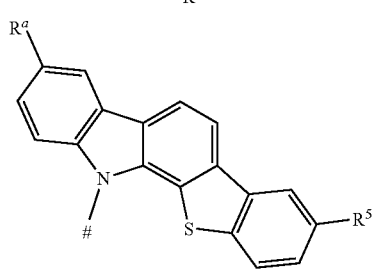
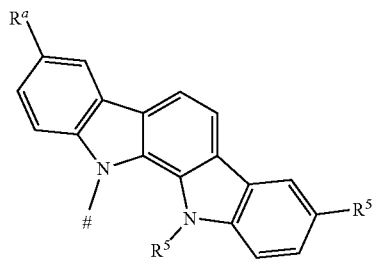
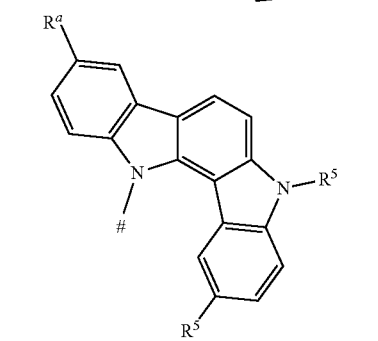
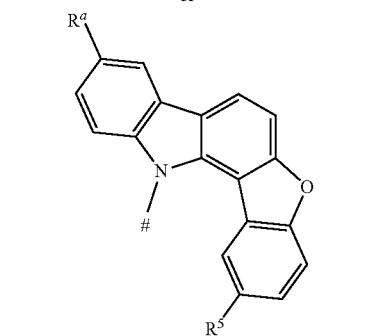

-continued

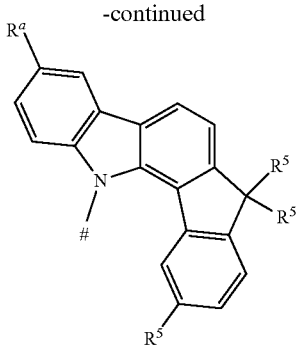

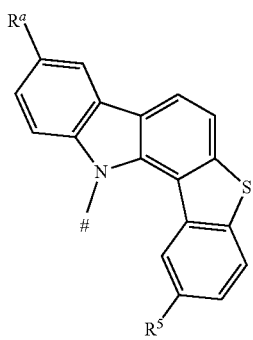

wherein the aforementioned definitions apply for #, Z, $R^a$, $R^3$, $R^4$ and $R^5$.

In one embodiment, $R^a$ and $R^5$ is at each occurrence independently from each other selected from the group consisting of hydrogen (H), methyl (Me), i-propyl (CH(CH$_3$)$_2$)($^i$Pr), t-butyl ($^t$Bu), phenyl (Ph), CN, CF$_3$, and diphenylamine (NPh$_2$).

In one embodiment of the invention, the organic molecules include or consist of a structure selected from the group consisting of Formula IVa, Formula IVb, and Formula IVc:

Formula IVa

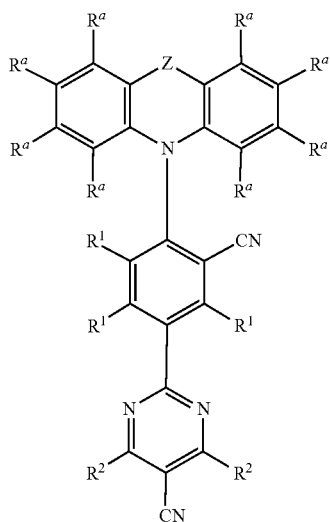

Formula IVb

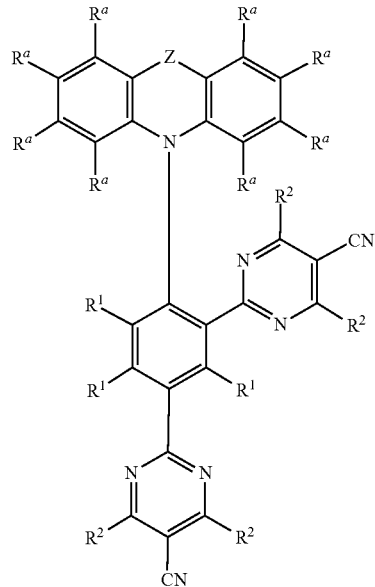

Formula IVc

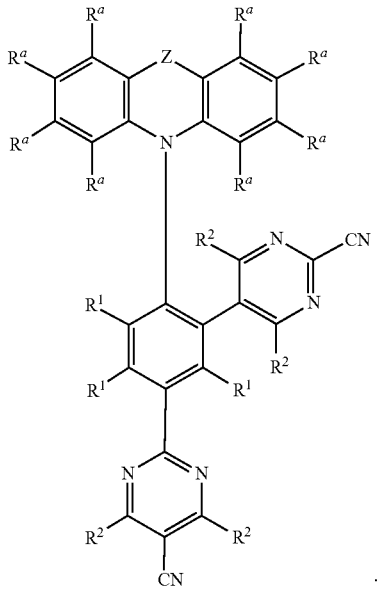

In a preferred embodiment of the invention, the organic molecules include or consist of a structure selected from the group consisting of Formula IVa and Formula IVb.

In one embodiment of the invention, the organic molecules include or consist of a structure selected from the group consisting of Formula IVa-1, Formula IVb-1, and Formula IVc-1:

Formula IVa-1
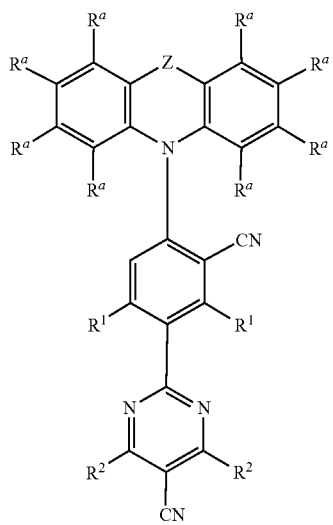
Formula IVb-1
Formula IVc-1
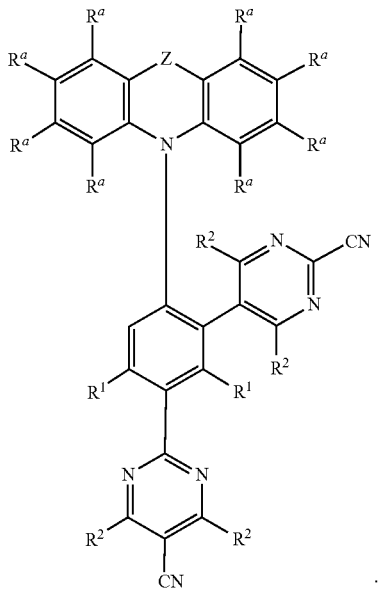
In one embodiment of the invention, the organic molecules include or consist of a structure selected from the group consisting of Formula Va, Formula Vb, and Formula Vc:
Formula Va
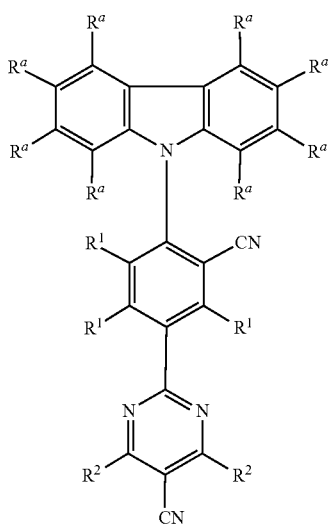

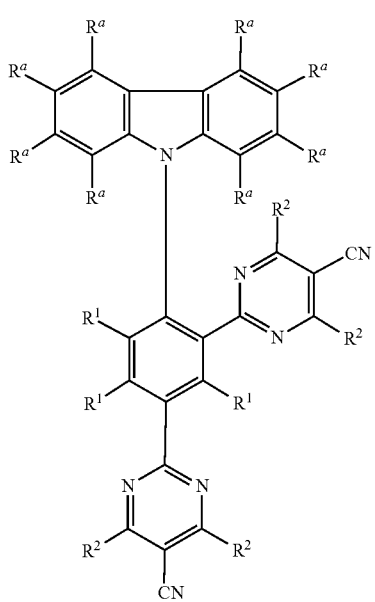
Formula Vb
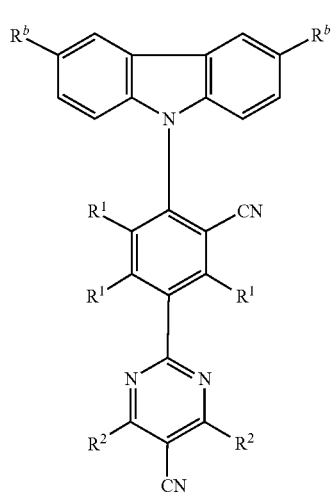
Formula Va-1
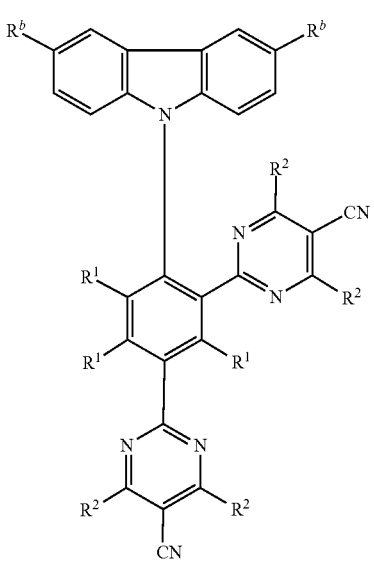
Formula Vb-1
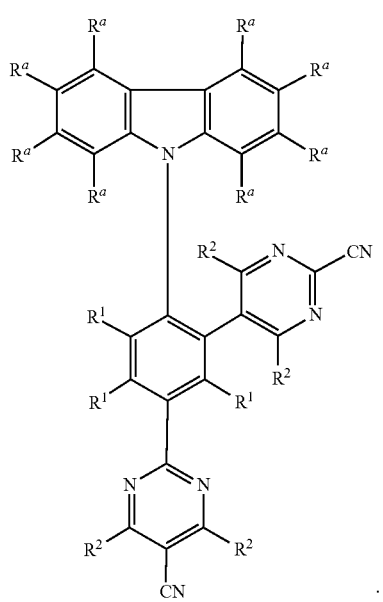
Formula Vc
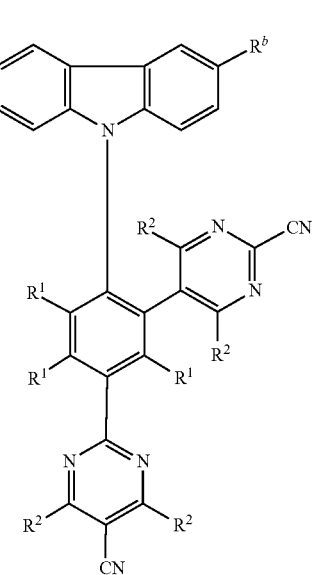
Formula Vc-1
In one embodiment of the invention, the organic molecules include or consist of a structure selected from the group consisting of Formula Va-1, Formula Vb-1, and Formula Vc-1:

In one embodiment of the invention, the organic molecules include or consist of a structure selected from the group consisting of Formula Va-2, Formula Vb-2, and Formula Vc-2:

Formula Va-2

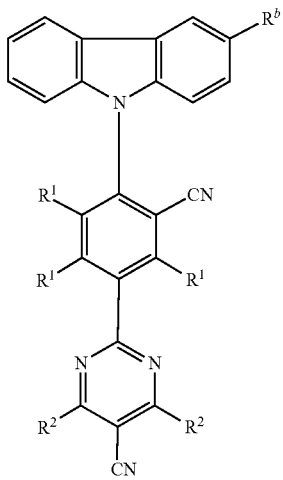

Formula Vc-2

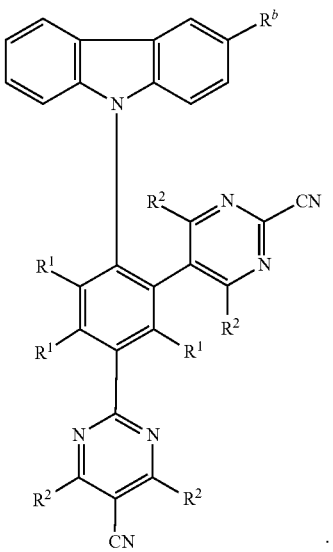

In one embodiment of the invention, the organic molecules include or consist of a structure selected from the group consisting of Formula VIa, Formula VIb, and Formula VIc:

Formula Vb-2

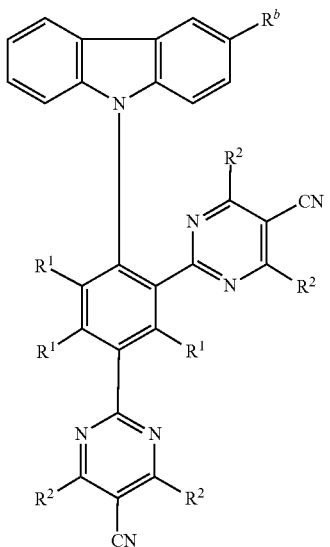

Formula VIa

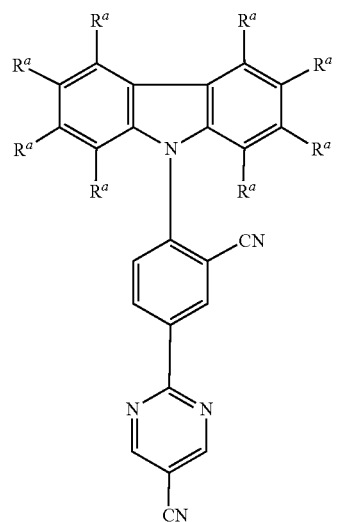

Formula VIb

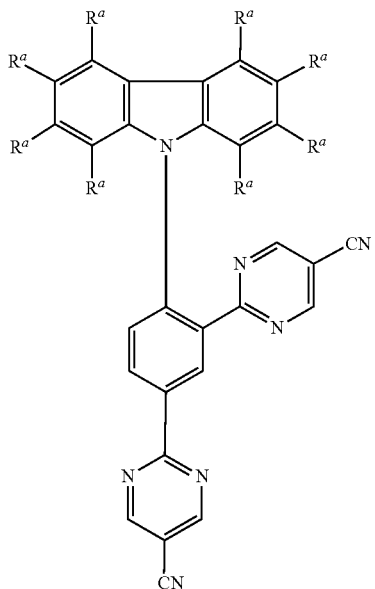

Formula VIa-1

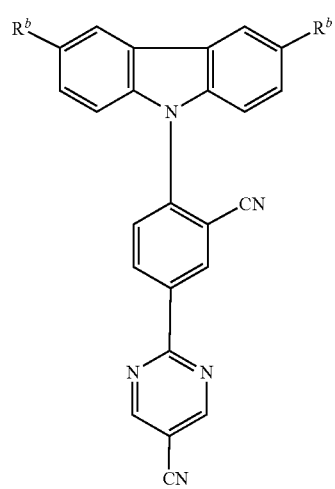

Formula VIc

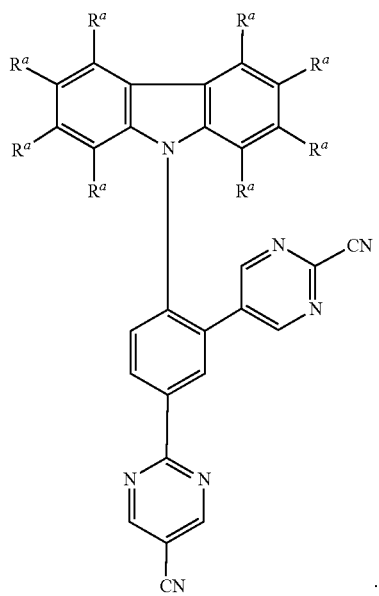

Formula VIb-1

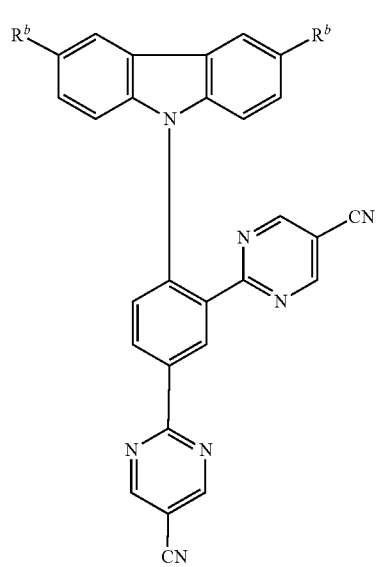

Formula VIc-1

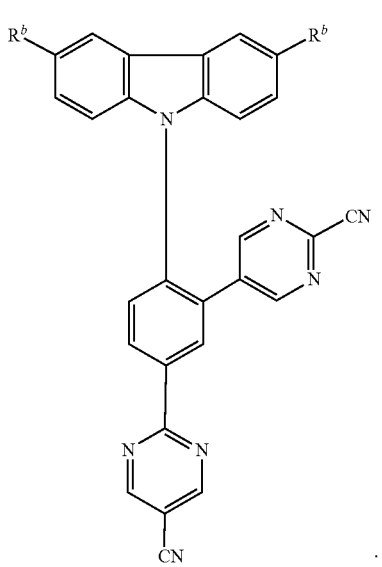

In a preferred embodiment of the invention, the organic molecules include or consist of a structure selected from the group consisting of Formula VIa and Formula VIb.

In one embodiment of the invention, the organic molecules include or consist of a structure selected from the group consisting of Formula VIa-1, Formula VIb-1, and Formula VIc-1, in which $R^b$ is defined as described above:

In one embodiment of the invention, the organic molecules include or consist of a structure selected from the group consisting of Formula VIa-2, Formula VIb-2, and Formula VIc-2, in which $R^b$ is defined as described above:

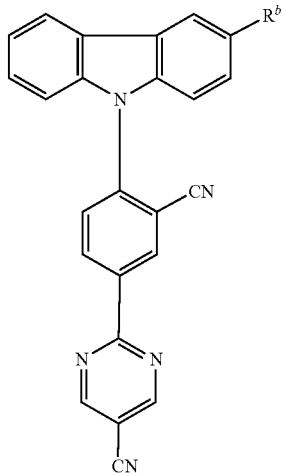

Formula VIa-2

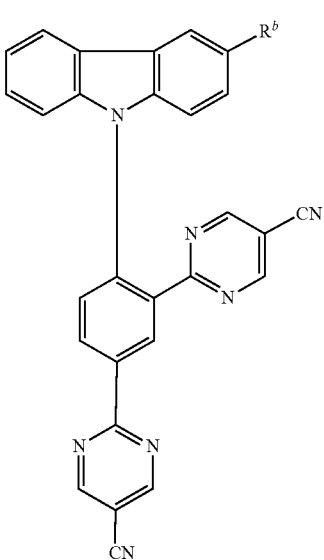

Formula VIb-2

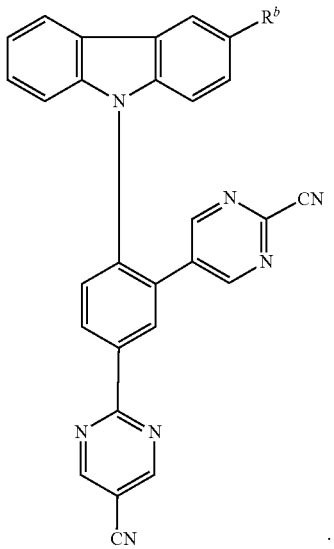

Formula VIc-2

In certain embodiments of the organic molecule, $R^b$ is at each occurrence independently from each other selected from the group consisting of:

deuterium; $N(R^5)_2$; $OR^5$; $Si(R^5)_3$; $B(OR^5)_2$; $OSO_2R^5$; $CF_3$; CN; F; Br; I;

$C_1$-$C_{40}$-alkyl,
which is optionally substituted with one or more substituents $R^5$ and
wherein one or more non-adjacent $CH_2$-groups are optionally substituted by $R^5C=CR^5$, $C≡C$, $Si(R^5)_2$, $Ge(R^5)_2$, $Sn(R^5)_2$, C=O, C=S, C=Se, C=NR^5, P(=O)(R^5), SO, SO_2, NR^5, O, S, or CONR^5;

$C_1$-$C_{40}$-alkoxy,
which is optionally substituted with one or more substituents $R^5$ and
wherein one or more non-adjacent $CH_2$-groups are optionally substituted by $R^5C=CR^5$, $C≡C$, $Si(R^5)_2$, $Ge(R^5)_2$, $Sn(R^5)_2$, C=O, C=S, C=Se, C=NR^5, P(=O)(R^5), SO, SO_2, NR^5, O, S, or CONR^5;

$C_1$-$C_{40}$-thioalkoxy,
which is optionally substituted with one or more substituents $R^5$ and
wherein one or more non-adjacent $CH_2$-groups are optionally substituted by $R^5C=CR^5$, $C≡C$, $Si(R^5)_2$, $Ge(R^5)_2$, $Sn(R^5)_2$, C=O, C=S, C=Se, C=NR^5, P(=O)(R^5), SO, SO_2, NR^5, O, S, or CONR^5;

$C_2$-$C_{40}$-alkenyl,
which is optionally substituted with one or more substituents $R^5$ and
wherein one or more non-adjacent $CH_2$-groups are optionally substituted by $R^5C=CR^5$, $C≡C$, $Si(R^5)_2$, $Ge(R^5)_2$, $Sn(R^5)_2$, C=O, C=S, C=Se, C=NR^5, P(=O)(R^5), SO, SO_2, NR^5, O, S, or CONR^5;

$C_2$-$C_{40}$-alkynyl,
which is optionally substituted with one or more substituents $R^5$ and
wherein one or more non-adjacent $CH_2$-groups are optionally substituted by $R^5C=CR^5$, $C≡C$, $Si(R^5)_2$, $Ge(R^5)_2$, $Sn(R^5)_2$, C=O, C=S, C=Se, C=NR^5, P(=O)(R^5), SO, SO_2, NR^5, O, S, or CONR^5;

$C_6$-$C_{60}$-aryl,
which is optionally substituted with one or more substituents $R^5$; and $C_3$-$C_{57}$-heteroaryl,
which is optionally substituted with one or more substituents $R^5$.

Definitions

Herein, the term "layer" refers to a body or sheet-like mass that bears an extensively planar geometry. Optoelectronic devices may be composed of several layers.

A light-emitting layer (EML) in the context of the invention is a layer of an optoelectronic device, wherein light emission from said layer is observed when applying a voltage and electrical current to the device. The person skilled in the art understands that light emission from optoelectronic devices is attributed to light emission from at least one EML. The skilled artisan understands that light emission from an EML is typically not (mainly) attributed to all materials included in said EML, to specific emitter materials.

An "emitter material" (also referred to as "emitter") in the context of the invention is a material that emits light when it is included in a light-emitting layer (EML) of an optoelectronic device, given that a voltage and electrical current are applied to said device. The emitter material usually is an "emissive dopant" material. A dopant material (may it be emissive or not) is a material that is embedded in a matrix material that is herein referred to as host material. Herein, host materials are also in general referred to as $H^B$ when they are included in an optoelectronic device, such as an OLED, including at least one organic molecule according to the invention.

In the context of the invention, the term "cyclic group" may be understood in the broadest sense as any mono-, bi- or polycyclic moiety.

In the context of the invention, the term "ring" when referring to chemical structures may be understood in the broadest sense as any monocyclic moiety. Along the same lines, the term "rings" when referring to chemical structures may be understood in the broadest sense as any bi- or polycyclic moiety.

In the context of the invention, the term "ring system" may be understood in the broadest sense as any mono-, bi- or polycyclic moiety.

In the context of the invention, the term "ring atom" refers to any atom which is part of the cyclic core of a ring or a ring system, and not part of a non-cyclic substituent optionally attached to the cyclic core.

In the context of the invention, the term "carbocycle" may be understood in the broadest sense as any cyclic group in which the cyclic core structure includes only carbon atoms that may of course be substituted with hydrogen or any other substituents defined in the specific embodiments of the invention. It is understood that the term "carbocyclic" as adjective refers to cyclic groups in which the cyclic core structure includes only carbon atoms that may of course be substituted with hydrogen or any other substituents defined in the specific embodiments of the invention.

In the context of the invention, the term "heterocycle" may be understood in the broadest sense as any cyclic group in which the cyclic core structure includes not just carbon atoms, but also at least one heteroatom. It is understood that the term "heterocyclic" as adjective refers to cyclic groups in which the cyclic core structure includes not just carbon atoms, but also at least one heteroatom. The heteroatoms may, unless stated otherwise in specific embodiments, at each occurrence be the same or different and preferably be individually selected from the group consisting of B, Si, N, O, S, and Se, more preferably B, N, O, and S, most preferably N, O, S. All carbon atoms or heteroatoms included in a heterocycle in the context of the invention may of course be substituted with hydrogen or any other substituents defined in the specific embodiments of the invention.

The person skilled in the art understands that any cyclic group (i.e., any carbocycle and heterocycle) may be aliphatic or aromatic or heteroaromatic.

In the context of the invention, the term aliphatic when referring to a cyclic group (i.e., to a ring, to rings, to a ring system, to a carbocycle, to a heterocycle) means that the cyclic core structure (not counting substituents that are optionally attached to it) contains at least one ring atom that is not part of an aromatic or heteroaromatic ring or ring system. Preferably, the majority of ring atoms and more preferably all ring atoms within an aliphatic cyclic group are not part of an aromatic or heteroaromatic ring or ring system (such as in cyclohexane or in piperidine, for example). Herein, no differentiation is made between carbocyclic and heterocyclic groups when referring to aliphatic rings or ring systems in general, whereat the term "aliphatic" may be used as adjective to describe a carbocycle or heterocycle in order to indicate whether or not a heteroatom is included in the aliphatic cyclic group.

As understood by the skilled artisan, the terms "aryl" and "aromatic" may be understood in the broadest sense as any mono-, bi- or polycyclic aromatic moieties, i.e., cyclic groups in which all ring atoms are part of an aromatic ring system, preferably part of the same aromatic ring system. However, throughout the present application, the terms "aryl" and "aromatic" are restricted to mono-, bi- or polycyclic aromatic moieties wherein all aromatic ring atoms are carbon atoms. In contrast, the terms "heteroaryl" and "heteroaromatic" herein refer to any mono-, bi- or polycyclic aromatic moieties, wherein at least one aromatic carbon ring atom is replaced by a heteroatom (i.e., not carbon). Unless stated otherwise in specific embodiments of the invention, the at least one heteroatom within a "heteroaryl" or "heteroaromatic" may at each occurrence be the same or different and be individually selected from the group consisting of N, O, S, and Se, more preferably N, O, and S. The person skilled in the art understands that the adjectives "aromatic" and "heteroaromatic" may be used to describe any cyclic group (i.e., any ring system). This is to say that an aromatic cyclic group (i.e., an aromatic ring system) is an aryl group and a heteroaromatic cyclic group (i.e., a heteroaromatic ring system) is a heteroaryl group.

Unless indicated differently in specific embodiments of the invention, an aryl group herein preferably contains 6 to 60 aromatic ring atoms, more preferably 6 to 40 aromatic ring atoms, and even more preferably 6 to 18 aromatic ring atoms. Unless indicated differently in specific embodiments of the invention, a heteroaryl group herein preferably contains 5 to 60 aromatic ring atoms, preferably 5 to 40 aromatic ring atoms, more preferably 5 to 20 aromatic ring atoms, out of which at least one is a heteroatom, preferably selected from N, O, S, and Se, more preferably from N, O, and S. If more than one heteroatom is included an a heteroaromatic group, all heteroatoms are preferably independently of each other selected from N, O, S, and Se, more preferably from N, O, and S.

In the context of the invention, for both aromatic and heteroaromatic groups (for example aryl or heteroaryl substituents), the number of aromatic ring carbon atoms may be given as subscripted number in the definition of certain substituents, for example in the form of "$C_6$-$C_{60}$-aryl", which means that the respective aryl substituent includes 6 to 60 aromatic carbon ring atoms. The same subscripted numbers are herein also used to indicate the allowable number of carbon atoms in all other kinds of substituents, regardless of whether they are aliphatic, aromatic or heteroaromatic substituents. For example, the expression "$C_1$-$C_{40}$-alkyl" refers to an alkyl substituent including 1 to 40 carbon atoms.

Preferred examples of aryl groups include groups derived from benzene, naphthalene, anthracene, phenanthrene, pyrene, dihydropyrene, chrysene, perylene, fluoranthene, benzanthracene, benzophenanthrene, tetracene, pentacene, benzopyrene, or combinations of these groups.

Preferred examples of heteroaryl groups include groups derived from furan, benzofuran, isobenzofuran, dibenzofuran, thiophene, benzothiophene, isobenzothiophene, dibenzothiophene; pyrrole, indole, isoindole, carbazole, indolocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthoimidazole, phenanthroimidazole, pyridoimidazole, pyrazinoimidazole, quinoxalinoimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, 1,3,5-triazine, 1,2,4-triazine, 1,2,3-triazine, quinoxaline, pyrazine, phenazine, naphthyridine, carboline, benzocarboline, phenanthroline, 1,2,3-triazole, 1,2,4-triazole, benzotriazole, 1,2,3-oxadiazole, 1,2,4-oxadiazole, 1,2,5-oxadiazole, 1,2,3,4-tetrazine, 1,2,4,5-tetrazine, purine, pteridine, indolizine, and benzothiadiazole, or combinations of these groups.

As used throughout the present application, the term "arylene" refers to a divalent aryl substituent that bears two binding sites to other molecular structures, thereby serving as a linker structure. Along the same lines, the term "heteroarylene" refers to a divalent aryl substituent that bears two binding sites to other molecular structures, thereby serving as a linker structure.

In the context of the invention, the term "fused" when referring to aromatic or heteroaromatic ring systems means that the aromatic or heteroaromatic rings that are "fused" share at least one bond that is part of both ring systems. For example, naphthalene (or naphthyl when referred to as substituent) or benzothiophene (or benzothiophenyl when referred to as substituent) are considered fused aromatic ring systems in the context of the invention, in which two benzene rings (for naphthalene) or a thiophene and a benzene (for benzothiophene) share one bond. It is also understood that sharing a bond in this context includes sharing the two atoms that build up the respective bond and that fused aromatic or heteroaromatic ring systems can be understood as one aromatic or heteroaromatic ring system. Additionally, it is understood, that more than one bond may be shared by the aromatic or heteroaromatic rings building up a fused aromatic or heteroaromatic ring system (e.g., in pyrene). Furthermore, it will be understood that aliphatic ring systems may also be fused and that this has the same meaning as for aromatic or heteroaromatic ring systems, with the exception of course, that fused aliphatic ring systems are not aromatic. Furthermore, it is understood that an aromatic or heteroaromatic ring system may also be fused to (in other words: share at least one bond with) an aliphatic ring system.

In the context of the invention, the term "condensed" ring system has the same meaning as "fused" ring system.

In certain embodiments of the invention, adjacent substituents bonded to a ring or a ring system may together form an additional mono- or polycyclic, aliphatic, aromatic or heteroaromatic ring system which is fused to the aromatic or heteroaromatic ring or ring system to which the substituents are bonded. It is understood that the optionally so formed fused ring system will be larger (meaning it includes more ring atoms) than the aromatic or heteroaromatic ring or ring system to which the adjacent substituents are bonded. In these cases (and if such a number is provided), the "total" amount of ring atoms included in the fused ring system is to be understood as the sum of ring atoms included in the aromatic or heteroaromatic ring or ring system to which the adjacent substituents are bonded and the ring atoms of the additional ring system formed by the adjacent substituents, wherein, however, the ring atoms that are shared by fused rings are counted once and not twice. For example, a benzene ring may have two adjacent substituents that together form each other benzene ring so that a naphthalene core is built. This naphthalene core then includes 10 ring atoms as two carbon atoms are shared by the two benzene rings and are thus only counted once and not twice. The term "adjacent substituents" in this context refers to substituents attached to the same or to neighboring atoms.

In general, in the context of the invention, the terms "adjacent substituents" or "adjacent groups" refer to substituents or groups bonded to either the same or to neighboring atoms.

In the context of the invention, the term "alkyl group" may be understood in the broadest sense as any linear, branched, or cyclic alkyl substituent. Preferred examples of alkyl groups as substituents include methyl (Me), ethyl (Et), n-propyl ($^n$Pr), i-propyl ($^i$Pr), cyclopropyl, n-butyl ($^n$Bu), i-butyl ($^i$Bu), s-butyl ($^s$Bu), t-butyl ($^t$Bu), cyclobutyl, 2-methylbutyl, n-pentyl, s-pentyl, t-pentyl, 2-pentyl, neo-pentyl, cyclopentyl, n-hexyl, s-hexyl, t-hexyl, 2-hexyl, 3-hexyl, neo-hexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2,2,2]octyl, 2-bicyclo[2,2,2]-octyl, 2-(2,6-dimethyl)octyl, 3-(3,7-dimethyl)octyl, adamantyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)-cyclohex-1-yl, 1-(n-butyl)-cyclohex-1-yl, 1-(n-hexyl)-cyclohex-1-yl, 1-(n-octyl)-cyclohex-1-yl, and 1-(n-decyl)-cyclohex-1-yl.

The "s" in for example s-butyl, s-pentyl and s-hexyl refers to "secondary"; or in other words: s-butyl, s-pentyl and s-hexyl are equal to sec-butyl, sec-pentyl and sec-hexyl, respectively. The "t" in for example t-butyl, t-pentyl and t-hexyl refers to "tertiary"; or in other words: t-butyl, t-pentyl and t-hexyl are equal to tert-butyl, tert-pentyl and tert-hexyl, respectively.

As used herein, the term "alkenyl" includes linear, branched, or cyclic alkenyl substituents. The term alkenyl group exemplarily includes the substituents ethenyl, propenyl, butenyl, pentenyl, cyclopentenyl, hexenyl, cyclohexenyl, heptenyl, cycloheptenyl, octenyl, cyclooctenyl, or cyclooctadienyl.

As used herein, the term "alkynyl" includes linear, branched, or cyclic alkynyl substituents. The term alkynyl group exemplarily includes ethynyl, propynyl, butynyl, pentynyl, hexynyl, heptynyl, or octynyl.

As used herein, the term "alkoxy" includes linear, branched, or cyclic alkoxy substituents. The term alkoxy group exemplarily includes methoxy, ethoxy, n-propoxy, i-propoxy, n-butoxy, i-butoxy, s-butoxy, t-butoxy, and 2-methylbutoxy.

As used herein, the term "thioalkoxy" includes linear, branched, or cyclic thioalkoxy substituents, in which the oxygen atom O of the corresponding alkoxy groups is replaced by sulfur, S.

As used herein, the terms "halogen" (or "halo" when referred to as substituent in chemical nomenclature) may be understood in the broadest sense as any atom of an element of the $7^{th}$ main group (in other words: group 17) of the periodic table of elements, preferably fluorine, chlorine, bromine, or iodine.

It is understood that when a molecular fragment is described as being a substituent or otherwise attached to another moiety, its name may be written as if it was a fragment (e.g., naphthyl, dibenzofuryl) or as if it was the intact group (e.g., naphthalene, dibenzofuran). As used herein, these different ways of designating a substituent or attached fragment are considered to be equivalent.

Furthermore, herein, whenever a substituent such as "$C_6$-$C_{60}$-aryl" or "$C_1$-$C_{40}$-alkyl" is referred to without the name indicating the binding site within that substituent, this is to mean that the respective substituent may bond via any atom. For example, a "$C_6$-$C_{60}$-aryl"-substituent may bond via any of the 6 to 60 aromatic carbon atoms and a "$C_1$-$C_{40}$-alkyl"-substituent may bond via any of the 1 to 40 aliphatic carbon atoms. On the other hand, a "2-cyanophenyl"-substituent can only be bonded in such a way that its CN-group is adjacent to the binding site as to allow for the chemical nomenclature to be correct.

In the context of the invention, whenever a substituent such as "butyl", "biphenyl" or "terphenyl" is referred to without further detail, this is to mean that any isomer of the respective substituent is allowable as the specific substituent. In this regard, for example the term "butyl" as substituent includes n-butyl, s-butyl, t-butyl, and iso-butyl as substituents. Along the same lines, the term "biphenyl" as substituent includes ortho-biphenyl, meta-biphenyl, or para-biphenyl, wherein ortho, meta and para are defined with regard to the binding site of the biphenyl substituent to the respective chemical moiety that bears the biphenyl substituent. Similarly, the term "terphenyl" as substituent includes 3-ortho-terphenyl, 4-ortho-terphenyl, 4-meta-terphenyl, 5-meta-terphenyl, 2-para-terphenyl or 3-para-terphenyl, wherein, as known to the skilled artisan, ortho, meta and para indicate the position of the two Ph-moieties within the terphenyl-group to each other and "2-", "3-", "4-" and "5-" denotes the binding site of the terphenyl substituent to the respective chemical moiety that bears the terphenyl substituent.

It is understood that all groups defined above and indeed all chemical moieties, regardless of whether they are cyclic or non-cyclic, aliphatic, aromatic or heteroaromatic, may be further substituted in accordance with the specific embodiments described herein.

In case, a group in the exemplary embodiments is defined differently from the general definitions given above, the definition in the exemplary embodiments is to be applied.

All hydrogen atoms (H) included in any structure referred to herein may at each occurrence independently of each other, and without this being indicated specifically, be replaced by deuterium (D). The replacement of hydrogen by deuterium is common practice and obvious for the person skilled in the art.

If experimental or calculated data are compared, the values have to be determined by the same methodology. Exemplarily, if an experimental $\Delta E_{ST}$ is determined to be below 0.4 eV by a specific method, a comparison is only valid using the same specific method including the same conditions. To give a specific example, the comparison of the photoluminescence quantum yield (PLQY) of different compounds is only valid, if the determination of the PLQY was performed by the same protocol under the same reaction conditions (e.g., measurement in a 10% PMMA film at room temperature). Also, energy values which were calculated are determined by the same calculation method (with same functional and same basis set).

Hyper-fluorescence is a concept for light emission from optoelectronic devices, in particular OLEDs, wherein at least one light-emitting layer includes one or more TADF materials and one or more fluorescence emitters. In hyper-fluorescence, at least one TADF material is capable of converting triplet excited states to singlet excite states by means of reverse-intersystem-crossing (RISC) and transfers excitation energy to at least one fluorescence emitter, which then emits light. This may allow to harvest triplet excitons for efficient fluorescent light generation.

Optoelectronic Devices Including an Organic Molecule According to the Invention

A further aspect of the invention relates to an optoelectronic device including an organic molecule according to the invention.

In one embodiment of the optoelectronic device including an organic molecule according to the invention is selected from the group consisting of:
- organic light-emitting diodes (OLEDs),
- light-emitting electrochemical cells,
- OLED sensors, especially in gas and vapor sensors not hermetically externally shielded,
- organic diodes,
- organic solar cells,
- organic transistors,
- organic field-effect transistors,
- organic lasers, and
- down-conversion elements.

A light-emitting electrochemical cell consists of three layers, namely a cathode, an anode, and an active layer, which may contain the organic molecule according to the invention.

In a preferred embodiment, the optoelectronic device including an organic molecule according to the invention is selected from the group consisting of an organic light emitting diode (OLED), a light emitting electrochemical cell (LEC), an organic laser, and a light-emitting transistor.

In an even more preferred embodiment, the optoelectronic device including an organic molecule according to the invention is an organic light-emitting diode (OLED).

In one embodiment the optoelectronic device including an organic molecule according to the invention is an OLED, that may exhibit the following layer structure:
1. substrate
2. anode layer A
3. hole injection layer, HIL
4. hole transport layer, HTL
5. electron blocking layer, EBL
6. light-emitting layer (also referred to as emission layer), EML
7. hole blocking layer, HBL
8. electron transport layer, ETL
9. electron injection layer, EIL
10. cathode layer C, wherein the OLED (with an inverted layer structure) includes each layer, except for an anode layer A, a cathode layer C and a light-emitting layer EML, only optionally, and wherein different layers may be merged and the OLED may include more than one layer of each layer types defined above.

Furthermore, the optoelectronic device including at least one organic molecule according to the invention may optionally include one or more protective layers protecting the device from damaging exposure to harmful species in the environment including, exemplarily moisture, vapor, and/or gases.

In one embodiment the optoelectronic device including an organic molecule according to the invention is an OLED, that may exhibit the following (inverted) layer structure:
1. substrate
2. cathode layer C
3. electron injection layer, EIL
4. electron transport layer, ETL
5. hole blocking layer, HBL
6. light-emitting layer (also referred to as emission layer), EML
7. electron blocking layer, EBL
8. hole transport layer, HTL
9. hole injection layer, HIL
10. anode layer A
wherein the OLED includes each layer, except for an anode layer A, a cathode layer C and a light-emitting layer EML, only optionally, and wherein different layers may be merged and the OLED may include more than one layer of each layer type defined above.

The organic molecules according to the invention (in accordance with the embodiments indicated above) can be employed in various layers, depending on the precise structure and on the substitution. In the case of the use, the fraction of the organic molecule according to the invention in the respective layer in an optoelectronic device, more particularly in an OLED, is 0.1% to 99% by weight (percentage by weight), more particularly 1% to 80% by weight. In an alternative embodiment, the proportion of the organic molecule in the respective layer is 100% by weight.

In one embodiment the optoelectronic device including an organic molecule according to the invention is an OLED which may exhibit stacked architecture. In this architecture, contrary to the typical arrangement, where the OLEDs are placed side by side, the individual units are stacked on top of each other. Blended light may be generated with OLEDs exhibiting a stacked architecture, in particular white light may be generated by stacking blue, green, and red OLEDs. Furthermore, the OLED exhibiting a stacked architecture may optionally include a charge generation layer (CGL), which is typically located between two OLED subunits and typically consists of a n-doped and p-doped layer with the n-doped layer of one CGL being typically located closer to the anode layer.

In one embodiment the optoelectronic device including an organic molecule according to the invention is an OLED, which includes two or more emission layers between anode and cathode. In particular, this so-called tandem OLED includes three emission layers, wherein one emission layer emits red light, one emission layer emits green light and one emission layer emits blue light, and optionally may include further layers such as charge generation layers, blocking or transporting layers between the individual emission layers. In a further embodiment, the emission layers are adjacently stacked. In a further embodiment, the tandem OLED includes a charge generation layer between each two emission layers. In addition, adjacent emission layers or emission layers separated by a charge generation layer may be merged.

In one embodiment the optoelectronic device including an organic molecule according to the invention may be an essentially white optoelectronic device, which is to say that the device emits white light. Exemplarily, such a white light-emitting optoelectronic device may include at least one (deep) blue emitter molecule and one or more emitter molecules emitting green and/or red light. Then, there may also optionally be energy transmittance between two or more molecules as described in a later section of this text.

In the case of the optoelectronic device including an organic molecule according to the invention, it is preferred that the at least one organic molecule according to the invention is included in a light-emitting layer (EML) of the optoelectronic device, most preferably in an EML of an OLED. However, the organic molecules according to the invention may for example also be employed in an electron transport layer (ETL) and/or in an electron blocking layer (EBL) or exciton-blocking layer and/or in a hole transport layer (HTL) and/or in a hole blocking layer (HBL). In the case of the use, the fraction of the organic molecule according to the invention in the respective layer in an optoelectronic device, more particularly in an OLED, is 0.1% to 99% by weight, more particularly 1% to 80% by weight. In an alternative embodiment, the proportion of the organic molecule in the respective layer is 100% by weight.

The selection criteria for suitable materials for the individual layers of optoelectronic devices, in particular OLEDs, form part of the common knowledge of those skilled in the art. The state of the art reveals plenty of materials to be used in the individual layers and also teaches which materials are suitable to be used alongside each other. It is understood that any materials used in the state of the art may also be used in optoelectronic devices including the organic molecule according to the invention. In the following, preferred examples of materials for the individual layers will be given. It is understood that, as stated previously, this does not imply that all types of layers listed below must be present in an optoelectronic device including at least one organic molecule according to the invention. Additionally, it is understood that an optoelectronic device including at least one organic molecule according to the invention may include more than one of each of the layers listed in the following, for example two or more light-emitting layers (EMLs). It is also understood that two or more layers of the same type (e.g., two or more EMLs or two or more HTLs) do not necessarily include the same materials or even the same materials in the same ratios. Furthermore, it is understood that an optoelectronic device including at least one organic molecule according to the invention does not have to include all the layer types listed in the following, wherein an anode layer, a cathode layer, and a light-emitting layer will usually be present in all cases.

The substrate may be formed by any material or composition of materials. Most frequently, glass slides are used as substrates. Alternatively, thin metal layers (e.g., copper, gold, silver, or aluminum films) or plastic films or slides may be used. This may allow a higher degree of flexibility. The anode layer A is mostly composed of materials allowing to obtain an (essentially) transparent film. As at least one of both electrodes should be (essentially) transparent in order to allow light emission from the OLED, either the anode layer A or the cathode layer C is usually transparent. Preferably, the anode layer A includes a large content or even consists of transparent conductive oxides (TCOs). Such an anode layer A may, for example, include indium tin oxide, aluminum zinc oxide, fluorine doped tin oxide, indium zinc oxide, PbO, SnO, zirconium oxide, molybdenum oxide, vanadium oxide, wolfram oxide, graphite, doped Si, doped Ge, doped GaAs, doped polyaniline, doped polypyrrole, and/or doped polythiophene.

Preferably, an anode layer A (essentially) consists of indium tin oxide (ITO) (e.g., $(In_2O_3)_{0.9}(SnO_2)_{0.1}$). The roughness of an anode layer A caused by the transparent conductive oxides (TCOs) may be compensated by using a hole injection layer (HIL). Further, a HIL may facilitate the injection of quasi charge carriers (i.e., holes) in that the transport of the quasi charge carriers from the TCO to the hole transport layer (HTL) is facilitated. A hole injection layer (HIL) may include poly-3,4-ethylenedioxy thiophene (PEDOT), polystyrene sulfonate (PSS), $MoO_2$, $V_2O_5$, CuPC, or CuI, in particular a mixture of PEDOT and PSS. A hole injection layer (HIL) may also prevent the diffusion of metals from an anode layer A into a hole transport layer (HTL). A HIL may for example include PEDOT:PSS (poly-3,4-ethylenedioxy thiophene:polystyrene sulfonate), PEDOT (poly-3,4-ethylenedioxy thiophene), mMTDATA (4,4',4"-tris[phenyl(m-tolyl)amino]triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4,N4-di-m-tolylbenzene-1,4-diamine), NPB (N,N'-bis-(1-naphthalenyl)-N,N'-bis-phenyl-(1,1'-biphenyl)-4,4'-diamine), NPNPB (N,N'-diphenyl-N,N'-di-[4-(N,N-diphenyl-amino)phenyl]benzidine), MeO-TPD (N,N,N',N'-tetrakis(4-methoxyphenyl)benzidine), HAT-CN (1,4,5,8,9,11-hexaazatriphenylene-hexacarbonitrile), and/or Spiro-NPD (N,N'-diphenyl-N,N'-bis-(1-naphthyl)-9,9'-spirobifluorene-2,7-diamine).

Adjacent to an anode layer A or a hole injection layer (HIL) typically a hole transport layer (HTL) is located. Herein, any hole transport material may be used. Exemplarily, electron-rich heteroaromatic compounds such as triarylamines and/or carbazoles may be used as hole transport compound. A HTL may decrease the energy barrier between an anode layer A and a light-emitting layer EML. A hole transport layer (HTL) may also be an electron blocking layer (EBL). Preferably, hole transport compounds bear comparably high energy levels of their lowermost excited triplet states T1. Exemplarily, a hole transport layer (HTL) may include a star-shaped heterocyclic compound such as tris(4-carbazol-9-ylphenyl)amine (TCTA), poly-TPD (poly(4-butylphenyl-diphenyl-amine)), [alpha]-NPD (poly(4-butylphenyl-diphenyl-amine)), TAPC (4,4'-cyclohexyliden-bis[N,N-bis(4-methylphenyl)benzenamine]), 2-TNATA (4,4',4"-tris[2-naphthyl(phenyl)amino]triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4,N4-di-m-tolylbenzene-1,4-diamine), NPB (N,N'-bis-(1-naphthalenyl)-N,N'-bis-phenyl-(1,1'-biphenyl)-4,4'-diamine)), NPNPB (N,N'-diphenyl-N,N'-di-[4-(N,N-diphenyl-amino)phenyl]benzidine), MeO-TPD (N,N,N',N'-tetrakis(4-methoxyphenyl)benzidine), HAT-CN (1,4,5,8,9,11-hexaazatriphenylene-hexacarbonitrile), and/or TrisPcz (9,9'-diphenyl-6-(9-phenyl-9H-carbazol-3-yl)-9H,9'H-3,3'-bicarbazole). In addition, a HTL may include a p-doped layer, which may be composed of an inorganic or organic dopant in an organic hole-transporting matrix. Transition metal oxides such as vanadium oxide, molybdenum oxide or tungsten oxide may be used as inorganic dopant. Tetrafluorotetracyanoquinodimethane (F4-TCNQ), copper-pentafluorobenzoate (Cu(I)pFBz) or transition metal complexes may be used as organic dopant.

An EBL may for example include mCP (1,3-bis(carbazol-9-yl)benzene), TCTA (tris(4-carbazol-9-ylphenyl)amine), 2-TNATA (4,4',4"-tris[2-naphthyl(phenyl)amino]triphenylamine), mCBP (3,3-di(9H-carbazol-9-yl)biphenyl), tris-Pcz (9-Phenyl-3,6-bis(9-phenyl-9H-carbazol-3-yl)-9H-carbazole), CzSi(9-(4-tert-Butylphenyl)-3,6-bis(triphenylsilyl)-9H-carbazole), and/or DCB (N,N'-dicarbazolyl-1,4-dimethylbenzene).

Adjacent to a hole transport layer (HTL) or (if present) an electron blocking layer (EBL), typically, a light-emitting layer (EML) is located. A light-emitting layer (EML) includes at least one light-emitting molecule (i.e., emitter material). Typically, an EML additionally includes one or more host materials (also referred to as matrix materials). Exemplarily, the host material may be selected from CBP (4,4'-Bis-(N-carbazolyl)-biphenyl), mCP (1,3-bis(carbazol-9-yl)benzene), mCBP (3,3-di(9H-carbazol-9-yl)biphenyl), Sif87 (dibenzo[b,d]thiophen-2-yltriphenylsilane), CzSi(9-(4-tert-Butylphenyl)-3,6-bis(triphenylsilyl)-9H-carbazole), Sif88 (dibenzo[b,d]thiophen-2-yl)diphenylsilane), DPEPO (bis[2-(diphenylphosphino)phenyl]ether oxide), 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, T2T (2,4,6-tris(biphenyl-3-yl)-1,3,5-triazine), T3T (2,4,6-tris(triphenyl-3-yl)-1,3,5-triazine), and/or TST (2,4,6-tris(9,9'-spirobifluoren-2-yl)-1,3,5-triazine). As known to the person skilled in the art, a host material typically should be selected to exhibit first (i.e., lowermost) excited triplet state (T1) and first (i.e., lowermost) excited singlet (S1) energy levels, which are energetically higher than the first (i.e., lowermost) excited triplet state (T1) and first (i.e., lowermost) excited singlet state (S1) energy levels of the at least one light-emitting molecule that is embedded in the respective host material(s).

As stated previously, it is preferred that at least one EML of the optoelectronic device in the context of the invention includes at least one molecule according to the invention. The preferred compositions of an EML of an optoelectronic device including at least one organic molecule according to the invention are described in more detail in a later section of this text (vide infra).

Adjacent to a light-emitting layer (EML), an electron transport layer (ETL) may be located. Herein, any electron transport material may be used. Exemplarily, compounds bearing electron-deficient groups, such as for example benzimidazoles, pyridines, triazoles, triazines, oxadiazoles (e.g., 1,3,4-oxadiazole), phosphine oxides and sulfones, may be used. An electron transport material may also be a star-shaped heterocyclic compound such as 1,3,5-tri(1-phenyl-1H-benzo[d]imidazol-2-yl)phenyl (TPBi). An ETL may for example include NBphen (2,9-bis(naphthalen-2-yl)-4,7-diphenyl-1,10-phenanthroline), Alq3 (aluminum-tris(8-hydroxyquinoline)), TSPO1 (diphenyl-4-triphenylsilylphenyl-phosphine oxide), BPyTP2 (2,7-di(2,2'-bipyridin-5-yl)triphenylene), Sif87 (dibenzo[b,d]thiophen-2-yltriphenylsilane), Sif88 (dibenzo[b,d]thiophen-2-yl)diphenylsilane), BmPyPhB (1,3-bis[3,5-di(pyridin-3-yl)phenyl]benzene), and/or BTB (4,4'-bis-[2-(4,6-diphenyl-1,3,5-triazinyl)]-1,1'-biphenyl). Optionally, an ETL may be doped with materials such as Liq ((8-hydroxyquinolinato) lithium). An electron transport layer (ETL) may also block holes or a hole blocking layer (HBL) is introduced, typically between an EML and an ETL.

A hole blocking layer (HBL) may for example include BCP (2,9-dimethyl-4,7-diphenyl-1,10- phenanthroline=bathocuproine), 4,6-diphenyl-2-(3-(triphenylsilyl)phenyl)-1,3,5-triazine, 9,9'-(5-(6-([1,1'-biphenyl]-3-yl)-2-phenylpyrimidin-4-yl)-1,3-phenylene)bis(9H-carbazole), BAlq (bis(8-hydroxy-2-methylquinoline)-(4-phenylphenoxy)aluminum), NBphen (2,9-bis(naphthalen-2-yl)-4,7-diphenyl-1,10-phenanthroline), Alq3 (Aluminum-tris(8-hydroxyquinoline)), TSPO1 (diphenyl-4-triphenylsilylphenyl-phosphine oxide), T2T (2,4,6-tris(biphenyl-3-yl)-1,3,5-triazine), T3T (2,4,6-tris(triphenyl-3-yl)-1,3,5-triazine), TST (2,4,6-tris(9,9'-spirobifluoren-2-yl)-1,3,5-triazine), and/or TCB/TCP (1,3,5-tris(N-carbazolyl)benzene/1,3,5-tris(carbazol)-9-yl)benzene).

A cathode layer C may be located adjacent to the electron transport layer (ETL). For example, the cathode layer C may include or may consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer may consist of (essentially) non-transparent metals such as Mg, Ca, or Al. Alternatively or additionally, the cathode layer C may also include graphite and or carbon nanotubes (CNTs). Alternatively, the cathode layer C may also include or consist of nanoscale silver wires.

An OLED including at least one organic molecule according to the invention may further, optionally include a protection layer between an electron transport layer (ETL) and a cathode layer C (which may be designated as electron injection layer (EIL)). This layer may include lithium fluoride, cesium fluoride, silver, Liq ((8-hydroxyquinolinato) lithium), $Li_2O$, $BaF_2$, MgO, and/or NaF.

Optionally, an electron transport layer (ETL) and/or a hole blocking layer (HBL) may also include one or more host materials.

As used herein, if not defined more specifically in the particular context, the designation of the colors of emitted and/or absorbed light is as follows:
violet: wavelength range of >380-420 nm;
deep blue: wavelength range of >420-480 nm;
sky blue: wavelength range of >480-500 nm;
green: wavelength range of >500-560 nm;
yellow: wavelength range of >560-580 nm;
orange: wavelength range of >580-620 nm;
red: wavelength range of >620-800 nm.

With respect to light-emitting molecules (in other words: emitter materials), such colors refer to the emission maximum of the main emission peak. Therefore, exemplarily, a deep blue emitter has an emission maximum in the range of from >420 to 480 nm, a sky-blue emitter has an emission maximum in the range of from >480 to 500 nm, a green emitter has an emission maximum in a range of from >500 to 560 nm, and a red emitter has an emission maximum in a range of from >620 to 800 nm.

A deep blue emitter may preferably have an emission maximum of below 475 nm, more preferably below 470 nm, even more preferably below 465 nm or even below 460 nm. It will typically be above 420 nm, preferably above 430 nm, more preferably above 440 nm or even above 450 nm. In one embodiment, the organic molecules according to the invention exhibit emission maxima between 420 and 500 nm, more preferably between 430 and 490 nm, even more preferably between 440 and 480 nm, and most preferably between 450 and 470 nm, typically measured at room temperature (i.e., (approximately) 20° C.) from a spin-coated film with 10% by weight of the organic molecule according to the invention in poly(methyl methacrylate), PMMA.

A further embodiment relates to an OLED including at least one organic molecule according to the invention and emitting light with CIEx and CIEy color coordinates close to the CIEx (=0.131) and CIEy (=0.046) color coordinates of the primary color blue (CIEx=0.131 and CIEy=0.046) as defined by ITU-R Recommendation BT.2020 (Rec. 2020) and thus is suited for the use in Ultra High Definition (UHD) displays, e.g., UHD-TVs. Accordingly, a further aspect of the invention relates to an OLED including at least one organic molecule according to the invention, whose emission exhibits a CIEx color coordinate of between 0.02 and 0.30, preferably between 0.03 and 0.25, more preferably between 0.05 and 0.20 or even more preferably between 0.08 and 0.18 or even between 0.10 and 0.15 and/or a CIEy color coordinate of between 0.00 and 0.45, preferably between 0.01 and 0.30, more preferably between 0.02 and 0.20 or even more preferably between 0.03 and 0.15 or even between 0.04 and 0.10.

A further embodiment relates to an OLED including at least one organic molecule according to the invention and exhibiting an external quantum efficiency at 1000 $cd/m^2$ of more than 8%, more preferably of more than 10%, more preferably of more than 13%, even more preferably of more than 15% or even more than 20% and/or exhibits an emission maximum 420 and 500 nm, more preferably between 430 and 490 nm, even more preferably between 440 and 480 nm, and most preferably between 450 and 470 nm or still and/or exhibits an LT80 value at 500 cd/m2 of more than 100 h, preferably more than 200 h, more preferably more than 400 h, even more preferably more than 750 h or even more than 1000 h.

A green emitter material may preferably have an emission maximum between 500 and 560 nm, more preferably between 510 and 550 nm, and even more preferably between 520 and 540 nm. In a preferred embodiment, the organic molecules according to the invention exhibit emission maxima between 500 and 560 nm, even more preferably between 510 and 550 nm, and most preferably between 520 and 540 nm, typically measured at room temperature (i.e., (approximately) 20° C.) from a spin-coated film with 10% by weight of the organic molecule according to the invention in poly(methyl methacrylate), PMMA.

A further embodiment relates to an OLED including at least one organic molecule according to the invention and emitting light with CIEx and CIEy color coordinates close to the CIEx (=0.170) and CIEy (=0.797) color coordinates of the primary color green (CIEx=0.170 and CIEy=0.797) as defined by ITU-R Recommendation BT.2020 (Rec. 2020). Thus, such a device is suited for the use in Ultra High Definition (UHD) displays, e.g., UHD-TVs. In this context, the term "close to" refers to the ranges of CIEx and CIEy coordinates provided at the end of this paragraph. In commercial applications, typically top-emitting (top-electrode is transparent) devices are used, whereas test devices as used throughout the present application represent bottom-emitting devices (bottom-electrode and substrate are transparent). Accordingly, a further aspect of the invention relates to an OLED including at least one organic molecule according to the invention and emitting light with a CIEx color coordinate of between 0.10 and 0.45 preferably between 0.10 and 0.35, more preferably between 0.10 and 0.30 or even more preferably between 0.10 and 0.25 or even between 0.15 and 0.20 and/or a CIEy color coordinate of between 0.60 and 0.92, preferably between 0.65 and 0.90, more preferably between 0.70 and 0.88 or even more preferably between 0.75 and 0.86 or even between 0.79 and 0.84.

A further preferred embodiment relates to an OLED including at least one organic molecule according to the invention and exhibiting an external quantum efficiency at 14500 cd/m² of more than 10%, more preferably of more than 13%, more preferably of more than 15%, even more preferably of more than 17% or even more than 20% and/or exhibiting an emission maximum between 500 and 560 nm, more preferably between 510 and 550 nm, even more preferably between 520 and 540 nm and/or exhibiting an LT97 value at 14500 cd/m² of more than 100 h, preferably more than 250 h, more preferably more than 500 h, even more preferably more than 750 h, or even more than 1000 h.

A further preferred embodiment relates to an OLED including at least one organic molecule according to the invention and emitting light at a distinct color point. Preferably, the OLED emits light with a narrow emission band (a small full width at half maximum (FWHM)). In a preferred embodiment, the OLED including at least one organic molecule according to the invention emits light with an FWHM of the main emission peak of less than 0.50 eV, preferably less than 0.48 eV, more preferably less than 0.45 eV, more preferably less than 0.43 eV or more preferably less than 0.40 eV, more preferably less than 0.35 eV, even more preferably less than 0.30 eV, or even less than 0.25 eV.

In accordance with the invention, the optoelectronic devices including at least one organic molecule according to the invention can for example be employed in displays, as light sources in lighting applications and as light sources in medical and/or cosmetic applications (for example light therapy).

Combination of the Organic Molecules According to the Invention with Further Materials It forms part of the common knowledge of those skilled in the art that any layer within an optoelectronic device (herein preferably an OLED), and in particular the light-emitting layer (EML), may be composed of a single material or a combination of different materials.

For example, the person skilled in the art understands that an EML may be composed of a single material that is capable of emitting light when a voltage (and electrical current) is applied to said device. However, the skilled artisan also understands that it may be beneficial to combine different materials in an EML of an optoelectronic device (herein preferably an OLED), in particular one or more host material(s)(in other words: matrix material(s); herein designated host material(s) $H^B$ when included in an optoelectronic device that includes at least one organic molecule according to the invention) and one or more dopant materials out of which at least one is emissive (i.e., an emitter material) when applying a voltage and electrical current to the device.

In a preferred embodiment of the use of an organic molecule according to the invention in an optoelectronic device, said optoelectronic device includes at least one organic molecule according to the invention in an EML or in a layer that is directly adjacent to an EML or in more than one of these layers.

In a preferred embodiment of the use of an organic molecule according to the invention in an optoelectronic device, said optoelectronic device is an OLED and includes at least one organic molecule according to the invention in an EML or in a layer that is directly adjacent to an EML or in more than one of these layers.

In an even more preferred embodiment of the use of an organic molecule according to the invention in an optoelectronic device, said optoelectronic device is an OLED and includes at least one organic molecule according to the invention in an EML. The person skilled in the art understands this to mean that the at least one organic molecule according to the invention may for example be used as host material $H^B$ (in other words: matrix material) of the respective EML or as dopant (material) that is embedded in at least one host material $H^B$ (in other words: matrix material). The person skilled in the art also understands that a dopant (material) may be emissive (i.e., an emitter material) or non-emissive (i.e., not emitting light when a voltage and electrical current is applied to the optoelectronic device).

In one embodiment relating to the optoelectronic device, preferably the OLED, including at least one organic molecule according to the invention, the at least one, preferably each, organic molecule according to the invention is used as emitter material in a light-emitting layer EML, which is to say that it emits light when a voltage (and electrical current) is applied to said device.

In another embodiment relating to the optoelectronic device, preferably the OLED, including at least one organic molecule according to the invention, the at least one, preferably each, organic molecule according to the invention is present in a light-emitting layer EML, but does not emit light, when a voltage (and electrical current) is applied to said device. This is to say that in such a case, the at least one organic molecule according to the invention would be a host material $H^B$ or a non-emissive dopant material, both of which are known to the person skilled in the art.

In one embodiment relating to the optoelectronic device, preferably the OLED, including at least one organic molecule according to the invention, more than one organic molecules according to the invention are included in at least one EML. The person skilled in the art understands this to mean that the more than one organic molecules according to the invention may all be emitter materials (in other words: emissive dopant materials) in said EML or may all be host materials $H^B$ in said EML or may all be non-emissive dopant materials in said EML or the organic molecules may be independently of each other selected from a host material $H^B$, an emitter material (in other words: emissive dopant material) or a non-emissive dopant material.

As known to the person skilled in the art, light emission from emitter materials (i.e., emissive dopants), for example in organic light-emitting diodes (OLEDs), may include fluorescence from excited singlet states (typically the lowermost excited singlet state S1) and phosphorescence from excited triplet states (typically the lowermost excited triplet state T1).

A fluorescence emitter F is capable of emitting light at room temperature (i.e., (approximately) 20° C.) upon electronic excitation (for example in an optoelectronic device), wherein the emissive excited state is a singlet state. Fluorescence emitters usually display prompt (i.e., direct) fluorescence on a timescale of nanoseconds, when the initial electronic excitation (for example by electron hole recombination) affords an excited singlet state of the emitter.

In the context of the invention, a delayed fluorescence material is a material that is capable of reaching an excited singlet state (typically the lowermost excited singlet state S1) by means of reverse intersystem crossing (RISC; in other words: up intersystem crossing or inverse intersystem crossing) from an excited triplet state (typically from the lowermost excited triplet state T1) and that is furthermore capable of emitting light when returning from the so-reached excited singlet state (typically S1) to its electronic ground state. The fluorescence emission observed after RISC from an excited triplet state (typically T1) to the emissive excited singlet state (typically S1) occurs on a timescale (typically in the range of microseconds) that is slower than the timescale on which direct (i.e., prompt) fluorescence occurs (typically in the range of nanoseconds) and is thus referred to as delayed fluorescence (DF). When RISC from an excited triplet state (typically from T1) to an excited singlet state (typically to S1), occurs through thermal activation, and if the so populated excited singlet state emits light (delayed fluorescence emission), the process is referred to as thermally activated delayed fluorescence (TADF). Accordingly, a TADF material is a material that is capable of emitting thermally activated delayed fluorescence (TADF) as explained above. It is known to the person skilled in the art that, when the energy difference $\Delta E_{ST}$ between the lowermost excited singlet state energy level $E(S1^E)$ and the lowermost excited triplet state energy level $E(T1^E)$ of a fluorescence emitter F is reduced, population of the lowermost excited singlet state from the lowermost excited triplet state by means of RISC may occur with high efficiency. Thus, it forms part of the common knowledge of those skilled in the art that a TADF material will typically have a small $\Delta E_{ST}$ value (vide infra). As known to the person skilled in the art, a TADF material may not just be a material that is on its own capable of RISC from an excited triplet state to an excited singlet state with subsequent emission of TADF as laid out above. It is known to those skilled in the art that a TADF material may in fact also be an exciplex that is formed from two kinds of materials, preferably from two host materials $H^B$, more preferably from a p-host material $H^P$ and an n-host material $H^N$ (vide infra).

The occurrence of (thermally activated) delayed fluorescence may for example be analyzed based on the decay curve obtained from time-resolved (i.e., transient) photoluminescence (PL) measurements. For this purpose, a spin-coated film of the respective emitter (i.e., the assumed TADF material) in poly(methyl methacrylate)(PMMA) with 1-10% by weight, in particular 10% by weight of the respective emitter may be used as sample. The analysis may for example be performed using an FS5 fluorescence spectrometer from Edinburgh instruments. The sample PMMA film may be placed in a cuvette and kept under nitrogen atmosphere during the measurement. Data acquisition may be performed using the well-established technique of time correlated single photon counting (TCSPC, vide infra). To gather the full decay dynamics over several orders of magnitude in time and signal intensity, measurements in four time windows (200 ns, 1 µs, and 20 µs, and a longer measurement spanning >80 µs) may be carried out and combined (vide infra).

TADF materials preferably fulfill the following two conditions regarding the aforementioned full decay dynamics:
  (i) the decay dynamics exhibit two time regimes, one in the nanosecond (ns) range and the other in the microsecond (µs) range; and
  (ii) the shapes of the emission spectra in both time regimes coincide;
  wherein, the fraction of light emitted in the first decay regime is taken as prompt fluorescence and the fraction emitted in the second decay regime is taken as delayed fluorescence.

The ratio of delayed and prompt fluorescence may be expressed in form of a so-called n-value that may be calculated by the integration of respective photoluminescence decays in time according to the following equation:

$$\frac{\int I_{DF}(t)dt}{\int I_{PF}(t)dt} = n$$

In the context of the present invention, a TADF material preferably exhibits an n-value (ratio of delayed to prompt fluorescence) larger than 0.05 (n>0.05), more preferably larger than 0.1 (n>0.1), even more preferably larger than 0.15 (n>0.15), particularly preferably larger than 0.2 (n>0.20), or even larger than 0.25 (n>0.25).

In a preferred embodiment, the organic molecules according to the invention exhibit an n-value (ratio of delayed to prompt fluorescence) larger than 0.05 (n>0.05).

In the context of the present invention, a TADF material $E^B$ is characterized by exhibiting a $\Delta E_{ST}$ value, which corresponds to the energy difference between the lowermost excited singlet state energy level $E(S1^E)$ and the lowermost excited triplet state energy level $E(T1^E)$, of less than 0.4 eV, preferably of less than 0.3 eV, more preferably of less than 0.2 eV, even more preferably of less than 0.1 eV, or even of less than 0.05 eV. The means of determining the $\Delta E_{ST}$ value of TADF materials $E^B$ are laid out in a later subchapter of this text.

In a preferred embodiment, the organic molecules according to the invention are TADF materials $E^B$ as defined herein and exhibit a $\Delta E_{ST}$ value, which corresponds to the energy difference between the lowermost excited singlet state energy level and the lowermost excited triplet state energy level, of less than 0.4 eV, preferably of less than 0.3 eV, more preferably of less than 0.2 eV, even more preferably of less than 0.13 eV, or even of less than 0.07 eV.

In the context of compositions including at least one organic molecule according to the invention (vide infra), reference will be made to compositions including one or more TADF materials $E^B$ which differ from the organic molecules according to the invention. The person skilled in the art understands that any TADF materials disclosed in the state of the art may be considered as suitable TADF materials $E^B$ in this regard. The skilled artisan also understands that TADF materials $E^B$ will typically be designed so that the highest occupied molecular orbital (HOMO) and the lowest unoccupied molecular orbital (LUMO) are spatially largely separated on (electron-) donor and (electron-) acceptor groups, respectively. These groups are usually bulky (i.e., sterically demanding) or connected via spiro-junctions so that they are twisted and the spatial overlap of the HOMO and the LUMO is reduced. However, minimizing the spatial overlap of the HOMO and the LUMO also results in a reduction of the photoluminescence quantum yield (PLQY) of the TADF material, which is unfavorable. Therefore, in practice, these two effects are both taken into account to achieve a reduction of $\Delta E_{ST}$ as well as a high PLQY.

One approach for the design of TADF materials in general is to covalently attach one or more (electron-) donor moieties on which the HOMO is distributed and one or more (electron-) acceptor moieties on which the LUMO is distributed to the same bridge, herein referred to as linker group. A TADF material $E^B$ may for example also include two or three linker groups which are bonded to the same acceptor moiety and additional donor and acceptor moieties may be bonded to each of these two or three linker groups.

One or more donor moieties and one or more acceptor moieties may also be bonded directly to each other (without the presence of a linker group).

Typical donor moieties are derivatives of diphenyl amine, indole, carbazole, acridine, phenoxazine, and related structures. In particular, aliphatic, aromatic or heteroaromatic ring systems may be fused to the aforementioned donor motifs to arrive at for example indolocarbazoles.

Benzene-, biphenyl-, and to some extend also terphenyl-derivatives are common linker groups.

Nitrile groups are very common acceptor moieties in TADF materials and known examples thereof include:
(i) carbazolyl dicyanobenzene compounds
such as 2CzPN (4,5-di(9H-carbazol-9-yl)phthalonitrile), DCzIPN (4,6-di(9H-carbazol-9-yl)isophthalonitrile), 4CzPN (3,4,5,6-tetra(9H-carbazol-9-yl)phthalonitrile), 4CzIPN (2,4,5,6-Tetra(9H-carbazol-9-yl)isophthalonitrile), 4CzTPN (2,4,5,6-tetra(9H-carbazol-9-yl)terephthalonitrile), and derivatives thereof;
(ii) carbazolyl cyanopyridine compounds
such as 4CzCNPy (2,3,5,6-tetra(9H-carbazol-9-yl)-4-cyanopyridine) and derivatives thereof;
(iii) carbazolyl cyanobiphenyl compounds
such as CNBPCz (4,4',5,5'-tetra(9H-carbazol-9-yl)-[1,1'-biphenyl]-2,2'-dicarbonitrile), CzBPCN (4,4',6,6'-tetra(9H-carbazol-9-yl)-[1,1'-biphenyl]-3,3'-dicarbonitrile), DDCzIPN (3,3',5,5'-tetra(9H-carbazol-9-yl)-[1,1'-biphenyl]-2,2',6,6'-tetracarbonitrile) and derivatives thereof;
wherein in these materials, one or more of the nitrile groups may be replaced by fluorine (F) or trifluoromethyl ($CF_3$) as acceptor moieties.

Nitrogen-heterocycles such as triazine-, pyrimidine-, triazole-, oxadiazole-, thiadiazole-, heptazine-, 1,4-diazatriphenylene-, benzothiazole-, benzoxazole-, quinoxaline-, and diazafluorene-derivatives are also well-known acceptor moieties used for the construction of TADF molecules. Known examples of TADF molecules including for example a triazine acceptor include PIC-TRZ (7,7'-(6-([1,1'-biphenyl]-4-yl)-1,3,5-triazine-2,4-diyl)bis(5-phenyl-5,7-dihydroindolo[2,3-b]carbazole)), mBFCzTrz (5-(3-(4,6-diphenyl-1,3,5-triazin-2-yl)phenyl)-5H-benzofuro[3,2-c]carbazole), and DCzTrz (9,9'-(5-(4,6-diphenyl-1,3,5-triazin-2-yl)-1,3-phenylene)bis(9H-carbazole)).

Another group of TADF molecules (materials) includes diaryl ketones such as benzophenone or (heteroaryl)aryl ketones such as 4-benzoylpyridine, 9,10-anthraquinone, 9H-xanthen-9-one, and derivatives thereof as acceptor moieties to which the donor moieties (usually carbazolyl substituents) are bonded. Examples of such TADF molecules include BPBCz (bis(4-(9'-phenyl-9H,9'H-[3,3'-bicarbazol]-9-yl)phenyl)methanone), mDCBP ((3,5-di(9H-carbazol-9-yl)phenyl)(pyridin-4-yl)methanone), AQ-DTBu-Cz (2,6-bis (4-(3,6-di-tert-butyl-9H-carbazol-9-yl)phenyl)anthracene-9,10-dione), and MCz-XT (3-(1,3,6,8-tetramethyl-9H-carbazol-9-yl)-9H-xanthen-9-one), respectively.

Sulfoxides, in particular diphenyl sulfoxides, are also commonly used as acceptor moieties for the construction of TADF materials and known examples include 4-PC-DPS (9-phenyl-3-(4-(phenylsulfonyl)phenyl)-9H-carbazole), DitBu-DPS (9,9'-(sulfonylbis(4,1-phenylene))bis(9H-carbazole)), and TXO-PhCz (2-(9-phenyl-9H-carbazol-3-yl)-9H-thioxanthen-9-one 10,10-dioxide).

It is understood that a fluorescence emitter F may also display TADF as defined herein and even be a TADF material $E^B$ as defined herein. In consequence, a small FWHM emitter $S^B$ as defined herein may or may not also be a TADF material $E^B$ as defined herein.

Phosphorescence, i.e., light emission from excited triplet states (typically from the lowermost excited triplet state T1) is a spin-forbidden process. As known to the person skilled in the art, phosphorescence may be facilitated (enhanced) by exploiting the (intramolecular) spin-orbit interaction (so called (internal) heavy atom effect). A phosphorescence material $P^B$ in the context of the invention is a phosphorescence emitter capable of emitting phosphorescence at room temperature (i.e., (approximately) 20° C.).

Herein, it is preferred that a phosphorescence material $P^B$ includes at least one atom of an element having a standard atomic weight larger than the standard atomic weight of calcium (Ca). Even more preferably, a phosphorescence material $P^B$ in the context of the invention includes a transition metal atom, in particular a transition metal atom of an element having a standard atomic weight larger than the standard atomic weight of zinc (Zn). The transition metal atom preferably included in the phosphorescence material $P^B$ may be present in any oxidation state (and may also be present as ion of the respective element).

It is common knowledge to those skilled in the art that phosphorescence materials $P^B$ used in organic electroluminescent devices are oftentimes complexes of Ir, Pd, Pt, Au, Os, Eu, Ru, Re, Ag, and Cu, in the context of this invention preferably of Ir, Pt, and Pd, more preferably of Ir and Pt. The skilled artisan knows which materials are suitable as phosphorescence materials $P^B$ in optoelectronic devices and how to synthesize them. Furthermore, the skilled artisan is familiar with the design principles of phosphorescent complexes for use as phosphorescence materials in optoelectronic devices and knows how to tune the emission of the complexes by means of structural variations.

The skilled artisan knows which materials are suitable as phosphorescence materials $P^B$ to be used in optoelectronic devices and how to synthesize them. In this regard, the skilled artisan is in particular familiar with the design principles of phosphorescent complexes for use as phosphorescence materials $P^B$ in optoelectronic devices and knows how to tune the emission of the complexes by means of structural variations.

Non-limiting examples of phosphorescence materials $P^B$ that may be used alongside the organic molecules according to the present invention (for example in form of a composition or in an EML of an optoelectronic device, vide infra) are disclosed in the state of the art. For example, the following metal complexes are phosphorescence materials $P^B$ that may be used alongside the organic molecules according to the present invention:

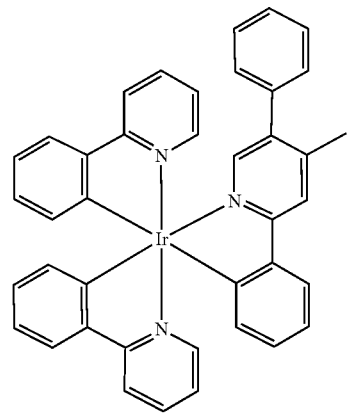

-continued

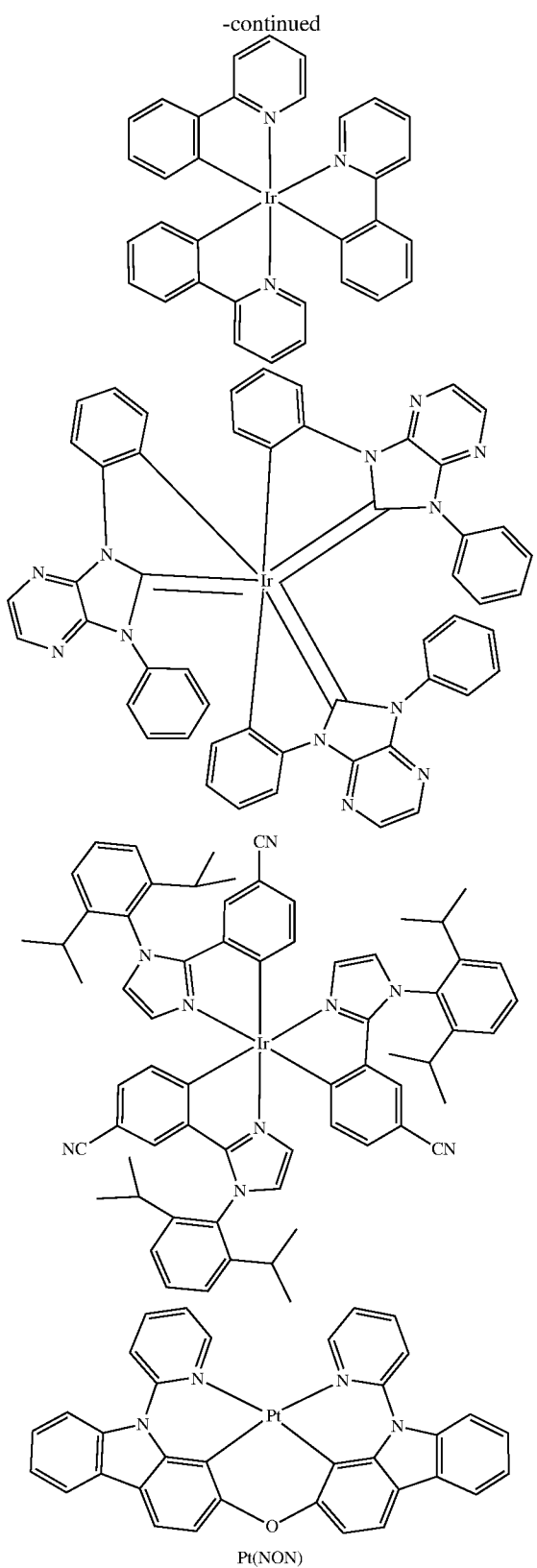

Pt(NON)

A small full width at half maximum (FWHM) emitter $S^B$ in the context of the invention is any emitter (i.e., emitter material) that has an emission spectrum, which exhibits an FWHM of less than or equal to 0.35 eV (≤ 0.35 eV), preferably of less than or equal to 0.30 eV (≤ 0.30 eV), in particular of less than or equal to 0.25 eV (≤ 0.25 eV). Unless stated otherwise, this is judged based on an emission spectrum of the respective emitter at room temperature (i.e., (approximately) 20° C.), typically measured with 1 to 5% by weight, in particular with 2% by weight, of the emitter in poly(methyl methacrylate) PMMA. Alternatively, emission spectra of small FWHM emitters $S^B$ may be measured in a solution, typically with 0.001-0.2 mg/mL of the emitter $S^B$ in dichloromethane or toluene at room temperature (i.e., (approximately) 20° C.).

A small FWHM emitter $S^B$ may be a fluorescence emitter F, a phosphorescence emitter (for example a phosphorescence material $P^B$) and/or a TADF emitter (for example a TADF material $E^B$). For the organic molecules according to the invention, for TADF materials $E^B$ and for phosphorescence materials $P^B$ as laid out above, the emission spectrum is recorded at room temperature (i.e., (approximately) 20° C.) from a spin-coated film of the respective material in poly(methyl methacrylate) PMMA, with 10% by weight of the respective molecule of the invention, $E^B$ or $P^B$.

As known to the person skilled in the art, the full width at half maximum (FWHM) of an emitter (for example a small FWHM emitter $S^B$) is readily determined from the respective emission spectrum (fluorescence spectrum for fluorescence emitters and phosphorescence spectrum for phosphorescence emitters). All reported FWHM values typically refer to the main emission peak (i.e., the peak with the highest intensity). The means of determining the FWHM (herein preferably reported in electron volts, eV) are part of the common knowledge of those skilled in the art. Given for example that the main emission peak of an emission spectrum reaches its half maximum emission (i.e., 50% of the maximum emission intensity) at the two wavelengths $\lambda_1$ and $\lambda_2$, both obtained in nanometers (nm) from the emission spectrum, the FWHM in electron volts (eV) is commonly (and herein) determined using the following equation:

$$\text{FWHM [eV]} = \left| \frac{1239.84[\text{eV} \cdot \text{nm}]}{\lambda_2[\text{nm}]} - \frac{1239.84[\text{eV} \cdot \text{nm}]}{\lambda_1[\text{nm}]} \right|$$

In the context of the invention, a small FWHM emitter $S^B$ is an organic emitter, which, in the context of the invention, means that it does not contain any transition metals. Preferably, a small FWHM emitter $S^B$ in the context of the invention predominantly consists of the elements hydrogen (H), carbon (C), nitrogen (N), and boron (B), but may for example also include oxygen (O), silicon (Si), fluorine (F), and bromine (Br).

Furthermore, it is preferred that a small FWHM emitter $S^B$ in the context of the invention is a fluorescence emitter F that may or may not additionally exhibit TADF.

Preferably, a small FWHM emitter $S^B$ in the context of the invention preferably fulfills at least one of the following requirements:
(i) it is a boron (B)-containing emitter, which means that at least one atom within the respective small FWHM emitter $S^B$ is boron (B);
(ii) it includes a polycyclic aromatic or heteroaromatic core structure, wherein at least two aromatic rings are fused together (e.g., anthracene, pyrene, or aza-derivatives thereof).

Even more preferably, a small FWHM emitter $S^B$ in the context of the invention fulfills at least one of the following requirements:

(i) it is a boron (B)-containing emitter, which means that at least one atom within the respective small FWHM emitter $S^B$ is boron (B);

(ii) it includes a pyrene core structure.

Most preferably, a small FWHM emitter $S^B$ in the context of the invention is a boron (B)-containing emitter, which means that at least one atom within the respective small FWHM emitter $S^B$ is boron (B).

The person skilled in the art knows how to design small FWHM emitters $S^B$ which fulfill the above-mentioned requirements or preferred features.

A class of fluorescence emitters F suitable as small FWHM emitters $S^B$ in the context of the invention are the well-known 4,4-difluoro-4-bora-3a,4a-diaza-s-indacene (BODIPY)-based materials, whose structural features and application in optoelectronic devices have been reviewed in detail and are common knowledge to those skilled in the art. The state of the art also reveals how such materials may be synthesized and how to arrive at an emitter with a certain emission color.

The skilled artisan is also familiar with the fact that the BODIPY base structure shown below

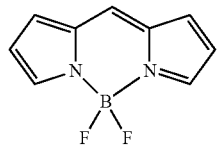

is not ideally suitable as emitter in an optoelectronic device, for example, due to intermolecular π-π interactions and the associated self-quenching.

Alternative emitter materials for optoelectronic devices have bulky (i.e., sterically demanding) groups as substituents attached to the BODIPY core structure shown above. These bulky groups may for example (among many others) be aryl, heteroaryl, alkyl or alkoxy substituents or condensed polycyclic aromatics, or heteroaromatics, all of which may optionally be substituted. The choice of suitable substituents at the BODIPY core is obvious for the skilled artisan and can easily be derived from the state of the art. The same holds true for the multitude of synthetic pathways which have been established for the synthesis and subsequent modification of such molecules.

Examples of BODIPY-based emitters that may be suitable as small FWHM emitters $S^B$ in the context of the invention are shown below:

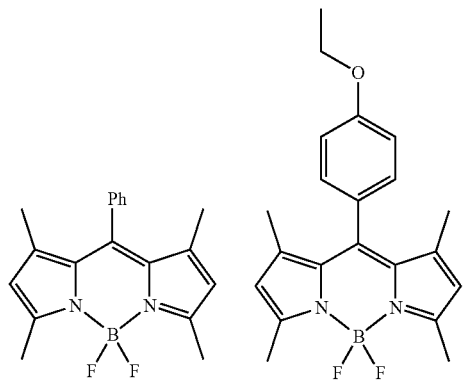

-continued

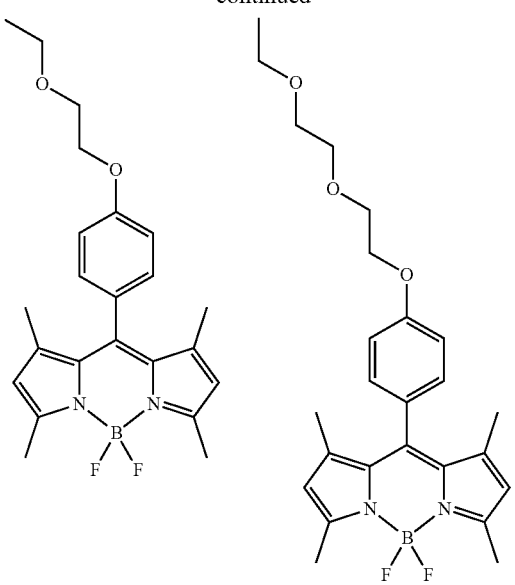

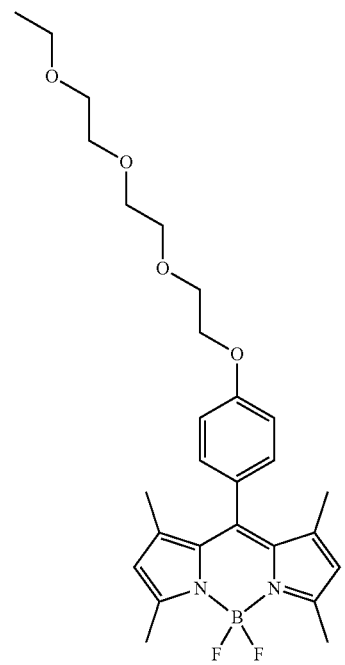

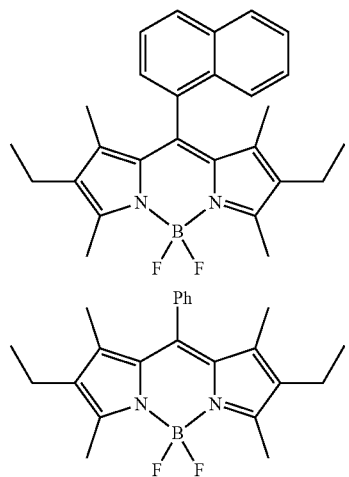

59
-continued
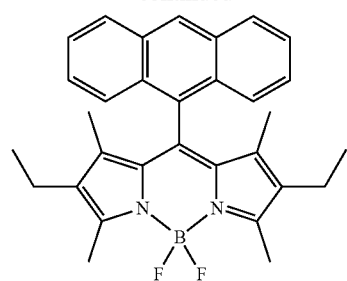
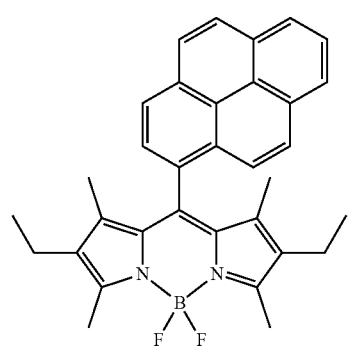
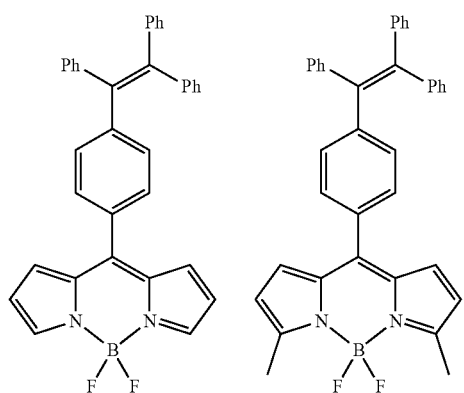
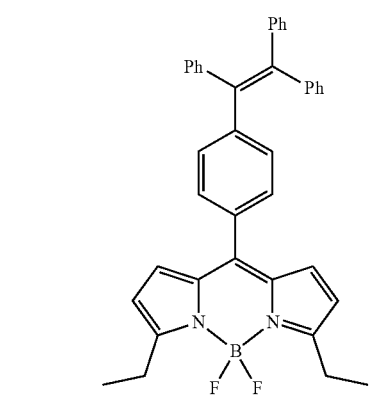
60
-continued
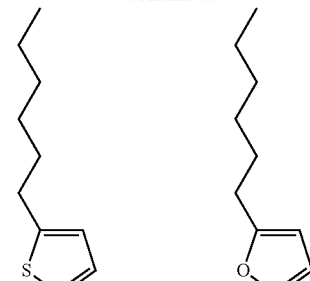
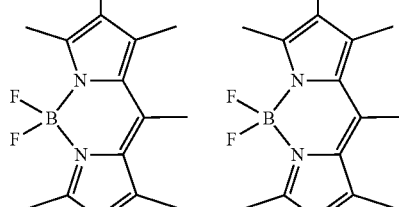
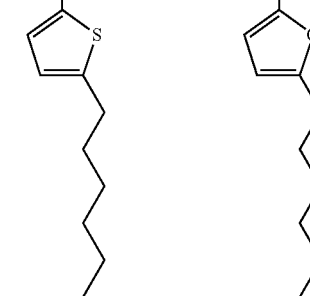
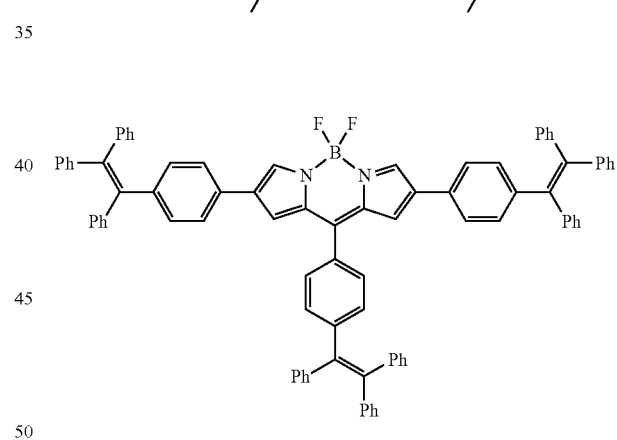
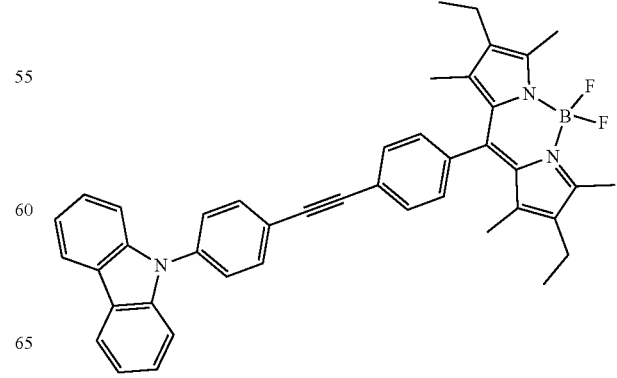

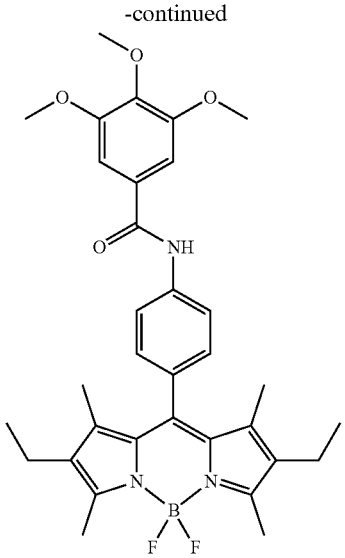

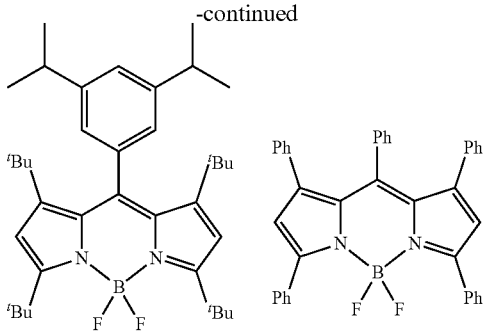

Furthermore, it is known to those skilled in the art, that one may also arrive at emitters for optoelectronic devices by replacing one or both of the fluorine substituents attached to the central boron atom of the BODIPY core structure by alkoxy or aryloxy groups which are attached via the oxygen atom and may optionally be substituted, preferably with electron-withdrawing substituents such as fluorine (F) or trifluoromethyl ($CF_3$). Examples of such emitter materials are shown below, which does not imply that only the shown structures may be suitable small FWHM emitters $S^B$ in the context of the invention:

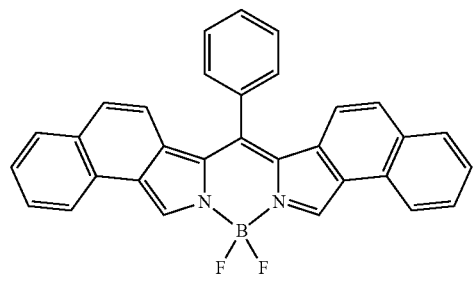

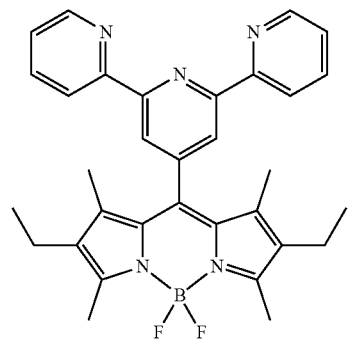

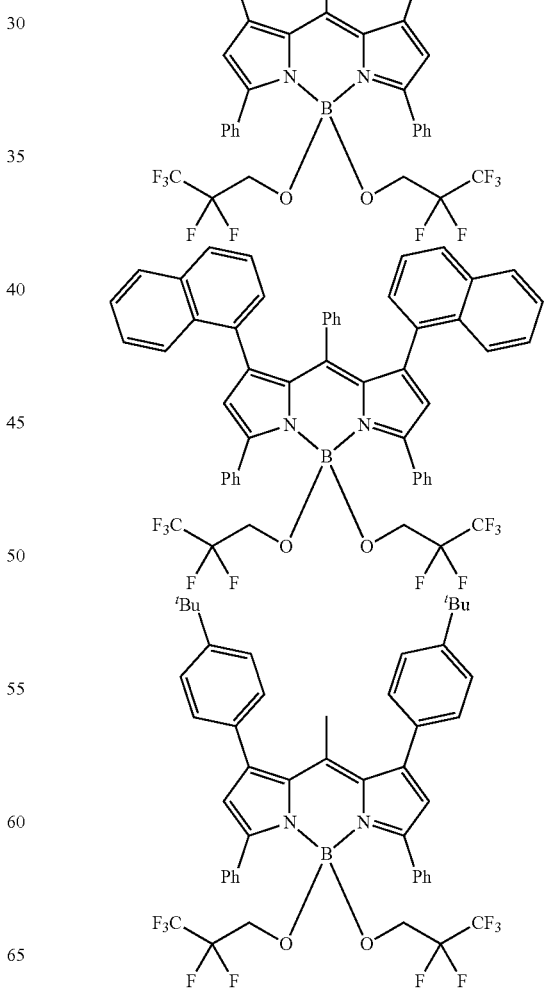

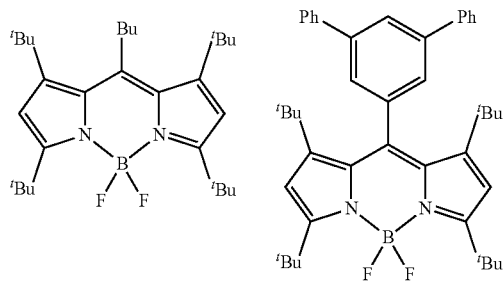

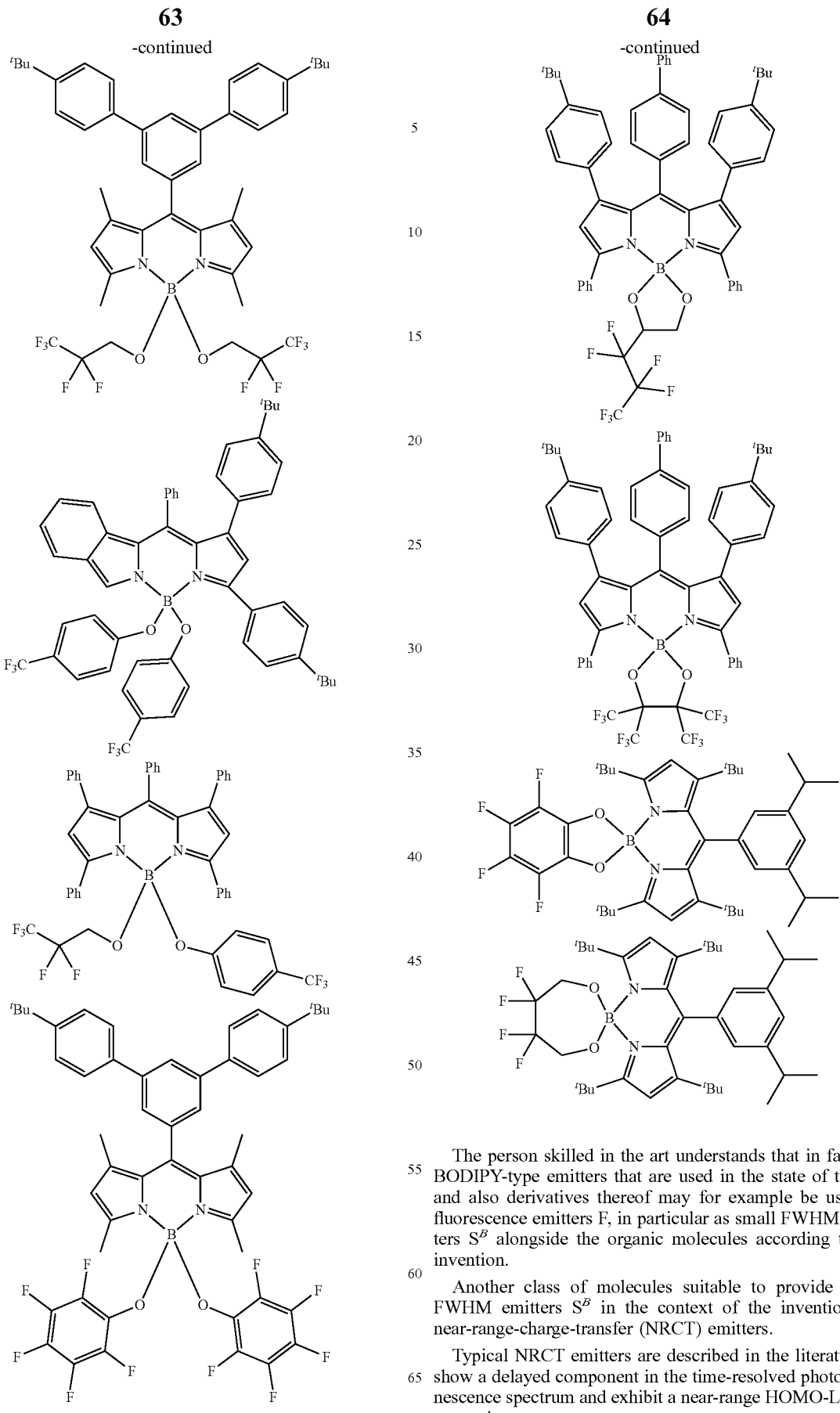

The person skilled in the art understands that in fact, all BODIPY-type emitters that are used in the state of the art and also derivatives thereof may for example be used as fluorescence emitters F, in particular as small FWHM emitters $S^B$ alongside the organic molecules according to the invention.

Another class of molecules suitable to provide small FWHM emitters $S^B$ in the context of the invention are near-range-charge-transfer (NRCT) emitters.

Typical NRCT emitters are described in the literature to show a delayed component in the time-resolved photoluminescence spectrum and exhibit a near-range HOMO-LUMO separation.

Typical NRCT emitters only show one emission band in the emission spectrum, wherein typical fluorescence emitters display several distinct emission bands due to vibrational progression.

The skilled artisan knows how to design and synthesize NRCT emitters that may be suitable as small FWHM emitters $S^B$ in the context of the invention.

Further fluorescence emitters F that are small FWHM emitters $S^B$ as defined herein and that may be used alongside the organic molecules according to the invention (vide infra) are the boron-containing emitters shown below:

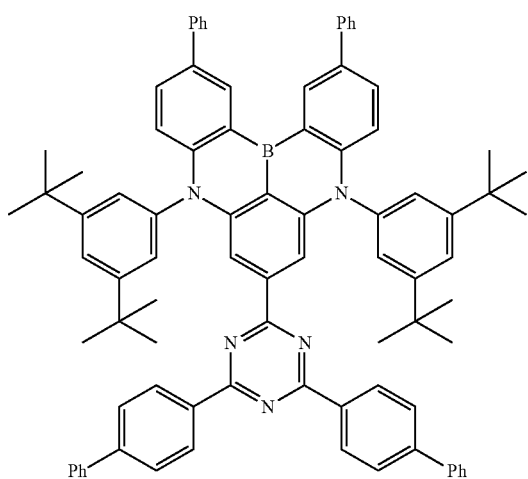

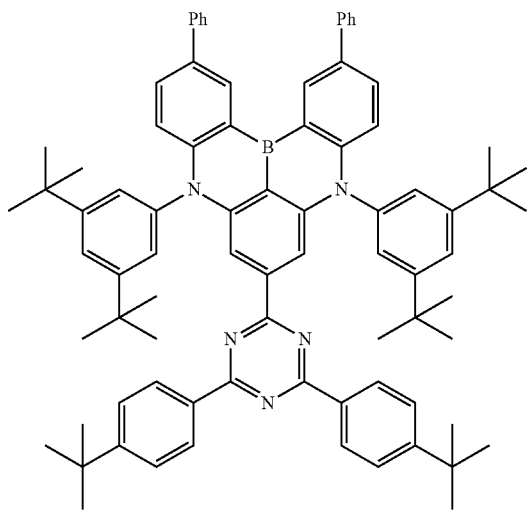

-continued

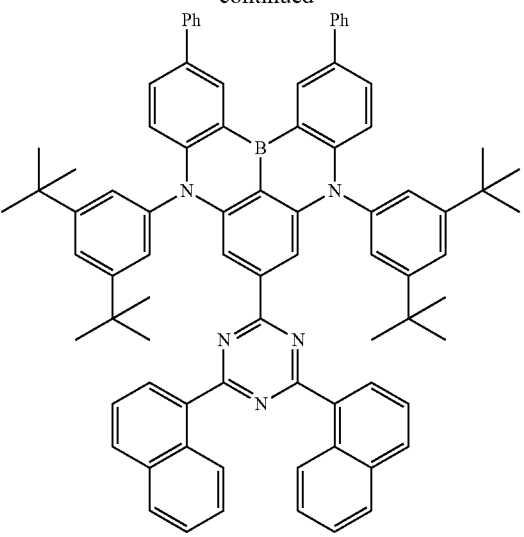

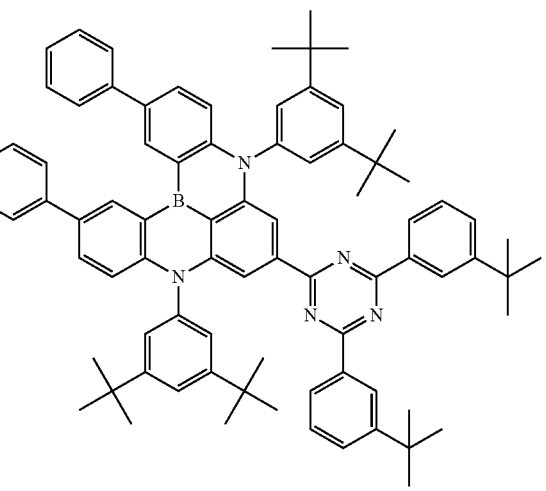

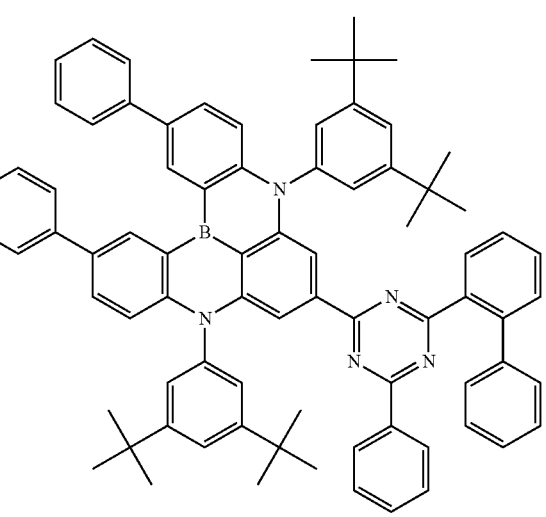

-continued
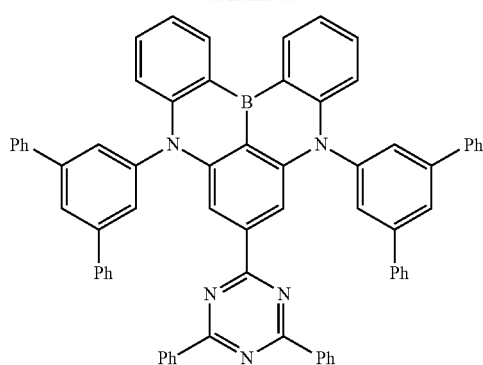
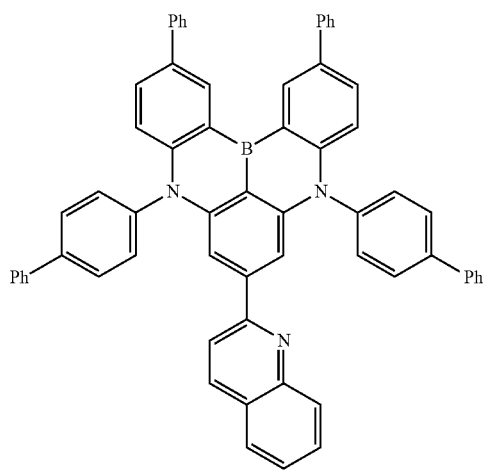
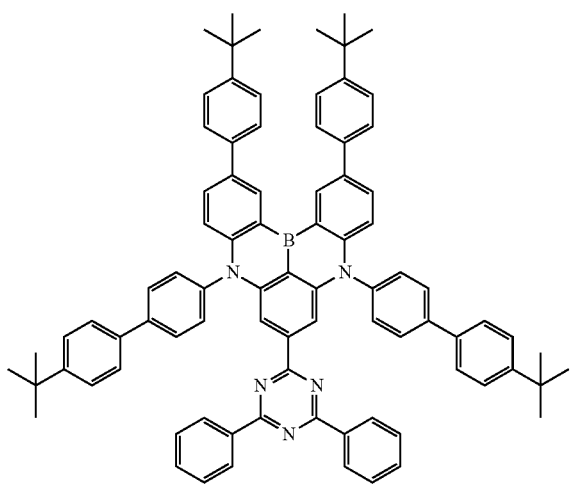
-continued
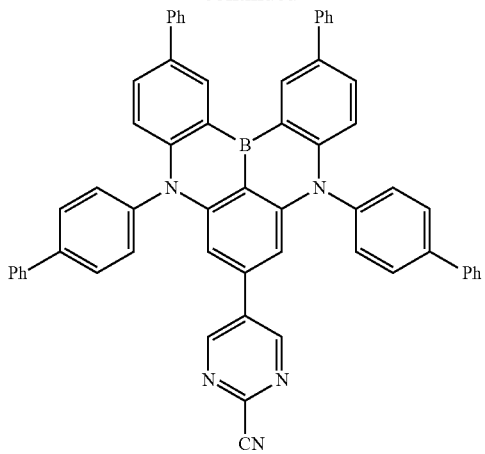
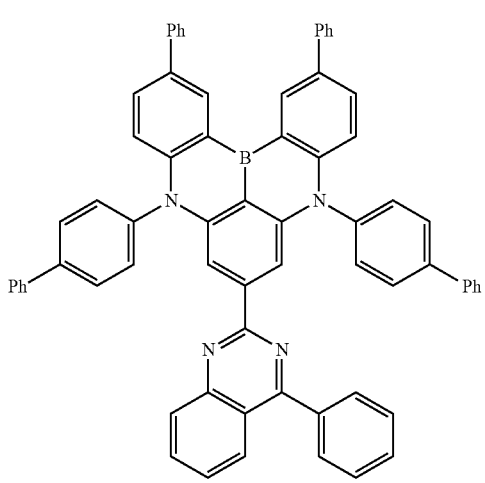
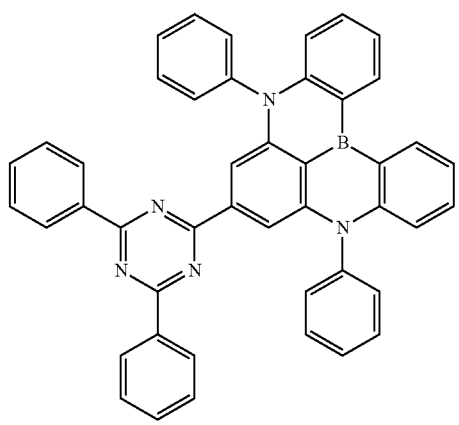

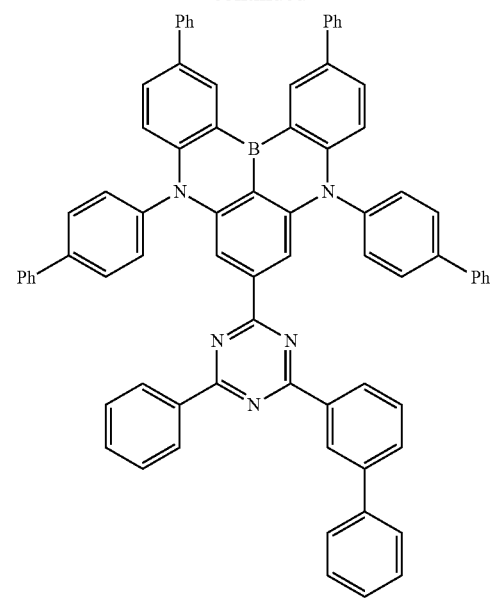
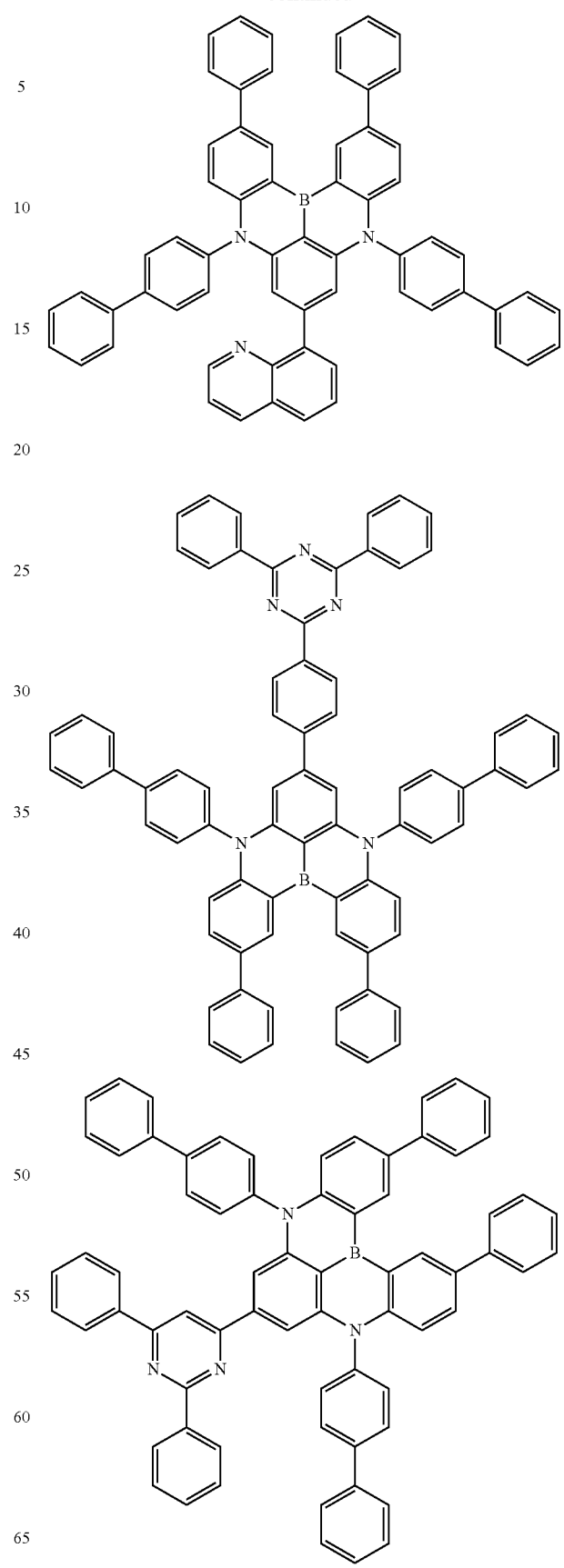

71
-continued
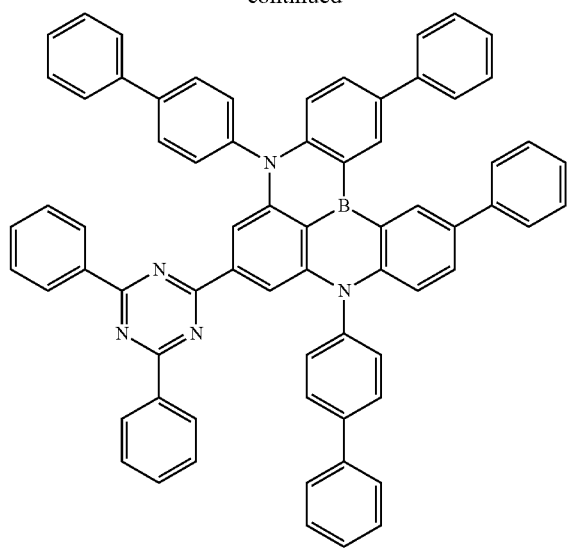
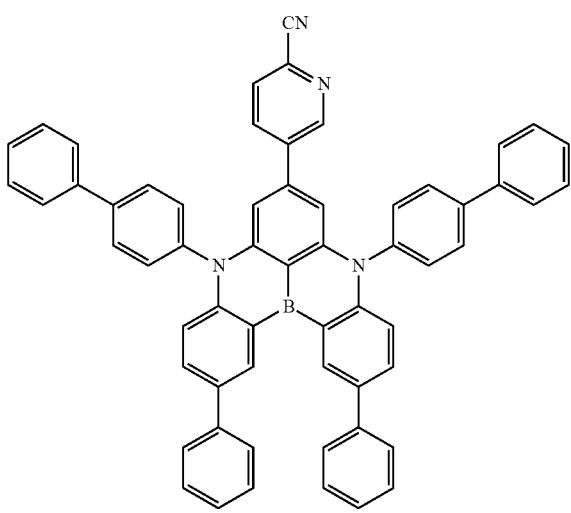
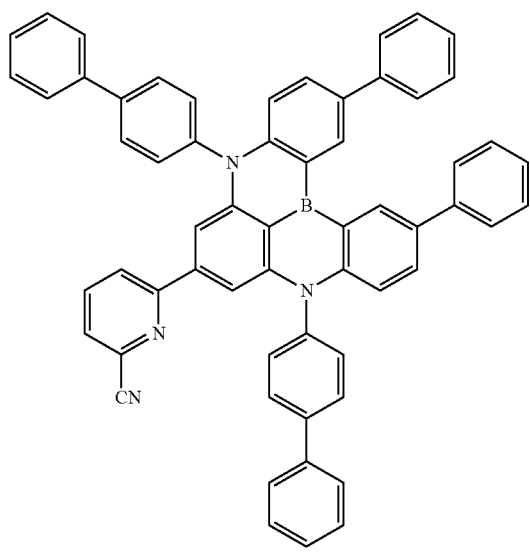
72
-continued
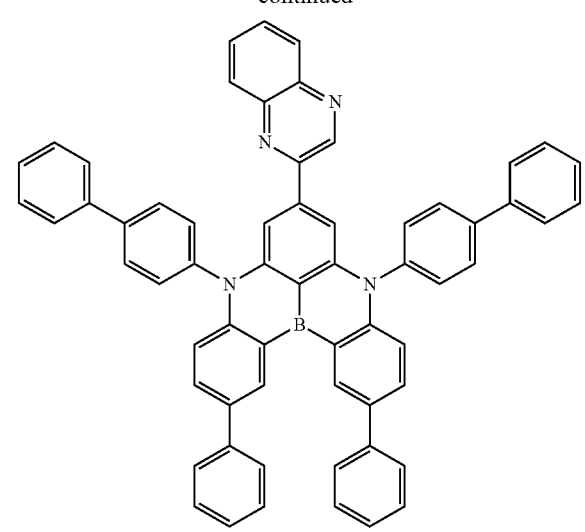
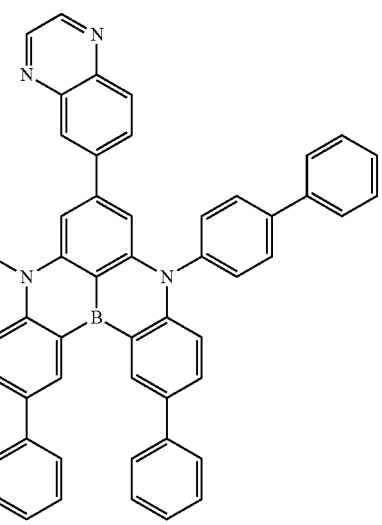
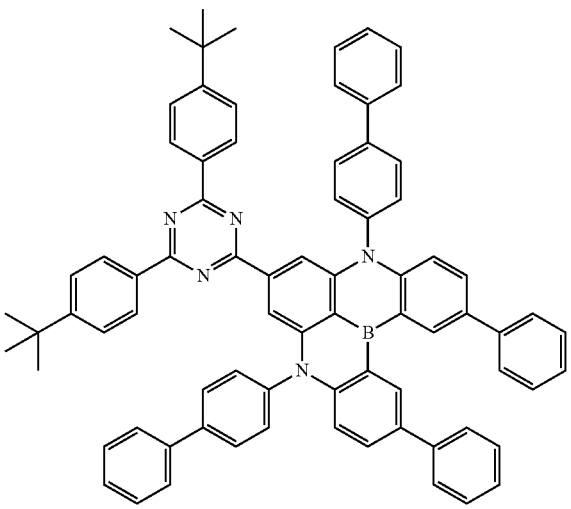

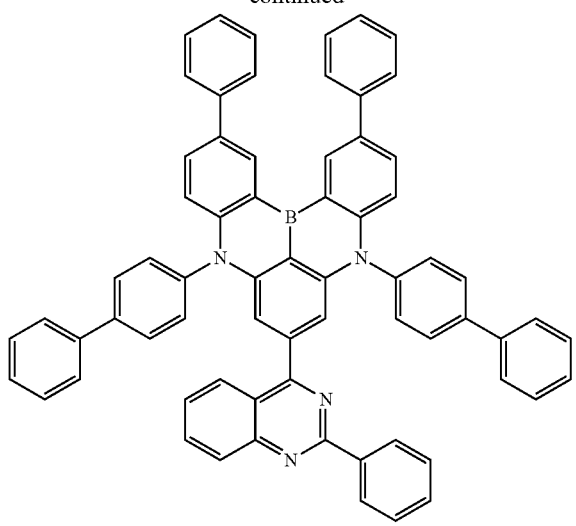
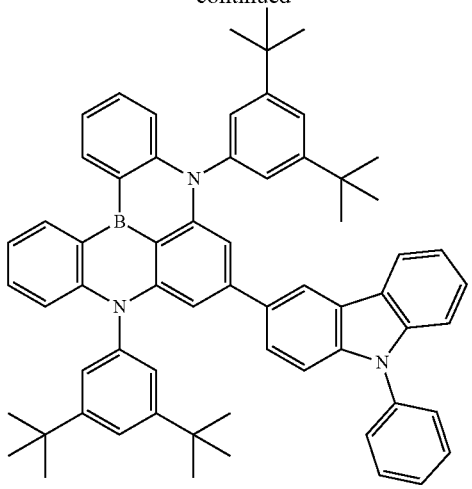
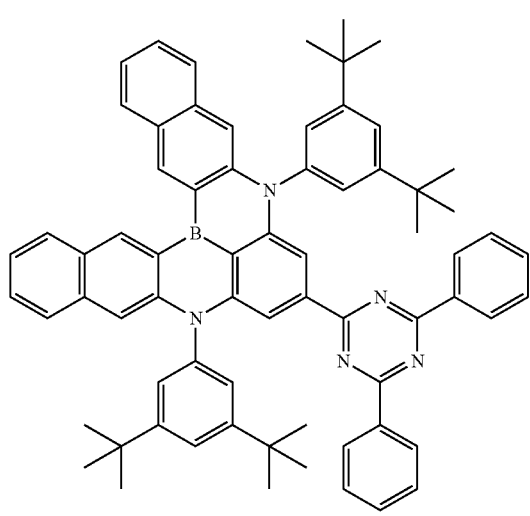
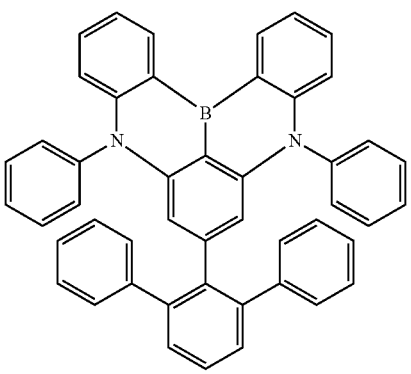
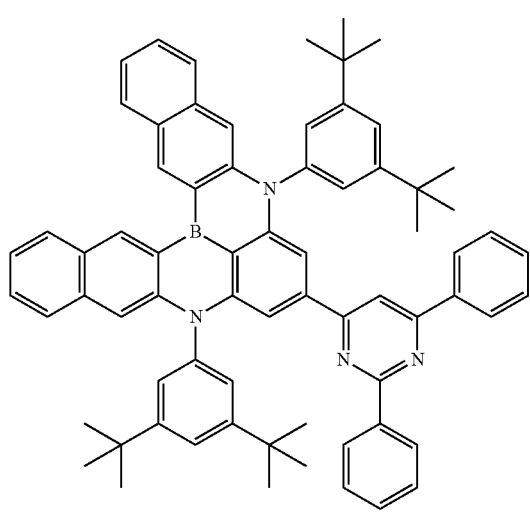
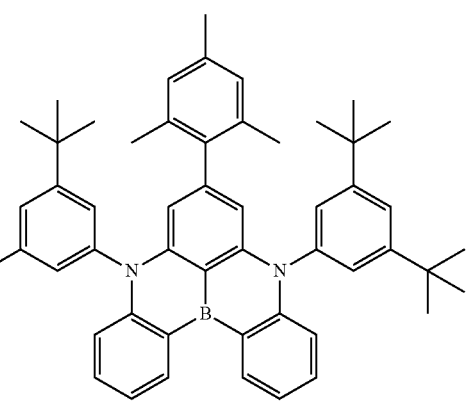

wherein this does not imply that only the shown materials may be used as small FWHM emitters $S^B$ in the context of the invention.

Another group of fluorescence emitters F that may be used as small FWHM emitters $S^B$ are the boron-containing emitters including exactly one direct B—N bond. The person skilled in the art understands that structurally related compounds may also be equally suitable as small FWHM emitter $S^B$ in the context of the invention. Not limited examples for small FWHM emitters $S^B$ are the boron-containing emitters including exactly one direct B—N bond including or consisting of the following structure:

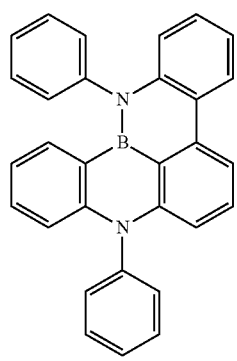 [SMILES: c1ccc(N2B3c4ccccc4N(c4ccccc4)c4cccc(c43)-c3ccccc32)cc1]
This structure may be additionally substituted and structural units and/or substituents might be bonded to form fused ring systems.
Specific, not limiting, examples of emitters that may be used as small FWHM emitters $S^B$ are shown in the following:
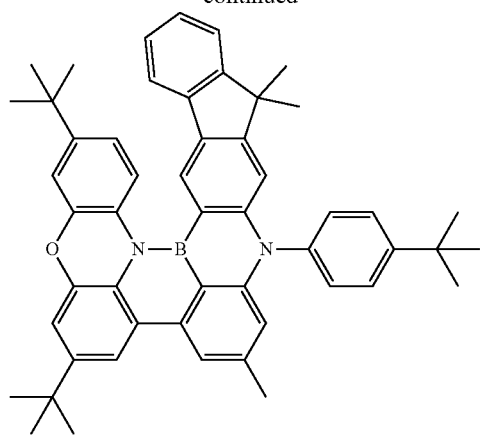
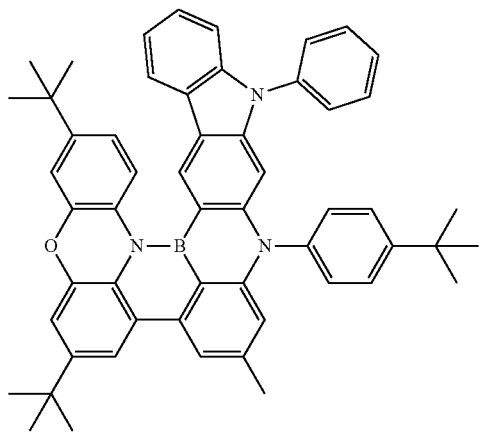
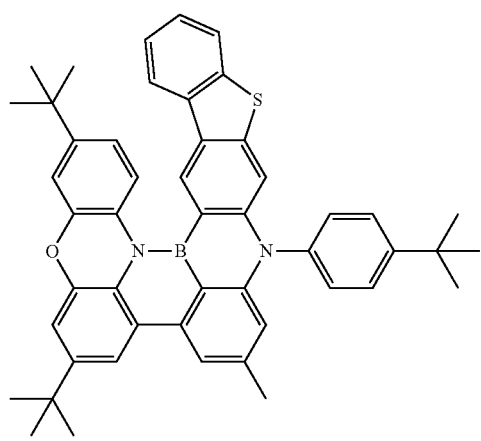
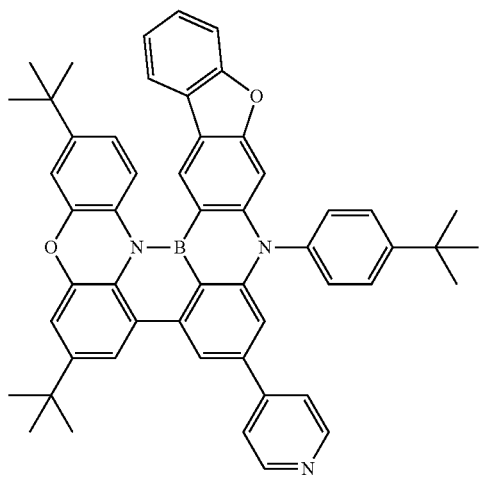
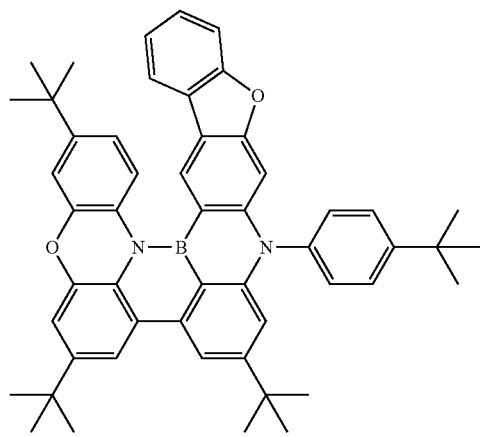

77
-continued
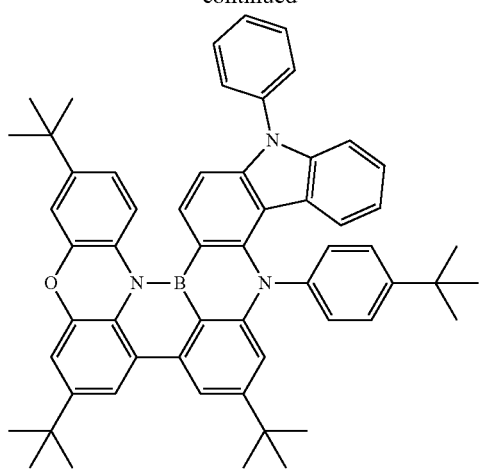
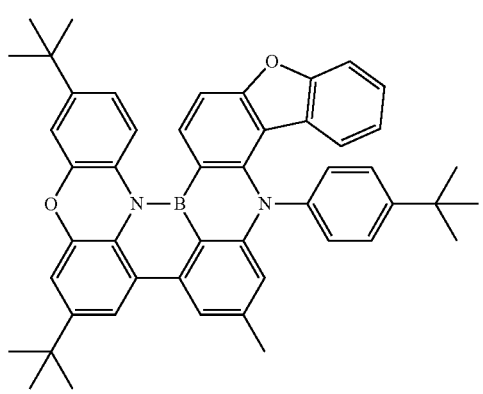
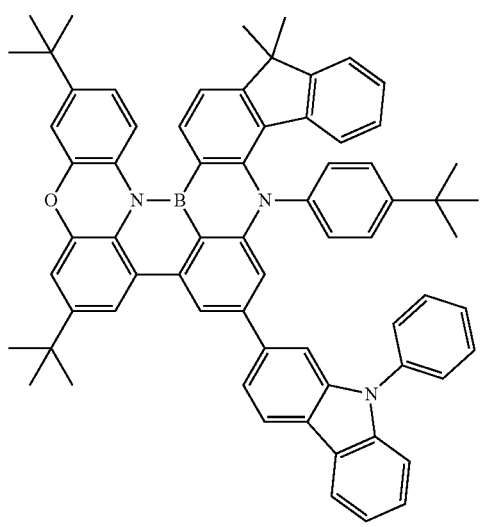
78
-continued
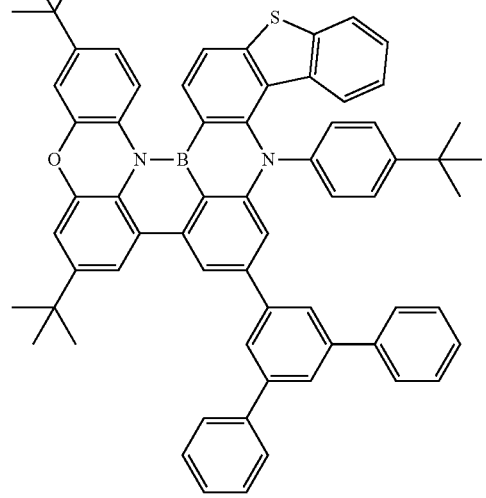
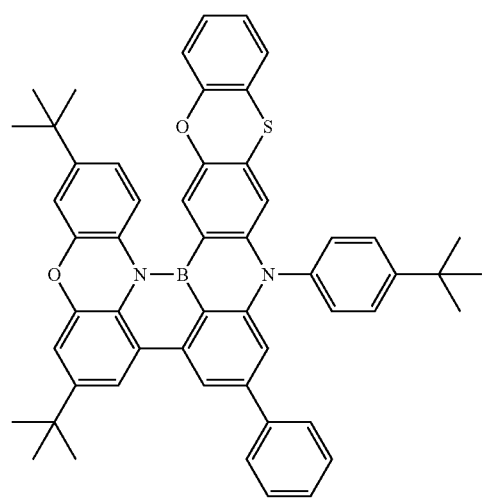

-continued

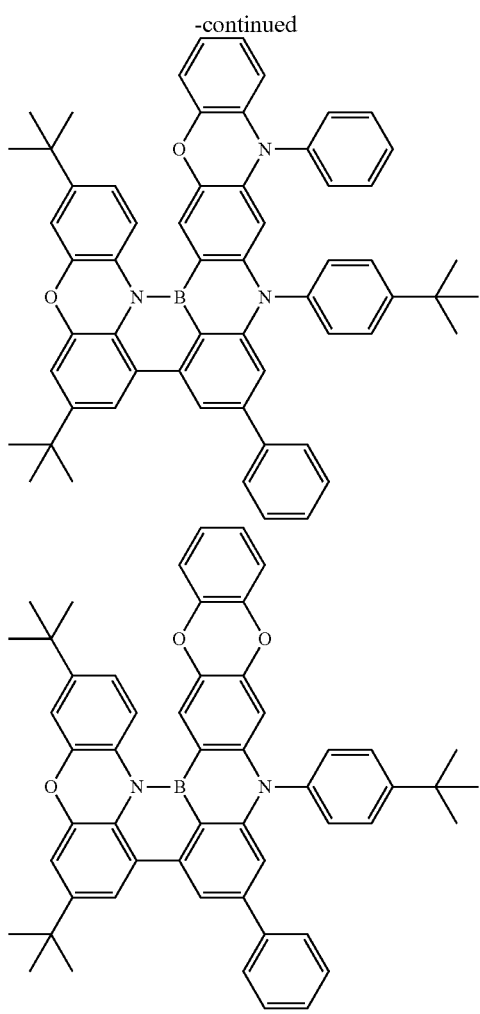

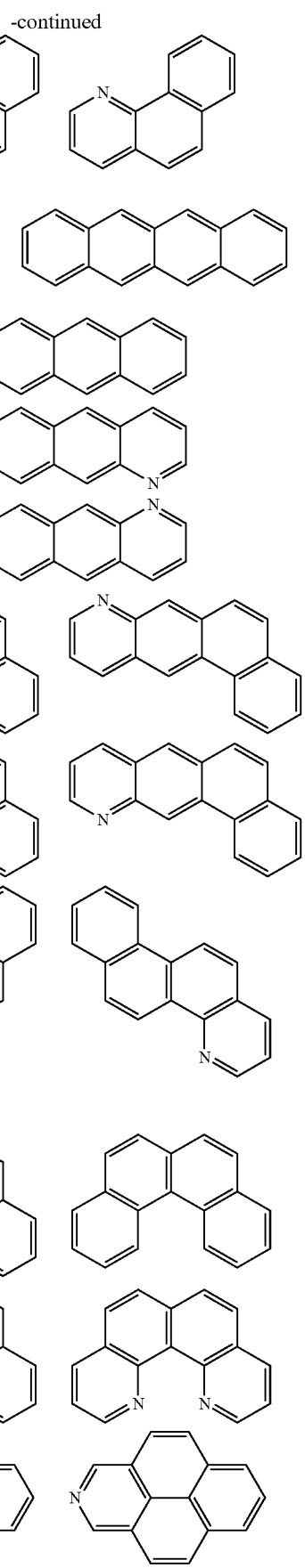

One approach to design fluorescence emitters F relies on the use of fluorescent polycyclic aromatic or heteroaromatic core structures. The latter are, in the context of the invention, any structures including more than one aromatic or heteroaromatic ring, preferably more than two such rings, which are, even more preferably, fused to each other or linked via more than one direct bond or linking atom. In other words, the fluorescent core structures include at least one, preferably only one, rigid conjugated π-system.

The skilled artisan knows how to select a fluorescent core structure for a fluorescence emitter F. Non-limiting examples of common fluorescent core structures of fluorescence emitters F are listed below:

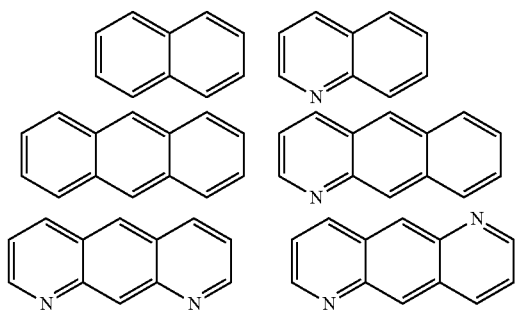

-continued
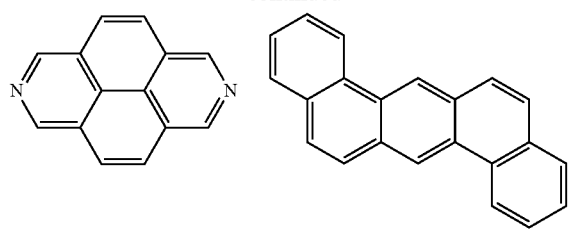
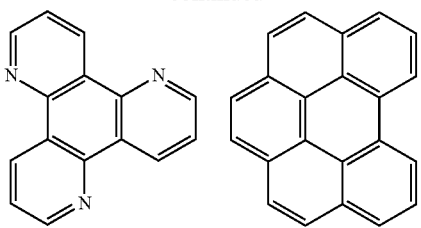

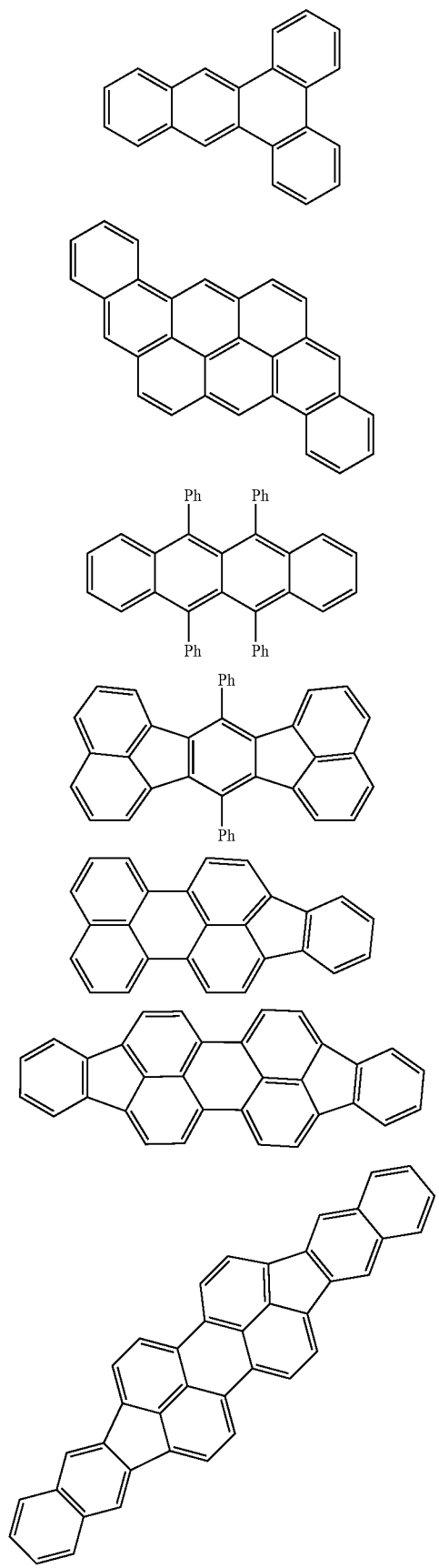
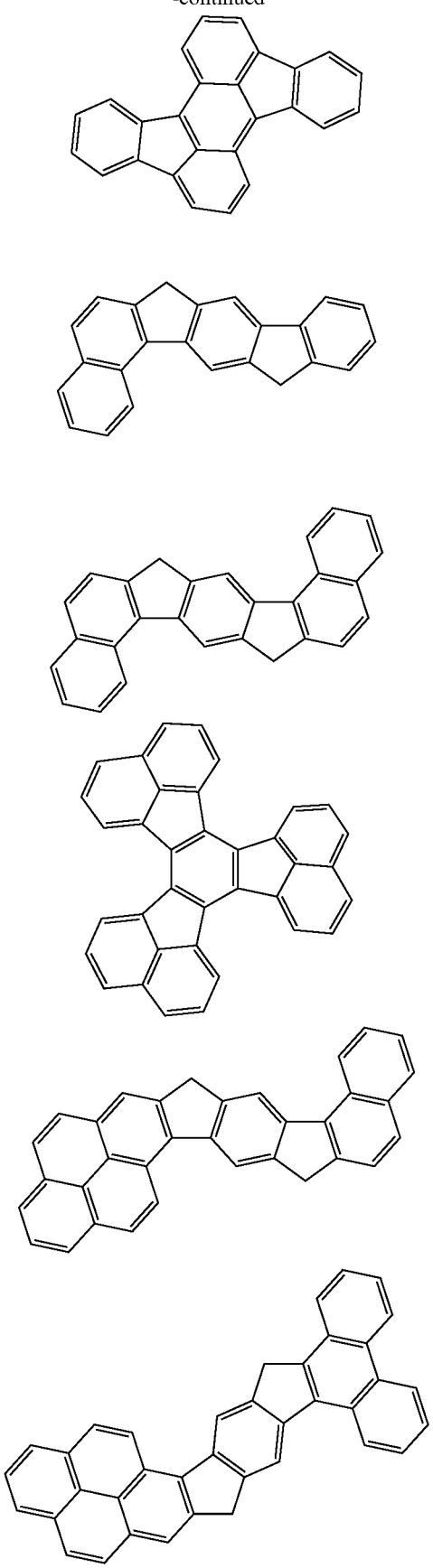

-continued

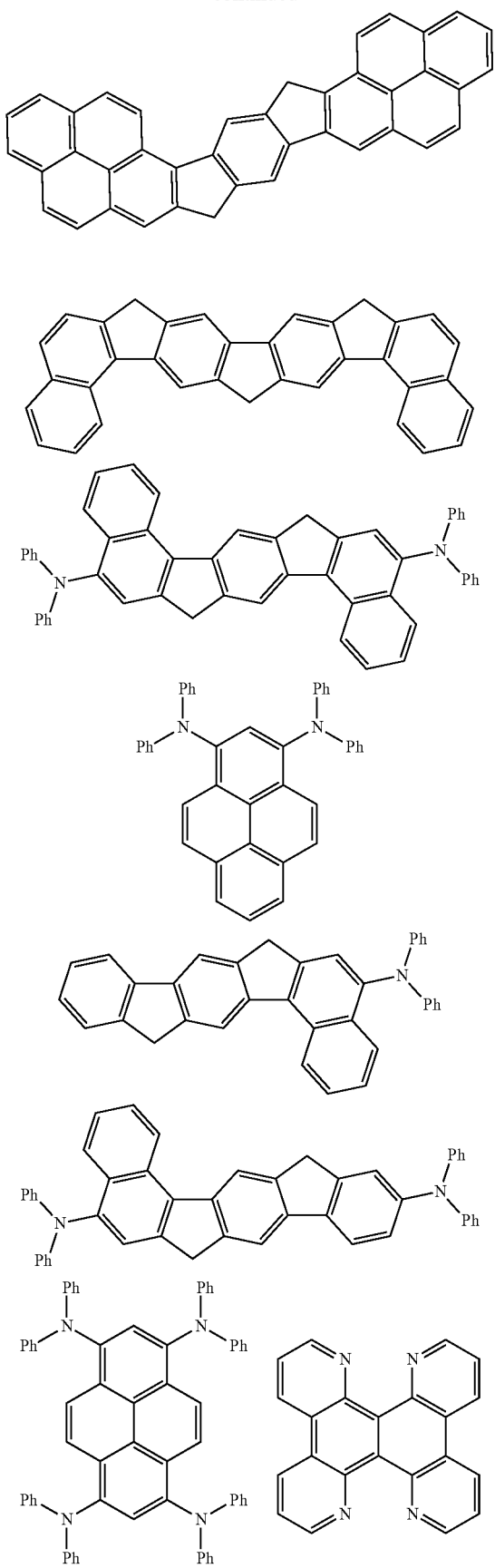

-continued

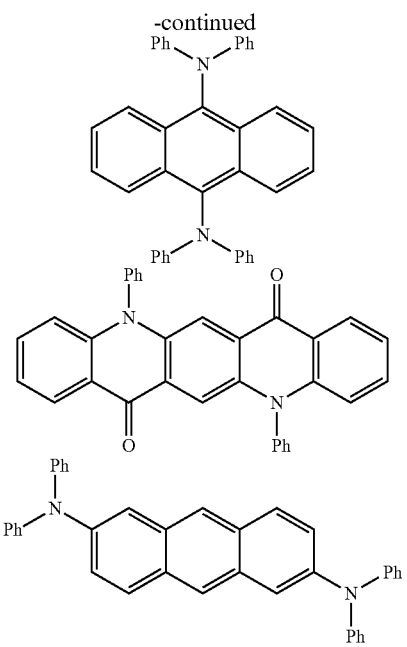

The term "fluorescent core structure" in this context indicates that any molecule including the core may potentially be used as fluorescence emitters F. The person skilled in the art knows that the core structure of such a fluorescence emitter F may be optionally substituted and which substituents are suitable in this regard.

As known to person skilled in the art, a host material $H^B$ of an EML may transport electrons or positive charges through said EML and may also transfer excitation energy to the at least one emitter material doped in the host material(s) $H^B$. The skilled artisan understands that a host material $H^B$ included in an EML of an optoelectronic device (e.g., an OLED) is typically not significantly involved in light emission from said device upon applying a voltage and electrical current. The person skilled in the art is also familiar with the fact that any host material $H^B$ may be a p-host $H^P$ exhibiting high hole mobility, an n-host $H^N$ exhibiting high electron mobility, or a bipolar host material $H^{BP}$ exhibiting both, high hole mobility and high electron mobility.

As known to person skilled in the art, an EML may also include a so-called mixed-host system with at least one p-host $H^P$ and one n-host $H^N$. In particular, the EML may include exactly one emitter material according to the invention and a mixed-host system including T2T (2,4,6-tris (biphenyl-3-yl)-1,3,5-triazine) as n-host $H^N$ and a host selected from CBP, mCP, mCBP, 4,6-diphenyl-2-(3-(triphenylsilyl)phenyl)-1,3,5-triazine, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, and 9-[3,5-bis(2-dibenzothiophenyl)phenyl]-9H-carbazole as p-host $H^P$.

An EML may include a so-called mixed-host system with at least one p-host $H^P$ and one n-host $H^N$, wherein the n-host $H^N$ includes groups derived from pyridine, pyrimidine, benzopyrimidine, 1,3,5-triazine, 1,2,4-triazine, and 1,2,3-triazine, while the p-host $H^P$ includes groups derived from indole, isoindole, and preferably carbazole.

The person skilled in the art knows which materials are suitable host materials for use in organic electroluminescent devices. It is understood that any host materials that are used in the state of the art may be suitable host materials $H^B$ in the context of the invention.

Non-limiting examples of materials H$^B$ that are p-host materials H$^P$ in the context of the invention are listed below:
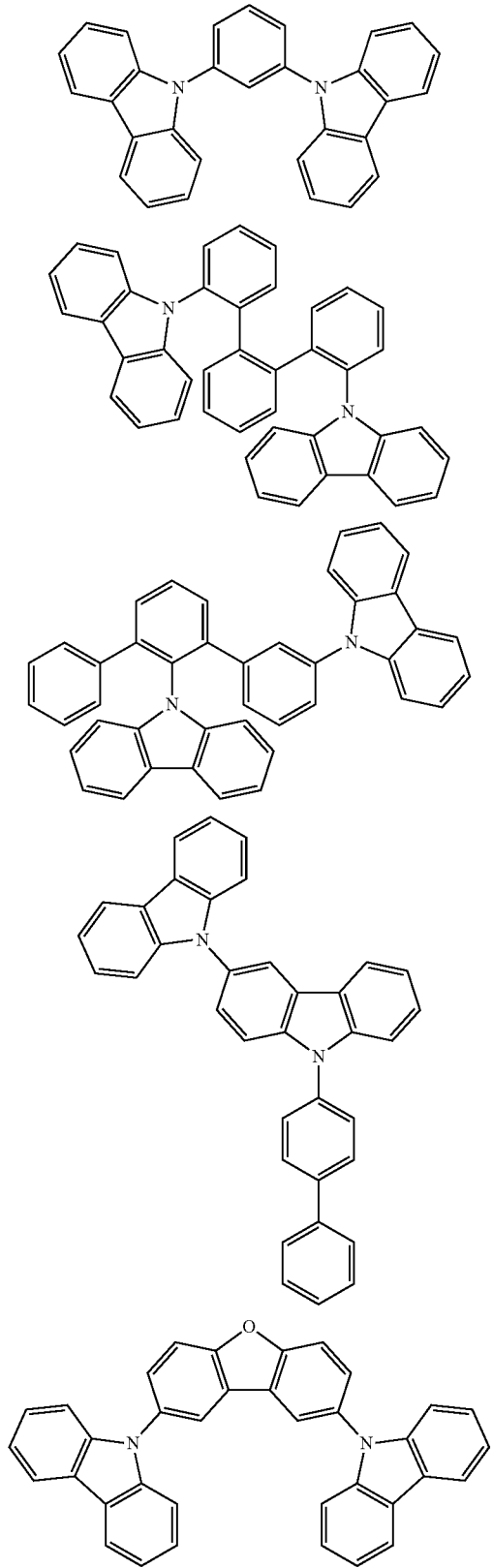
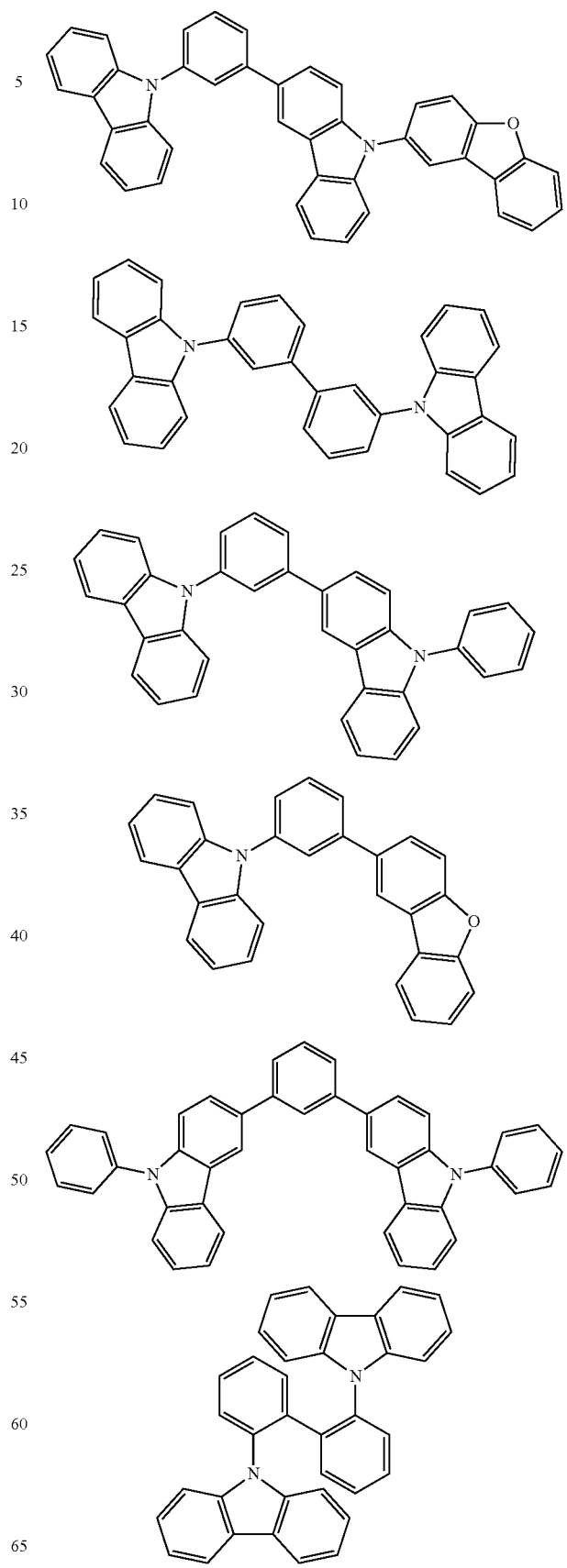

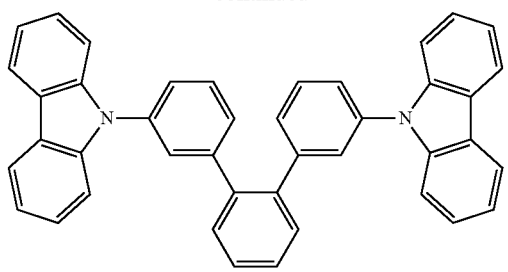
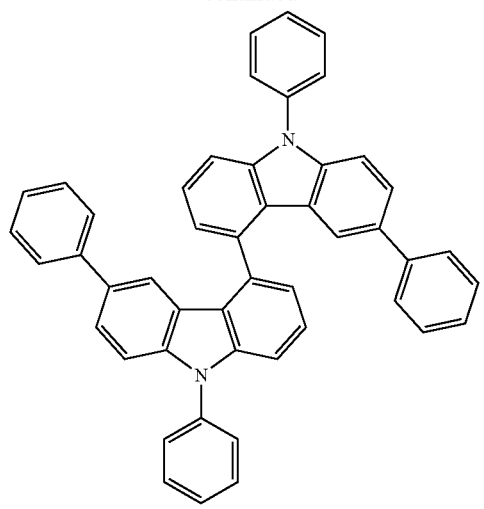
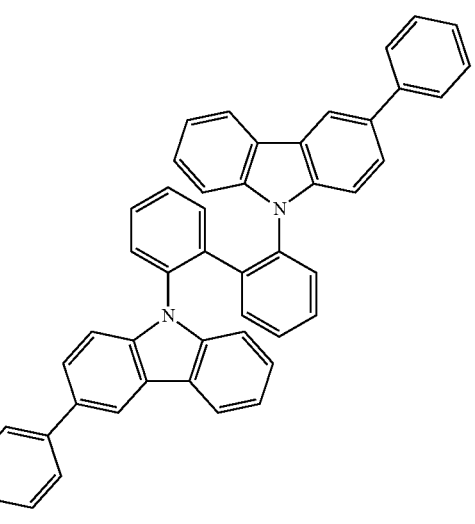
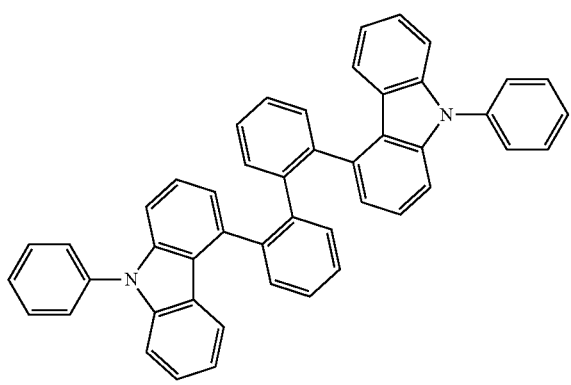
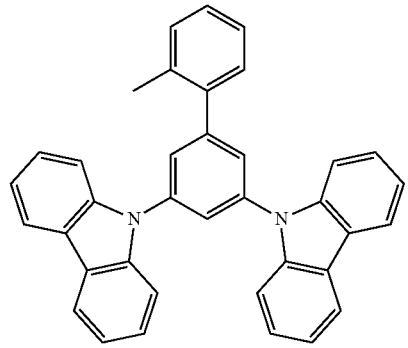

91
-continued
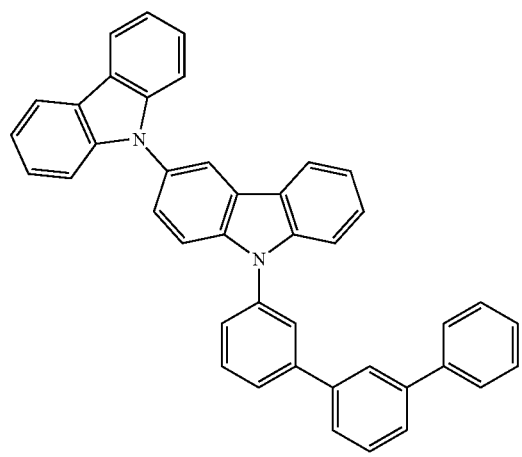
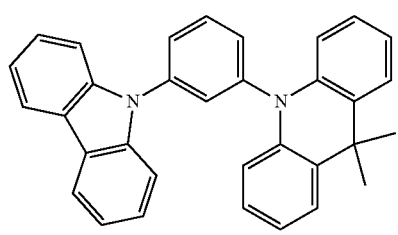
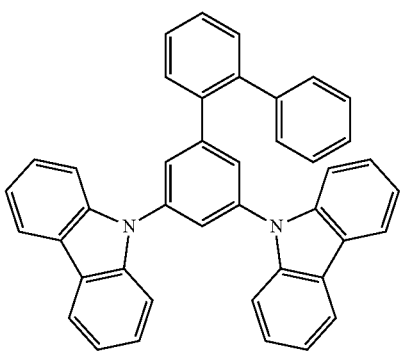
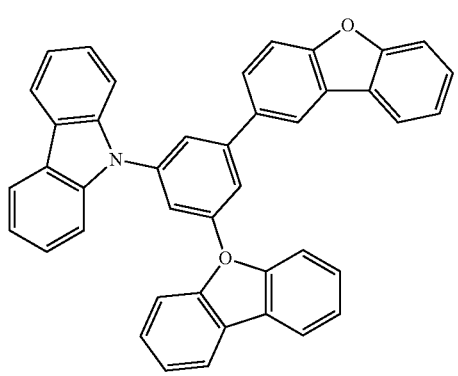
92
-continued
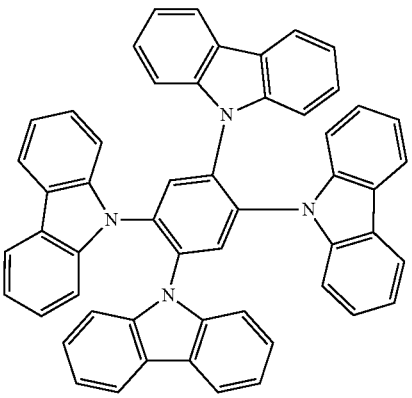
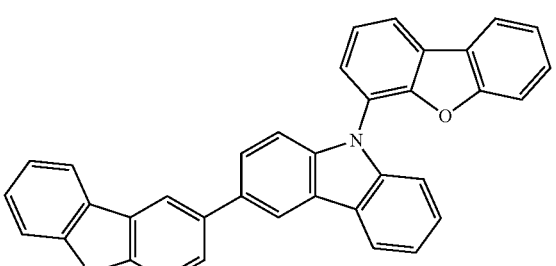
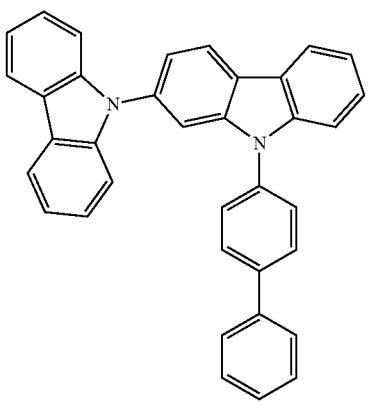
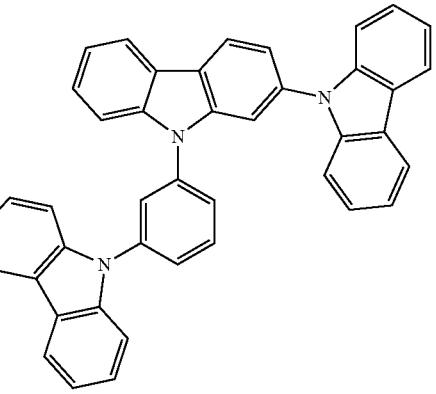

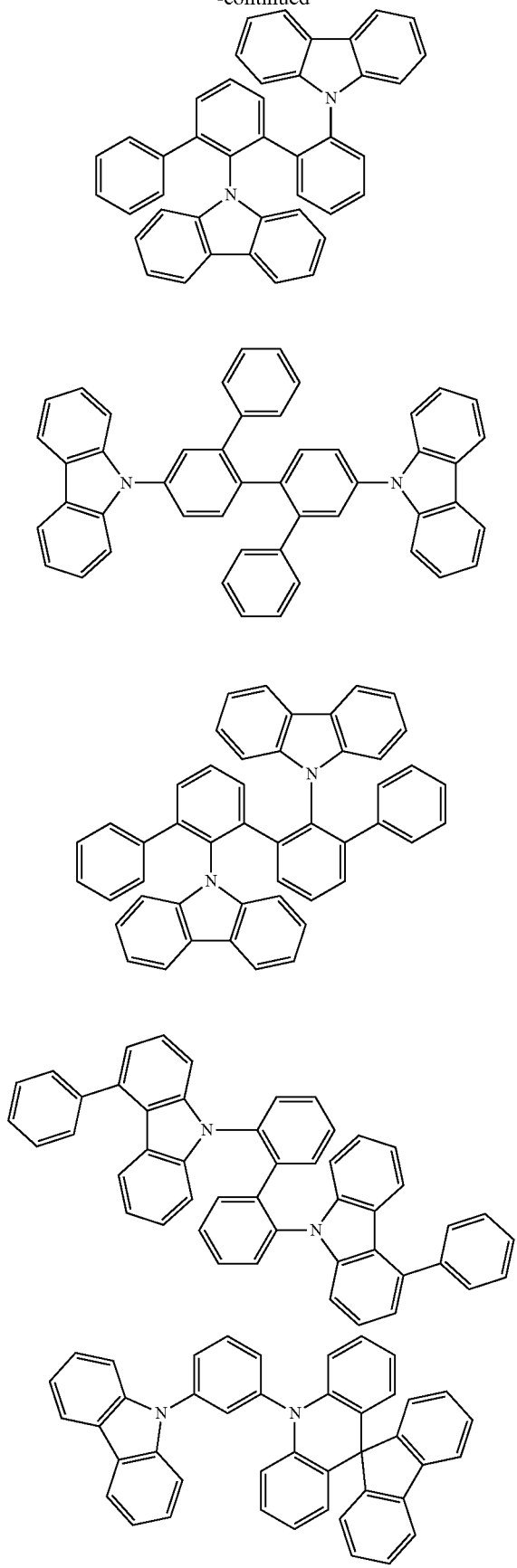

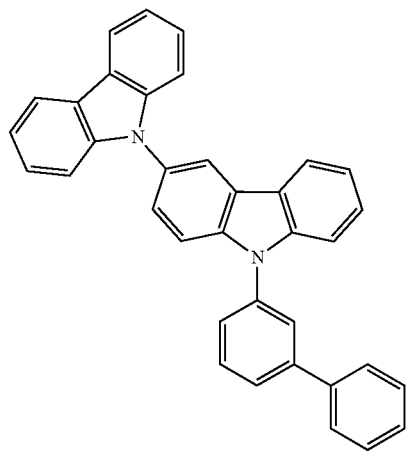
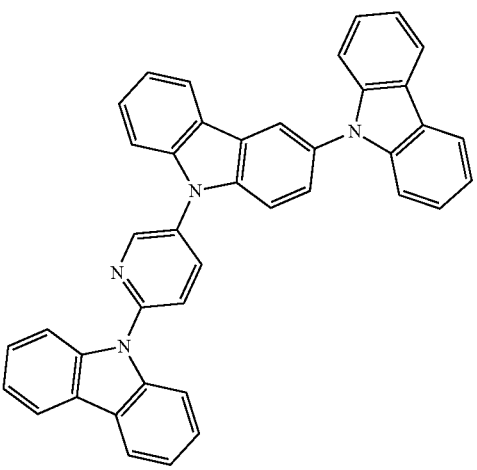
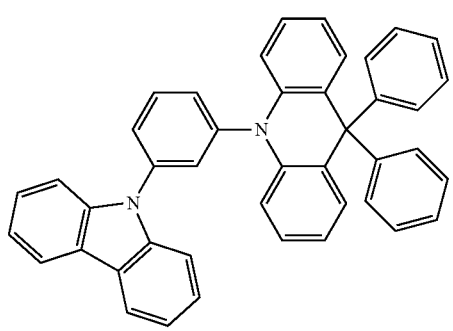
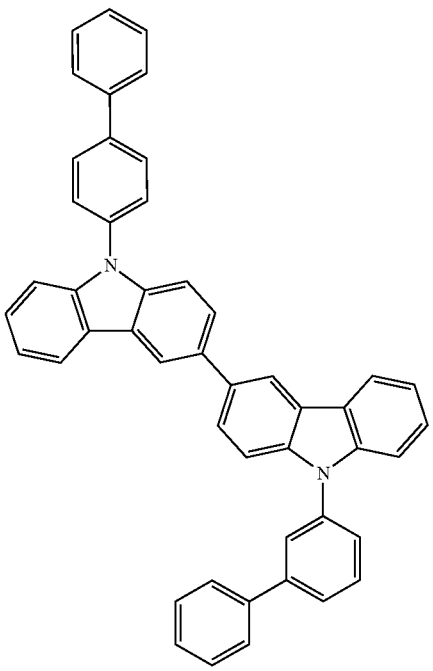
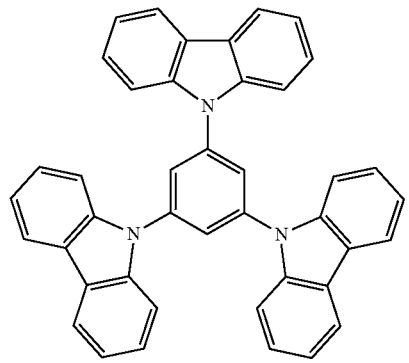
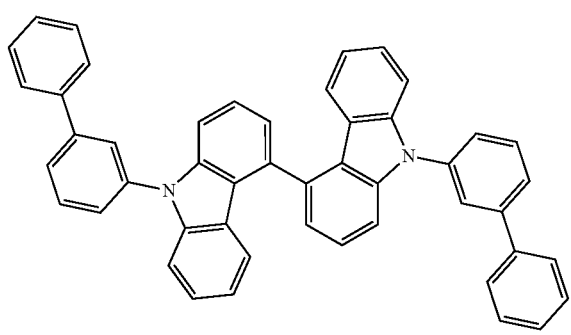
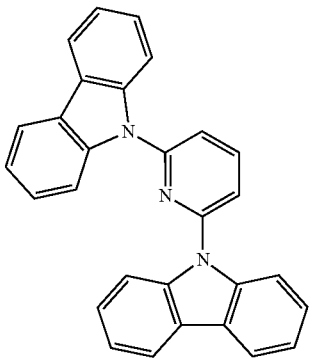

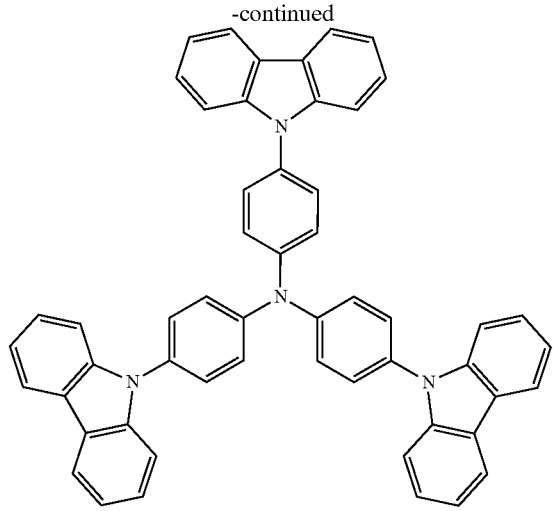
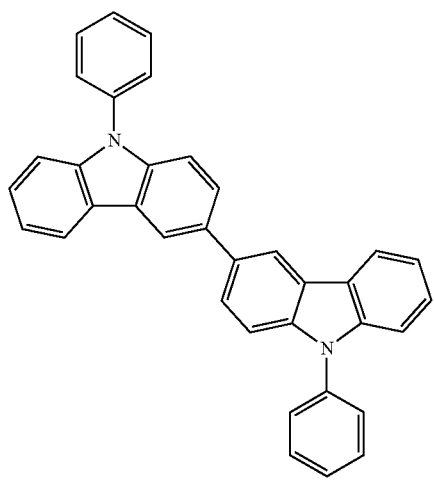
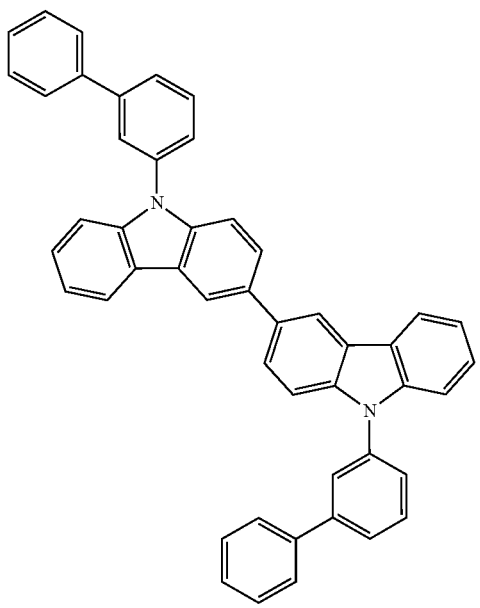
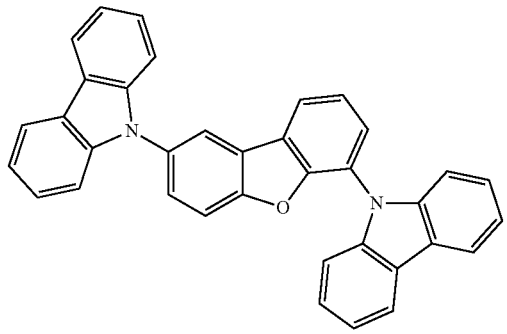
Non-limiting examples of materials $H^B$ that are n-host materials $H^N$ in the context of the invention are listed below:

-continued
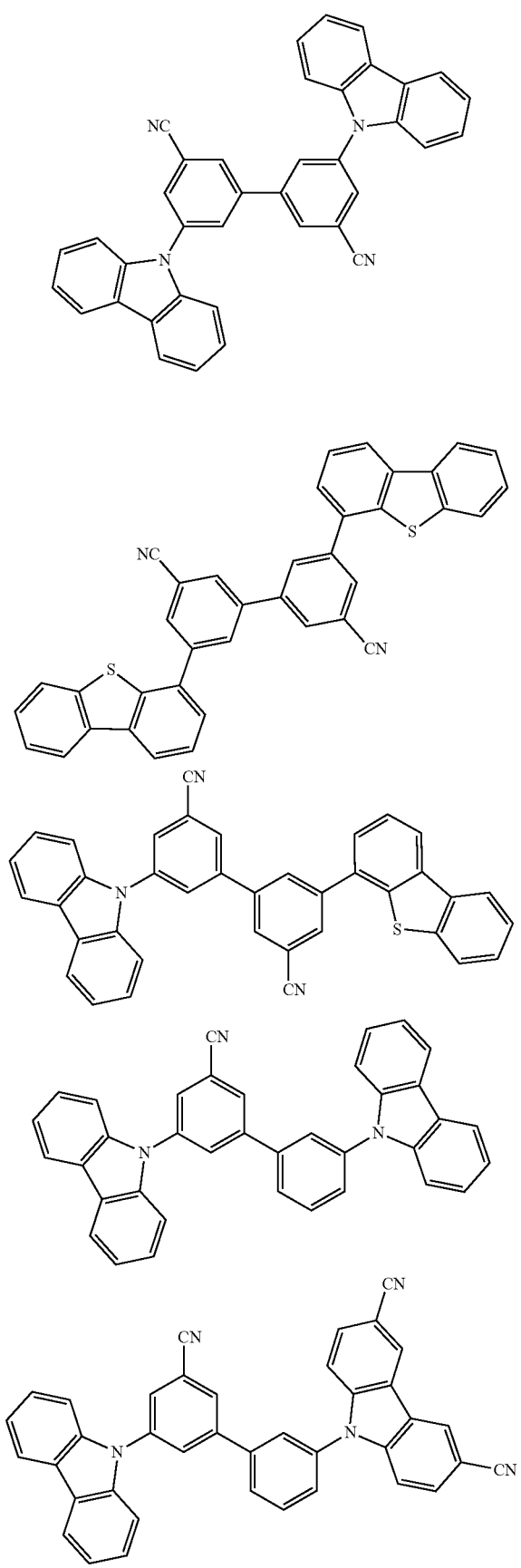
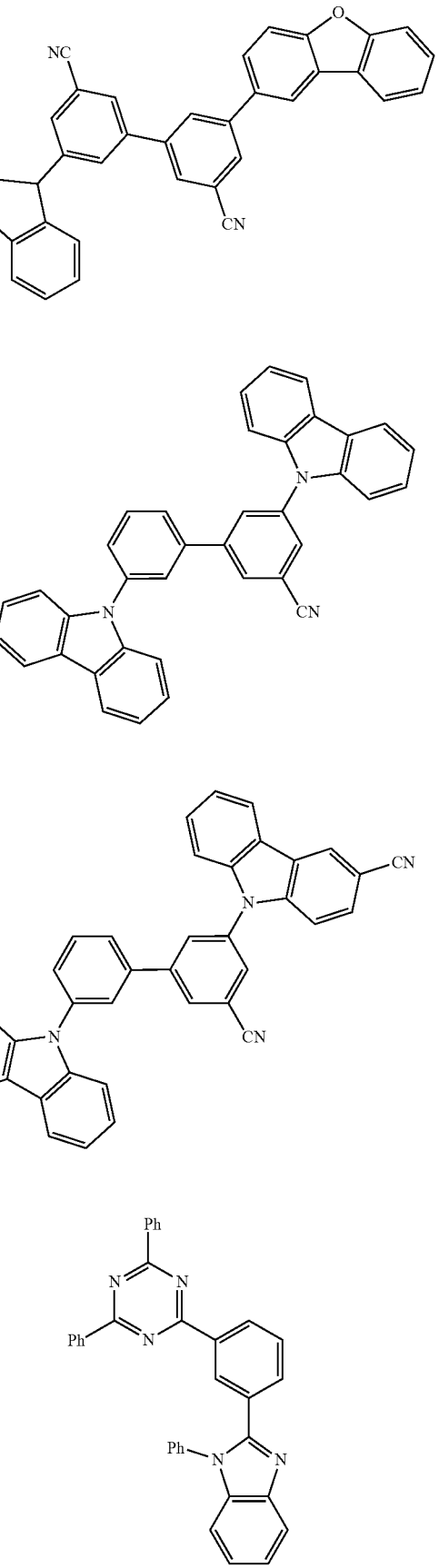

-continued
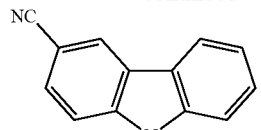
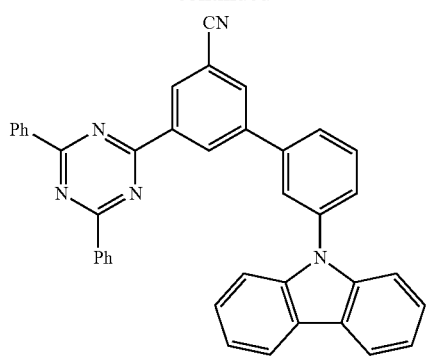
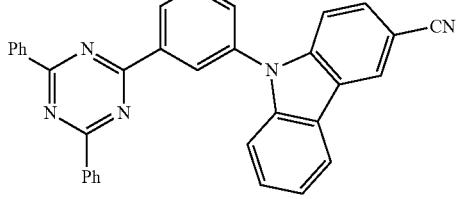
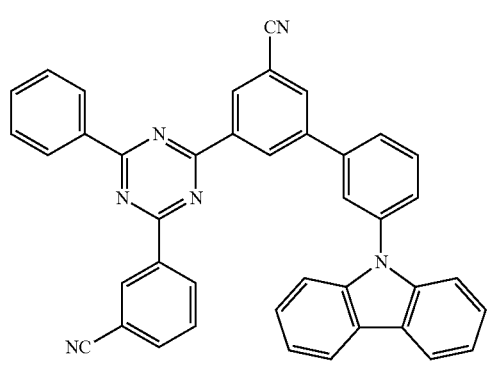
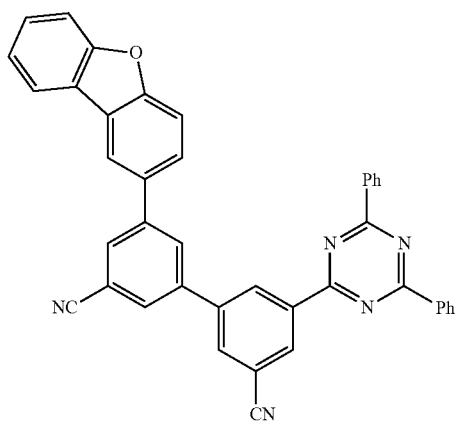
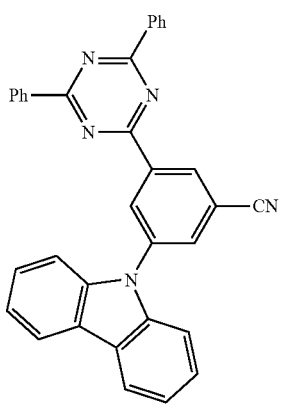
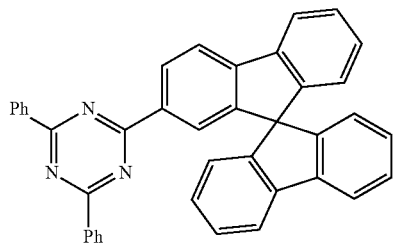
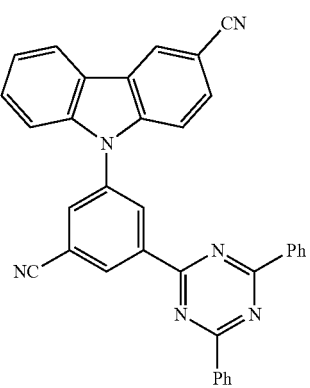
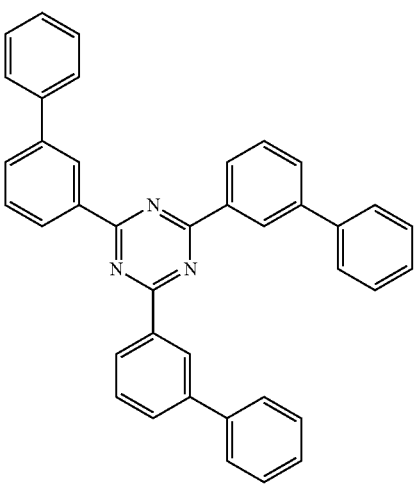

-continued

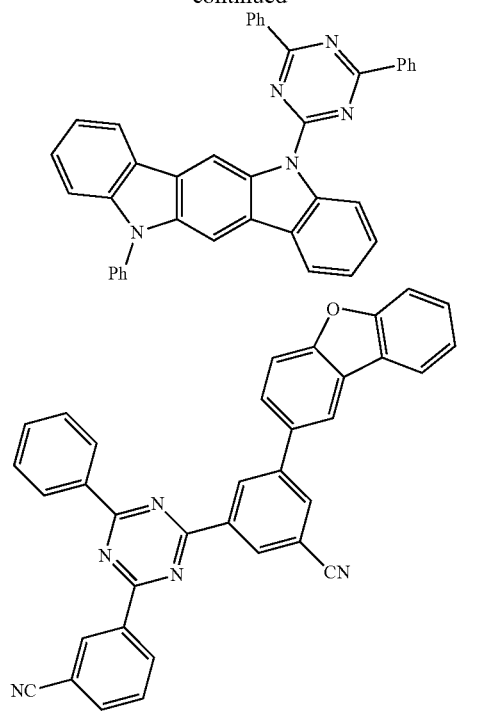

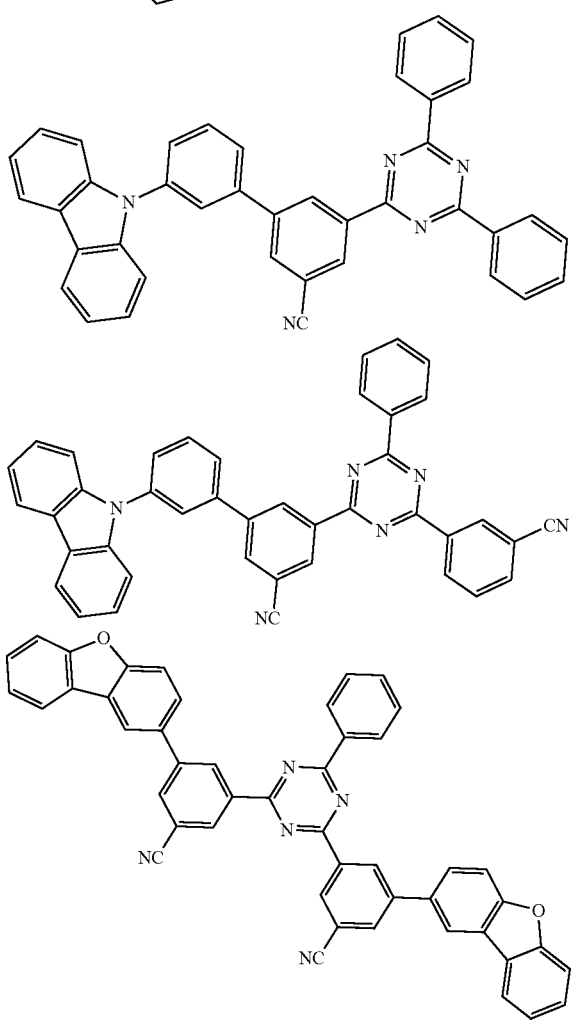

-continued

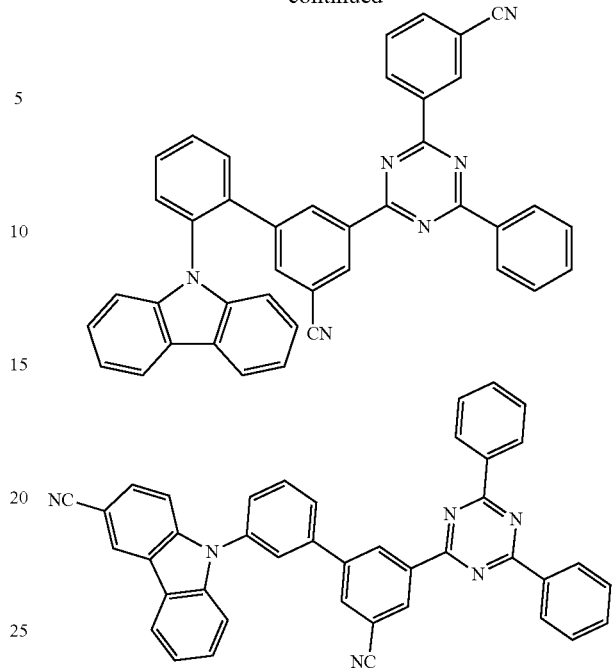

The person skilled in the art understands that any materials that are included in the same layer, in particular in the same EML, but also materials that are in adjacent layers and get in close proximity at the interface between these adjacent layers, may together form an exciplex. The person skilled in the art knows how to choose pairs of materials, in particular pairs of a p-host $H^P$ and an n-host $H^N$, which form an exciplex and the selection criteria for the two components of said pair of materials, including HOMO- and/or LUMO-energy level requirements. This is to say that, in case exciplex formation may be aspired, the highest occupied molecular orbital (HOMO) of the one component, e.g., the p-host material $H^P$, may be at least 0.20 eV higher in energy than the HOMO of the other component, e.g., the n-host material $H^N$, and the lowest unoccupied molecular orbital (LUMO) of the one component, e.g., the p-host material $H^P$, may be at least 0.20 eV higher in energy than the LUMO of the other component, e.g., the n-host material $H^N$. It belongs to the common knowledge of those skilled in the art that, if present in an EML of an optoelectronic device, in particular an OLED, an exciplex may have the function of an emitter material and emit light when a voltage and electrical current are applied to said device. As also commonly known from the state of the art, an exciplex may also be non-emissive and may for example transfer excitation energy to an emitter material, if included in an EML of an optoelectronic device.

Compositions Including at Least One Organic Molecule According to the Invention

One aspect of the invention relates to a composition including at least one organic molecule according to the invention. One aspect of the invention relates to the use of this composition in optoelectronic devices, preferably OLEDs, in particular in an EML of said devices.

In the following, when describing the aforementioned composition, reference is in some cases made to the content of certain materials in the respective compositions in form of percentages. It is to be noted that, unless stated otherwise for specific embodiments, all percentages refer to weight percentages, which has the same meaning as percent by weight or % by weight ((weight/weight), (w/w), wt. %). It is understood that, when for example stating that the content of one or more organic molecules according to the invention in a specific composition is exemplarily 30%, this is to mean that the total weight of the one or more organic molecules according to the invention (i.e., of all of these molecules combined) is 30% by weight, i.e., accounts for 30% of the total weight of the respective composition. It is understood that, whenever a composition is specified by providing the preferred content of its components in % by weight, the total content of all components adds up to 100% by weight (i.e., the total weight of the composition).

When in the following describing the embodiments of the invention relating to a composition including at least one organic molecule according to the invention, reference will be made to energy transfer processes that may take place between components within these compositions when using said compositions in an optoelectronic device, preferably in an EML of an optoelectronic device, most preferably in an EML of an OLED. The person skilled in the art understands that such excitation energy transfer processes may enhance the emission efficiency when using the composition in an EML of an optoelectronic device.

The skilled artisan understands that for excitation energy transfer to occur (efficiently), there preferably is spectral overlap between the emission spectrum of the energy donor and the absorption spectrum of the energy acceptor. Additionally the person skilled in the art understands that the intended energy donor should have a higher excited state energy level as compared to the intended energy acceptor, which is to say that the energy level E(S1)(donor) of the energy donor's lowermost excited singlet state S1(donor) and/or the energy level E(T1)(donor) of the energy donor's lowermost excited triplet state T1(donor) is preferably higher in energy than the energy level E(S1)(acceptor) of the energy acceptor's lowermost excited singlet state S1 (acceptor) and/or the energy level E(T1)(acceptor) of the energy acceptor's lowermost excited triplet state T1(acceptor). Selecting materials that fulfill the aforementioned preferred criteria is easily achieved based on standard knowledge of those skilled in the art and without an inventive step. Experimental detail on how excited state energies may be determined and on how absorption and emission spectra may be recorded is provided in a later section of this text.

When describing compositions including at least one organic molecule according to the present inventions, it will also be pointed out that certain materials "differ" from other materials. This is to mean the materials that "differ" from each other do not have the same chemical structure.

In one embodiment, the composition includes or consists of:
(a) one or more organic molecules according to the invention, and
(b) optionally, one or more host materials $H^B$, which differ from the organic molecules of (a), and
(c) optionally one or more TADF materials $E^B$, which differ from the organic molecules of (a), and
(d) optionally one or more phosphorescence materials $P^B$, which differ from the organic molecules of (a), and
(e) optionally one or more fluorescence emitters F, which differ from the organic molecules of (a), and also differ from the TADF materials $E^B$ of (c), and
(f) optionally, one or more solvents and/or dyes,
wherein any of these materials of (a) to (e)(either materials of the same group as defined above and/or materials of different groups as defined above, optionally form one or more exciplexes; and wherein, if no fluorescence emitter F of (e) is present in the composition, at least one material of (a) and/or (c) and/or (d) and/or at least one exciplex is an emitter material.

Compositions Including at Least One Organic Molecule According to the Invention and (Optionally) at Least One Host Material $H^B$ One embodiment of the composition according to the invention relates to a composition including at least one organic molecule according to the invention and, optionally, at least one host material $H^B$ that is structurally different from the molecules of the invention.

It is preferred that at least one, preferably each emitter material in said composition emits light with an emission maximum between 500 and 560 nm, more preferably between 510 and 550 nm, even more preferably between 520 and 540 nm in an emission spectrum recorded at room temperature (i.e., (approximately) 20° C.) from a spin-coated film of 10% by weight of the respective emitter in poly(methyl methacrylate), PMMA. It is preferred that, if present, at least one, preferably each host material $H^B$ has a lowermost excited singlet state $S1(H^B)$ that is higher in energy than the lowermost excited singlet state of the at least one, preferably of each, emitter material. It is preferred that, if present, at least one, preferably each host material $H^B$ may transfer excitation energy to at least one, preferably to each emitter material. Excitation energy may also be transferred between different organic molecules according to the invention, wherein it is again particularly preferred that excitation energy may be transferred to at least one, preferably to each, emitter material.

In one embodiment, the composition includes or consists of:
(a) one or more organic molecules according to the invention, and
(b) one or more host materials $H^B$, which differ from the organic molecules of (a), and
(c) optionally, one or more solvents.

In one embodiment, the composition includes or consists of:
(a) one or more organic molecules according to the invention, and
(b) one or more host materials $H^B$, which differ from the organic molecules of (a),
wherein the fraction of the host materials $H^B$ in % by weight in the composition is higher than the fraction of the organic molecules according to the invention in % by weight, preferably the fraction of the host materials $H^B$ in % by weight in the composition is two times higher than the fraction of the organic molecules according to the invention in % by weight.

In one embodiment, the composition includes or consists of:
(a) 1-50% by weight, preferably 5-40% by weight, in particular 10-30% by weight, of one or more organic molecules according to the invention, and
(b) 5-99% by weight, preferably 30-95% by weight, in particular 40-90% by weight by weight of one or more host materials $H^B$, which differ from the organic molecules of (a), and
(c) 0-94% by weight, preferably 0-65% by weight, in particular 0-50% by weight, of one or more solvents
wherein the materials of groups (a) to (c) add up to 100% by weight in certain embodiments.

Compositions Including at Least One Organic Molecule According to the Invention in Combination with at Least One (Further) Fluorescence Emitter F A preferred embodiment of the composition relates to a composition including at least one organic molecule according to the invention and at least one fluorescence emitter F (as defined above) is not a molecule of the invention (i.e., if the organic molecule according to the invention is a fluorescence emitter, a further fluorescence emitter F may be present in the composition.)

In this case, any organic molecule according to the invention and the at least one (further) fluorescence emitter F may serve as emitter material(s), but preferably, light emission from the composition in case it is used in an EML of an optoelectronic device, is mainly (i.e., to an extent of more than 50%, preferably more than 60%, more preferably more than 70%, even more preferably more than 80%, or even more than 90%) attributed to at least one, preferably to exactly one, (further) fluorescence emitter F that structurally differs from the molecules of the invention. Additionally, excitation energy may preferably be transferred between different materials within this composition, in particular from at least one, preferably each, host material $H^B$ (if present) to at least one, preferably each, TADF material $E^B$ and to at least one, preferably each, (further) fluorescence emitter F. It is preferred that excitation energy may also be transferred between the materials within the composition that are selected from: the at least one organic molecule according to the invention and the at least one (further) fluorescence emitter F, in particular from at least one, preferably each, organic molecule according to the invention to at least one, preferably each, (further) fluorescence emitter F. It is particularly preferred that at least one, preferably each, (further) fluorescence emitter F is a small FWHM emitter $S^B$ in the context of the invention, that preferably emits green light with an emission maximum between 500 and 560 nm, more preferably between 510 and 550 nm, even more preferably between 520 and 540 nm in an emission spectrum recorded at room temperature (i.e., (approximately) 20° C.) from a spin-coated film of 1-5% by weight, preferably 2% by weight of the respective $S^B$ in poly(methyl methacrylate), PMMA.

In one embodiment, the composition includes or consists of:
(a) one or more organic molecules according to the invention and
(b) optionally, one or more host materials $H^B$, which differ from the organic molecules of (a), and
(c) one or more fluorescence emitters F, which differ from the organic molecules of (a), and
(d) optionally, one or more solvents,
wherein at least one, preferably each fluorescence emitter F of group (c) preferably is a small FWHM emitter $S^B$ in the context of the invention, that preferably emits green light with an emission maximum between >500 and 560 nm, more preferably between 510 and 550 nm, even more preferably between 520 and 540 nm in an emission spectrum recorded at room temperature (i.e., (approximately) 20° C.) from a spin-coated film of 1-5% by weight, preferably 2% by weight of the respective $S^B$ in poly(methyl methacrylate), PMMA.

In one embodiment, the composition includes or consists of:
(a) one or more organic molecules according to the invention and
(c) one or more fluorescence emitters F, which differ from the organic molecules of (a),
wherein the fraction of the organic molecule of group (a) in % by weight is higher than the fraction of the fluorescence emitter F of group (c) in % by weight, preferably the fraction of the organic molecule of group (a) in % by weight is at least five times higher than the fraction of the fluorescence emitter F of group (c) in % by weight.

In one embodiment, the composition includes or consists of:
(a) 1-50% by weight, preferably 5-40% by weight, in particular 10-30% by weight, of one or more organic molecules according to the invention, and
(b) 30-98.9% by weight, preferably 48-94.5% by weight, in particular 65-89% by weight, of one or more host materials $H^B$, which differ from the organic molecules of (a), and
(c) 0.1-20% by weight, preferably 0.5-12% by weight, in particular 1-5% by weight, of one or more (further) fluorescence emitters F, which differ from the organic molecules of (a), and
(d) optionally 0-68.9% by weight, preferably 0-46.5% by weight, in particular 0-24% by weight, of one or more solvents,
wherein at least one, preferably each, fluorescence emitter F of (c) preferably is a small FWHM emitter $S^B$ in the context of the invention, that preferably emits green light with an emission maximum between >500 and 560 nm, more preferably between 510 and 550 nm, even more preferably between 520 and 540 nm in an emission spectrum recorded at room temperature (i.e., (approximately) 20° C.) from a spin-coated film of 1-5% by weight, preferably 2% by weight of the respective $S^B$ in poly(methyl methacrylate), PMMA,
and wherein the materials of groups (a) to (d) add up to 100% by weight in certain embodiments.

Compositions including at least one organic molecule according to the invention in combination with at least one (further) TADF material $E^B$ Another preferred embodiment of the composition relates to a composition including at least one organic molecule according to the invention and at least one TADF material $E^B$ (as defined above) that is not a molecule of the invention, i.e., it differs structurally.

In this case, any material(s) selected from the at least one organic molecule according to the invention and the at least one TADF material $E^B$ may serve as emitter material(s). Additionally, excitation energy may be transferred between different materials within this composition, in particular from at least one, preferably each, host material $H^B$ to at least one, preferably each, TADF material $E^B$ and/or to at least one, preferably each, organic molecule according to the invention. It is preferred that excitation energy may also be transferred between the materials within the composition that are selected from the at least one organic molecule according to the invention and the at least one TADF material $E^B$, in particular to at least one, preferably to each, emitter material. It is particularly preferred that the at least one, preferably each, material selected from the at least one organic molecule according to the invention and the at least one TADF material $E^B$ that serves as emitter material emits green light with an emission maximum between 500 and 560 nm, more preferably between 510 and 550 nm, even more preferably between 520 and 540 nm in an emission spectrum recorded at room temperature (i.e., (approximately) 20° C.) from a spin-coated film of 10% by weight of the respective emitter in poly(methyl methacrylate), PMMA.

In one embodiment, the composition includes or consists of:
- (a) one or more organic molecules according to the invention, and
- (b) optionally, one or more host materials $H^B$, which differ from the organic molecules of (a), and
- (c) one or more TADF materials $E^B$, which differ from the organic molecules of (a), and
- (d) optionally, one or more solvents.

In one embodiment, the composition includes or consists of:
- (a) one or more organic molecules according to the invention, and
- (c) one or more TADF materials $E^B$, which differ from the organic molecules of (a),
  wherein the fraction of the TADF materials $E^B$ of group (c) in % by weight is higher than the fraction of the organic molecule of group (a) in % by weight, preferably the fraction of the TADF materials $E^B$ of group (c) in % by weight is at least two times higher than the fraction of the organic molecule of group (a) in % by weight.

In one embodiment, the composition includes or consists of:
- (a) 1-50% by weight, preferably 5-40% by weight, in particular 10-30% by weight of one or more organic molecules according to the invention, and
- (b) 0-98.9% by weight, preferably 20-94.5% by weight, in particular 40-89% by weight, of one or more host materials $H^B$, which differ from the organic molecules of (a), and
- (c) 0.1-50% by weight, preferably 0.5-40% by weight, in particular 1-30% by weight, of one or more TADF materials $E^B$, which differ from the organic molecules of (a), and
- (d) 0-98.9% by weight, preferably 20-74.5% by weight, in particular 30-49% by weight, of one or more solvents,
  wherein at least one material of (a) and/or (c) is an emitter material,
  and wherein the materials of groups (a) to (c) add up to 100% by weight in certain embodiments.

Compositions Including at Least One Organic Molecule According to the Invention in Combination with at Least One (Further) TADF Material $E^B$ and at Least One (Further) Fluorescence Emitter F Another preferred embodiment of the composition relates to a composition including at least one organic molecule according to the invention and at least one TADF material $E^B$ (as defined above) that is not an organic molecule of the invention, and at least one (further) fluorescence emitter F (as defined above) that is not a molecule of the invention.

In this case, any material(s) selected from the at least one organic molecule according to the invention, the at least one (further) TADF material $E^B$, and the at least one (further) fluorescence emitter F may serve as emitter material(s), but preferably, light emission from the composition in case it is used in an EML of an optoelectronic device, is mainly (i.e., to an extent of more than 50%, preferably more than 60%, more preferably more than 70%, even more preferably more than 80%, or even more than 90%) attributed to at least one, preferably to exactly one, (further) fluorescence emitter F that is not a molecule of the invention. It is particularly preferred that at least one, preferably each, (further) fluorescence emitter F is a small FWHM emitter $S^B$ in the context of the invention, that preferably emits green light with an emission maximum between 500 and 560 nm, more preferably between 510 and 550 nm, even more preferably between 520 and 540 nm in an emission spectrum recorded at room temperature (i.e., (approximately) 20° C.) from a spin-coated film of 1-5% by weight, preferably 2% by weight of the respective $S^B$ in poly(methyl methacrylate), PMMA. Additionally, excitation energy may preferably be transferred between different materials within this composition, in particular from at least one, preferably each, host material $H^B$ (if present) to at least one, preferably each, TADF material $E^B$ and to at least one, preferably each, (further) fluorescence emitter F. It is preferred that excitation energy may also be transferred between the materials within the composition that are selected from: the at least one organic molecule according to the invention, the at least one (further) TADF material $E^B$, and the at least one (further) fluorescence emitter F, in particular from at least one, preferably each, organic molecule according to the invention and/or from at least one, preferably each, (further) TADF material $E^B$ to at least one, preferably each, (further) fluorescence emitter F.

In one embodiment, the composition includes or consists of:
- (a) one or more organic molecules according to the invention, and
- (b) optionally, one or more host materials $H^B$, which differ from the organic molecules of (a), and
- (c) one or more (further) TADF materials $E^B$, which differ from the organic molecules of (a), and
- (d) one or more (further) fluorescence emitters F, which differ from the organic molecules of (a) and also differ from the TADF materials $E^B$ of (c), and
- (e) optionally, one or more solvents,
  wherein at least one, preferably each fluorescence emitter F of (d) preferably is a small FWHM emitter $S^B$ in the context of the invention, that preferably emits green light with an emission maximum between >500 and 560 nm, more preferably between 510 and 550 nm, even more preferably between 520 and 540 nm in an emission spectrum recorded at room temperature (i.e., (approximately) 20° C.) from a spin-coated film of 1-5% by weight, preferably 2% by weight of the respective $S^B$ in poly(methyl methacrylate), PMMA.

In one embodiment, the composition includes or consists of:
- (a) one or more organic molecules according to the invention, and
- (c) one or more TADF materials $E^B$, which differ from the organic molecules of (a), and
- (d) one or more fluorescence emitters F, which differ from the organic molecules of (a) and also differ from the TADF materials $E^B$ of (c),
  wherein the fraction of the TADF materials $E^B$ of group (c) in % by weight is higher than the fraction of the organic molecule of group (a) in % by weight, preferably the fraction of the TADF materials $E^B$ of group (c) in % by weight is at least two times higher than the fraction of the organic molecule of group (a) in % by weight, and
  wherein the fraction of the organic molecule of group (a) in % by weight is higher than the fraction of the fluorescence emitters F of group (d) in % by weight, preferably the fraction of the organic molecule of group (a) in % by weight is at least two times higher than the fraction of the fluorescence emitters F of group (d) in % by weight.

In one embodiment, the composition includes or consists of:
- (a) 1-50% by weight, preferably 5-40% by weight, in particular 10-30% by weight, of one or more organic molecules according to the invention, and (b) 0-98.8% by weight, preferably 0-94% by weight, in particular 0-88% by weight of one or more host materials $H^B$, which differ from the organic molecules of (a), and (c) 0.1-98.9% by weight, preferably 0.5-94.5% by weight, in particular 1-89% by weight, of one or more TADF materials $E^B$, which differ from the organic molecules of (a), and (d) 0.1-20% by weight, preferably 0.5-12% by weight, in particular 1-5% by weight, of one or more (further) fluorescence emitters F, which differ from the organic molecules of (a) and also differ from the TADF materials $E^B$ of (c), and (e) 0-98.8% by weight, preferably 0-94% by weight, in particular 0-88% by weight of one or more solvents, wherein at least one, preferably each, (further) fluorescence emitter F (i.e., a material of (d)) preferably is a small FWHM emitter $S^B$ in the context of the invention, that preferably emits green light with an emission maximum between 500 and 560 nm, more preferably between 510 and 550 nm, even more preferably between 520 and 540 nm in an emission spectrum recorded at room temperature (i.e., (approximately) 20° C.) from a spin-coated film of 1-5% by weight, preferably 2% by weight of the respective $S^B$ in poly (methyl methacrylate), PMMA, and wherein the materials of groups (a) to (e) add up to 100% by weight in certain embodiments.

Compositions Including at Least One Organic Molecule According to the Invention in Combination with at Least One Phosphorescence Material $P^B$ Another preferred embodiment of the composition relates to a composition including at least one organic molecule according to the invention and at least one phosphorescence material $P^B$ (as defined above) that is not a molecule of the invention.

In this case, any material(s) selected from the at least one organic molecule according to the invention and the at least one phosphorescence material $P^B$ may serve as emitter material(s).

If light emission from said composition, in case it is used in an EML of an optoelectronic device, is mainly (i.e., to an extent of more than 50%, preferably more than 60%, more preferably more than 70%, even more preferably more than 80%, or even more than 90%) attributed to the at least one phosphorescence material $P^B$ it is preferred that the lowermost excited singlet state S1 of the at least one, preferably of each organic molecule according to the invention is higher in energy than the lowermost excited triplet state T1 of at least one, preferably each, phosphorescence material $P^B$. It is then also preferred that at least one, preferably each organic molecule according to the invention may transfer excitation energy to at least one, preferably each, phosphorescence material $P^B$.

If light emission from said composition, in case it is used in an EML of an optoelectronic device, is mainly (i.e., to an extent of more than 50%, preferably more than 60%, more preferably more than 70%, even more preferably more than 80%, or even more than 90%) attributed to the at least one organic molecule according to the invention, it is preferred that the lowermost excited triplet state T1 of at least one, preferably each, phosphorescence material $P^B$ is higher in energy than the lowermost excited triplet state T1 of at least one, preferably each, organic molecule according to the invention. It is then also preferred that at least one, preferably each, phosphorescence material $P^B$ may transfer excitation energy to at least one, preferably each, organic molecule according to the invention. As stated previously, it is generally preferred that organic molecules according to the invention are TADF materials $E^B$ as defined herein (see above). In this case and in said composition, at least one, preferably each, phosphorescence material $P^B$ may enhance the efficiency of the RISC process within at least one, preferably each, TADF material $E^B$ included in the composition by means of an external heavy atom effect, which forms part of the common knowledge of those skilled in the art.

In one embodiment, the composition includes or consists of:

(a) one or more organic molecules according to the invention, and (b) optionally, one or more host materials $H^B$, which differ from the organic molecules of (a), and (c) one or more phosphorescence materials $P^B$, which differ from the organic molecules of (a), and (d) optionally, one or more solvents, wherein at least one material of (a) and/or (c) is an emitter material.

In one embodiment, the composition includes or consists of:

(a) one or more organic molecules according to the invention and (c) one or more phosphorescence materials $P^B$, which differ from the organic molecules of (a), wherein the fraction of the organic molecule of group (a) in % by weight is higher than the fraction of the phosphorescence materials $P^B$ of group (c) in % by weight, preferably the fraction of the organic molecule of group (a) in % by weight is at least two times higher than the fraction of the phosphorescence materials $P^B$ of group (c) in % by weight.

In one embodiment, the composition includes or consists of:

(a) 1-99.5% by weight, preferably 5-50% by weight, in particular 10-30% by weight, of one or more organic molecules according to the invention, and (b) 0-98.5% by weight, preferably 35-94% by weight, in particular 60-88% by weight of one or more host materials $H^B$, which differ from the organic molecules of (a), and (c) 0.5-20% by weight, preferably 1-15% by weight, in particular 2-10% by weight, of one or more phosphorescence materials $P^B$, which differ from the organic molecules of (a), and (d) 0-98.5% by weight, preferably 0-59% by weight, in particular 0-28% by weight of one or more solvents, wherein at least one material of (a) and/or (c) is an emitter material, and wherein the materials of groups (a) to (d) add up to 100% by weight in certain embodiments.

Compositions Including at Least One Organic Molecule According to the Invention in Combination with at Least One Phosphorescence Material $P^B$ and with at Least One (Further) Fluorescence Emitter F Another preferred embodiment is a composition including at least one organic molecule according to the invention and at least one phosphorescence material $P^B$ (as defined above) that is not a molecule of the invention, and at least one (further) fluorescence emitter F (as defined above) that is not a molecule of the invention.

In this case, any material(s) selected from the at least one organic molecule according to the invention, the at least one phosphorescence material $P^B$, and the at least one (further) fluorescence emitter F may serve as emitter material(s), but preferably, light emission from the composition in case it is used in an EML of an optoelectronic device, is mainly (i.e., to an extent of more than 50%, preferably more than 60%, more preferably more than 70%, even more preferably more than 80%, or even more than 90%) attributed to at least one, preferably to exactly one, (further) fluorescence emitter F that is not a molecule of the invention. It is particularly preferred that at least one, preferably each, (further) fluorescence emitter F is a small FWHM emitter $S^B$ in the context of the invention, that preferably emits green light with an emission maximum between 500 and 560 nm, more preferably between 510 and 550 nm, even more preferably between 520 and 540 nm in an emission spectrum recorded at room temperature (i.e., (approximately) 20° C.) from a spin-coated film of 1-5% by weight, preferably 2% by weight of the respective $S^B$ in poly(methyl methacrylate), PMMA. Additionally, excitation energy may preferably be transferred between different materials within this composition, in particular from at least one, preferably each, host material $H^B$ of (if present) to at least one, preferably each, organic molecule according to the invention, and to at least one, preferably each, phosphorescence material $P^B$, and to at least one, preferably each, (further) fluorescence emitter F. It is preferred that excitation energy may also be transferred between the materials within the composition that are selected from: the at least one organic molecule according to the invention, the at least one phosphorescence material $P^B$, and the at least one (further) fluorescence emitter F, in particular from at least one, preferably each, organic molecule according to the invention and/or from at least one, preferably each, phosphorescence material $P^B$ to at least one, preferably each, (further) fluorescence emitter F. Preferably excitation energy may also be transferred from at least one, preferably each, organic molecule according to the invention to at least one, preferably each, phosphorescence material $P^B$.

In one embodiment, the composition includes or consists of:
(a) one or more organic molecules according to the invention, and
(b) optionally, one or more host materials $H^B$, which differ from the organic molecules of (a), and
(c) one or more phosphorescence materials $P^B$, which differ from the organic molecules of (a), and
(d) one or more fluorescence emitters F, which differ from the organic molecules of (a) and also differ from the phosphorescence materials $P^B$ of (c), and
(e) optionally, one or more solvents,
wherein at least one, preferably each, (further) fluorescence emitter F (i.e., a material of (d)) preferably is a small FWHM emitter $S^B$ in the context of the invention, that preferably emits green light with an emission maximum between 500 and 560 nm, more preferably between 510 and 550 nm, even more preferably between 520 and 540 nm in an emission spectrum recorded at room temperature (i.e., (approximately) 20° C.) from a spin-coated film of 1-5% by weight, preferably 2% by weight of the respective $S^B$ in poly (methyl methacrylate), PMMA.

In one embodiment, the composition includes or consists of:
(a) one or more organic molecules according to the invention, and
(c) one or more phosphorescence materials $P^B$, which differ from the organic molecules of (a), and
(d) one or more fluorescence emitters F, which differ from the organic molecules of (a) and also differ from the phosphorescence materials $P^B$ of (c),
wherein the fraction of the organic molecule of group (a) in % by weight is higher than the fraction of the phosphorescence materials $P^B$ of group (c) in % by weight, preferably the fraction of the organic molecule of group (a) in % by weight is at least two times higher than the fraction of the phosphorescence materials $P^B$ of group (c) in % by weight, and
wherein the fraction of the organic molecule of group (a) in % by weight is higher than the fraction of the fluorescence emitters F of group (d) in % by weight, preferably the fraction of the organic molecule of group (a) in % by weight is at least five times higher than the fraction of the fluorescence emitters F of group (d) in % by weight.

In one embodiment, the composition includes or consists of:
(a) 1-99.8% by weight, preferably 5-50% by weight, in particular 10-30% by weight, of one or more organic molecules according to the invention, and
(b) 0-98.8% by weight, preferably 35-94% by weight, in particular 60-88% by weight of one or more host materials $H^B$, which differ from the organic molecules according to the invention, and
(c) 0.1-20% by weight, preferably 0.5-10% by weight, in particular 1-3% by weight, of one or more phosphorescence materials $P^B$, which differ from the organic molecules of (a), and
(d) 0.1-20% by weight, preferably 0.5-12% by weight, in particular 1-5% by weight, of one or more (further) fluorescence emitters F, which differ from the organic molecules of (a), and
(e) 0-98.8% by weight, preferably 0-59% by weight, in particular 0-28% by weight of one or more solvents,
wherein at least one, preferably each, (further) fluorescence emitter F (i.e., a material of (d)) preferably is a small FWHM emitter $S^B$ in the context of the invention, that preferably emits green light with an emission maximum between 500 and 560 nm, more preferably between 510 and 550 nm, even more preferably between 520 and 540 nm in an emission spectrum recorded at room temperature (i.e., (approximately) 20° C.) from a spin-coated film of 1-5% by weight, preferably 2% by weight of the respective $S^B$ in poly (methyl methacrylate), PMMA,
and wherein the materials of groups (a) to (e) add up to 100% by weight in certain embodiments.

Further Aspects and Embodiments of the Invention

In a preferred embodiment, the organic molecules according to the invention have a photoluminescence quantum yield (PLQY) equal to or higher than 20%, more preferably equal to or higher than 30%, even more preferably equal to or higher than 40%, in particular equal to or higher than 50%, in particular equal to or higher than 60%, in particular equal to or higher than 70%, or even equal to or higher than 80%, wherein the PLQY of the organic molecule according to the invention is determined at room temperature (i.e., (approximately) 20° C.) from a spin-coated film with 10% by weight of the organic molecule in poly(methyl methacrylate), PMMA, and as described in a later section of this text.

In one embodiment of the invention, the organic molecules according to the invention have an delayed excited state lifetime of not more than 50 μs, preferably of not more than 25 μs, more preferably of not more than 15 μs, even more preferably of not more than 10 μs, in particular of not more than 8 μs, in particular of not more than 6 μs, and particularly preferably of not more than 4 μs, measured at room temperature (i.e., (approximately) 20° C.) in a film of poly(methyl methacrylate)(PMMA) with 10% by weight of the organic molecule.

In a further embodiment, the organic molecules according to the invention have a full width at half maximum (FWHM) of less than 0.60 eV, preferably less than 0.50 eV, more preferably less than 0.45 eV, even more preferably less than 0.43 eV or even less than 0.40 eV in a film of poly(methyl methacrylate)(PMMA) with 10% by weight of the organic molecule at room temperature (i.e., (approximately) 20° C.).

In a further embodiment, the organic molecules according to the invention have an delayed excited state lifetime of not more than 50 μs, preferably of not more than 25 μs, more preferably of not more than 15 μs, even more preferably of not more than 10 μs, in particular of not more than 8 μs, in particular of not more than 6 μs, and particularly preferably of not more than 4 μs, and a full width at half maximum (FWHM) of less than 0.60 eV, preferably less than 0.50 eV, more preferably less than 0.45 eV, even more preferably less than 0.43 eV or even less than 0.40 eV in a film of poly(methyl methacrylate)(PMMA) with 10% by weight of the organic molecule at room temperature (i.e., (approximately) 20° C.).

In a further embodiment of the invention, the organic molecules according to the invention have an emission peak in the visible or nearest ultraviolet range, i.e., in the range of a wavelength of from 380 to 800 nm, with a full width at half maximum (FWHM) of less than 0.60 eV, preferably less than 0.50 eV, more preferably less than 0.45 eV, even more preferably less than 0.43 eV or even less than 0.40 eV, measured from a film of the respective organic molecule in poly(methyl methacrylate)(PMMA) with 10% by weight of organic molecule at room temperature (i.e., (approximately) 20° C.).

A further aspect of the invention relates to a method for preparing the organic molecules according to the invention, wherein this method includes a palladium-catalyzed cross coupling reaction and a nucleophilic aromatic substitution reaction:

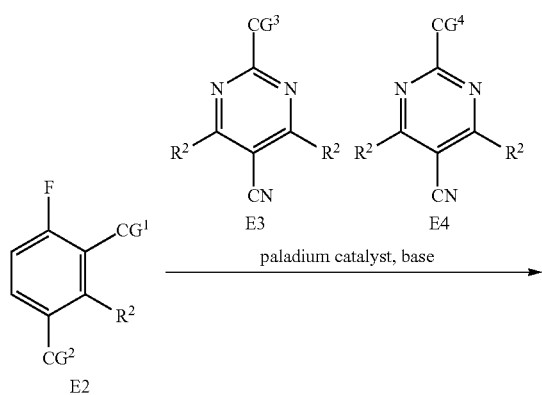

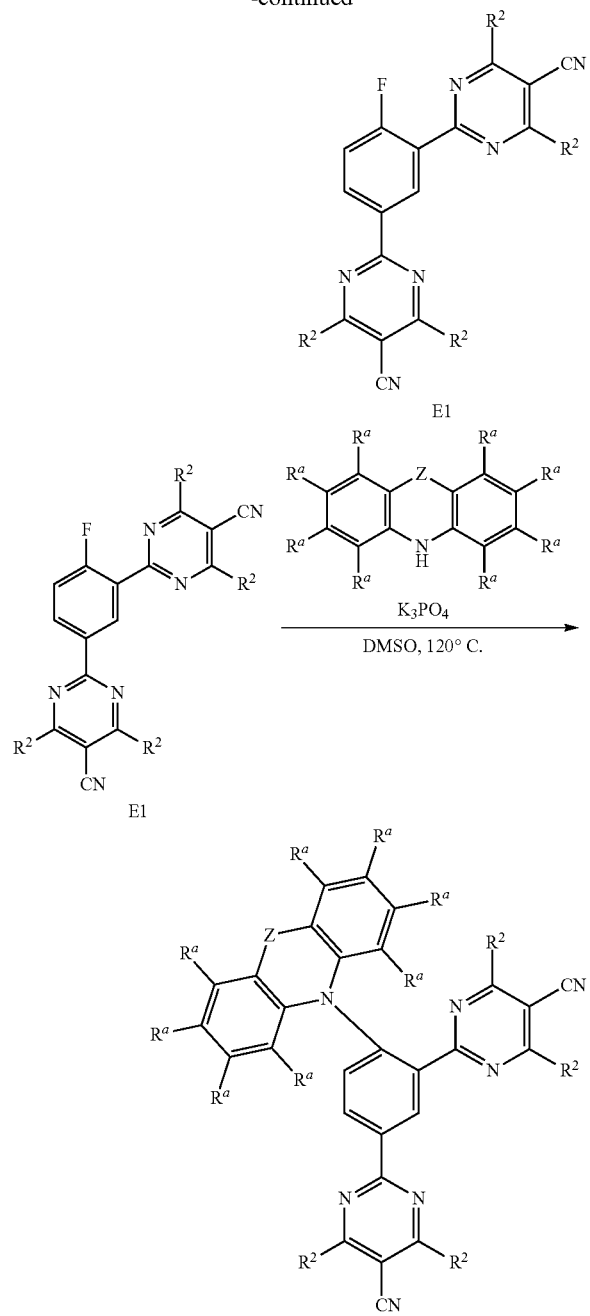

According to the invention, a 1-fluorobenzene E2, which is substituted with a coupling group $CG^1$ in 2-position and which is substituted with a coupling group $CG^2$ in 4-position, is used as starting material, that is reacted with two heterocycles, one substituted with a coupling group $CG^3$ (reactant E3) and one with a coupling group $CG^4$ (reactant E4). The coupling groups $CG^1$ and $CG^4$ are chosen as a reaction pair to introduce the heterocycle of E4 at the position of $CG^1$. Accordingly, coupling groups $CG^2$ and $CG^3$ are chosen as a reaction pair for introducing the heterocycle of E3 at the position of $CG^2$. Preferably, a so-called Suzuki coupling reaction is used. Here, either $CG^1$ is chosen from Cl, Br or I, and $CG^4$ is a boronic acid group or a boronic acid ester group, in particular a boronic acid pinacol ester group, or $CG^1$ is a boronic acid group or a boronic acid ester group, in particular a boronic acid pinacol ester group, and CG⁴ is chosen from Cl, Br or I. Analogously, either CG² is chosen from Cl, Br or I, and CG³ is a boronic acid group or a boronic acid ester group, in particular a boronic acid pinacol ester group, or CG² is a boronic acid group or a boronic acid ester group, in particular a boronic acid pinacol ester group, and CG³ is chosen from Cl, Br or I. The person skilled in the art knows that in order to introduce different heterocycles via the coupling reactions of E3 with E2 and E4 with E2, either first E2 is reacted with E3 and the resulting intermediate is subsequently reacted with E4 to yield E1, or first E2 is reacted with E4 and the resulting intermediate is subsequently reacted with E3 to yield E1.

For the reaction of a nitrogen heterocycle in a nucleophilic aromatic substitution with an aryl halide, preferably an aryl fluoride, typical conditions include the use of a base, such as tribasic potassium phosphate or sodium hydride, for example, in an aprotic polar solvent, such as dimethyl sulfoxide (DMSO) or N,N-dimethylformamide (DMF), for example.

The person skilled in the art is aware of multiple structures that are suitable for the reaction of a nitrogen heterocycle in a nucleophilic aromatic substitution with an aryl halide.

Below, non-limiting examples for nitrogen heterocycles are listed (CAS-numbers are given in parenthesis below the structure):

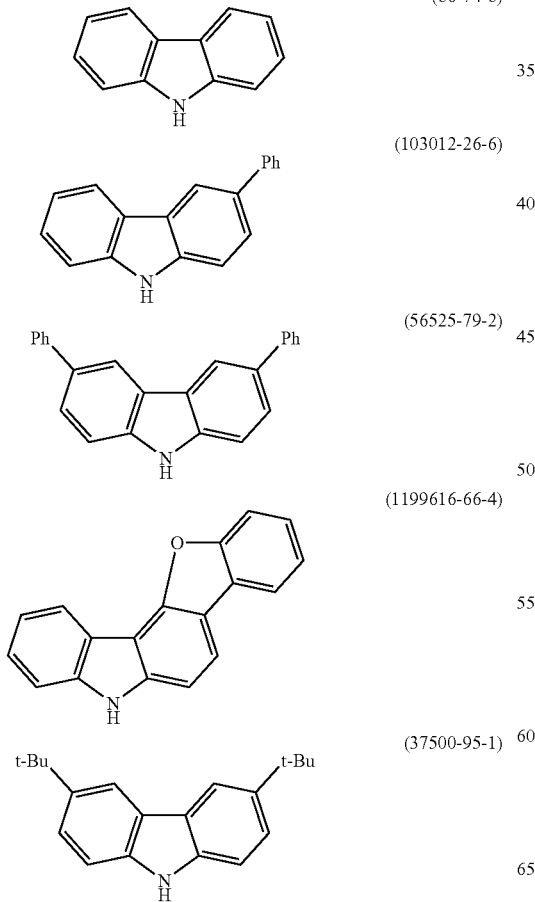

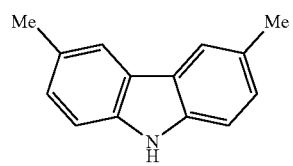
(5599-50-8)

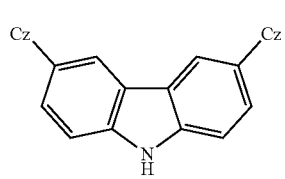
(606129-90-2)

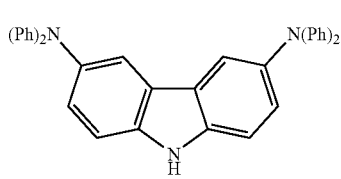
(608527-58-8)

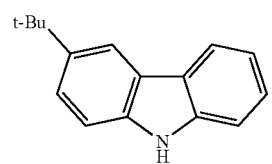
22401-74-7

Cz = carbazolyl group

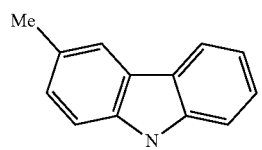
(4630-20-0)

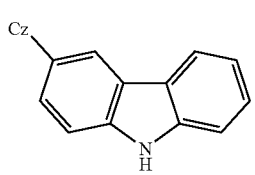
(18628-07-4)

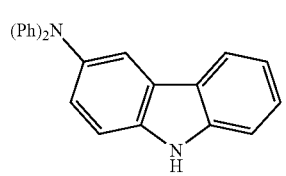
(883224-26-8)

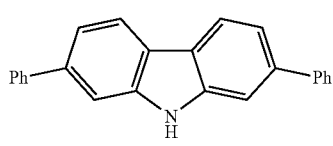
(42448-04-4)

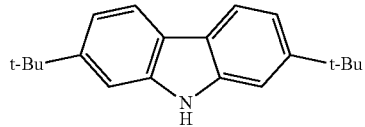
(69386-35-2)

(57103-03-4)
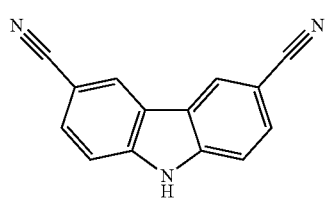
(1255308-97-4)
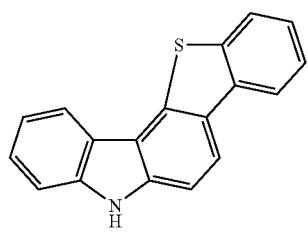
(88590-00-5)
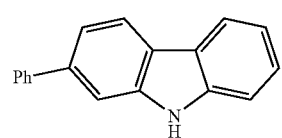
(69386-36-3)
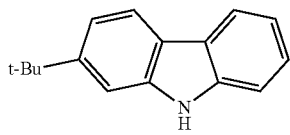
(57955-18-7)
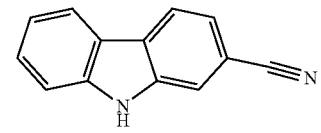
(1448296-00-1)
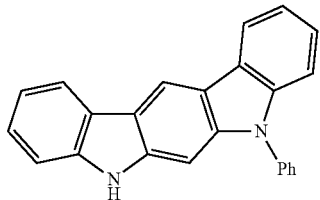
(205-25-4)
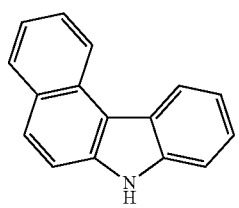
(194-59-2)
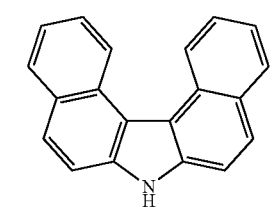
(57102-93-9)
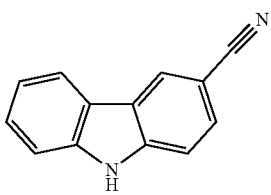
(1338919-70-2)
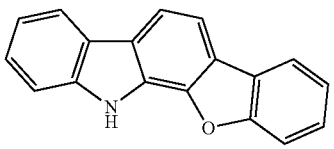
(1637752-63-6)
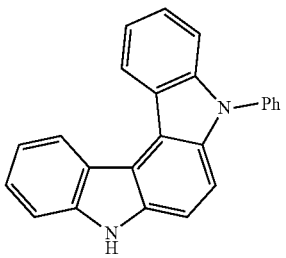
(6510-65-2)
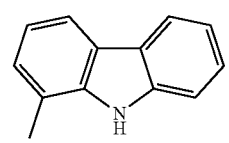
(1329054-41-2)
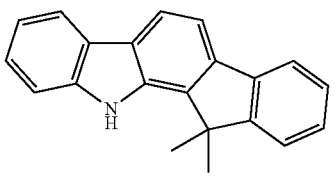
(1247053-55-9)
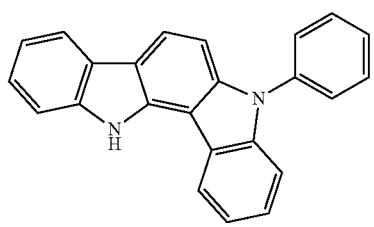
(1257220-47-5)
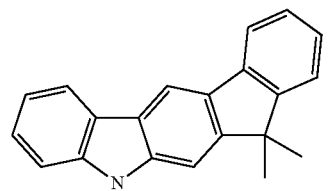
(104636-53-5)
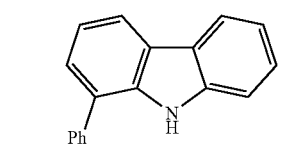

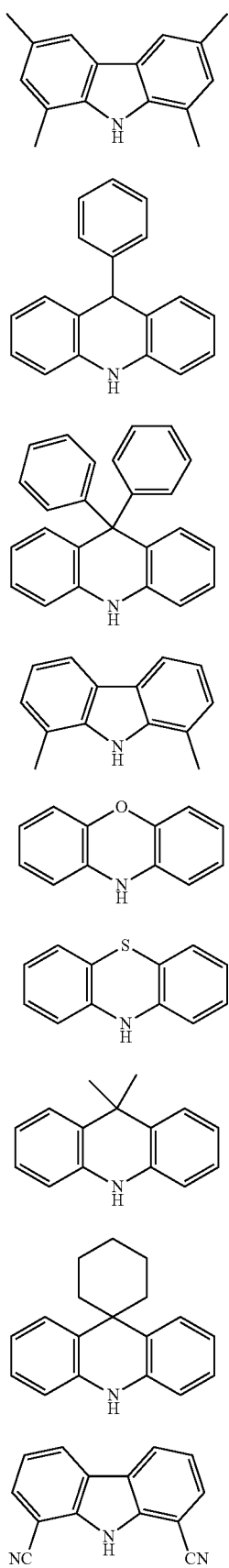

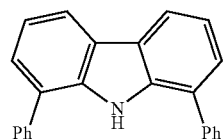

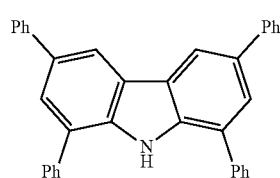

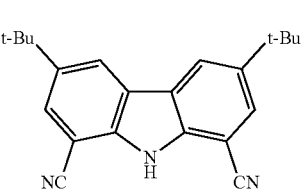

A further aspect of the invention relates to a method for producing an optoelectronic component or device, preferably an optoelectronic device including at least one organic molecule according to the invention.

A further aspect of the invention relates to a method for producing an optoelectronic device, wherein an organic molecule according to the invention or a composition including an organic molecule according to the invention is used.

The optoelectronic device, in particular the OLED including at least one molecule according to the invention can be fabricated by any means of vapor deposition and/or liquid processing.

Known methods for the formation of the individual layers of an OLED include:
deposition by means of a sublimation process,
deposition by means of an organic vapor phase deposition process,
deposition by means of a carrier gas sublimation process,
solution processing or printing.

A further aspect of the invention relates to a method for producing an optoelectronic device, wherein an organic molecule according to the invention or a composition including an organic molecule according to the invention is used, in particular including the processing of the organic molecule using a vacuum evaporation method or from a solution.

The methods used to fabricate optoelectronic devices, such as the optoelectronic device, preferably the OLED, including at least one organic molecule according to the invention, are known to those skilled in the art. The different layers are individually and successively deposited on a suitable substrate by means of subsequent deposition processes. The individual layers may be deposited using the same or differing deposition methods.

Vapor deposition processes may include thermal (co) evaporation, chemical vapor deposition and physical vapor deposition. For active matrix OLED display, an AMOLED backplane is used as substrate. The individual layer may be processed from solutions or dispersions employing adequate solvents. Solution deposition process exemplarily include spin coating, dip coating and jet printing. Liquid processing may optionally be carried out in an inert atmosphere (e.g., in a nitrogen atmosphere) and the solvent may optionally be completely or partially removed by means known in the state of the art.

Preference is given to an optoelectronic device including at least one organic molecule according to the invention, characterized in that one or more layers are coated by means of the OVPD (organic vapor phase deposition) process or with the aid of carrier-gas sublimation, in which the materials are applied at a pressure of between $10^{-5}$ mbar and 1 bar. A special case of this process is the OVJP (organic vapor jet printing) process, in which the materials are applied directly through a nozzle and are thus structured.

Preference is furthermore given to an optoelectronic device including at least one organic molecule according to the invention, characterized in that one or more layers are produced from solution, such as, for example, by spin-coating, or by means of any desired printing process, such as, for example, screen printing, flexographic printing, nozzle printing or offset printing, but particularly preferably LITI (light induced thermal imaging, thermal transfer printing) or ink-jet printing. Soluble compounds are necessary for this purpose. High solubility can be achieved through suitable substitution of the compounds.

Hybrid processes, in which, for example, one or more layers are applied from solution and one or more further layers are applied by vapor deposition are also possible. Thus, it is possible, for example, to apply the light-emitting layer from solution and to apply the electron transport layer by means of vapor deposition.

These processes/methods are generally known to the person skilled in the art and can be applied by him without inventive step to organic electroluminescent devices including the at least one molecule according to the invention.

A further aspect, the invention relates to a method for generating light, in particular green light, of a wavelength between 500 and 560 nm including the steps of:
 (i) providing an optoelectronic device including an organic molecule according to the invention; and
 (ii) applying an electrical current to device.

A central element of an organic electroluminescent device for generating light typically is the at least one light-emitting layer (EML) placed between an anode and a cathode. When a voltage (and electrical current) is applied to an organic electroluminescent device at the anode and the cathode, holes and electrons are injected from an anode and a cathode, respectively. A hole transport layer (HTL) is typically located between the light-emitting layer (EML) and the anode, and an electron transport layer (ETL) is typically located between the light-emitting layer (EML) and the cathode. The different layers are sequentially disposed. Excitons of high energy are then generated by recombination of the holes and the electrons in the EML. The decay of such excited states (e.g., singlet states such as S1 and/or triplet states such as T1) to the ground state (S0) desirably leads to the emission of light.

Determination of Orbital and Excited State Energies and of $\Delta E_{ST}$

Orbital and excited state energies can be determined either by means of experimental methods or by calculations employing quantum-chemical methods, in particular density functional theory calculations. The energy of the highest occupied molecular orbital $E^{HOMO}$ is determined by methods known to the person skilled in the art from cyclic voltammetry measurements with an accuracy of 0.1 eV.

The energy of the lowest unoccupied molecular orbital $E^{LUMO}$ may be determined by methods known to the person skilled in the art from cyclic voltammetry measurements with an accuracy of 0.1 eV. If $E^{LUMO}$ is determined by cyclic voltammetry measurements, it will be denoted as $E_{CV}^{LUMO}$. Alternatively, and herein preferably, $E^{LUMO}$ is calculated as $E^{HOMO}+E^{gap}$, wherein $E^{gap}$ is determined from the onset of the photoluminescence (PL) spectrum (steady state spectrum) at room temperature (i.e., (approximately) 20° C.), typically measured from a spin-coated film of the respective material in poly(methyl methacrylate), PMMA. For the organic molecules according to the invention, for TADF materials $E^B$ in general and for phosphorescence materials $P^B$, the concentration of the respective material in the spin-coated PMMA film is 10% by weight, unless stated otherwise. For host materials $H^B$ that do not form part of differs from the molecules of the invention (i.e., that are not represented by general Formula X) and that are not TADF materials $E^B$ as defined herein, the PL spectra are typically recorded from a neat film of the respective host material $H^B$. For fluorescence emitters F that that differs from the molecules of the invention (i.e., that are not represented by general Formula X), in particular if they are small FWHM emitters $S^B$ in the context of the invention, the PL spectra are typically recorded from a spin-coated film of the respective emitter material in PMMA with a concentration of 1-5%, preferably 2% by weight of F in PMMA.

Absorption spectra are recorded at room temperature (i.e., (approximately) 20° C.), typically from a spin-coated film of the respective material in poly(methyl methacrylate), PMMA. For the organic molecules according to the invention, for TADF materials $E^B$ in general and for phosphorescence materials $P^B$, the concentration of the respective material in the spin-coated PMMA film is 10% by weight, unless stated otherwise. For host materials $H^B$ that differs from the molecules of the invention and that are not TADF materials $E^B$ as defined herein, absorption spectra are typically recorded from a neat film of the respective host material $H^B$. For fluorescence emitters F that that is not a molecule of the invention, in particular if they are small FWHM emitters $S^B$ in the context of the invention, absorption spectra are typically recorded from a spin-coated film of the respective emitter material in PMMA with a concentration of 1-5%, preferably 2% by weight of F in PMMA. Alternatively, absorption spectra may also be recorded from solutions of the respective molecules, for example in dichloromethane or toluene, wherein the concentration of the solution is typically chosen so that the maximum absorbance preferably is in a range of 0.1 to 0.5.

Unless stated otherwise, the energy of the first excited triplet state T1 is determined from the onset the phosphorescence spectrum at 77 K (steady-state spectrum), typically from a spin-coated film of the respective material in poly(methyl methacrylate), PMMA. Only for phosphorescence materials $P^B$, the phosphorescence spectra are recorded at room temperature (i.e., (approximately) 20° C.). For the organic molecules according to the invention, for TADF materials $E^B$ in general and for phosphorescence materials $P^B$, the concentration of the respective material in the spin-coated PMMA film is 10% by weight, unless stated otherwise. For host materials $H^B$ that differs from the molecules of the invention and that are not TADF materials $E^B$ as defined herein, absorption spectra are typically recorded from a neat film of the respective host material $H^B$. For fluorescence emitters F that that is not a molecule of the invention, in particular if they are small FWHM emitters $S^B$ in the context of the invention, absorption spectra are typically recorded from a spin-coated film of the respective emitter material in PMMA with a concentration of 1-5%, preferably 2% by weight of F in PMMA. It is acknowledged that for TADF materials $E^B$ with small $\Delta E_{ST}$ values, intersystem crossing and reverse intersystem crossing may both occur even at low temperatures. In consequence, the emission spectrum at 77 K may include emission from both, the S1 and the T1 state. However, the contribution/value of the triplet energy is typically considered dominant.

Unless stated otherwise, the energy of the first excited singlet state S1 is determined from the onset the fluorescence spectrum at room temperature (i.e., (approximately) 20° C.)(steady-state spectrum, typically from a spin-coated film of the respective material in poly(methyl methacrylate), PMMA. For the organic molecules according to the invention and for TADF materials $E^B$ in general, the concentration of the respective material in the spin-coated PMMA film is 10% by weight, unless stated otherwise. For host materials $H^B$ that differs from the molecules of the invention and that are not TADF materials $E^B$ as defined herein, absorption spectra are typically recorded from a neat film of the respective host material $H^B$. For fluorescence emitters F that that is not a molecule of the invention in particular if they are small FWHM emitters $S^B$ in the context of the invention, absorption spectra are typically recorded from a spin-coated film of the respective emitter material in PMMA with a concentration of 1-5%, preferably 2% by weight of F in PMMA. For phosphorescence materials $P^B$ displaying efficient intersystem crossing however, room temperature emission (typically measured from a spin-coated film of $P^B$ in PMMA with 10% by weight of the emitter) may be (mostly) phosphorescence and not fluorescence. In this case, the onset of the emission spectrum at room temperature (i.e., (approximately) 20° C.) is used to determine the energy of the first excited triplet state T1 as stated above and not for determining the energy of the first excited singlet state S1.

Unless stated otherwise, the $\Delta E_{ST}$ value, which corresponds to the energy difference between the first (i.e., the lowermost) excited singlet state (S1) and the first (i.e., the lowermost) excited triplet state (T1), is determined based on the first excited singlet state energy and the first excited triplet state energy, which were determined as stated above.

EXAMPLES

General Synthesis Scheme I

Exemplarily, the general synthesis scheme I provides a synthesis scheme for organic molecules M1 according to the invention,

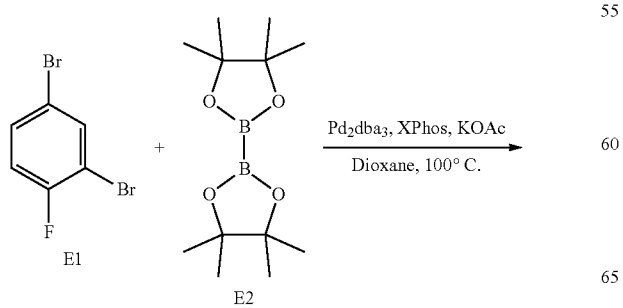

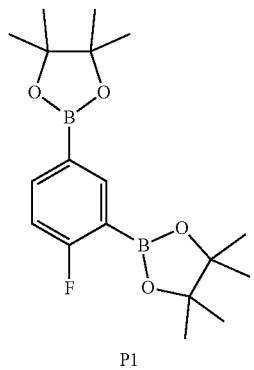

P1

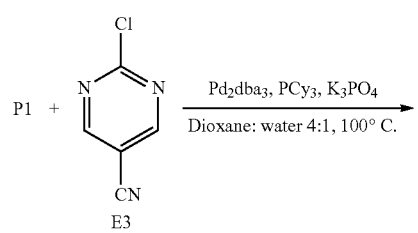

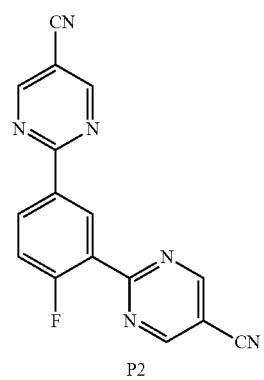

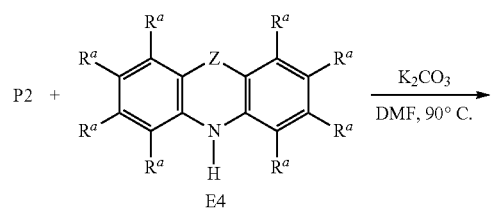

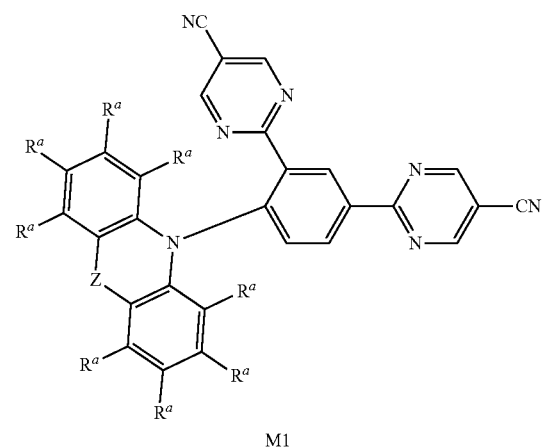

M1

127

General Synthesis Scheme II

The general synthesis scheme II provides a synthesis scheme for organic molecules M2 according to the invention, Wherein if W = N, then Y = CH, and
wherein if Y = N, then W = CH.
X is a halogen, preferably Cl or Br

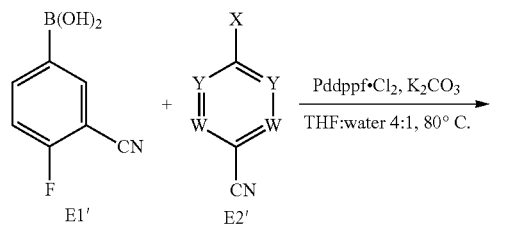

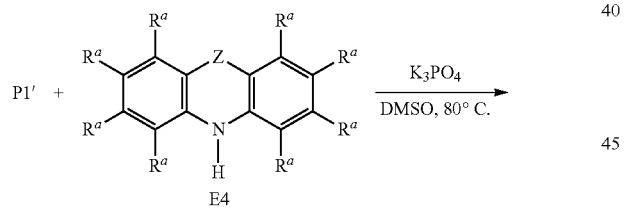

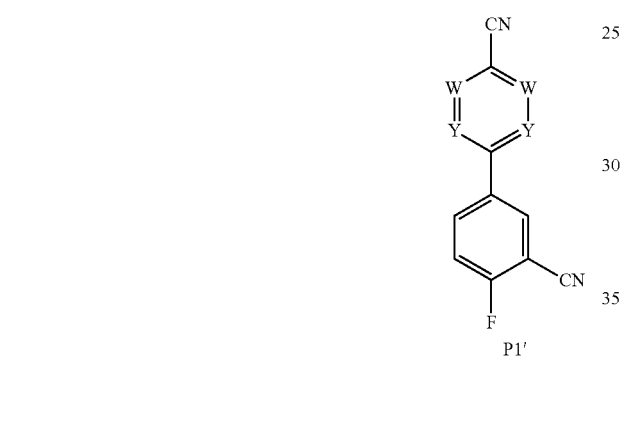

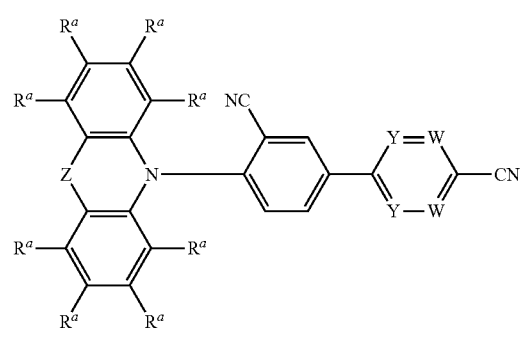

128

General Synthesis Scheme III

Exemplarily, the general synthesis scheme III provides a synthesis scheme for organic molecules M2 according to the invention,

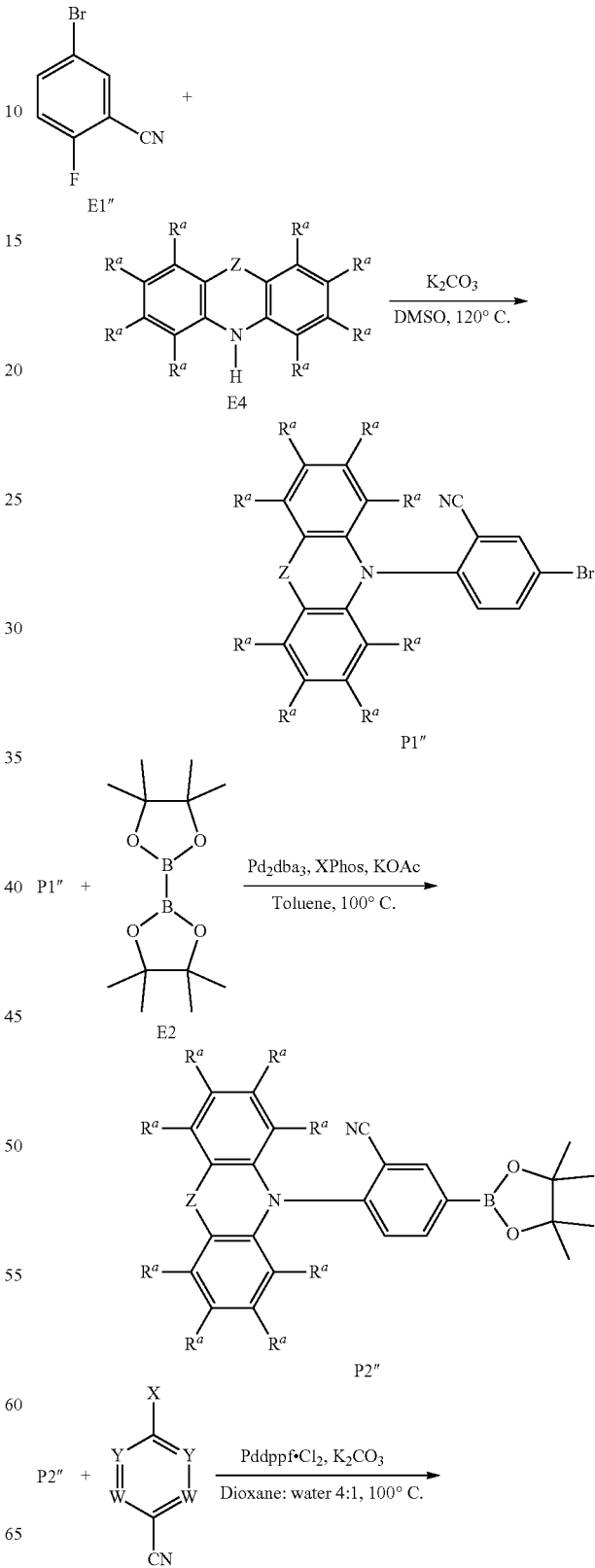

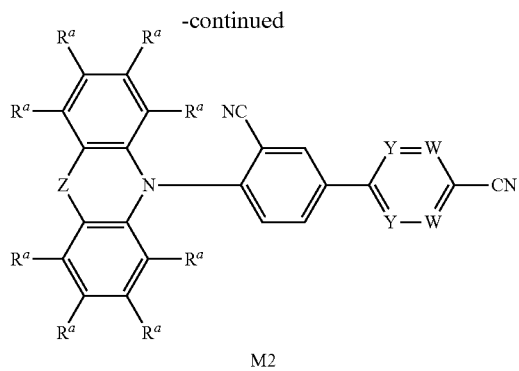

M2

General Procedures for Synthesis

Procedures for Synthesis Scheme I

Procedure 1

Under nitrogen atmosphere, dry dioxane is added to 2,4-dibromo-1-fluorobenzene E1 (1.00 equivalents, CAS1435-53-6)), bis(pinacolato)diboron E2 (2.40 equivalents, CAS 73183-34-3), potassium acetate (6.00 equivalents), tris(dibenzylideneacetone)dipalladium(0)(0.02 equivalents, CAS 51364-51-3), and XPhos (0.08, CAS 564483-18-7) followed by nitrogen-sparging for 10 min. The reaction mixture is stirred at 100° C. until full conversion of E1 is reached as judged by GC/MS and TLC. After cooling to room temperature, activate charcoal and Celite® (kieselgur) is added to the mixture, stirred for 15 minutes then filtered by vacuum suction. The filtrate is extracted with ethyl acetate and brine. The organic extracts are concentrated under reduced pressure. The resulting crude product is purified recrystallization in n-hexane to afford P1 as a solid.

Procedure 2

Under nitrogen atmosphere, a mixture of Dioxane and water (ratio of 4:1) is added to the boronic pinacol ester P1 (1.00 equivalents, product of procedure 1), 2-chloropyrimidine-5-carbonitrile E3 (2.10 equivalents, CAS 1753-50-0)), potassium phosphate tribasic (4.00 equivalents), tris(dibenzylideneacetone)dipalladium(0)(0.06 equivalents, CAS 51364-51-3), and tricyclohexylphosphine (0.12, CAS 2622-12-2), followed by nitrogen-sparging for 10 min. The reaction mixture is stirred at 100° C. until full conversion of the boronic pinacol ester E3 is reached as judged by GC/MS and TLC. After cooling to room temperature, water is added to the reaction mixture and the formed precipitate removed by vacuum suction. The resulting crude product is purified is purified by column chromatography, washing or recrystallization to afford P2 as a solid.

Procedure 3

P2 (1.00 equivalents, product of procedure 2), E4 (1.00 equivalents), and potassium carbonate (1.50 equivalents) are dissolved under nitrogen atmosphere in dry DMF and stirred at 90° C. for 24 h (reaction monitored via LC/MS and TLC). Subsequently, the reaction mixture is poured into a stirred mixture of water and ice. The resulting precipitate is filtered off and washed with water and ethanol. The crude product is purified by column chromatography or recrystallization to obtain M1 as a solid.

Procedures for Synthesis Scheme II

Procedure 4

Under nitrogen atmosphere, a mixture of THF and water (ratio of 4:1) is added to 3-Cyano-4-fluorophenylboronic acid E1' (1.00 equivalents, CAS 214210-21-6), the halogenated pyrimidine-carbonitrile derivative E3' (1.00 equivalents), potassium carbonate (2.00 equivalents) and [1,1'-]bis(diphenylphosphino)ferrocene)palladium(II)dichloride (0.015 equivalents, CAS 72287-26-4), followed by nitrogen-sparging for 10 min. The reaction mixture is stirred at 80° C. until full conversion of the boronic acid E1' is reached as judged by GC/MS and TLC. After cooling to room temperature, the reaction mixture was extracted with dichloromethane and water. The organic extracts are concentrated under reduced pressure. The resulting crude product by is purified by column chromatography, washing or recrystallization to afford P1' as a solid.

Procedure 5

P1' (1.00 equivalents, product of procedure 4), E4 (1.00 equivalents), and potassium phosphate tribasic (2.00 equivalents) are dissolved under nitrogen atmosphere in dry DMSO and stirred at 80° C. for 24 h (reaction monitored via LC/MS and TLC). Subsequently, the reaction mixture is poured into a stirred mixture of water and ice. The resulting precipitate is filtered off and washed with water and ethanol. The crude product is purified by column chromatography, washing or recrystallization to obtain M2 as a solid.

Procedures for Synthesis Scheme III

Procedure 6

5-Bromo-2-fluorobenzonitrile E1" (1.00 equivalents), E4 (1.00 equivalents), and potassium phosphate tribasic (2.00 equivalents) are dissolved under nitrogen atmosphere in dry DMSO and stirred at 120° C. for 16 h (reaction monitored via LC/MS and TLC). Subsequently, the reaction mixture is poured into a stirred mixture of water and ice. The resulting precipitate is filtered off and washed with water and ethanol. The crude product is purified by column chromatography, washing or recrystallization to obtain P1" as a solid.

Procedure 7

Under nitrogen atmosphere, dry toluene is added to P1" (1.00 equivalents, product of procedure 6)), bis(pinacolato)diboron E2 (2.40 equivalents, CAS 73183-34-3), potassium acetate (6.00 equivalents), tris(dibenzylideneacetone)dipalladium(0) (0.02 equivalents, CAS 51364-51-3), and XPhos (0.08, CAS 564483-18-7) followed by nitrogen-sparging for 10 min. The reaction mixture is stirred at 100° C. until full conversion of P1" is reached as judged by LCC/MS and TLC. After cooling to room temperature, activate charcoal and Celite® is added to the mixture, stirred for 15 minutes then filtered by vacuum suction. The filtrate was added to n-hexane or methanol to precipitate the crude solid. The resulting crude product is purified by column chromatography or recrystallization to afford P2" as a solid.

Procedure 8

Under nitrogen atmosphere, a mixture of dioxane and water (ratio of 4:1) is added to P2" (1.00 equivalents, product of procedure 7), the halogenated pyrimidine-carbonitrile derivative E3' (1.10 equivalents), potassium carbonate (2.00 equivalents) and [1,1'-]bis(diphenylphosphino)ferrocene)palladium(II)dichloride (0.015 equivalents, CAS 72287-26-4), followed by nitrogen-sparging for 10 min. The reaction mixture is stirred at 100° C. until full conversion of the pinacol boronic ester P2" is reached as judged by LC/MS and TLC. After cooling to room temperature, water is added to the reaction mixture and the formed precipitate removed by vacuum suction. The resulting crude product is purified is purified by column chromatography, washing or recrystallization to afford M2 as a solid.

Cyclic Voltammetry

Cyclic voltammograms are measured from solutions having concentration of $10^{-3}$ mol/L of the respective compound (e.g., the organic molecules according to the present invention, TADF materials $E^B$ in general, host materials $H^B$ in general, phosphorescence materials $P^B$ in general, and fluorescence emitters F in general) in dichloromethane or a suitable solvent and a suitable supporting electrolyte (e.g., 0.1 mol/L of tetrabutylammonium hexafluorophosphate). The measurements are conducted at room temperature (i.e., (approximately) 20° C.) under nitrogen atmosphere with a three-electrode assembly (working and counter electrodes: Pt wire, reference electrode: Pt wire) and calibrated using $FeCp_2/FeCp_2^+$ as internal standard. The HOMO and the LUMO data is corrected using ferrocene as an internal standard—with the literature values of ferrocene used for this purpose.

Density Functional Theory Calculation

Molecular structures are optimized employing the BP86 functional and the resolution of identity approach (RI). Excitation energies are calculated using the (BP86) optimized structures employing Time-Dependent DFT (TD-DFT) methods. Orbital and excited state energies are calculated with the B3LYP functional. Def2-SVP basis sets (and a m4-grid for numerical integration were used. The Turbomole program package was used for all calculations.

Photophysical Measurements

Sample Pretreatment: Spin-Coating

Unless stated otherwise, photophysical measurements of components are performed from spin-coated films of the respective component (e.g., the organic molecules according to the present invention, TADF materials $E^B$ in general, host materials $H^B$ in general, phosphorescence materials $P^B$ in general, and fluorescence emitters F in general) in poly (methyl methacrylate), PMMA. Unless stated differently, the concentration of the components in these spin-coated PMMA films is as follows:

all organic molecules according to the present invention: 10% by weight in PMMA

TADF materials $E^B$ as defined herein: 10% by weight in PMMA phosphorescence materials $P^B$ as defined herein: 10% by weight in PMMA fluorescence emitters F as defined herein that do not form part of the organic molecules according to the invention, in particular if they are small FWHM emitters $S^B$ in the context of the present invention: 1-5%, preferably 2% by weight in PMMA.

However, host materials $H^B$ are not organic molecules according to the invention and that are not TADF materials $E^B$ or phosphorescence materials $P^B$ or fluorescence emitters F as defined herein, a spin-coated neat film of $H^B$ is used instead of a PMMA film.

Apparatus: Spin150, SPS euro.

The sample concentration is 1.0 mg/ml, typically dissolved in Toluene/DCM as suitable solvent.

Program: 7-30 sec. at 2000 U/min. After coating, the films are tried at 70° C. for 1 min.

Absorption Measurements

A Thermo Scientific Evolution 201 UV-Visible Spectrophotometer is used to determine the wavelength of the absorption maximum of the sample in the wavelength region above 270 nm. This wavelength is used as excitation wavelength for photoluminescence spectral and quantum yield measurements.

Photoluminescence Spectroscopy

For the measuring of Photoluminescence spectroscopy a fluorescence spectrometer "Fluoromax 4P" from Horiba is used.

Steady state fluorescence spectra and phosphorescence spectra from phosphorescent emitters are recorded at room temperature. The basic scheme of operation is as follows: A continuous source of light (Xenon arc lamp) shines onto an excitation monochromator, which selects a suitable band of wavelengths. This monochromatic excitation light is directed onto the sample, which emits luminescence. If the sample is a spin coated or evaporated film, it is placed in a cuvette and kept under nitrogen atmosphere during the measurement. The luminescence is directed into a second, emission monochromator, which selects a band of wavelengths, being changed during measurement, and shines them onto a photon counting detector (R928P photomultiplier tube). The signal from the detector is reported to a system controller and host computer, where the data can be processed and presented.

Phosphorescent spectra from TADF emitters are recorded at 77 K. The basic scheme of operation is as follows: A pulsed source of light (pulsed xenon lamp) is used for excitation, operating at 25 Hz. A control module including a gate-and-delay generator is used to control the timing between excitation and detection. A typical sequence of data-acquisition starts with a flash from the pulsed lamp, sensed by the control module. The light enters an excitation monochromator, where it is dispersed. Monochromatic light from the monochromator excites the sample. The sample is placed in a glass Dewar container that is filled with liquid nitrogen during the measurement. Luminescence emission from the sample then passes through an emission monochromator to a photon counting photomultiplier-tube detector. The control module intercepts the signal from the detector and collects only a gated portion of the signal only the flash (the initial delay) for a pre-determined length of sampling time (the sample window). Any signal arriving before or after the gating is ignored. The initial delay can be varied between 0 and 10000 ms and is set to exclude any contribution from initial fluorescent emission and lamp decay, preferably 50 ms. The sample window may be varied between 0.01 and 10000 ms and is set to gather phosphorescent emission, preferably 40 ms.

Time-Resolved (Transient) Photoluminescence (PL) Spectroscopy in the µs-Range and ns-Range (FS5)

Time-resolved PL measurements are performed on a FS5 fluorescence spectrometer from Edinburgh Instruments. Compared to measurements on the HORIBA setup, better light gathering allows for an optimized signal to noise ratio, which favors the FS5 system especially for transient PL measurements of delayed fluorescence characteristics. As continuous light source, the spectrometer includes a 150 W xenon arc lamp and specific wavelengths may be selected by a Czerny-Turner monochromator. However, the standard measurements are instead performed using an external VPLED variable pulsed LED with an emission wavelength of 310 nm. The sample emission is directed towards a sensitive R928P photomultiplier tube (PMT), allowing the detection of single photons with a peak quantum efficiency of up to 25% in the spectral range between 200 nm and 870 nm. The detector is a temperature stabilized PMT, providing dark counts below 300 cps (counts per second).

Data acquisition is made using the well-established technique of time correlated single photon counting (TCSPC). The FS5 is equipped with an emission monochromator, a temperature stabilized photomultiplier as detector unit and a pulsed LED (310 nm central wavelength, 910 ps pulse width) as excitation source. If the sample is a spin coated or evaporated film, it is placed in a cuvette and kept under nitrogen atmosphere during the measurement.

To determine the average decay time $\bar{\tau}$ of a measured transient photoluminescence signal, the data is fitted with a sum of n exponential functions:

$$\sum_{i=1}^{n} A_i \exp\left(-\frac{t}{t_i}\right)$$

wherein n is between 1 and 3. By weighting the specific lifetimes $\tau_i$ with the corresponding amplitudes $A_i$, the delayed fluorescence lifetime $\tau_{DF}$ is determined:

$$\tau_{DF} = \frac{\sum_{i=1}^{n} A_i \tau_i}{\sum_{i=1}^{n} A_i}$$

TCSPC (Time-Correlated Single-Photon Counting)

Excited state population dynamics are determined employing Edinburgh Instruments FS5 Spectrofluorometers, equipped with an emission monochromator, a temperature stabilized photomultiplier as detector unit and a pulsed LED (310 nm central wavelength, 910 ps pulse width) as excitation source. The samples are placed in a cuvette and flushed with nitrogen during the measurements.

Full Decay Dynamics

The full excited state population decay dynamics over several orders of magnitude in time and signal intensity is achieved by carrying out TCSPC measurements in 4 time windows: 200 ns, 1 µs, and 20 µs, and a longer measurement spanning >80 µs. The measured time curves are then processed in the following way:

A background correction is applied by determining the average signal level before excitation and subtracting.

The time axes are aligned by taking the initial rise of the main signal as reference.

The curves are scaled onto each other using overlapping measurement time regions.

The processed curves are merged to one curve.

Data Analysis

Data analysis is done using mono-exponential and bi-exponential fitting of prompt fluorescence (PF)(usually in the order of nanoseconds) and delayed fluorescence (DF) (usually in the order of microseconds) decays separately. The ratio of delayed and prompt fluorescence (n-value) is calculated by the integration of respective photoluminescence decays in time.

$$\frac{\int I_{DF}(t)dt}{\int I_{PF}(t)dt} = n$$

The average excited state life time is calculated by taking the average of prompt and delayed fluorescence decay time, weighted with the respective contributions of PF and DF.

Photoluminescence Quantum Yield Measurements

For photoluminescence quantum yield (PLQY) measurements an Absolute PL Quantum Yield Measurement C9920-03G system (Hamamatsu Photonics) is used. Quantum yields and CIE coordinates are determined using the software U6039-05 version 3.6.0.

Emission maxima are given in nm, quantum yields Φ in % and CIE coordinates as x,y values.

The photoluminescence quantum yield (PLQY) is determined using the following protocol:

Quality assurance: Anthracene in ethanol (known concentration) is used as reference.

Excitation wavelength: the absorption maximum of the organic molecule is determined and the molecule is excited using this wavelength Measurement Quantum yields are measured at room temperature (i.e., (approximately) 20° C.) from the aforementioned spin-coated films under nitrogen atmosphere. The PLQY is calculated using the following equation:

$$\Phi_{PL} = \frac{n_{photon}, \text{emitted}}{n_{photon}, \text{absorbed}} = \frac{\int_{\lambda_3}^{\lambda_4} \frac{\lambda}{hc}[I_{sample}(\lambda) - I_{reference}(\lambda)]d\lambda}{\int_{\lambda_1}^{\lambda_2} \frac{\lambda}{hc}[I_{reference}(\lambda) - I_{sample}(\lambda)]d\lambda},$$

wherein $n_{photon}$ denotes the photon count and I the intensity. The index 'reference' refers to a reference measurement without the emitting sample, the index 'sample' refers to a measurement with the emitting sample. The wavelengths $\lambda_1$ and $\lambda_2$ mark the region of the excitation light, the wavelengths $\lambda_3$ and $\lambda_4$ mark the region of the sample emission.

Production and Characterization of Optoelectronic Devices

Via vacuum-deposition methods OLED devices including organic molecules according to the invention can be produced. If a layer contains more than one compound, the weight-percentage of one or more compounds is given in %. The total weight-percentage values amount to 100%, thus if a value is not given, the fraction of this compound equals to the difference between the given values and 100%.

The not fully optimized OLEDs are characterized using standard methods and measuring electroluminescence spectra, the external quantum efficiency (in %) in dependency on the intensity, calculated using the light detected by the photodiode, and the current. The OLED device lifetime is extracted from the change of the luminance during operation at constant current density. The LT50 value corresponds to the time, where the measured luminance decreased to 50% of the initial luminance, analogously LT80 corresponds to the time point, at which the measured luminance decreased to 80% of the initial luminance, LT97 to the time point, at which the measured luminance decreased to 97% of the initial luminance etc.

Accelerated lifetime measurements are performed (e.g., applying increased current densities). Exemplarily LT80 values at 500 cd/m² are determined using the following equation:

$$LT80\left(500\frac{cd^2}{m^2}\right) = LT80(L_0)\left(\frac{L_0}{500\frac{cd^2}{m^2}}\right)^{1.6}$$

wherein $L_0$ denotes the initial luminance at the applied current density.

The values correspond to the average of several pixels (typically two to eight), the standard deviation between these pixels is given. Figures show the data series for one OLED pixel.

HPLC-MS

The purity of organic compounds can be assessed using high pressure liquid chromatography (HPLC) coupled with mass spectrometry (MS). Such HPLC-MS measurements were performed using a HPLC1260 Infinity HPLC-MS system by Agilent with a single quadrupole MS-detector. For example, a typical HPLC method is as follows: a reverse phase column 3.0 mm×100 mm, particle size 2.7 μm from Agilent (Poroshell 120EC-C18, 3.0×100 mm, 2.7 μm HPLC column) is used in the HPLC. The HPLC-MS measurements are performed at 45° C. and a typical gradient is as follows:

| Flow rate [ml/min] | Time [min] | A[%] | B[%] | C[%] |
|---|---|---|---|---|
| 2.1 | 0.0 | 40 | 50 | 10 |
| 2.1 | 1.00 | 40 | 50 | 10 |
| 2.1 | 3.50 | 10 | 65 | 25 |
| 2.1 | 6.00 | 10 | 40 | 50 |
| 2.1 | 8.00 | 10 | 10 | 80 |
| 2.1 | 11.50 | 10 | 10 | 80 |
| 2.1 | 11.51 | 40 | 50 | 10 |
| 2.1 | 12.50 | 40 | 50 | 10 | and the following solvent mixtures (all solvents contain 0.1% (V/V) of formic acid):

| Solvent A: | H$_2$O (10%) | MeCN (90%) |
| Solvent B: | H$_2$O (90%) | MeCN (10%) |
| Solvent C: | THF (50%) | MeCN (50%) |

An injection volume of 2 μL of a solution with a concentration of 0.5 mg/mL of the analyte is used for the measurements.

Ionization of the probe is performed using an atmospheric pressure chemical ionization (APCI) source either in positive (APCI+) or negative (APCI−) ionization mode or an atmospheric pressure photoionization (APPI) source.

Example 1

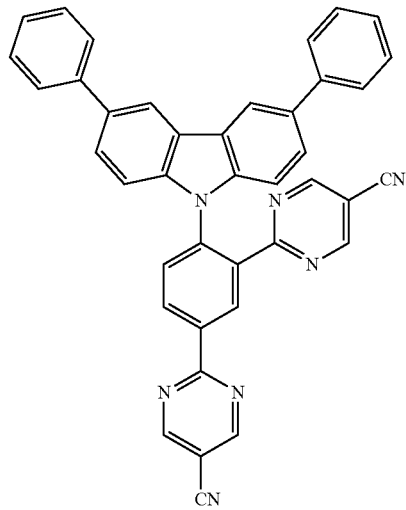 [SMILES: N#Cc1cnc(-c2ccc(-n3c4ccc(-c5ccccc5)cc4c4cc(-c5ccccc5)ccc43)c(-c3ncc(C#N)cn3)c2)nc1]

Example 1 was synthesized according to procedure 1 (yield 53%), procedure 2 (yield 62%) and procedure 3 (yield 32%), where 3,6-diphenylcarbazole CAS 56525-79-2 was used as educt E4.

MS (HPLC-MS), m/z (retention time): 602.4 (6.61 min).

FIG. 1 depicts the emission spectrum of example 1 (10% by weight in PMMA) at room temperature (i.e., approximately 20° C.). The emission maximum ($\lambda_{max}$) is at 521 nm. The photoluminescence quantum yield (PLQY) is 61%, the full width at half maximum (FWHM) is 0.39 eV, and the emission lifetime is 32.2 μs. The resulting $CIE_x$ coordinate is determined at 0.30 and the CIEy coordinate at 0.56.

Example 2

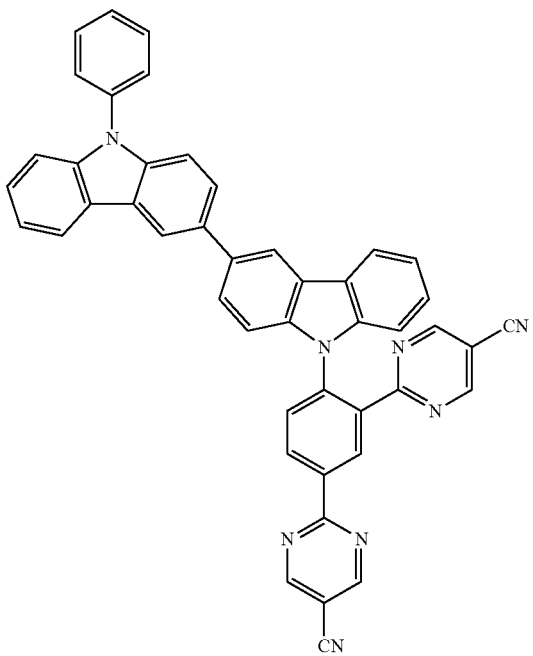 [SMILES: N#Cc1cnc(-c2ccc(-n3c4ccccc4c4cc(-c5ccc6c(c5)c5ccccc5n6-c5ccccc5)ccc43)c(-c3ncc(C#N)cn3)c2)nc1]

Example 2 was synthesized according to procedure 1 (yield 53%), procedure 2 (yield 62%) and procedure 3 (yield 6%) where 9-Phenyl-9H,9"H-[3,3']bicarbazolyl CAS 1060735-14-9 was used as educt E4.

MS (HPLC-MS), m/z (retention time): 691.6 (4.10 min).

FIG. 2 depicts the emission spectrum of example 2 (10% by weight in PMMA) at room temperature (i.e., approximately 20° C.). The emission maximum (Amax) is at 533 nm. The photoluminescence quantum yield (PLQY) is 41%, the full width at half maximum (FWHM) is 0.43 eV, and the emission lifetime is 17.6 μs. The resulting $CIE_x$ coordinate is determined at 0.36 and the CIEy coordinate at 0.56.

Example 3

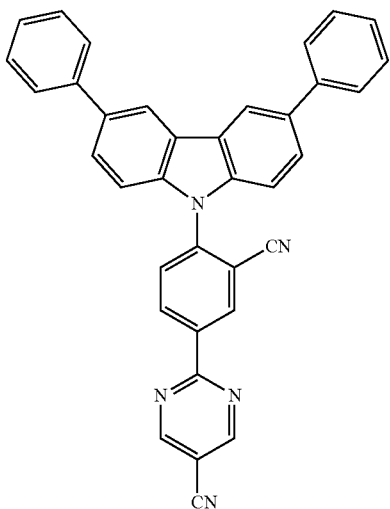 [SMILES: N#Cc1cnc(-c2ccc(-n3c4ccc(-c5ccccc5)cc4c4cc(-c5ccccc5)ccc43)c(C#N)c2)nc1]

Example 3 was synthesized according to procedure 6 (yield 71%), where 3,6-diphenylcarbazole CAS 56525-79-2 was used as educt E4, procedure 7 (58%) and procedure 8 (yield 76%), where 2,7-chloropyrimidine-5-carbonitrile CAS 1753-50-0 was used as educt E2'.

MS (HPLC-MS), m/z (retention time): 524.5 (3.39 min).

FIG. 3 depicts the emission spectrum of example 3 (10% by weight in PMMA) at room temperature (i.e., approximately 20° C.). The emission maximum (λmax) is at 503 nm. The photoluminescence quantum yield (PLQY) is 84%, the full width at half maximum (FWHM) is 0.45 eV, and the emission lifetime is 73.5 µs. The resulting $CIE_x$ coordinate is determined at 0.25 and the CIEy coordinate at 0.47.

Example 4

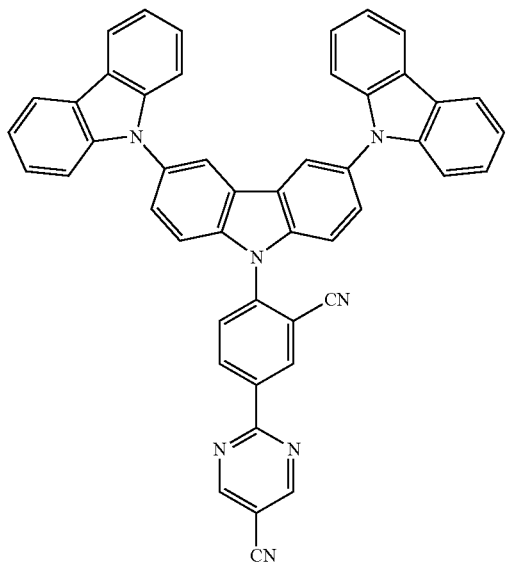 [SMILES: N#Cc1cnc(-c2ccc(-n3c4ccc(-n5c6ccccc6c6ccccc65)cc4c4cc(-n5c6ccccc6c6ccccc65)ccc43)c(C#N)c2)nc1]

Example 4 was synthesized according to procedure 4 (yield 51%), and procedure 5 (yield 41%), where 6-(9H-carbazol-9-yl)-9H-3,9''-bicarbazole CAS 606129-90-2 was used as educt E4.

MS (HPLC-MS), m/z (retention time): 701.8 (4.45 min).

FIG. 4 depicts the emission spectrum of example 4 (10% by weight in PMMA) at room temperature (i.e., approximately 20° C.). The emission maximum (λmax) is at 511 nm. The photoluminescence quantum yield (PLQY) is 69%, the full width at half maximum (FWHM) is 0.49 eV, and the emission lifetime is 41.0 µs. The resulting $CIE_x$ coordinate is determined at 0.28 and the CIEy coordinate at 0.48.

Additional Examples of Organic Molecules of the Invention

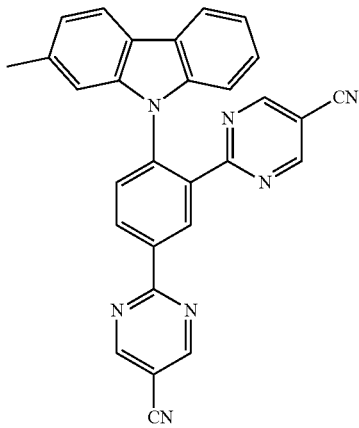

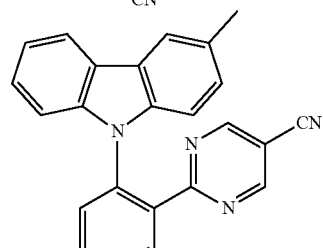

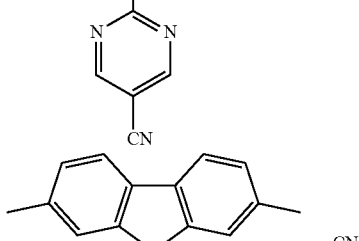

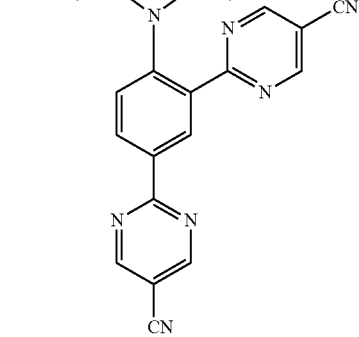

139
-continued
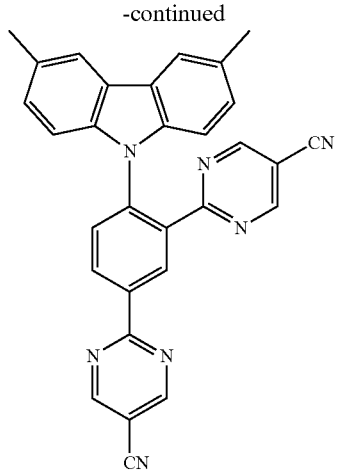
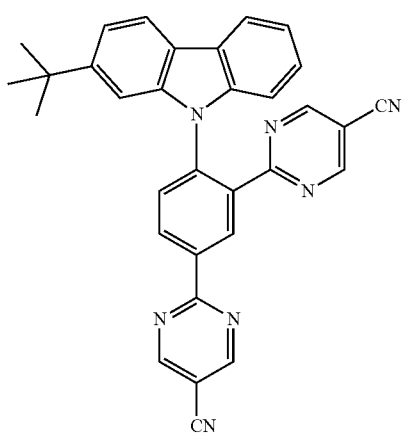
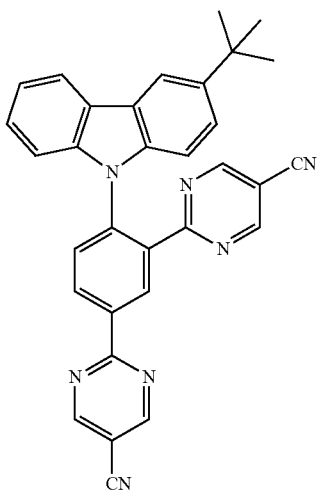
140
-continued
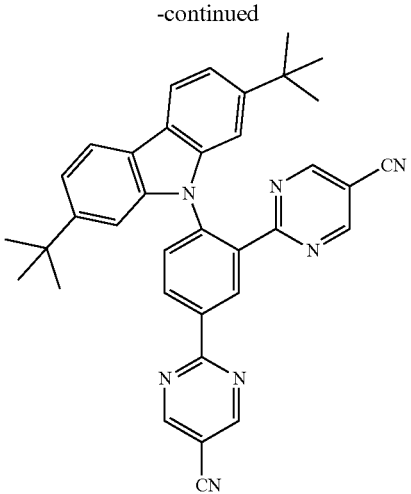
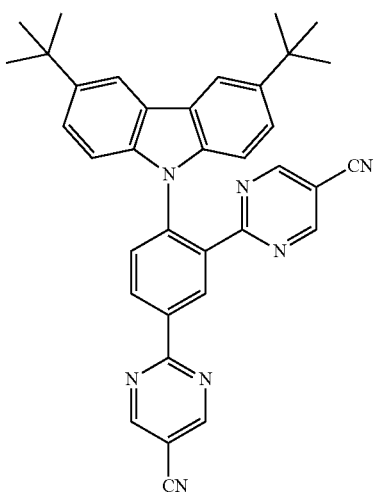
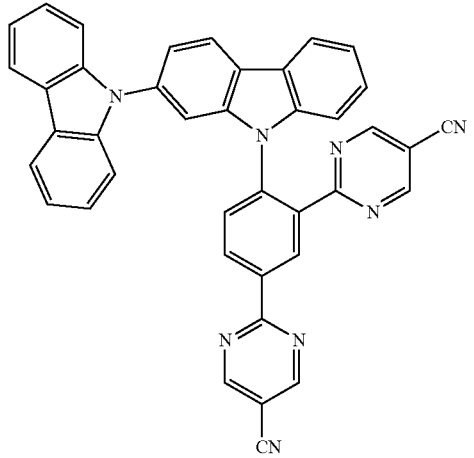

141
-continued
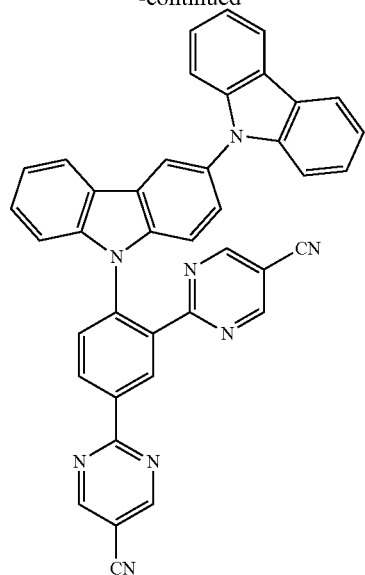
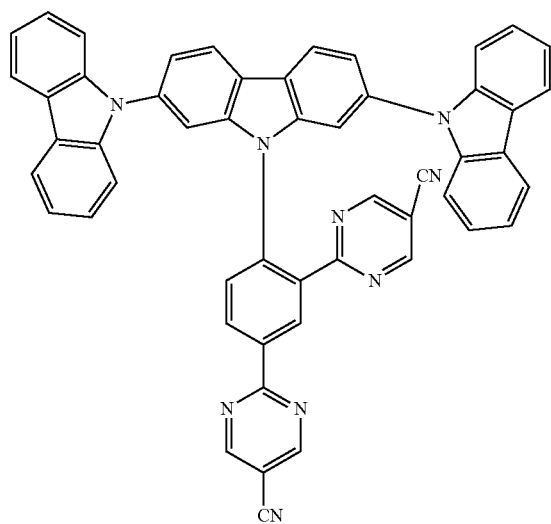
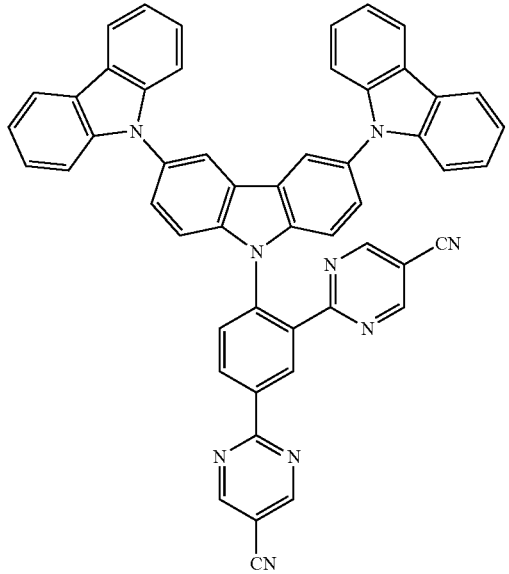
142
-continued
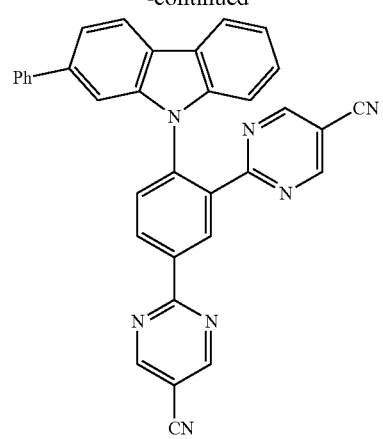
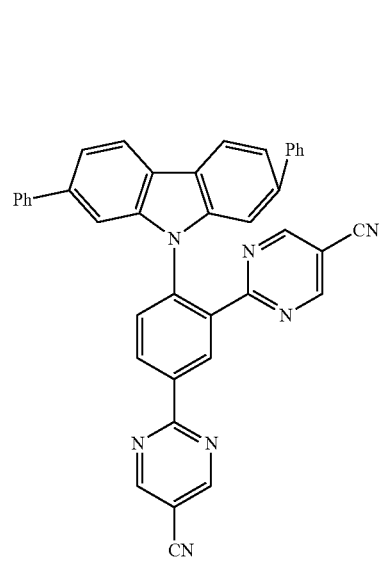

143
-continued
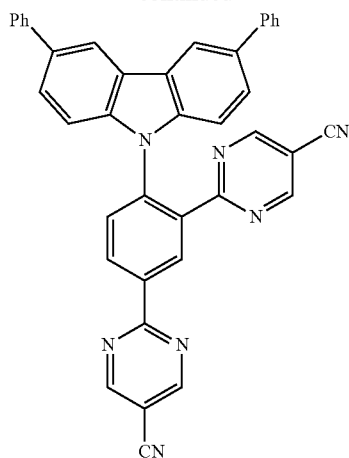
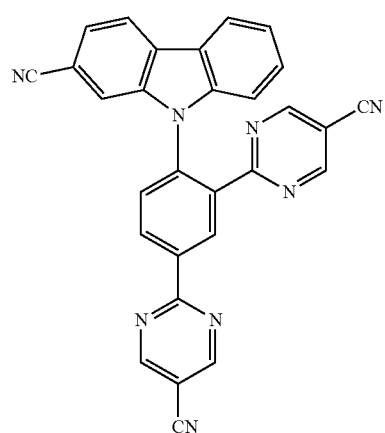
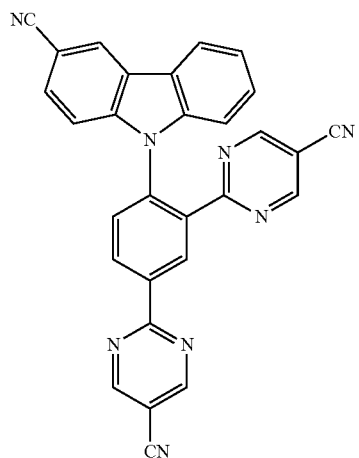
144
-continued
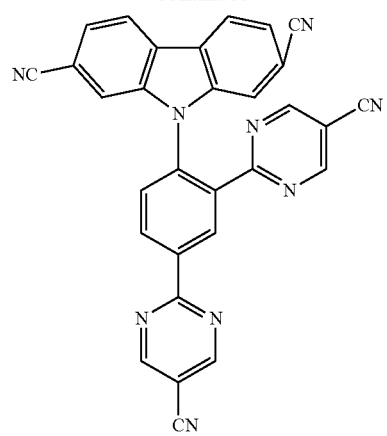
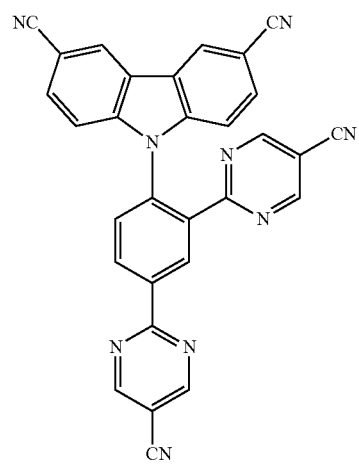
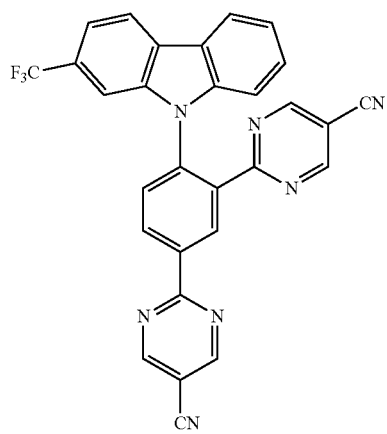

145
-continued
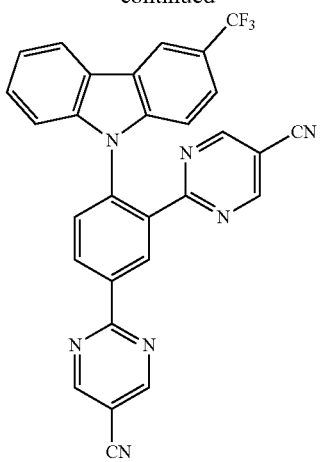
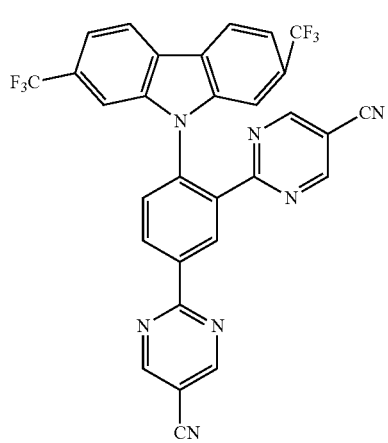
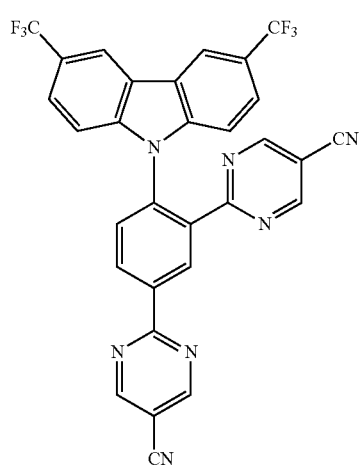
146
-continued
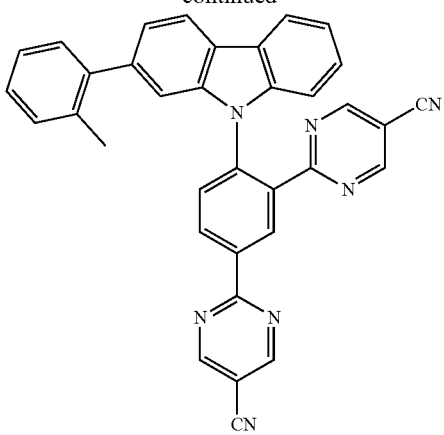
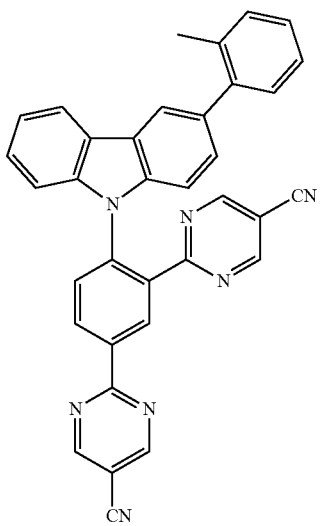
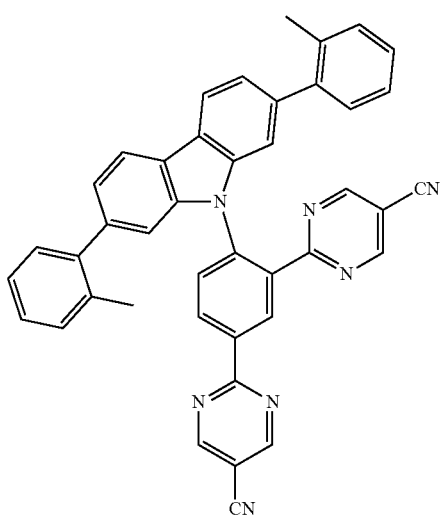

147
-continued
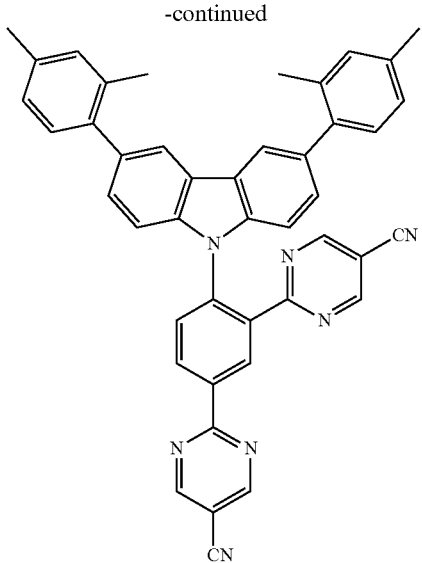
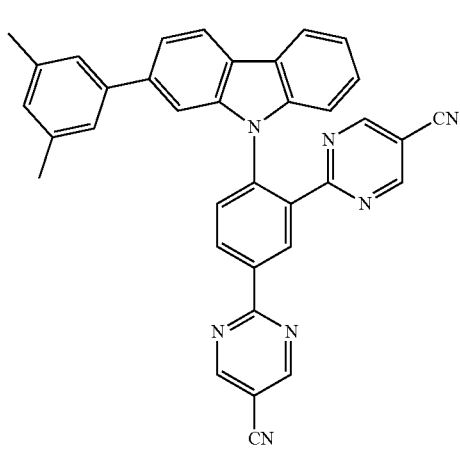
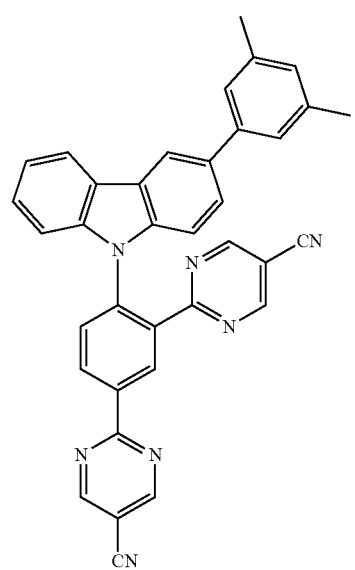
148
-continued
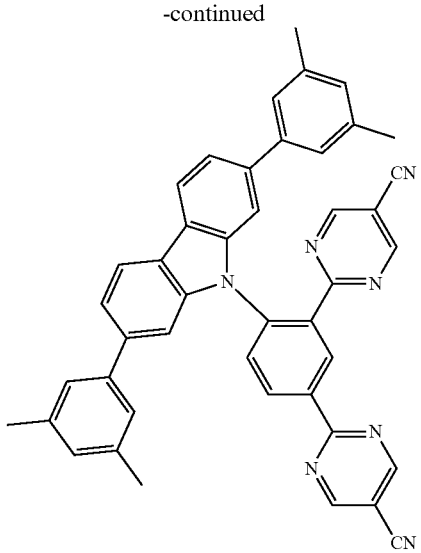
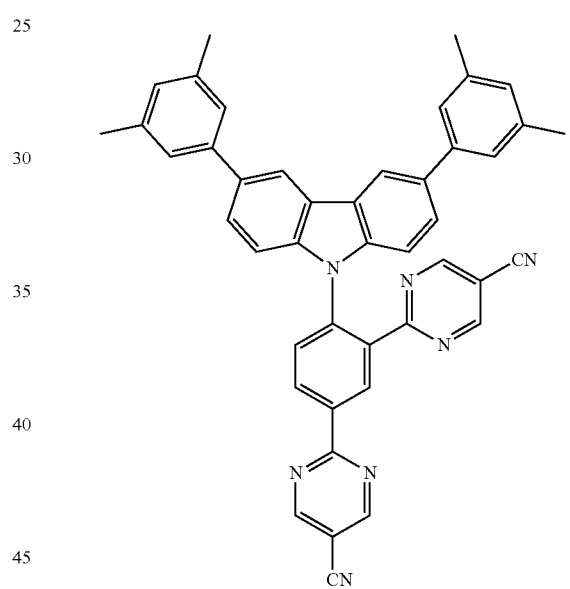
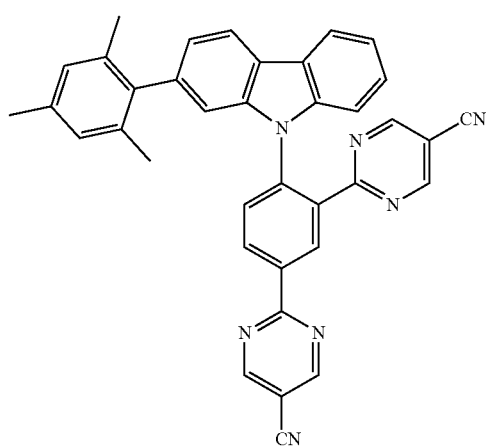

149
-continued
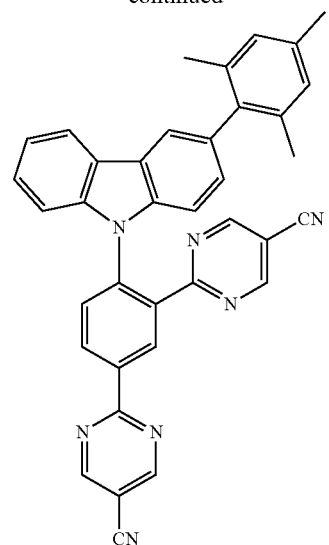
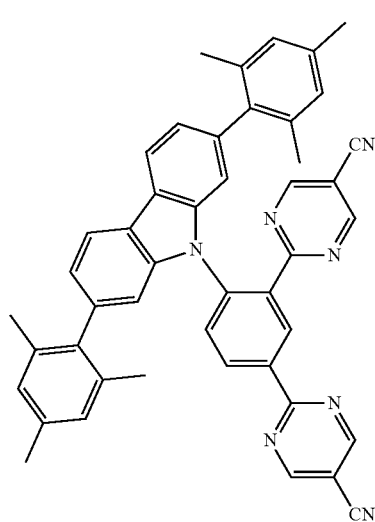
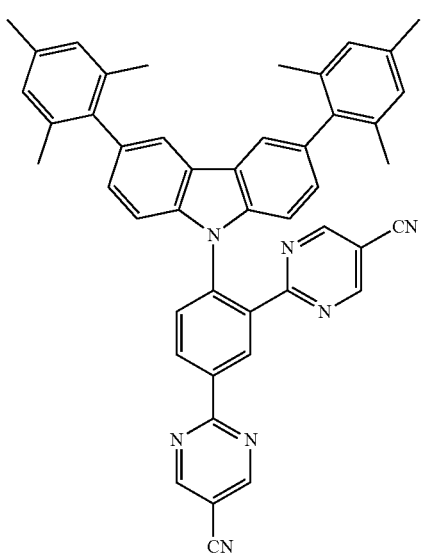
150
-continued
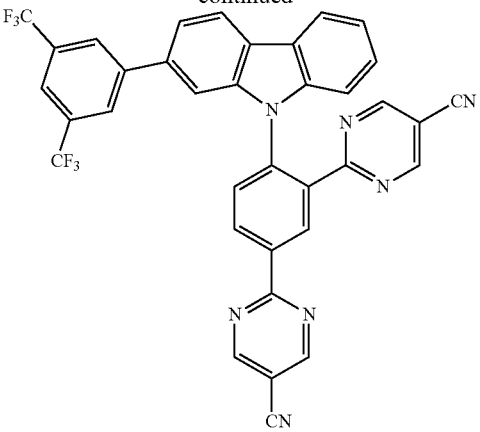
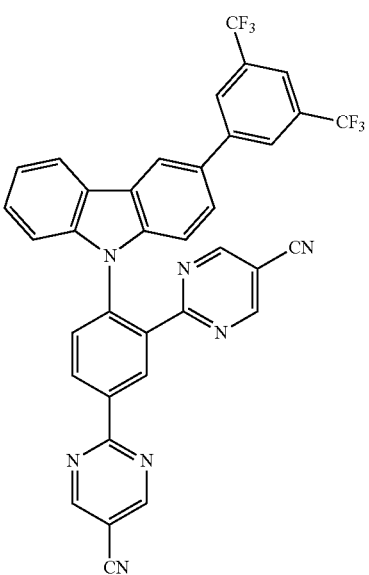
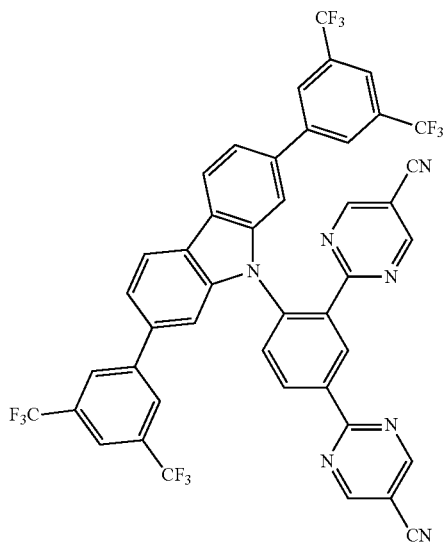

151
-continued
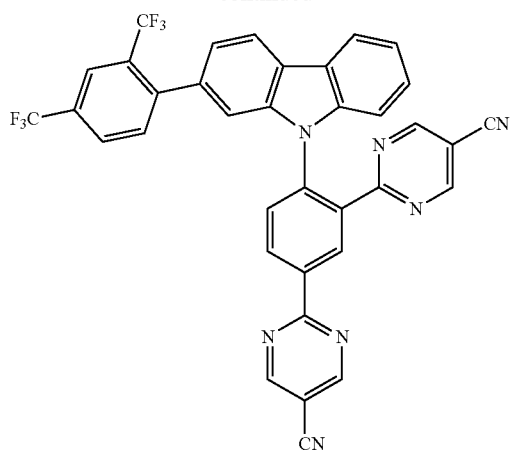
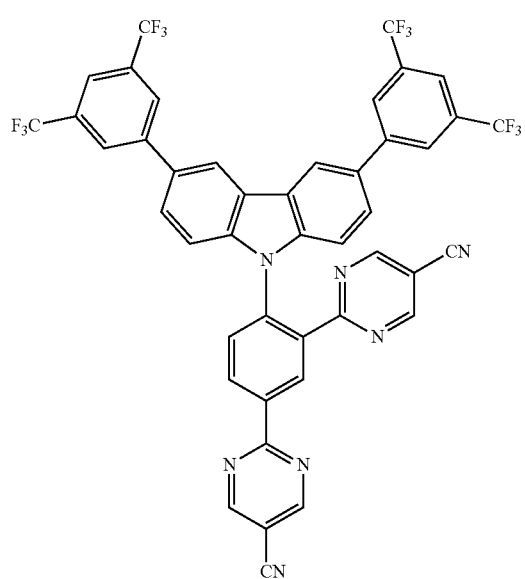
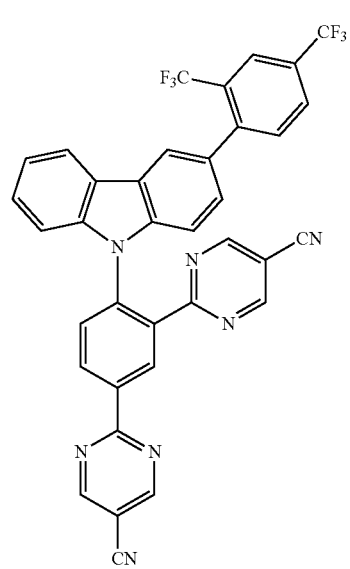
152
-continued
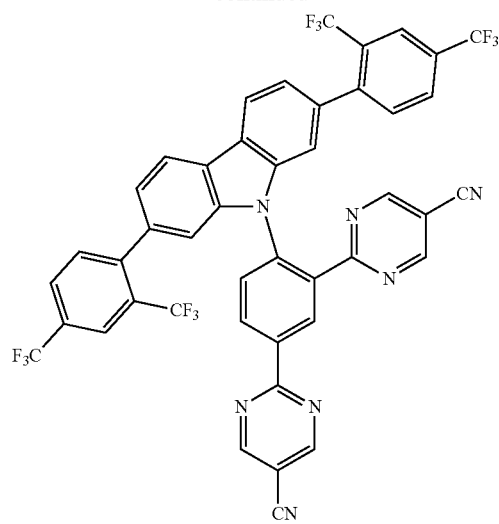
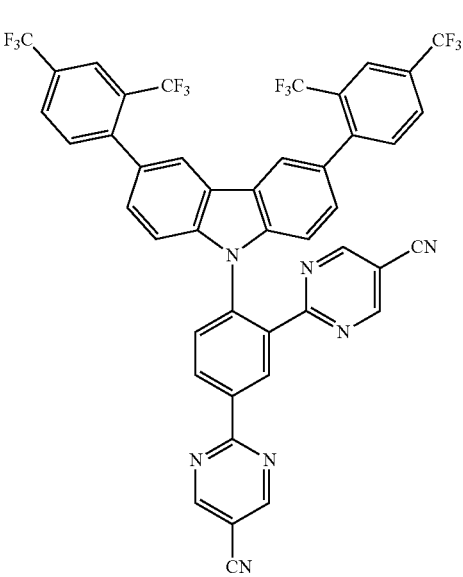
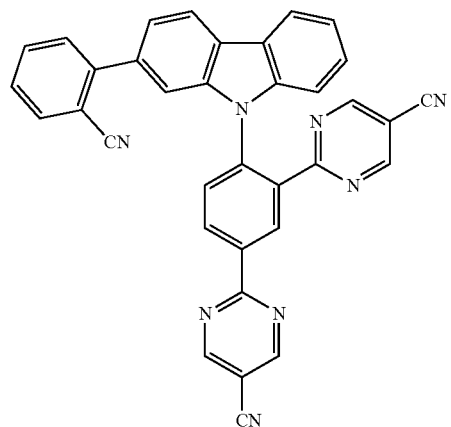

153
-continued
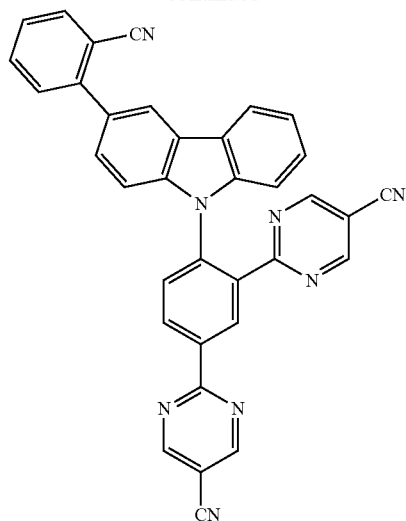
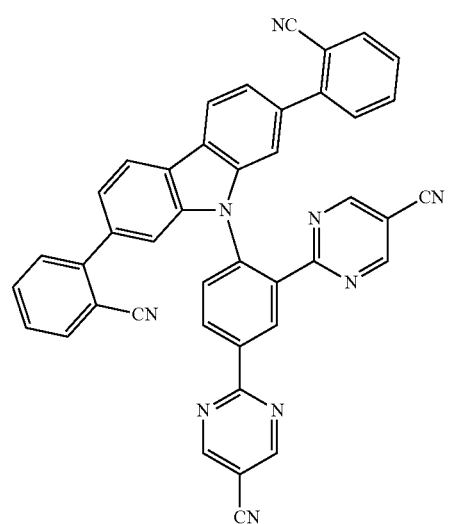
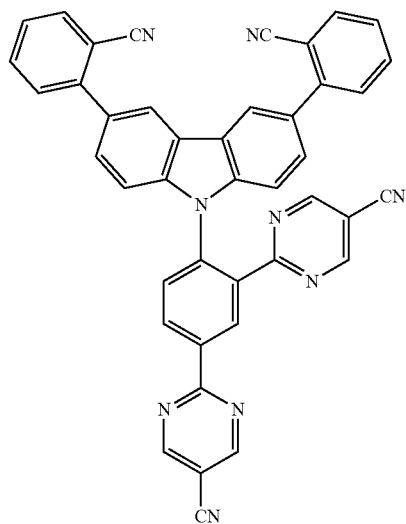
154
-continued
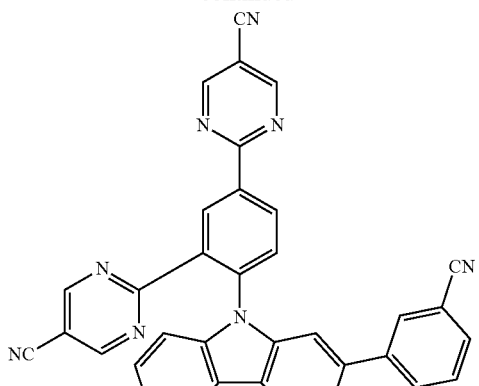
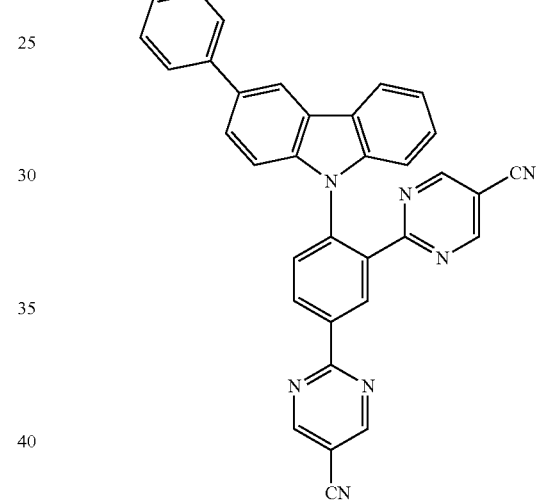
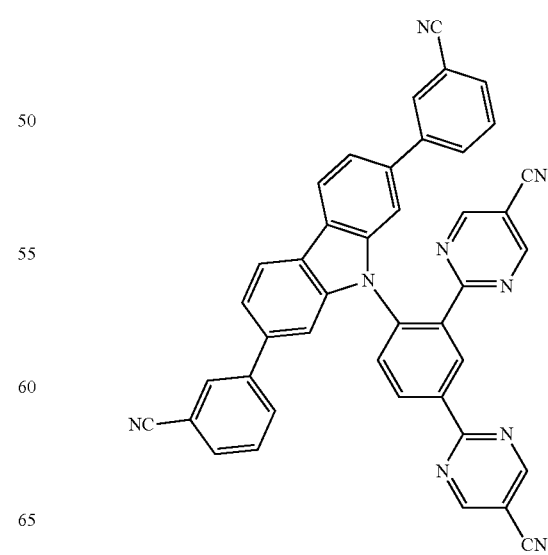

155
-continued
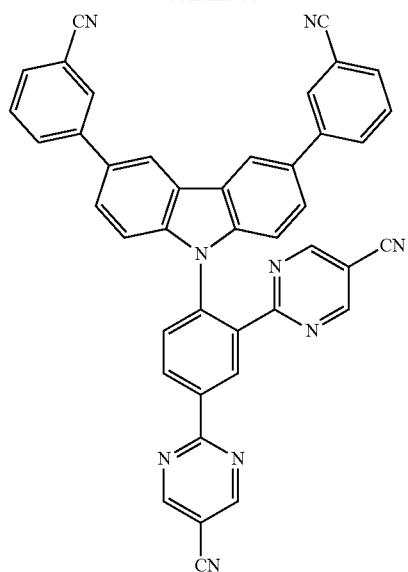
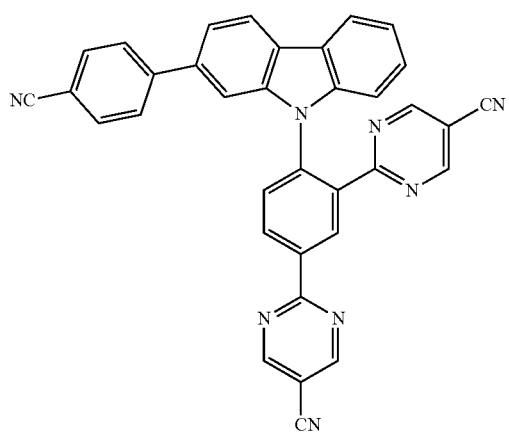
156
-continued
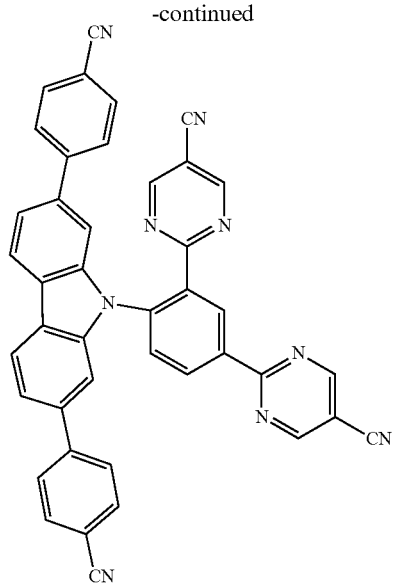
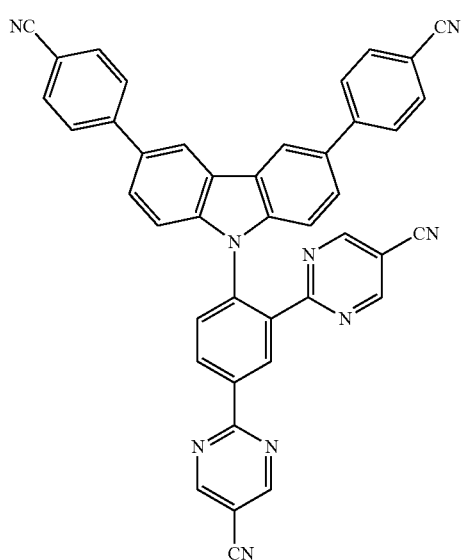
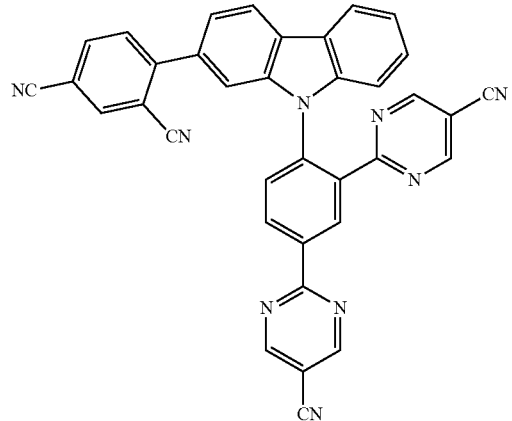

157
-continued
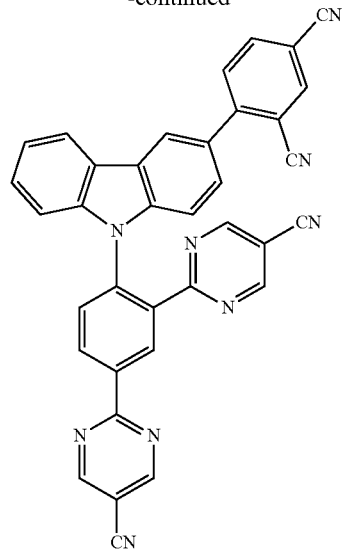
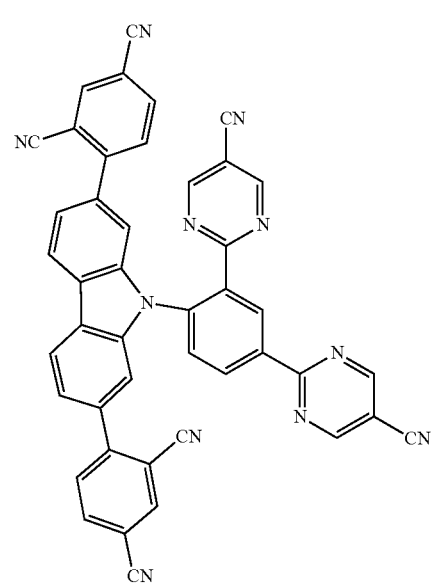
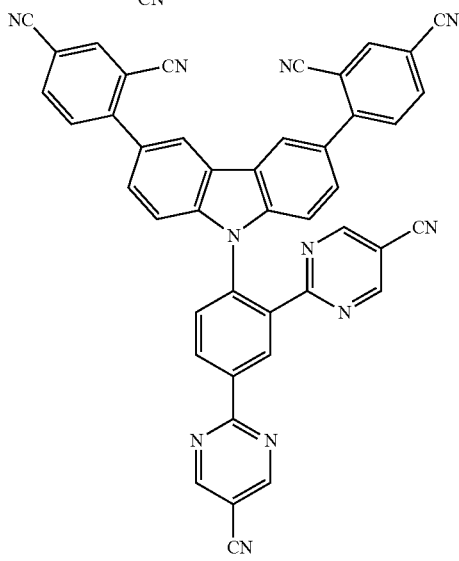
158
-continued
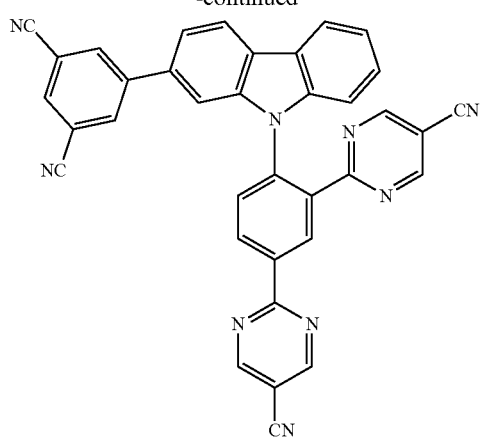
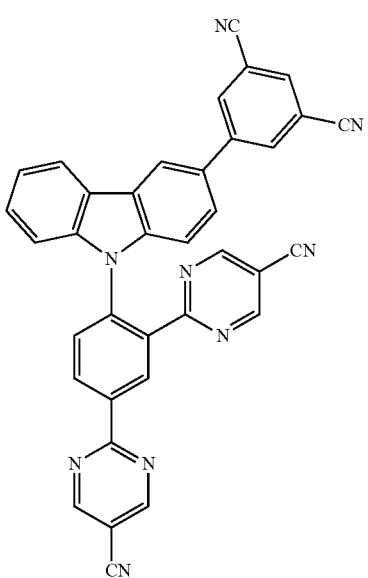
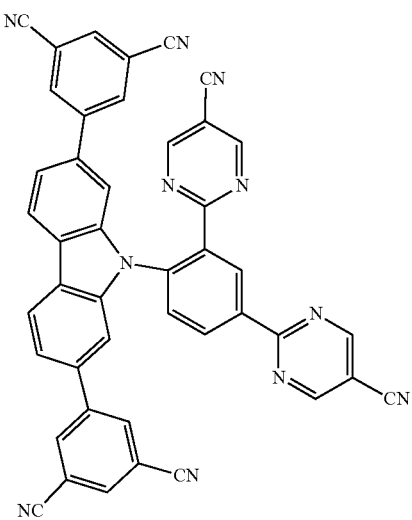

159
-continued
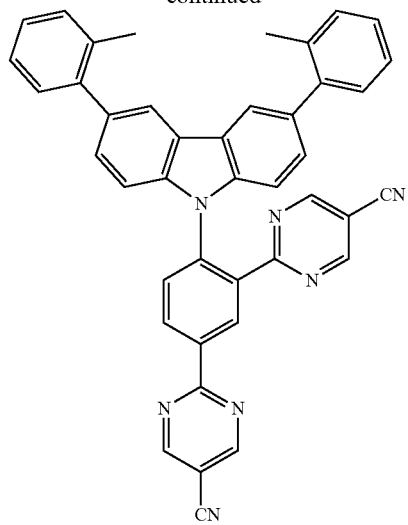
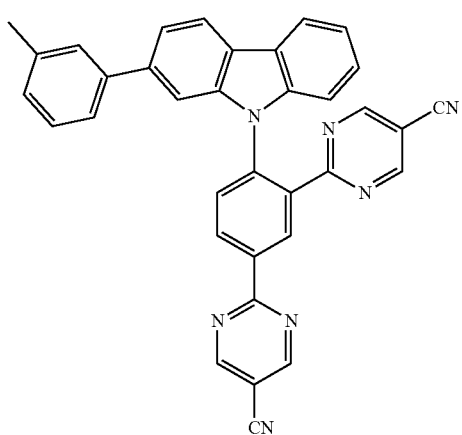
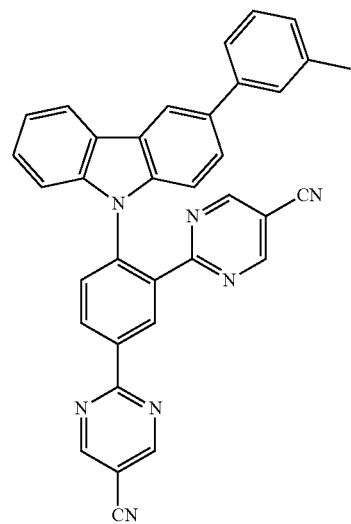
160
-continued
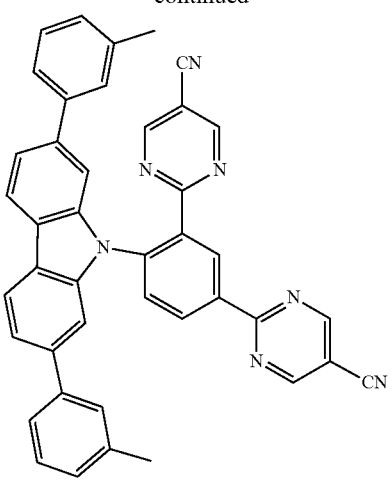
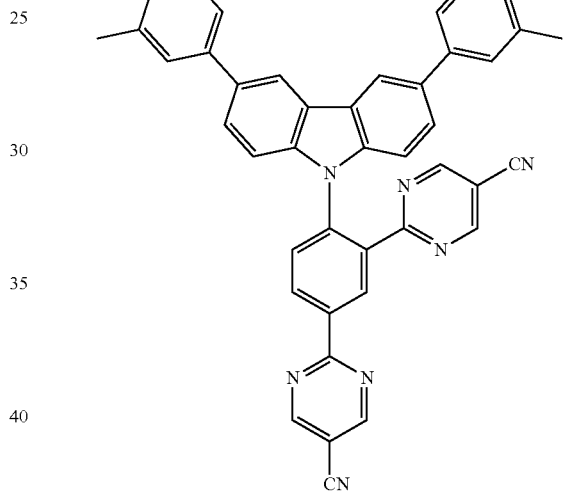
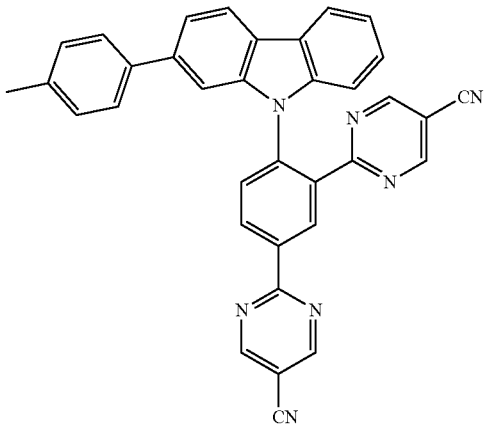

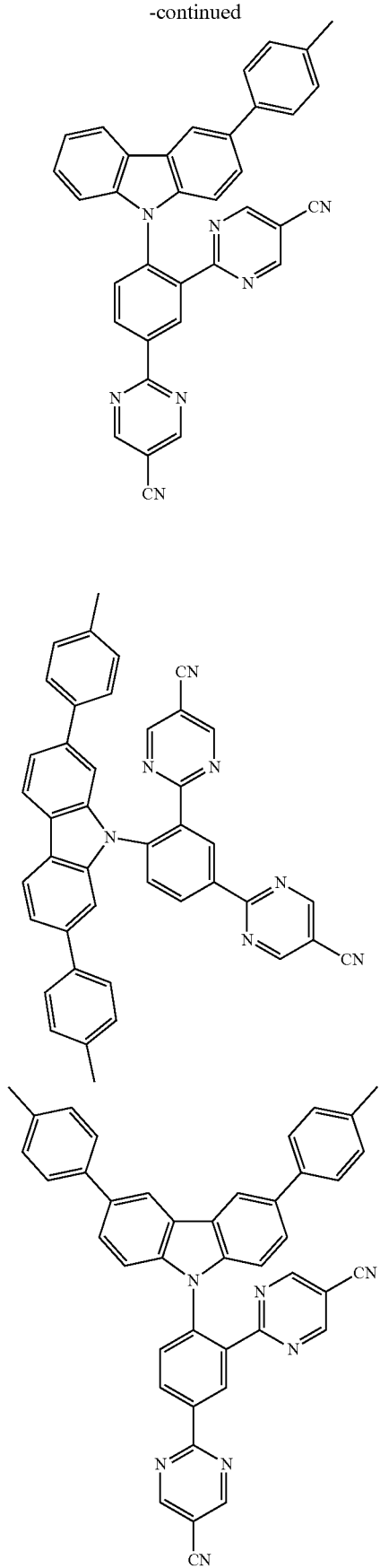
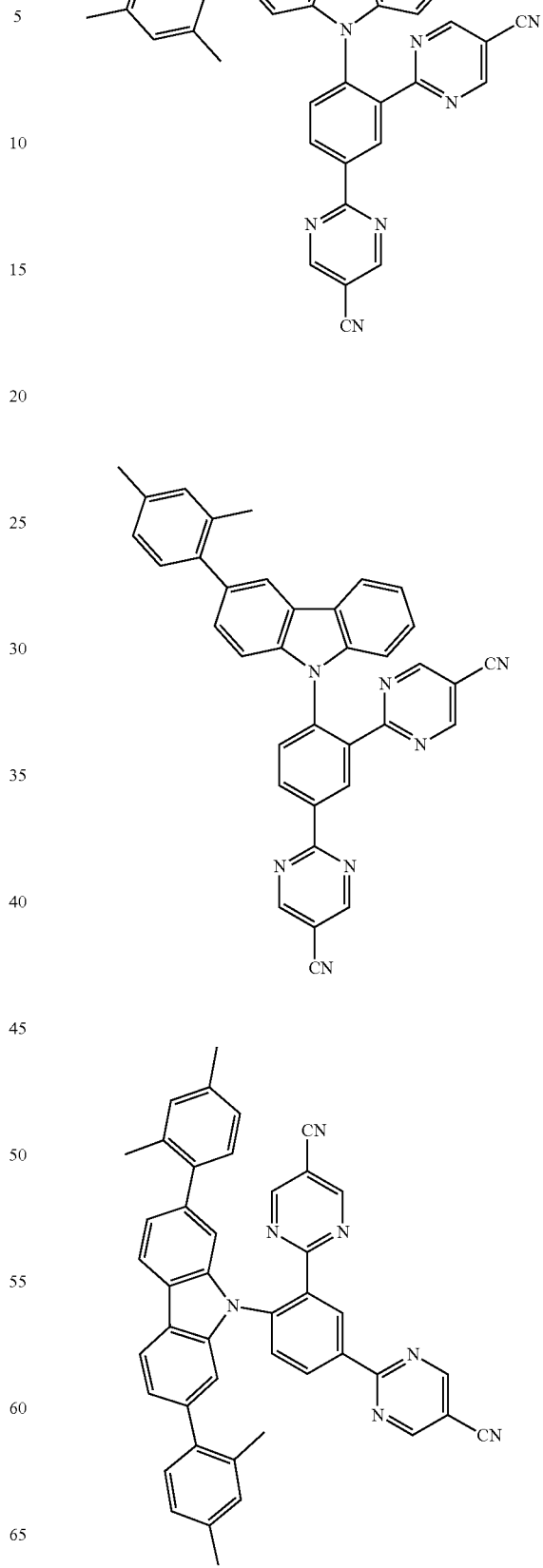

163
-continued
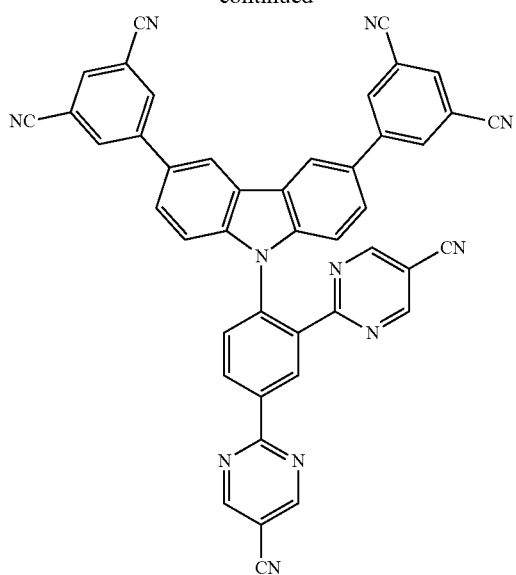
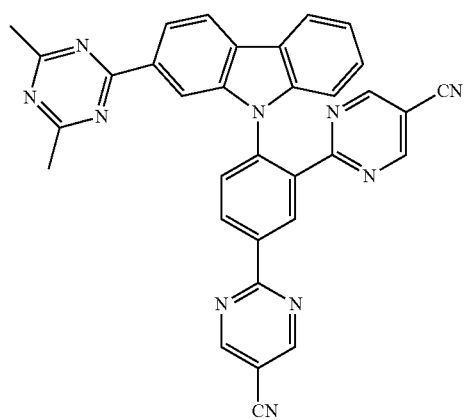
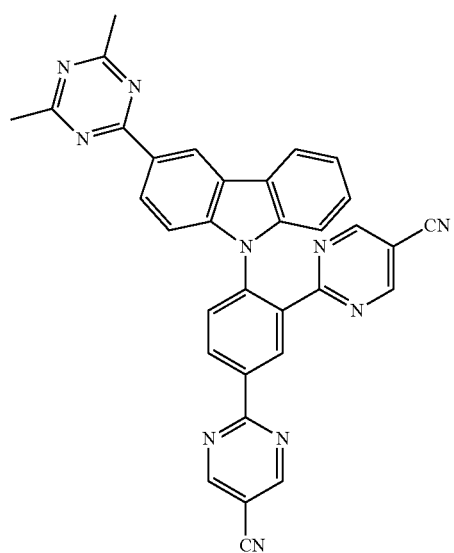
164
-continued
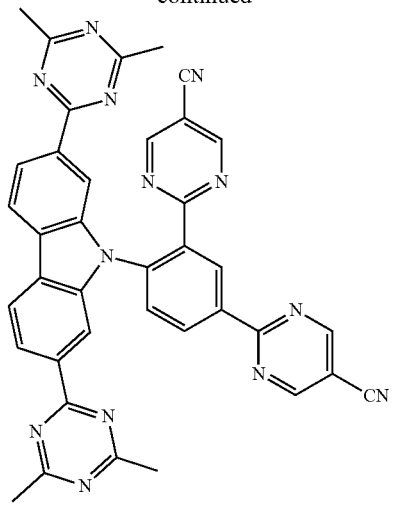
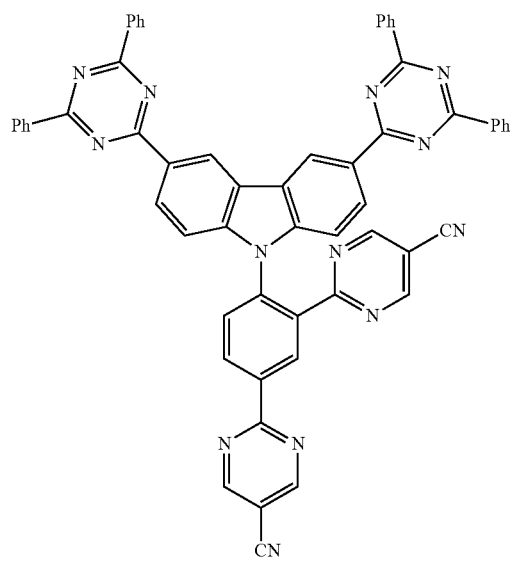
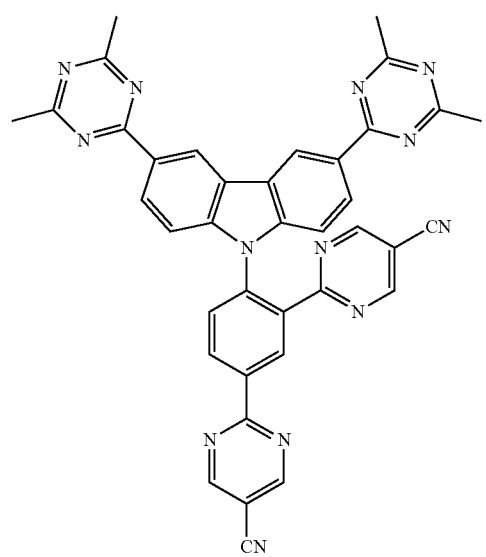

165
-continued
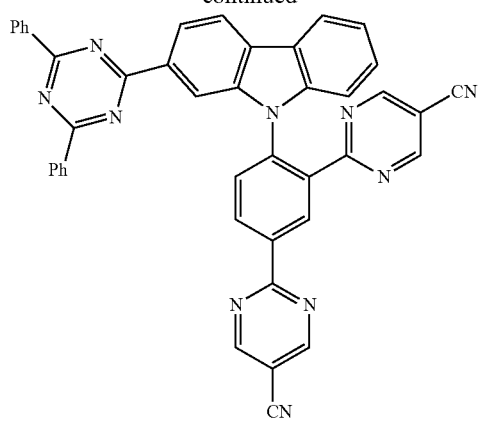
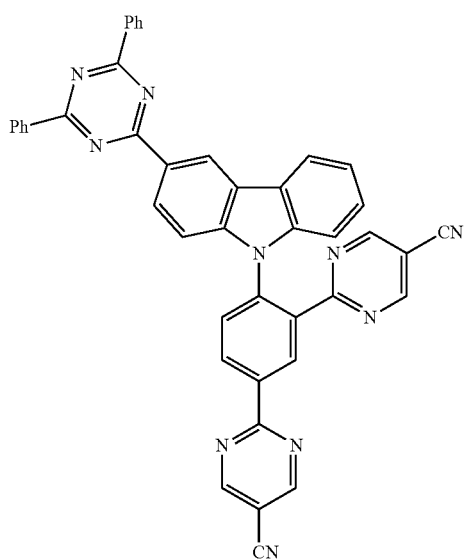
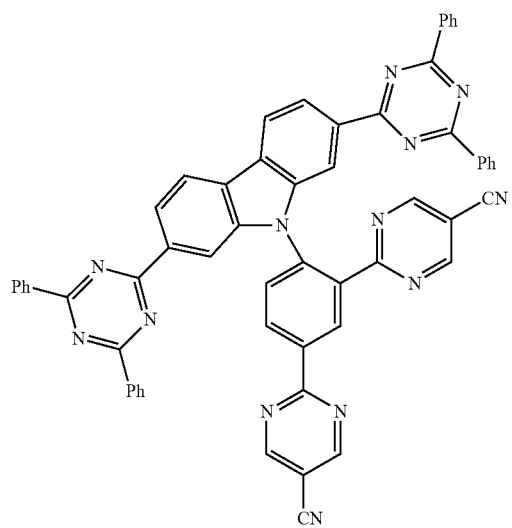
166
-continued
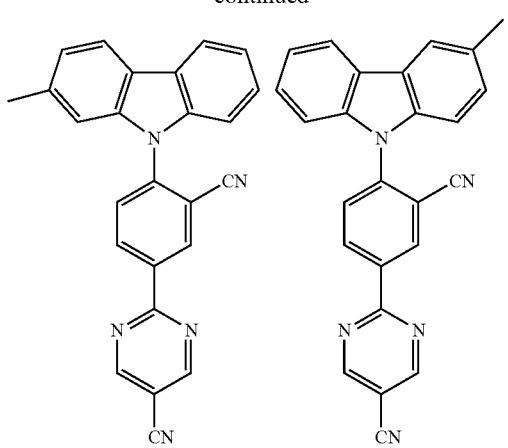
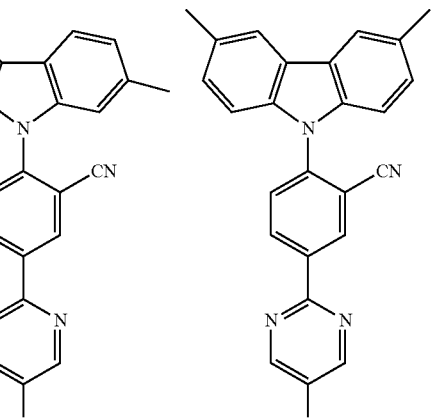
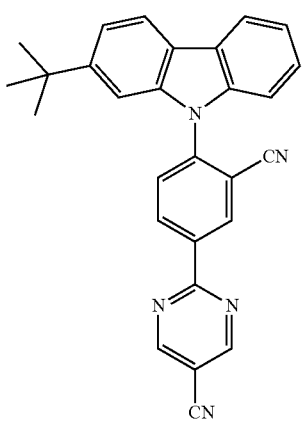

167
-continued
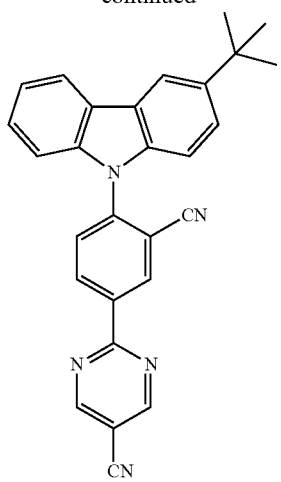
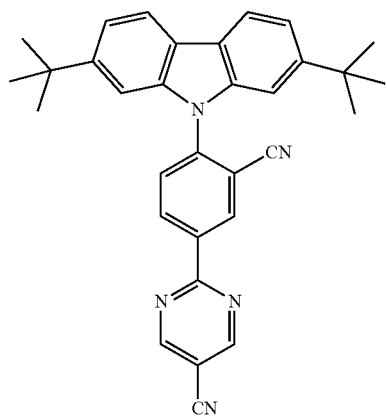
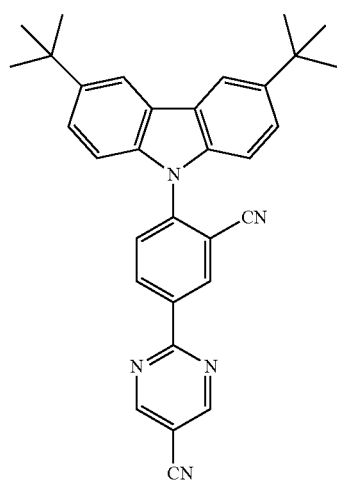
168
-continued
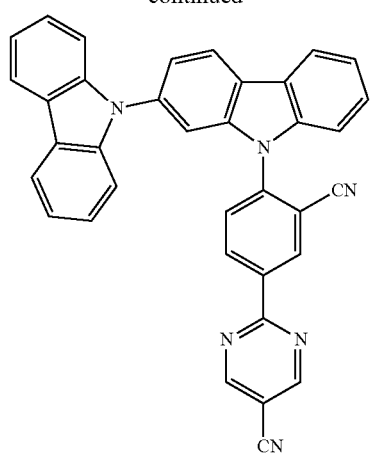
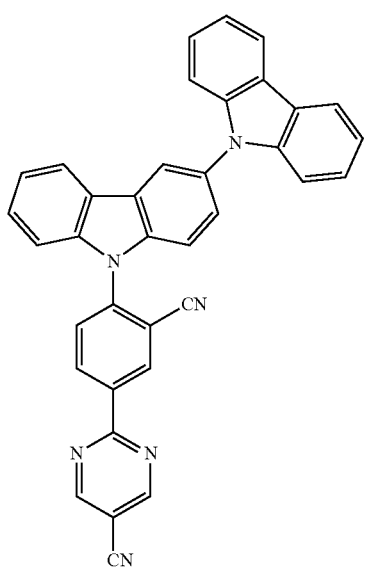
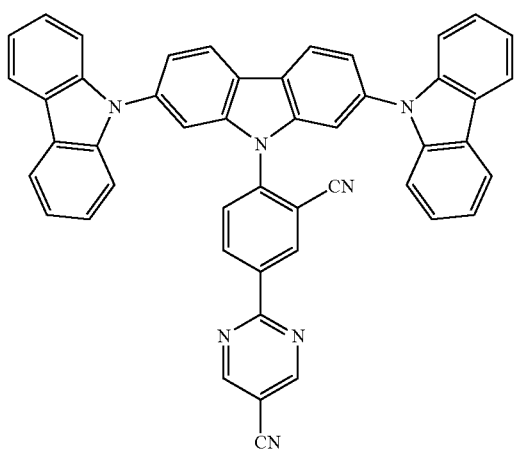

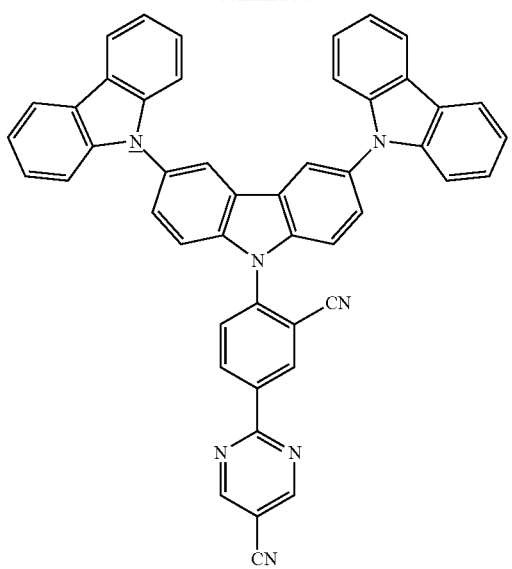
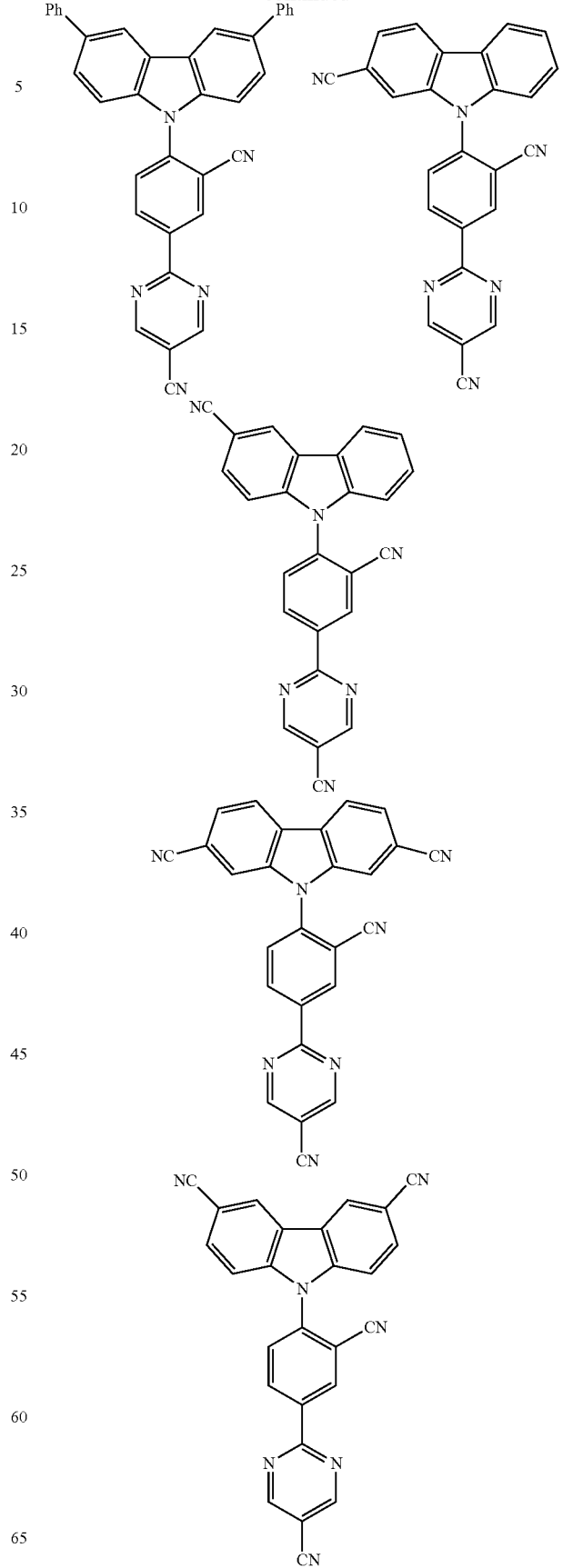

171
-continued
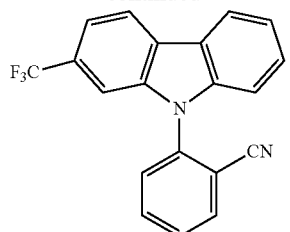
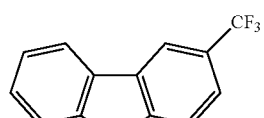
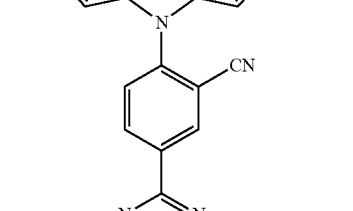
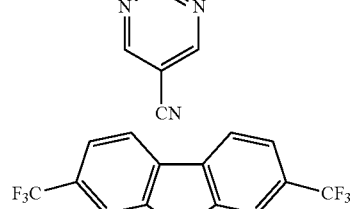
172
-continued
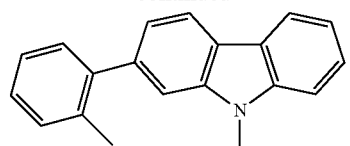
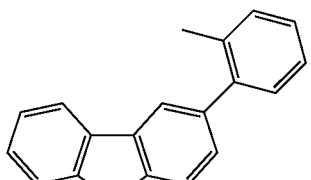
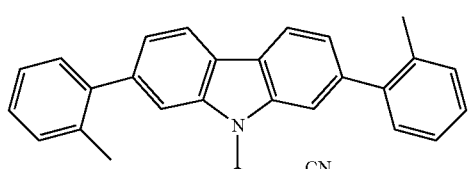

173
-continued
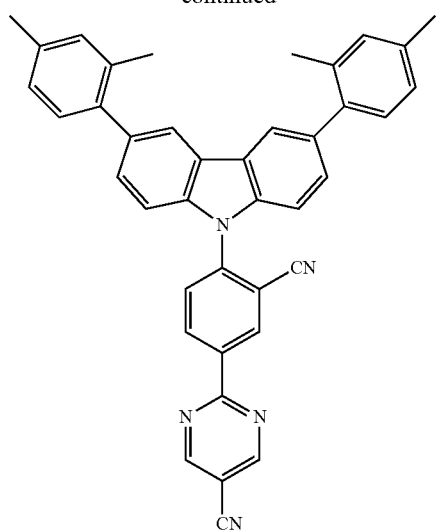
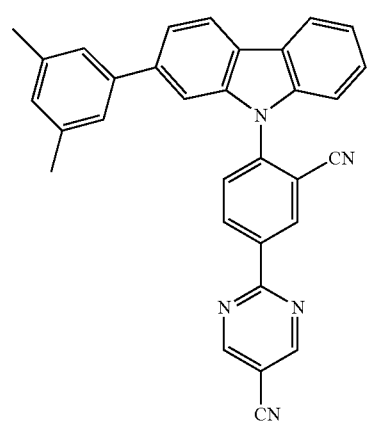
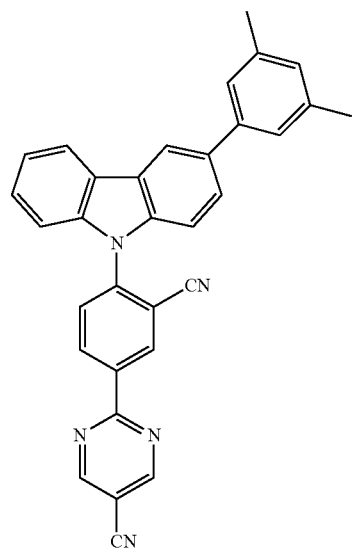
174
-continued
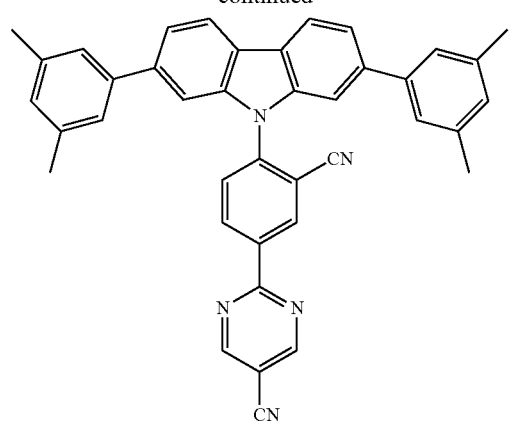
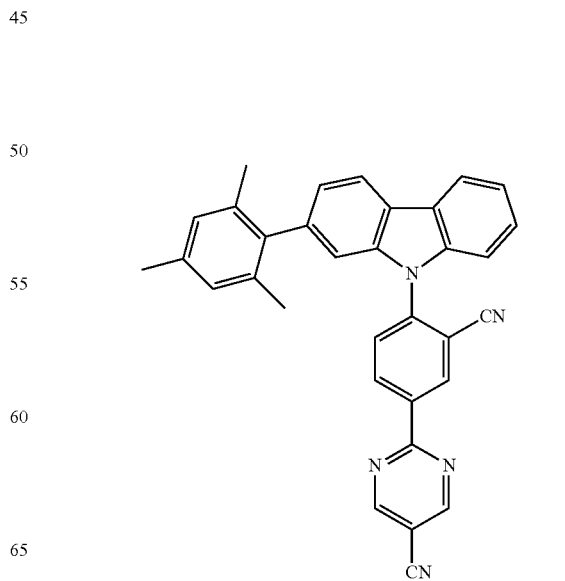

175
-continued
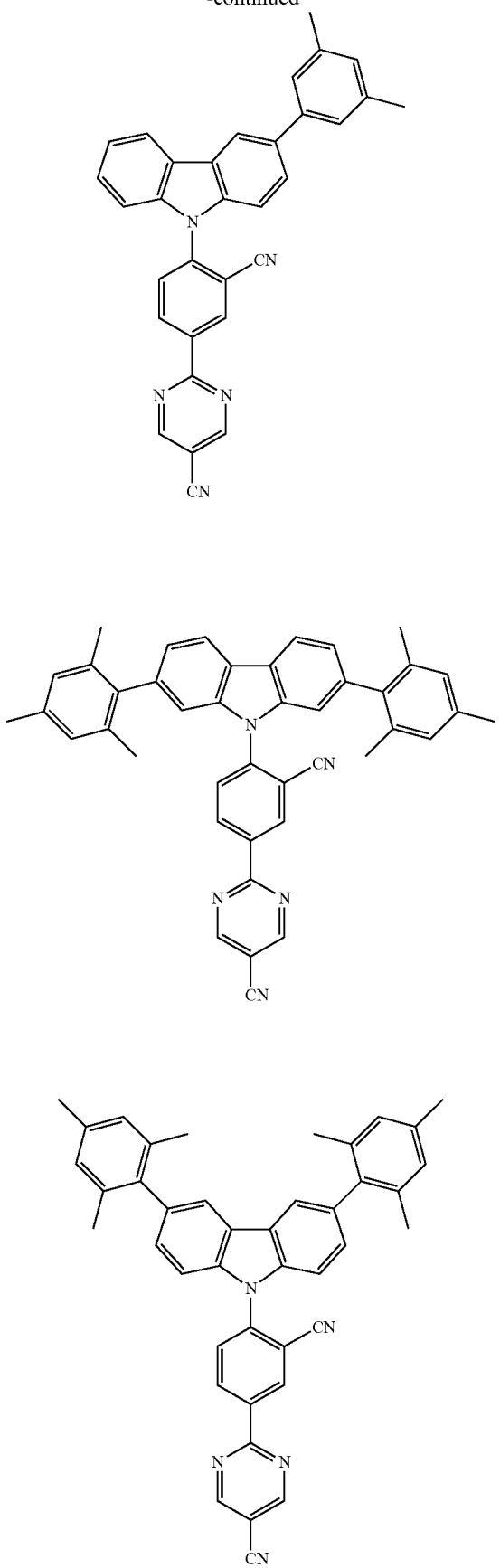
176
-continued
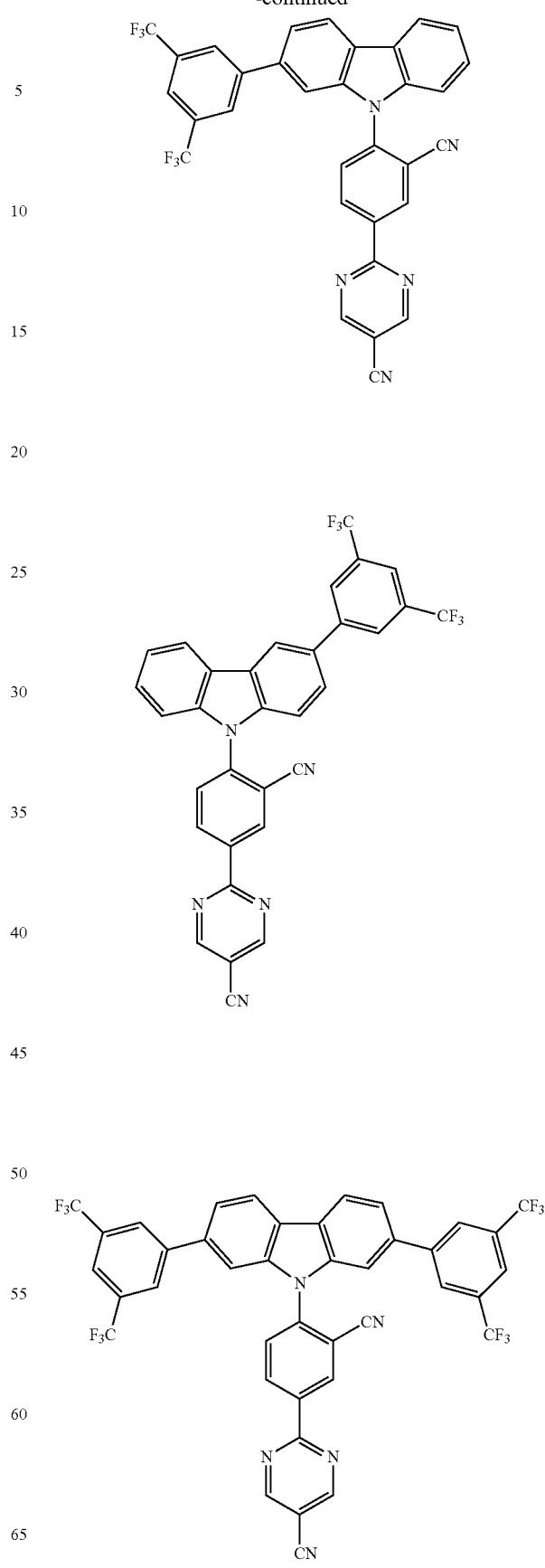

177
-continued
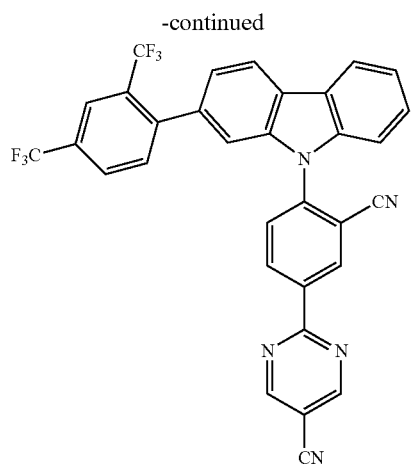
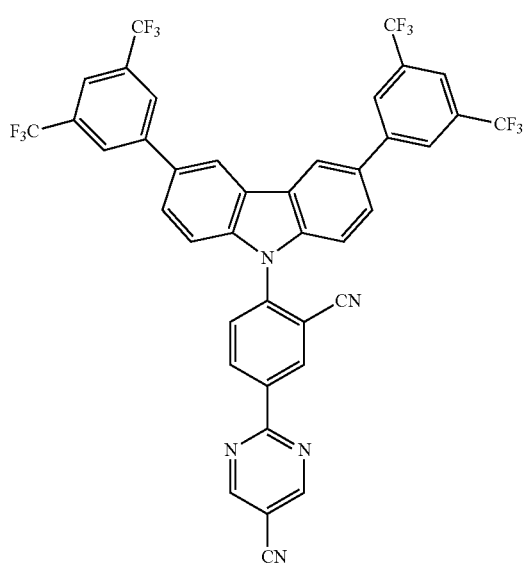
178
-continued
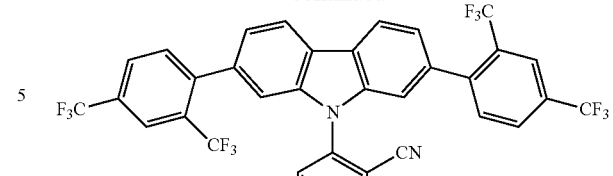
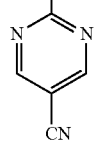
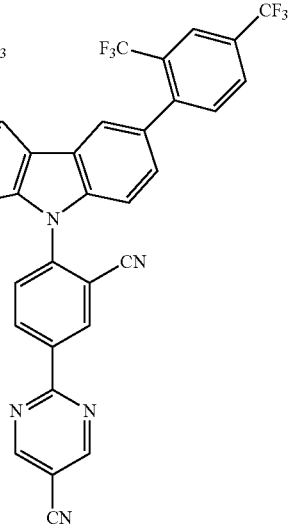
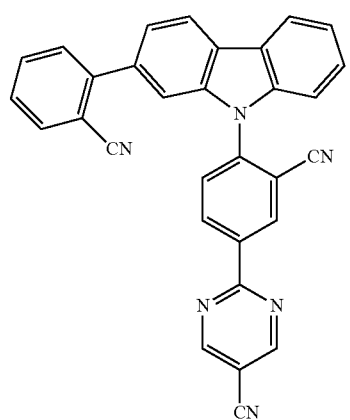

179
-continued
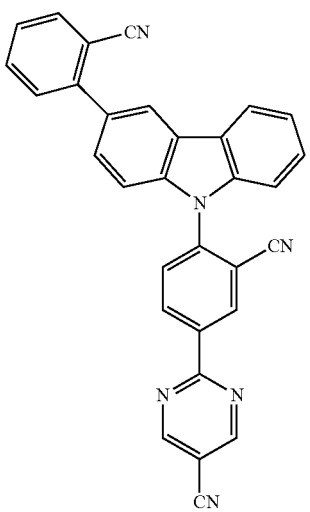
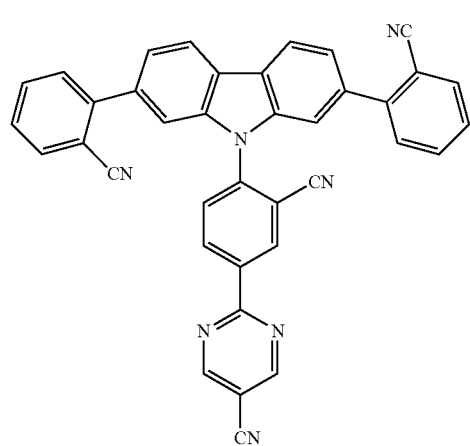
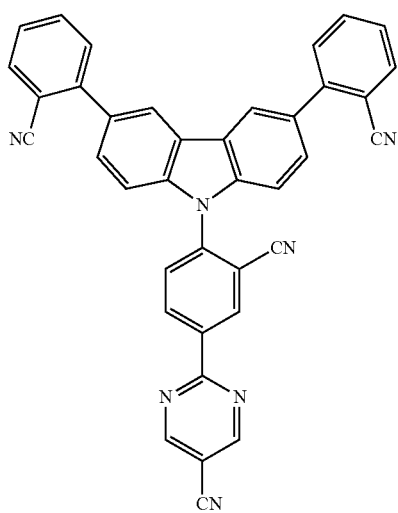
180
-continued
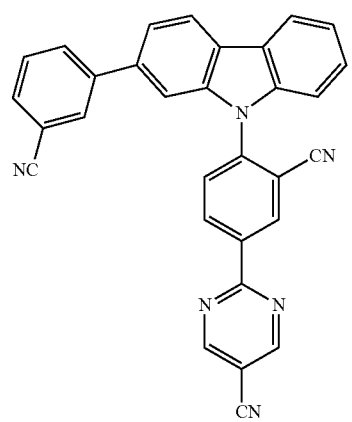
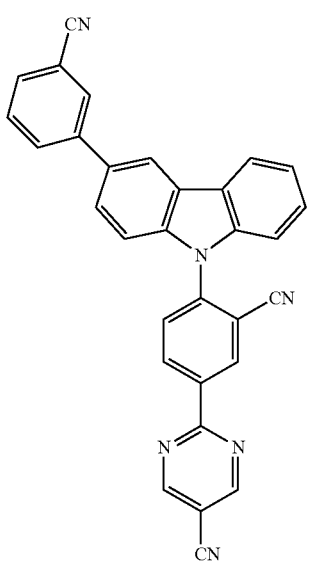
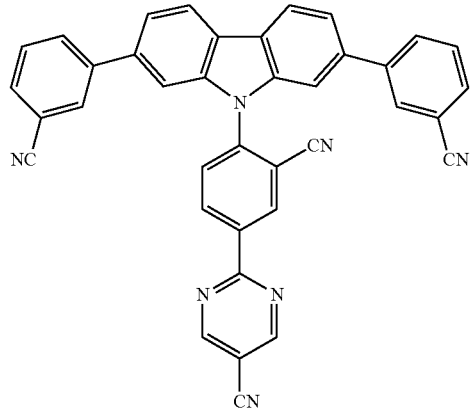

181
-continued
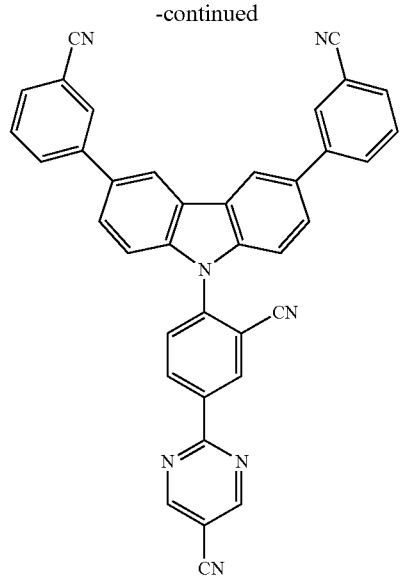
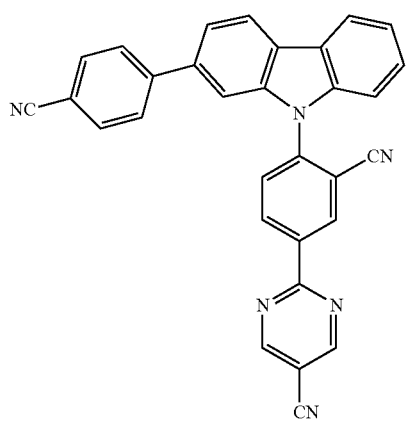
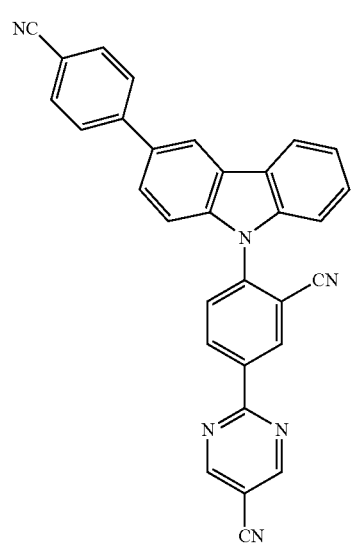
182
-continued
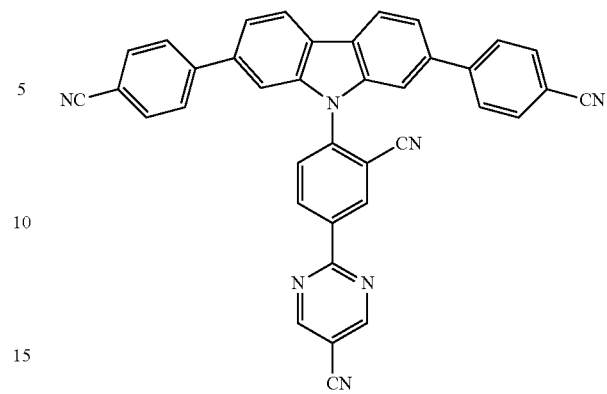
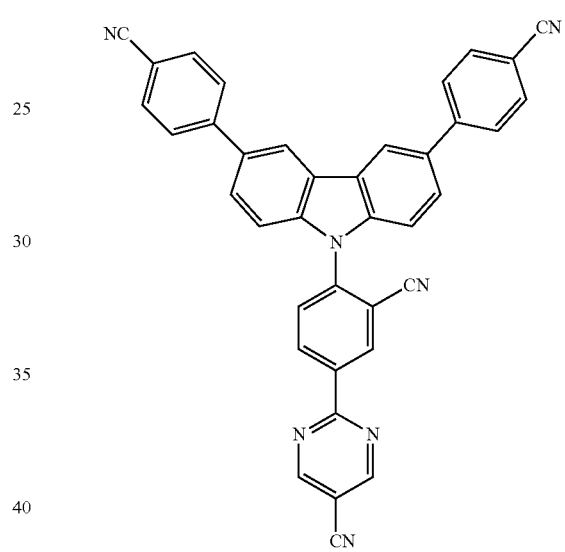
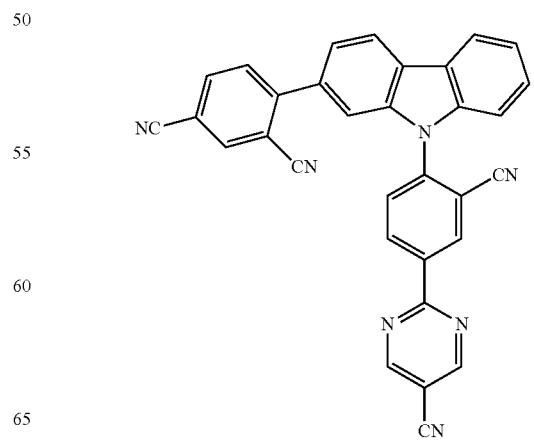

183
-continued
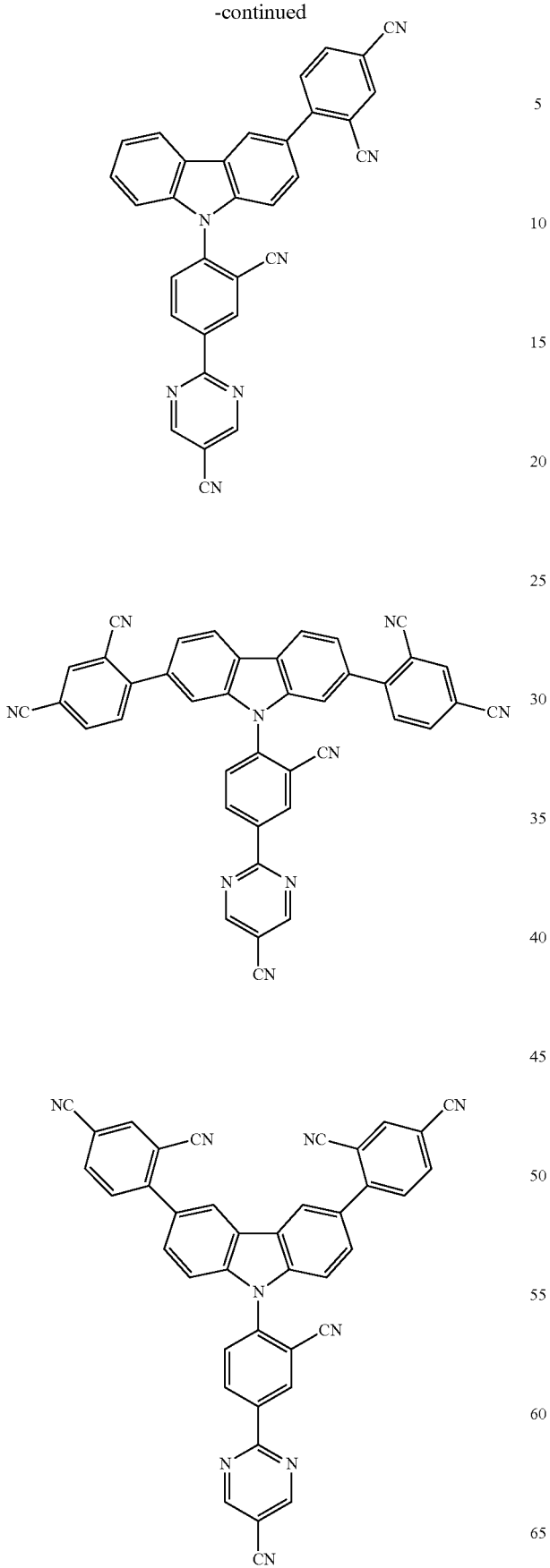
184
-continued
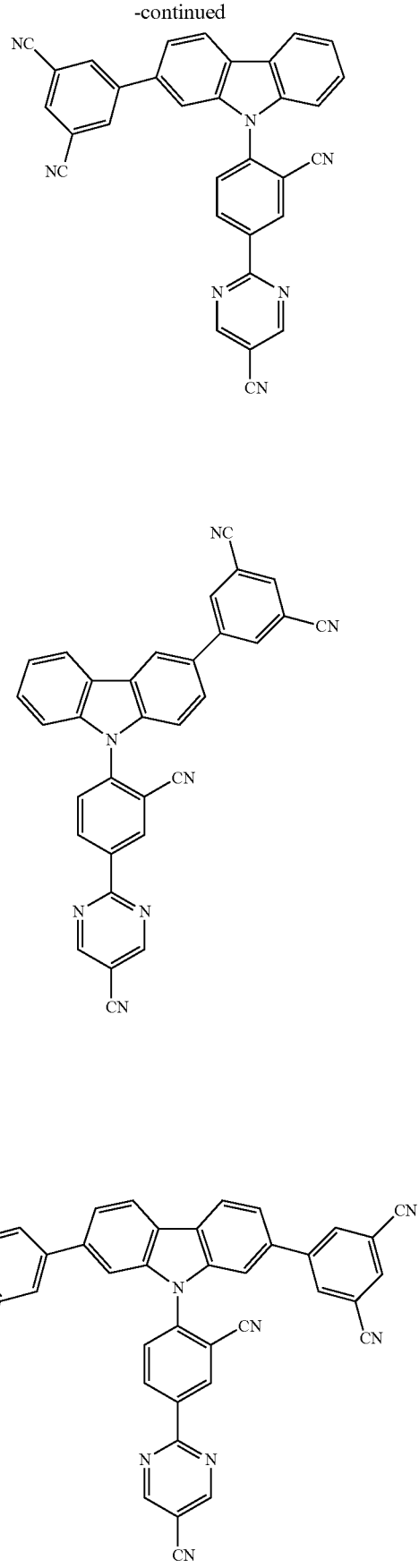

185
-continued
186
-continued
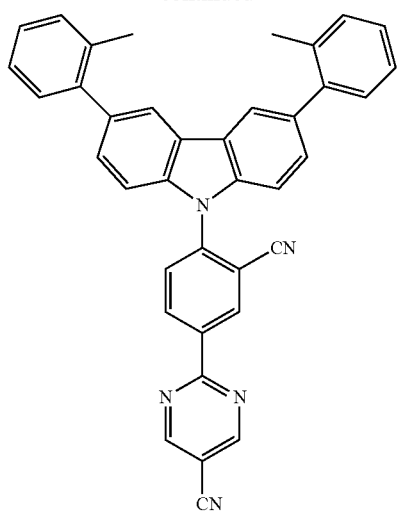
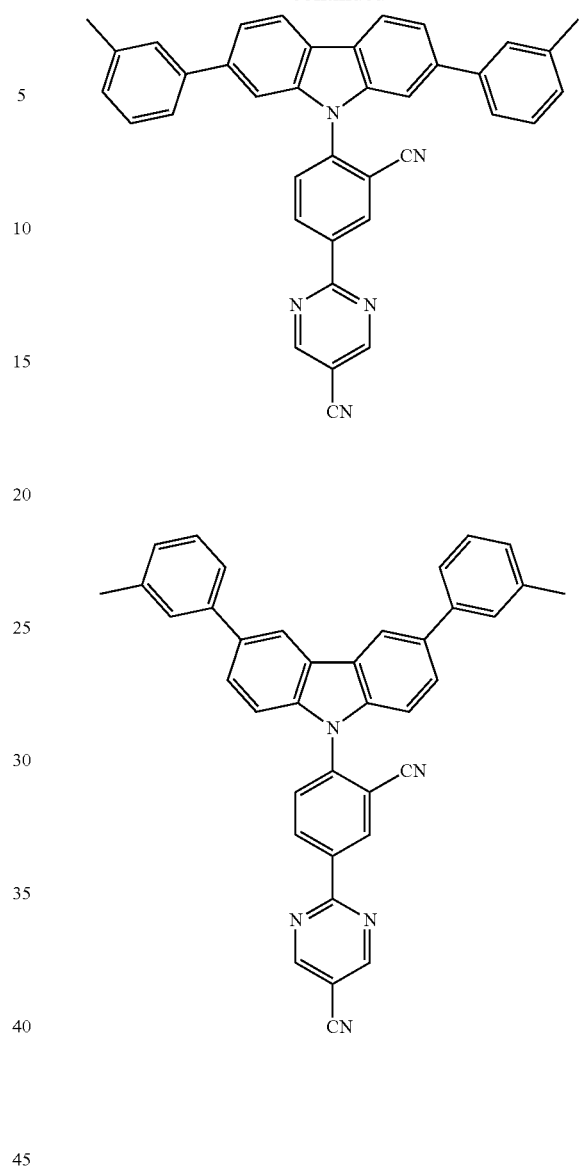
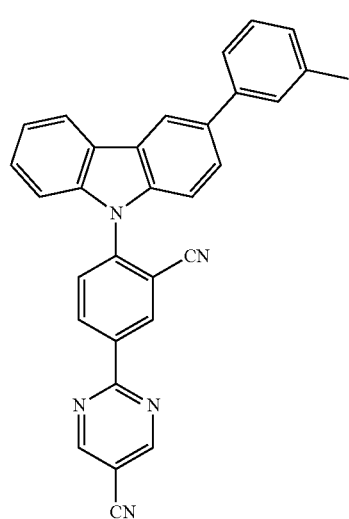

187
-continued
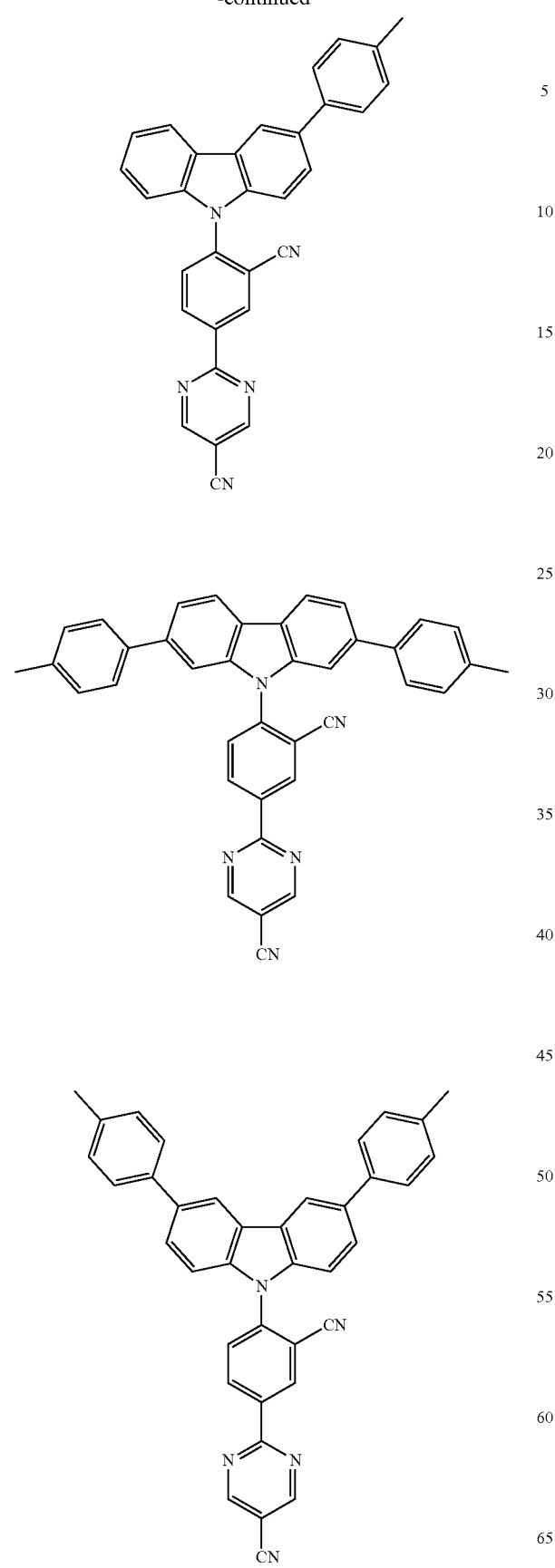
188
-continued
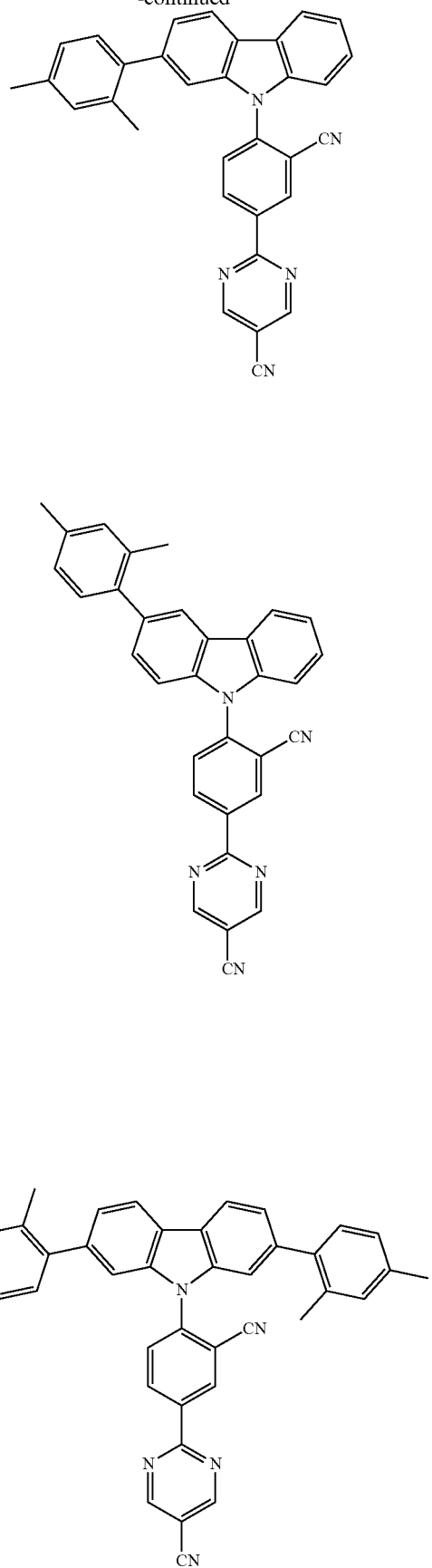

189
-continued
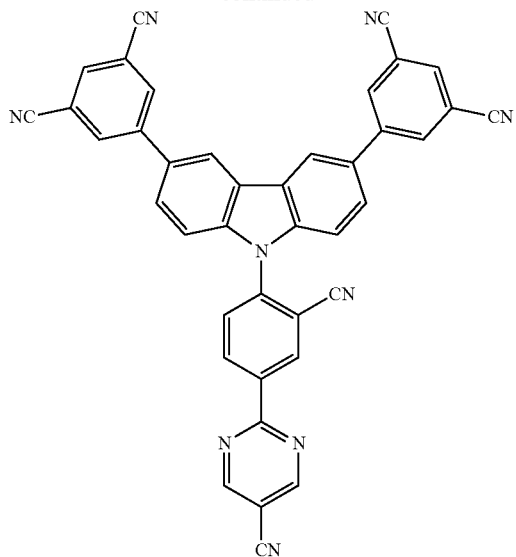
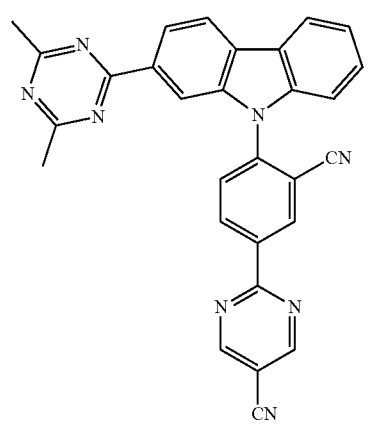
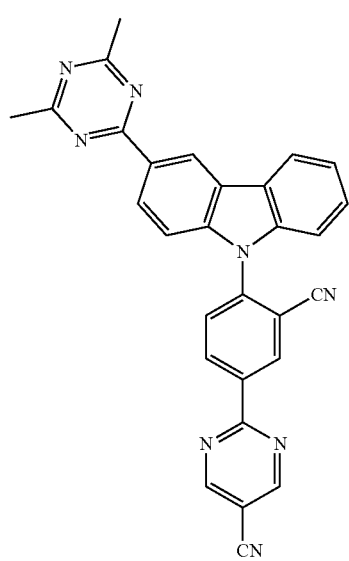
190
-continued
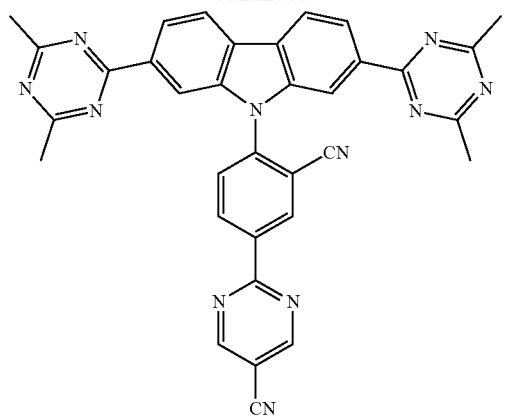
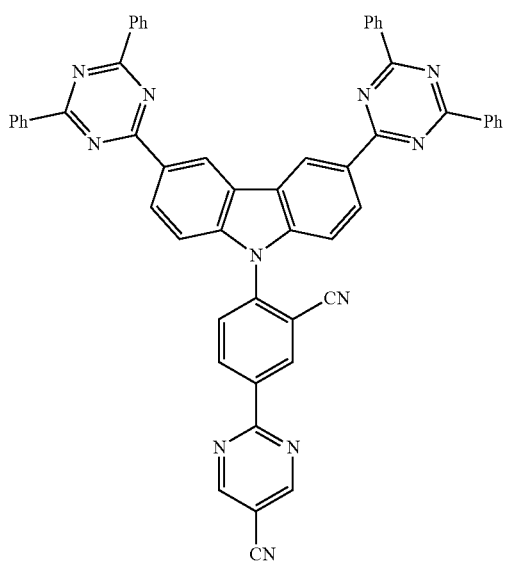
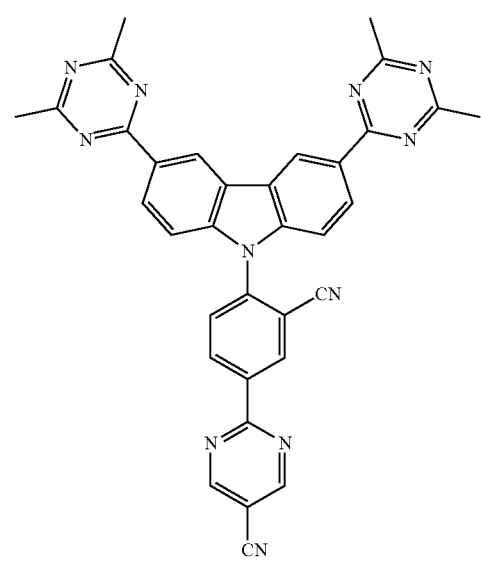

191
-continued
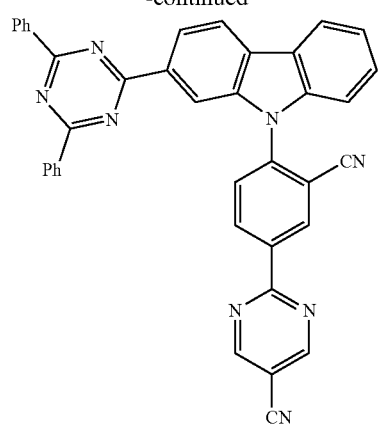
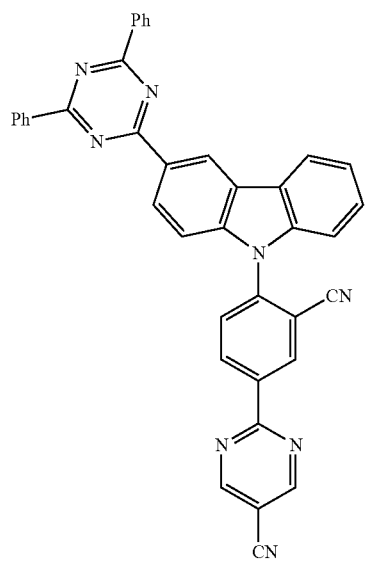
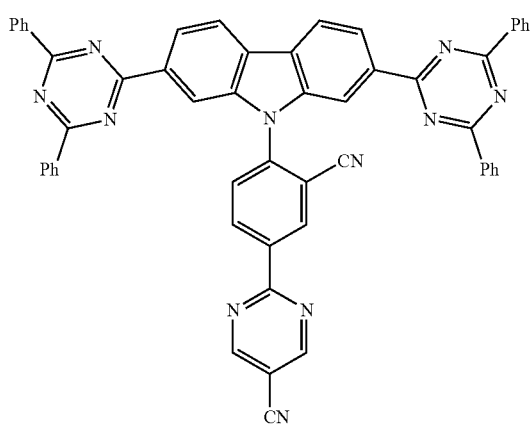
192
-continued
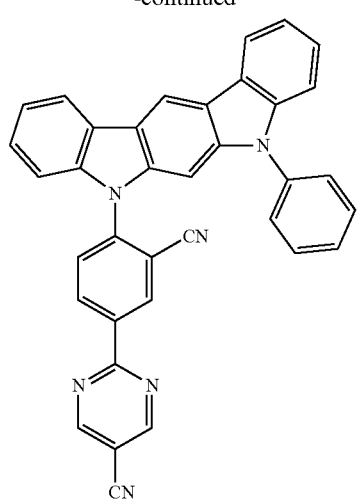
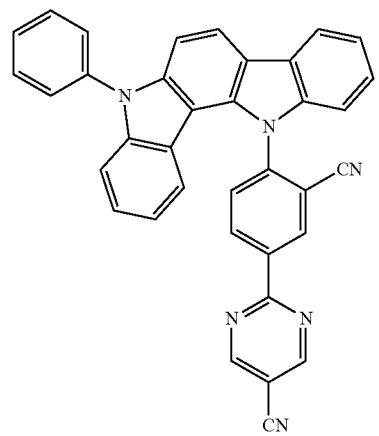
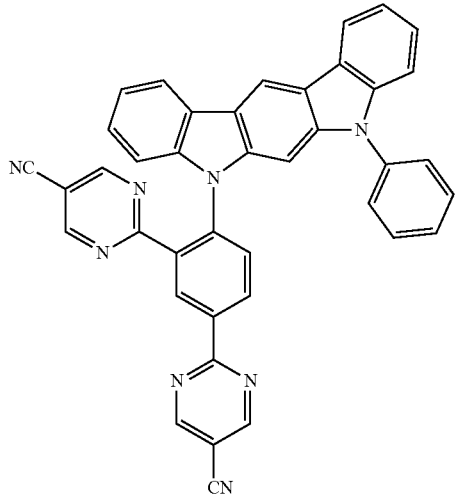

-continued

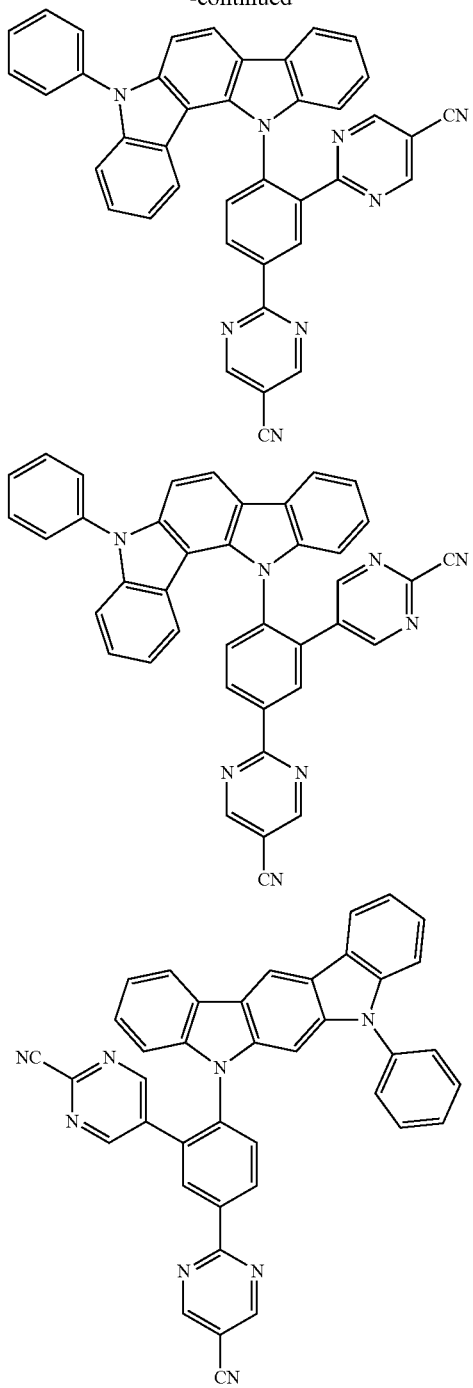

Figure 1:
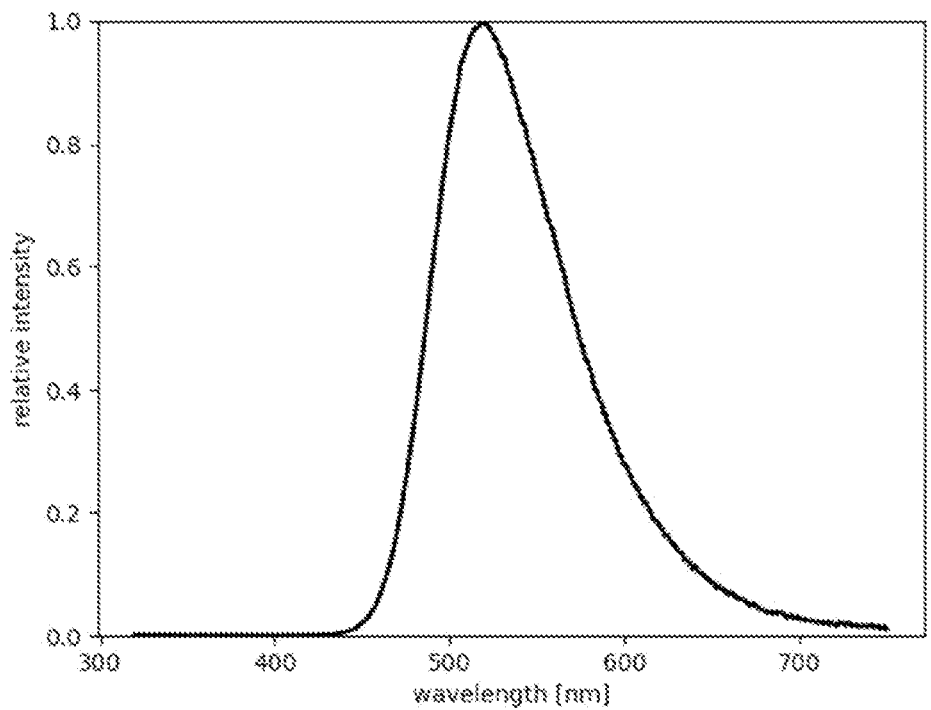
FIG. 1 illustrates an emission spectrum of example 1 (10% by weight) in PMMA.
Figure 2:
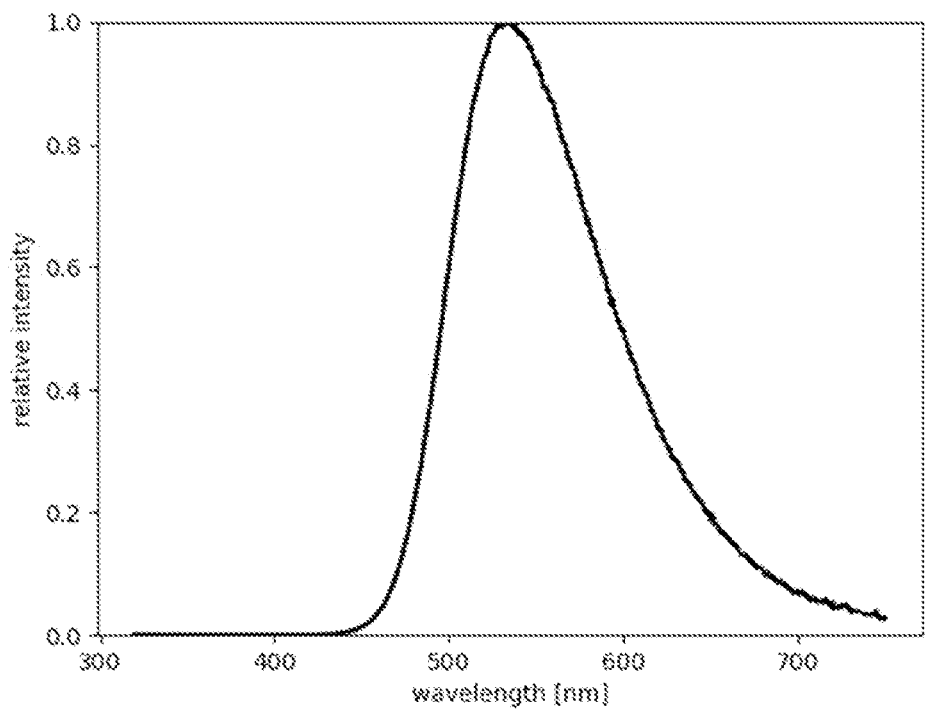
FIG. 2 illustrates an emission spectrum of example 2 (10% by weight) in PMMA.
Figure 3:
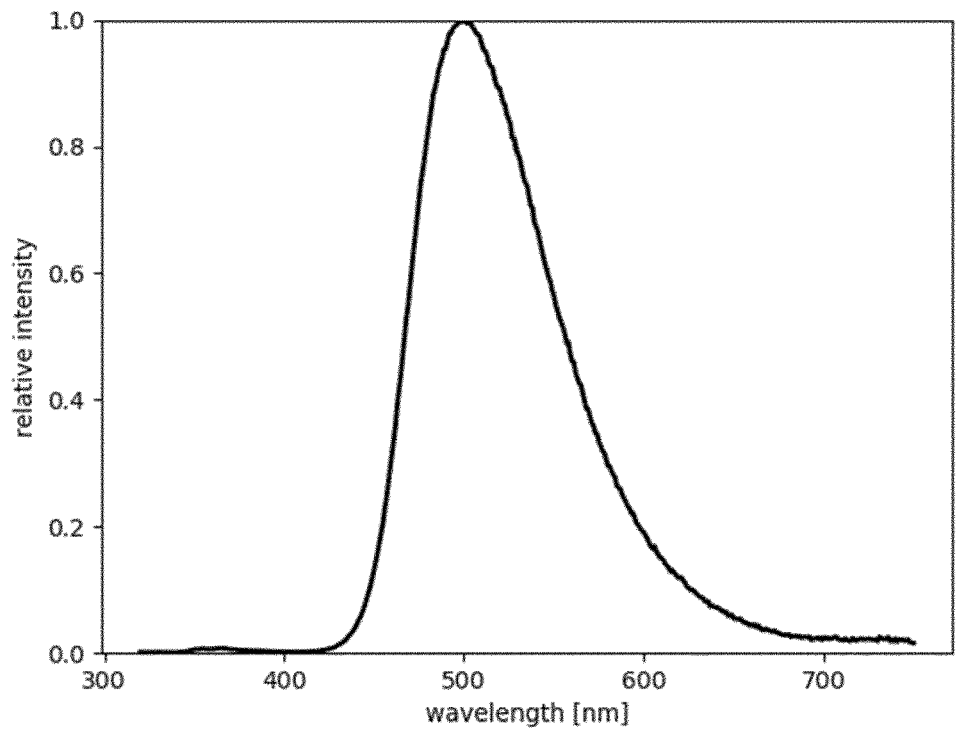
FIG. 3 illustrates an emission spectrum of example 3 (10% by weight) in PMMA.
Figure 4:
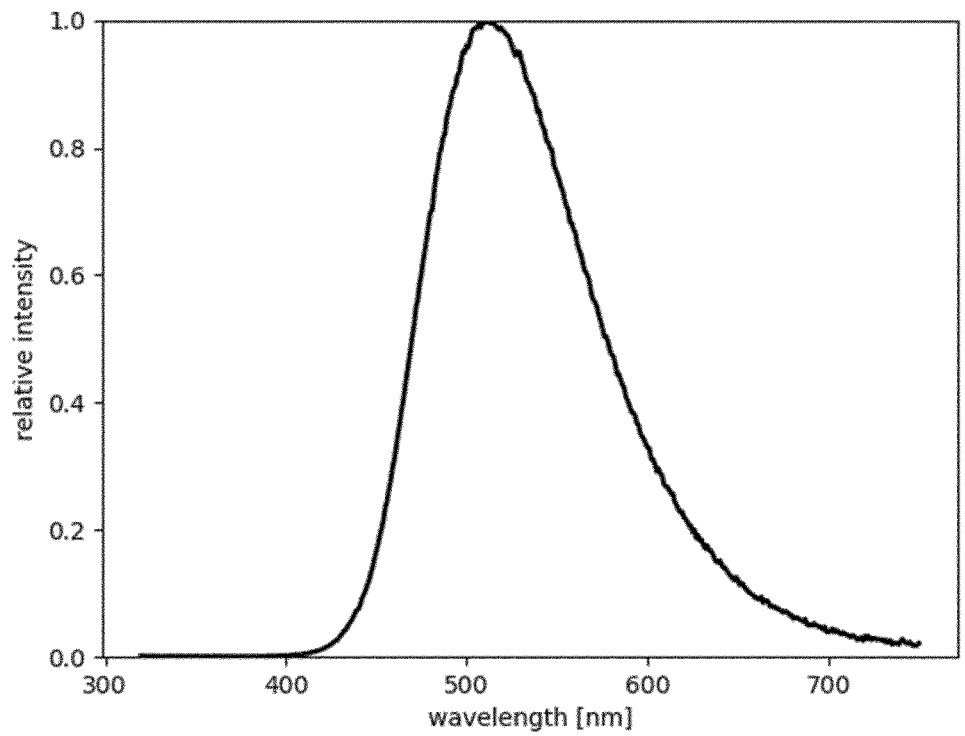
FIG. 4 illustrates an emission spectrum of example 4 (10% by weight) in PMMA.

The invention claimed is:

1. An organic molecule, comprising
a first chemical moiety, comprising of a structure of Formula I:

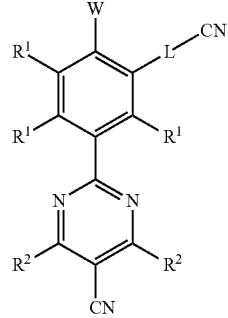

Formula I and
a second chemical moiety, comprising a structure selected from the following structures:

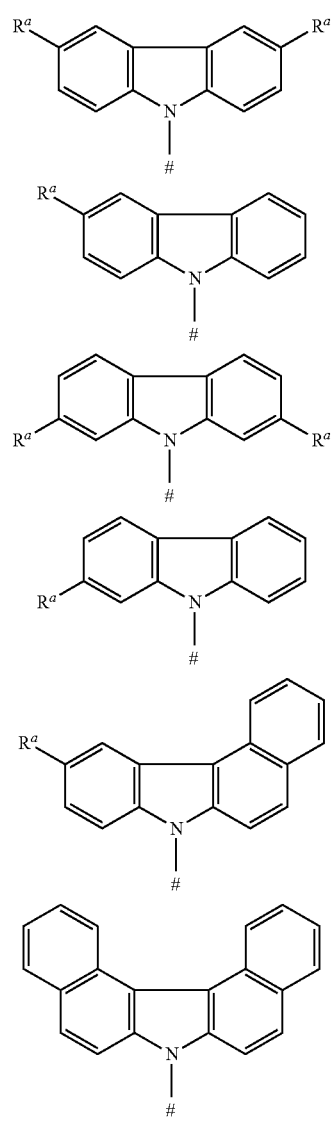

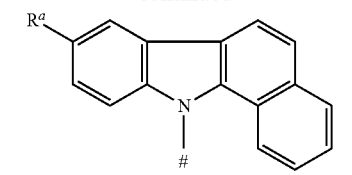
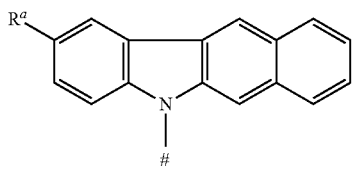
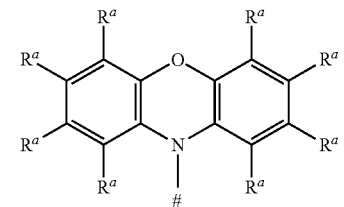
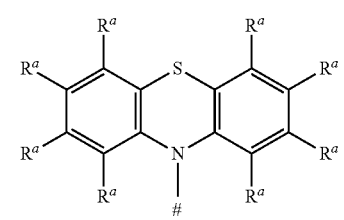
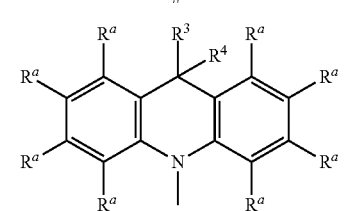
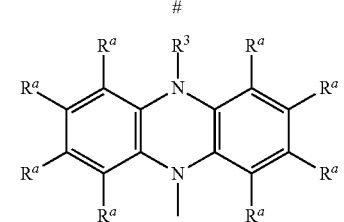
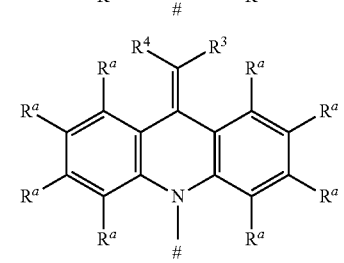
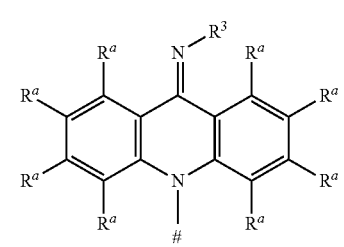
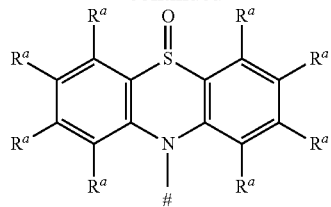
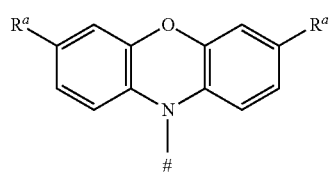
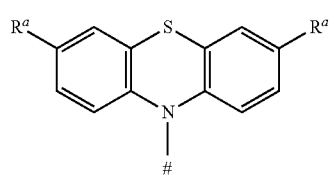
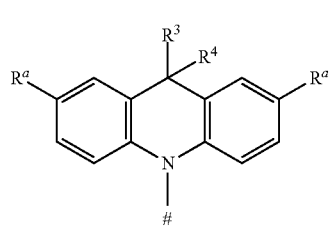
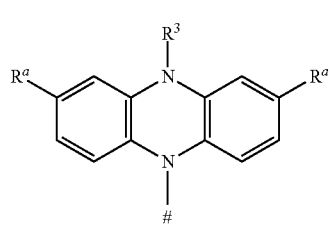
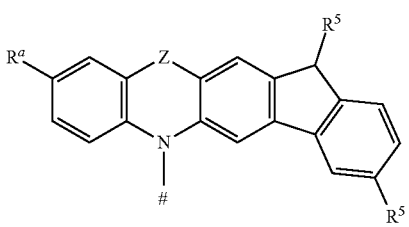
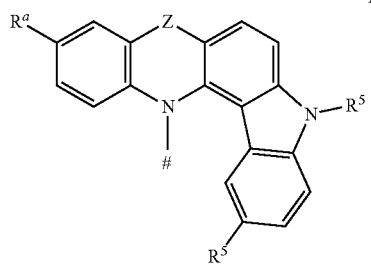

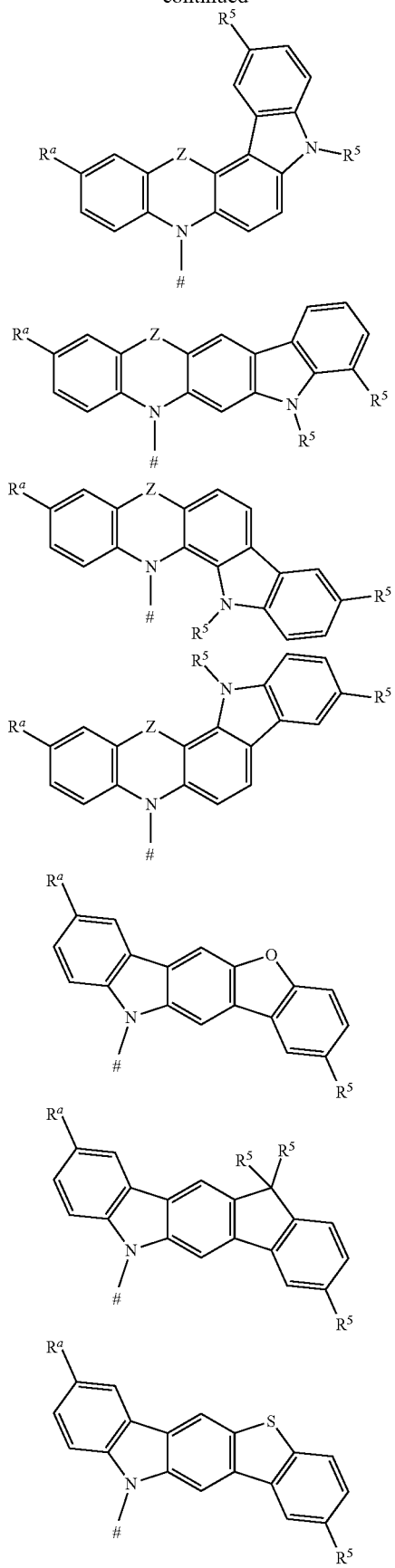
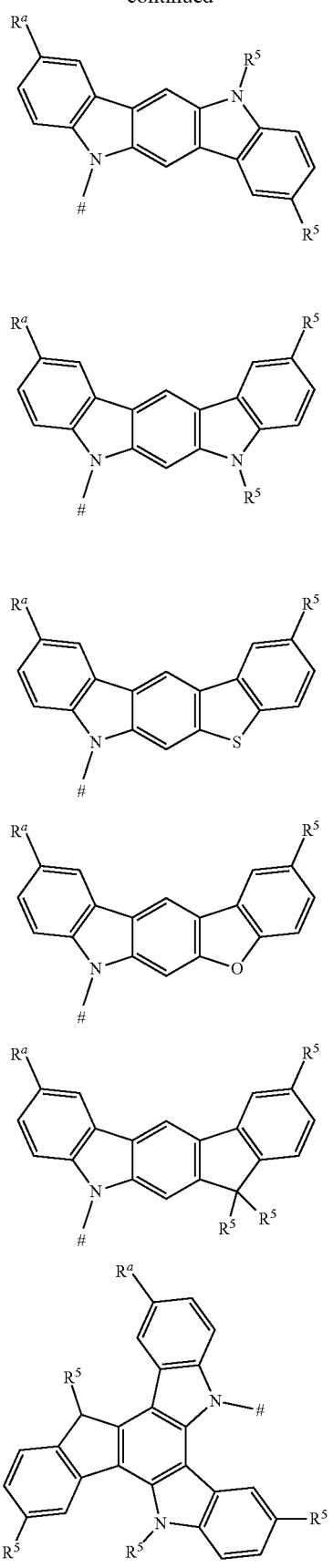

199
-continued
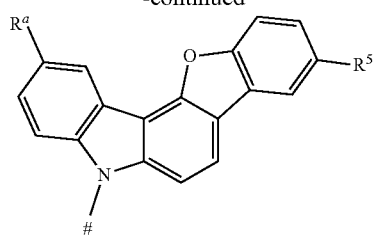
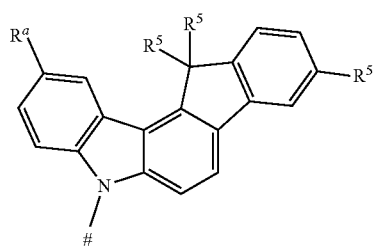
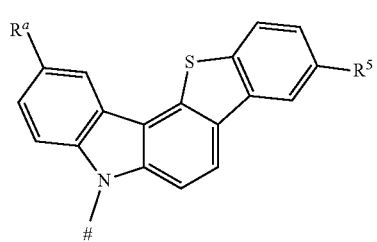
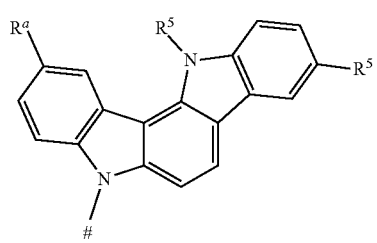
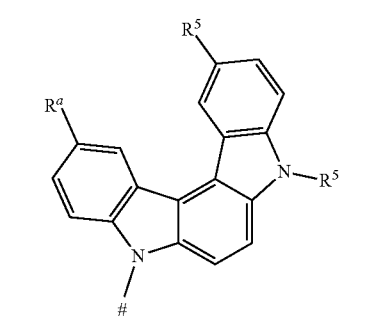
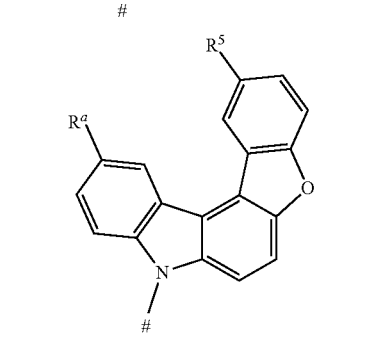
200
-continued
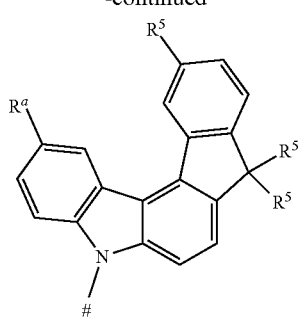
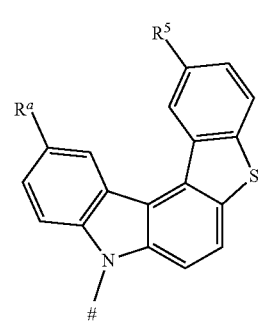
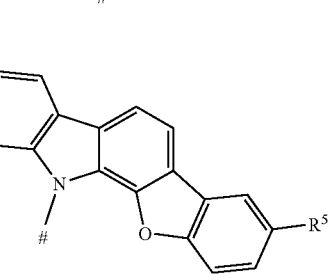
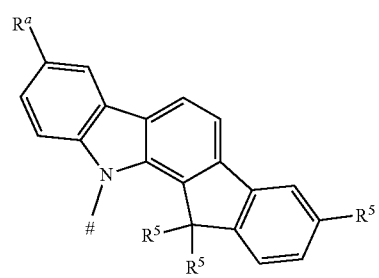
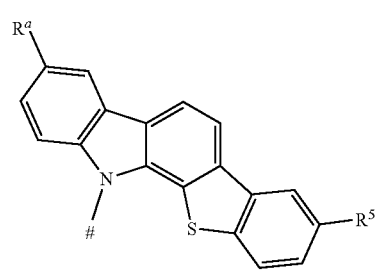
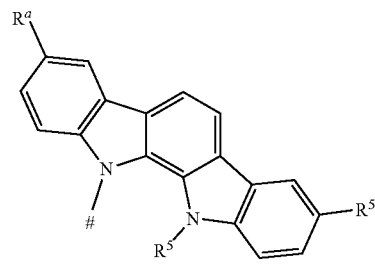

-continued

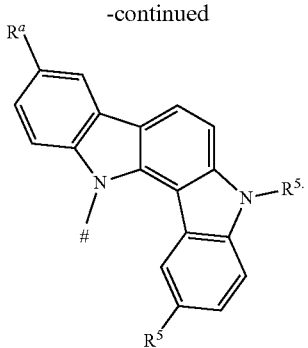

wherein
the first chemical moiety is linked to the second chemical moiety via a single bond;
W is a binding site of a single bond linking the first chemical moiety to the second chemical moiety,
L is selected from a direct bond and a linking group, which consists of a structure of Formula BN-I,

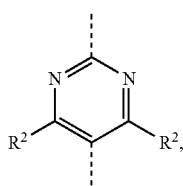

Formula BN-I wherein the dashed lines denote binding sites as indicated in Formula I, # represents a binding site of the first chemical moiety to the second chemical moiety;
Z is at each occurrence independently from each other selected from the group consisting of a direct bond, $CR^3R^4$, $C=CR^3R^4$, $C=O$, $C=NR^3$, $NR^3$, O, $SiR^3R^4$, S, S(O), and $S(O)_2$;
$R^1$ and $R^2$ are at each occurrence independently from each other selected from the group consisting of hydrogen; deuterium; CN; $CF_3$; phenyl;
$C_1$-$C_5$-alkyl,
wherein one or more hydrogen atoms are optionally substituted by deuterium;
$C_2$-$C_8$-alkenyl,
wherein one or more hydrogen atoms are optionally substituted by deuterium; and
$C_2$-$C_8$-alkynyl,
wherein one or more hydrogen atoms are optionally substituted by deuterium;
$R^a$, $R^3$ and $R^4$ are at each occurrence independently from each other selected from the group consisting of hydrogen;
deuterium;
$N(R^5)_2$;
$OR^5$;
$Si(R^5)_3$;
$B(OR^5)_2$;
$OSO_2R^5$;
$CF_3$;
CN;
F;
Br;
I;
$C_1$-$C_{40}$-alkyl,
which is optionally substituted with one or more substituents $R^5$ and
wherein one or more non-adjacent $CH_2$-groups are optionally substituted by $R^5C=CR^5$, $C\equiv C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR^5$, O, S, or $CONR^5$;
$C_1$-$C_{40}$-alkoxy,
which is optionally substituted with one or more substituents $R^5$ and
wherein one or more non-adjacent $CH_2$-groups are optionally substituted by $R^5C=CR^5$, $C\equiv C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR^5$, O, S, or $CONR^5$;
$C_1$-$C_{40}$-thioalkoxy,
which is optionally substituted with one or more substituents $R^5$ and
wherein one or more non-adjacent $CH_2$-groups are optionally substituted by $R^5C=CR^5$, $C\equiv C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR^5$, O, S, or $CONR^5$;
$C_2$-$C_{40}$-alkenyl,
which is optionally substituted with one or more substituents $R^5$ and
wherein one or more non-adjacent $CH_2$-groups are optionally substituted by $R^5C=CR^5$, $C\equiv C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR^5$, O, S, or $CONR^5$;
$C_2$-$C_{40}$-alkynyl,
which is optionally substituted with one or more substituents $R^5$ and
wherein one or more non-adjacent $CH_2$-groups are optionally substituted by $R^5C=CR^5$, $C\equiv C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR^5$, O, S, or $CONR^5$;
$C_6$-$C_{60}$-aryl,
which is optionally substituted with one or more substituents $R^5$; and
$C_3$-$C_{57}$-heteroaryl,
which is optionally substituted with one or more substituents $R^5$;
$R^5$ is at each occurrence independently from each other selected from the group consisting of hydrogen; deuterium; $N(R^6)_2$; $OR^6$; $Si(R^6)_3$; $B(OR^6)_2$; $OSO_2R^6$; $CF_3$; CN; F; Br; I;
$C_1$-$C_{40}$-alkyl,
which is optionally substituted with one or more substituents $R^6$ and
wherein one or more non-adjacent $CH_2$-groups are optionally substituted by $R^6C=CR^6$, $C\equiv C$, $Si(R^6)_2$, $Ge(R^6)_2$, $Sn(R^6)_2$, $C=O$, $C=S$, $C=Se$, $C=NR^6$, $P(=O)(R^6)$, SO, $SO_2$, $NR^6$, O, S, or $CONR^6$;
$C_1$-$C_{40}$-alkoxy,
which is optionally substituted with one or more substituents $R^6$ and
wherein one or more non-adjacent $CH_2$-groups are optionally substituted by $R^6C=CR^6$, $C\equiv C$, $Si(R^6)_2$, $Ge(R^6)_2$, $Sn(R^6)_2$, $C=O$, $C=S$, $C=Se$, $C=NR^6$, $P(=O)(R^6)$, SO, $SO_2$, $NR^6$, O, S, or $CONR^6$;
$C_1$-$C_{40}$-thioalkoxy,
which is optionally substituted with one or more substituents $R^6$ and
wherein one or more non-adjacent $CH_2$-groups are optionally substituted by $R^6C=CR^6$, $C\equiv C$, $Si(R^6)_2$, $Ge(R^6)_2$, $Sn(R^6)_2$, $C=O$, $C=S$, $C=Se$, $C=NR^6$, $P(=O)(R^6)$, SO, $SO_2$, $NR^6$, O, S, or $CONR^6$;

$C_2$-$C_{40}$-alkenyl,
which is optionally substituted with one or more substituents $R^6$ and
wherein one or more non-adjacent $CH_2$-groups are optionally substituted by $R^6C=CR^6$, $C≡C$, $Si(R^6)_2$, $Ge(R^6)_2$, $Sn(R^6)_2$, $C=O$, $C=S$, $C=Se$, $C=NR^6$, $P(=O)(R^6)$, SO, $SO_2$, $NR^6$, O, S, or $CONR^6$;

$C_2$-$C_{40}$-alkynyl,
which is optionally substituted with one or more substituents $R^6$ and
wherein one or more non-adjacent $CH_2$-groups are optionally substituted by $R^6C=CR^6$, $C≡C$, $Si(R^6)_2$, $Ge(R^6)_2$, $Sn(R^6)_2$, $C=O$, $C=S$, $C=Se$, $C=NR^6$, $P(=O)(R^6)$, SO, $SO_2$, $NR^6$, O, S, or $CONR^6$;

$C_6$-$C_{60}$-aryl,
which is optionally substituted with one or more substituents $R^6$; and $C_3$-$C_{57}$-heteroaryl,
which is optionally substituted with one or more substituents $R^6$;

$R^6$ is at each occurrence independently from each other selected from the group consisting of hydrogen; deuterium; OPh; $CF_3$; CN; F;

$C_1$-$C_5$-alkyl,
wherein one or more hydrogen atoms are optionally, independently from each other substituted by deuterium, CN, $CF_3$, or F;

$C_1$-$C_5$-alkoxy,
wherein one or more hydrogen atoms are optionally, independently from each other substituted by deuterium, CN, $CF_3$, or F;

$C_1$-$C_5$-thioalkoxy,
wherein one or more hydrogen atoms are optionally, independently from each other substituted by deuterium, CN, $CF_3$, or F;

$C_2$-$C_5$-alkenyl,
wherein one or more hydrogen atoms are optionally, independently from each other substituted by deuterium, CN, $CF_3$, or F;

$C_2$-$C_5$-alkynyl,
wherein one or more hydrogen atoms are optionally, independently from each other substituted by deuterium, CN, $CF_3$, or F;

$C_6$-$C_{18}$-aryl,
which is optionally substituted with one or more $C_1$-$C_5$-alkyl substituents;

$C_3$-$C_{17}$-heteroaryl,
which is optionally substituted with one or more $C_1$-$C_5$-alkyl substituents;

$N(C_6$-$C_{18}$-aryl$)_2$;
$N(C_3$-$C_{17}$-heteroaryl$)_2$; and
$N(C_3$-$C_{17}$-heteroaryl$)(C_6$-$C_{18}$-aryl); and wherein at least of the substituents $R^a$, $R^3$, $R^4$, or $R^5$, independently from each other, optionally forms a mono- or polycyclic, aliphatic, aromatic, or heteroaromatic ring system with at least another one of the substituents $R^a$, $R^3$, $R^4$, or $R^5$.

2. The organic molecule according to claim 1, wherein $R^1$ and $R^2$ are at each occurrence independently from each other selected from the group consisting of hydrogen, deuterium, CN, $CF_3$, phenyl, and $C_1$-$C_5$-alkyl.

3. The organic molecule according to claim 1, wherein $R^1$ and $R^2$ is at each occurrence independently from each other selected from the group consisting of H, methyl, and phenyl.

4. The organic molecule according to claim 1, wherein $R^a$ is at each occurrence independently from each other selected from the group consisting of:

hydrogen,
deuterium,
Me,
$^i$Pr,
$^t$Bu,
CN,
$CF_3$,
Ph, which is optionally substituted with one or more substituents independently from each other selected from the group consisting of Me, $^i$Pr, $^t$Bu, CN, $CF_3$, and Ph,
pyridinyl, which is optionally substituted with one or more substituents independently from each other selected from the group consisting of Me, $^i$Pr, $^t$Bu, CN, $CF_3$, and Ph,
pyrimidinyl, which is optionally substituted with one or more substituents independently from each other selected from the group consisting of Me, $^i$Pr, $^t$Bu, CN, $CF_3$, and Ph,
carbazolyl, which is optionally substituted with one or more substituents independently from each other selected from the group consisting of Me, $^i$Pr, $^t$Bu, CN, $CF_3$, and Ph,
triazinyl, which is optionally substituted with one or more substituents independently from each other selected from the group consisting of Me, $^i$Pr, $^t$Bu, CN, $CF_3$, and Ph, and
$N(Ph)_2$, which is optionally substituted with one or more substituents independently from each other selected from the group consisting of Me, $^i$Pr, $^t$Bu, CN, $CF_3$, and Ph;

wherein two adjacent substituents $R^a$ are optionally replaced by a ring system selected from the group consisting of:

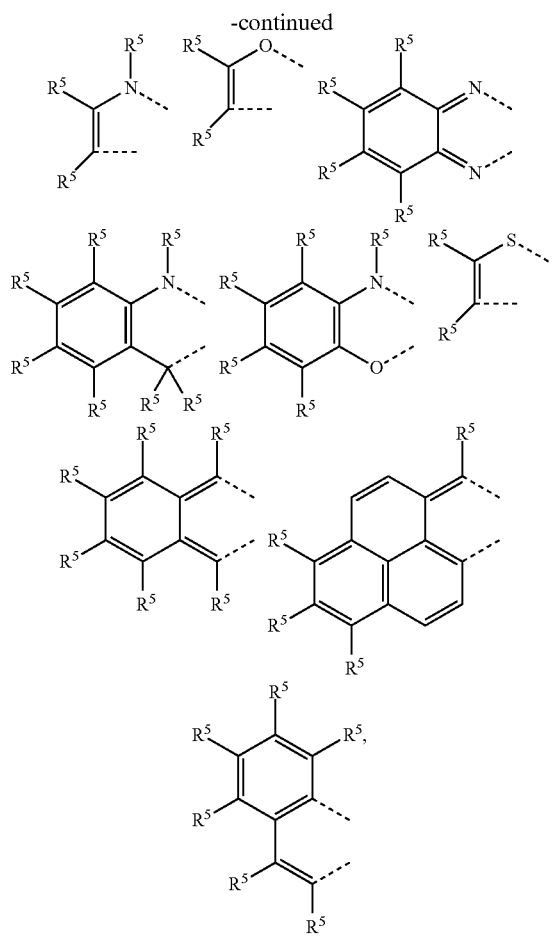

and
wherein each dashed line indicates a direct bond connecting one of the above shown ring systems to a position indicated by $R^a$.

5. An optoelectronic device comprising the organic molecule according to claim 1.

6. The optoelectronic device according to claim 5, wherein the optoelectronic device is selected from the group consisting of:
organic light-emitting diodes (OLEDs),
light-emitting electrochemical cells,
OLED sensors,
organic diodes,
organic solar cells,
organic transistors,
organic field-effect transistors,
organic lasers, and
down-conversion elements.

7. The optoelectronic device according to claim 6, wherein the optoelectronic device is an OLED and comprises the organic molecule in a light-emitting layer (EML) and/or in a layer that is directly adjacent to the light-emitting layer (EML).

8. A method for generating light with a wavelength between 500 nm and 560 nm, the method comprising:
applying an electrical current to the optoelectronic device according to claim 5 to generate light.

9. A composition, comprising:
the organic molecule according to claim 1, and
a host material $H^B$, which differs from the organic molecule.

10. The composition according to claim 9, further comprising
a fluorescence emitter F, which differs from the organic molecule,
wherein a fraction of the organic molecule in % by weight is higher than a fraction of the fluorescence emitter F in % by weight, based on a total weight of the organic molecule and the fluorescence emitter.

11. The composition according to claim 10, wherein the fraction of the organic molecule in % by weight is at least five times higher than the fraction of the fluorescence emitter F in % by weight, based on the total weight of the organic molecule and the fluorescence emitter F.

12. A method for producing an optoelectronic device, the method comprising depositing the composition according to claim 9 by a vacuum evaporation method and/or a solution deposition method.

13. A method for producing an optoelectronic device, the method comprising depositing the organic molecule according to claim 1 by a vacuum evaporation method and/or a solution deposition method.

14. An organic molecule, comprising a structure selected from the group consisting of Formula VIa-1, Formula VIb-1, and Formula VIc-1:

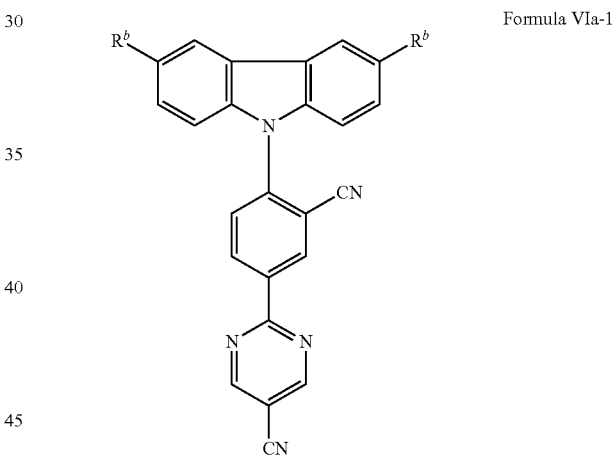

Formula VIa-1

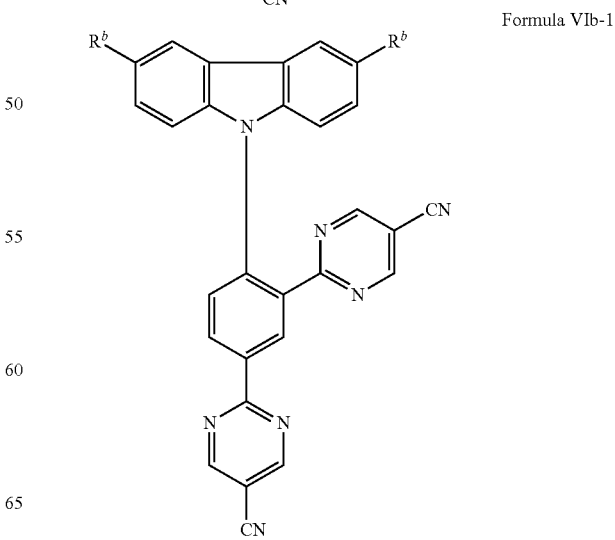

Formula VIb-1

-continued

Formula VIc-1

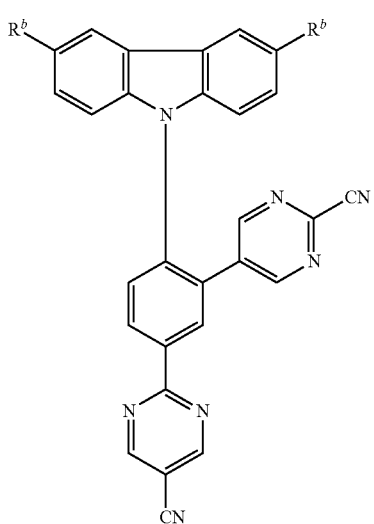

wherein
$R^b$ is at each occurrence independently from each other selected from the group consisting of:
deuterium;
$N(R^5)_2$;
$OR^5$;
$Si(R^5)_3$;
$B(OR^5)_2$;
$OSO_2R^5$;
$CF_3$;
CN;
F;
Br;
I;
$C_1$-$C_{40}$-alkyl,
which is optionally substituted with one or more substituents $R^5$ and
wherein one or more non-adjacent $CH_2$-groups are optionally substituted by $R^5C=CR^5$, $C\equiv C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR^5$, O, S, or $CONR^5$;
$C_1$-$C_{40}$-alkoxy,
which is optionally substituted with one or more substituents $R^5$ and
wherein one or more non-adjacent $CH_2$-groups are optionally substituted by $R^5C=CR^5$, $C\equiv C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR^5$, O, S, or $CONR^5$;
$C_1$-$C_{40}$-thioalkoxy,
which is optionally substituted with one or more substituents $R^5$ and
wherein one or more non-adjacent $CH_2$-groups are optionally substituted by $R^5C=CR^5$, $C\equiv C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR^5$, O, S, or $CONR^5$;
$C_2$-$C_{40}$-alkenyl,
which is optionally substituted with one or more substituents $R^5$ and wherein one or more non-adjacent $CH_2$-groups are optionally substituted by $R^5C=CR^5$, $C\equiv C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR^5$, O, S, or $CONR^5$;
$C_2$-$C_{40}$-alkynyl,
which is optionally substituted with one or more substituents $R^5$ and
wherein one or more non-adjacent $CH_2$-groups are optionally substituted by $R^5C=CR^5$, $C\equiv C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR^5$, O, S, or $CONR^5$;
$C_6$-$C_{60}$-aryl,
which is optionally substituted with one or more substituents $R^5$; and
$C_3$-$C_{57}$-heteroaryl,
which is optionally substituted with one or more substituents $R^5$;
$R^5$ is at each occurrence independently from each other selected from the group consisting of hydrogen; deuterium; $N(R^6)_2$; $OR^6$; $Si(R^6)_3$; $B(OR^6)_2$; $OSO_2R^6$; $CF_3$; CN; F; Br; I;
$C_1$-$C_{40}$-alkyl,
which is optionally substituted with one or more substituents $R^6$ and
wherein one or more non-adjacent $CH_2$-groups are optionally substituted by $R^6C=CR^6$, $C\equiv C$, $Si(R^6)_2$, $Ge(R^6)_2$, $Sn(R^6)_2$, $C=O$, $C=S$, $C=Se$, $C=NR^6$, $P(=O)(R^6)$, SO, $SO_2$, $NR^6$, O, S, or $CONR^6$;
$C_1$-$C_{40}$-alkoxy,
which is optionally substituted with one or more substituents $R^6$ and
wherein one or more non-adjacent $CH_2$-groups are optionally substituted by $R^6C=CR^6$, $C\equiv C$, $Si(R^6)_2$, $Ge(R^6)_2$, $Sn(R^6)_2$, $C=O$, $C=S$, $C=Se$, $C=NR^6$, $P(=O)(R^6)$, SO, $SO_2$, $NR^6$, O, S, or $CONR^6$;
$C_1$-$C_{40}$-thioalkoxy,
which is optionally substituted with one or more substituents $R^6$ and
wherein one or more non-adjacent $CH_2$-groups are optionally substituted by $R^6C=CR^6$, $C\equiv C$, $Si(R^6)_2$, $Ge(R^6)_2$, $Sn(R^6)_2$, $C=O$, $C=S$, $C=Se$, $C=NR^6$, $P(=O)(R^6)$, SO, $SO_2$, $NR^6$, O, S, or $CONR^6$;
$C_2$-$C_{40}$-alkenyl,
which is optionally substituted with one or more substituents $R^6$ and
wherein one or more non-adjacent $CH_2$-groups are optionally substituted by $R^6C=CR^6$, $C\equiv C$, $Si(R^6)_2$, $Ge(R^6)_2$, $Sn(R^6)_2$, $C=O$, $C=S$, $C=Se$, $C=NR^6$, $P(=O)(R^6)$, SO, $SO_2$, $NR^6$, O, S, or $CONR^6$;
$C_2$-$C_{40}$-alkynyl,
which is optionally substituted with one or more substituents $R^6$ and
wherein one or more non-adjacent $CH_2$-groups are optionally substituted by $R^6C=CR^6$, $C\equiv C$, $Si(R^6)_2$, $Ge(R^6)_2$, $Sn(R^6)_2$, $C=O$, $C=S$, $C=Se$, $C=NR^6$, $P(=O)(R^6)$, SO, $SO_2$, $NR^6$, O, S, or $CONR^6$;
$C_6$-$C_{60}$-aryl,
which is optionally substituted with one or more substituents $R^6$; and
$C_3$-$C_{57}$-heteroaryl,
which is optionally substituted with one or more substituents $R^6$
$R^6$ is at each occurrence independently from each other selected from the group consisting of hydrogen; deuterium; OPh; $CF_3$; CN; F;
$C_1$-$C_5$-alkyl,
wherein one or more hydrogen atoms are optionally, independently from each other substituted by deuterium, CN, $CF_3$, or F;
$C_1$-$C_5$-alkoxy,
wherein one or more hydrogen atoms are optionally, independently from each other substituted by deuterium, CN, $CF_3$, or F;

$C_1$-$C_5$-thioalkoxy, wherein one or more hydrogen atoms are optionally, independently from each other substituted by deuterium, CN, $CF_3$, or F;

$C_2$-$C_5$-alkenyl, wherein one or more hydrogen atoms are optionally, independently from each other substituted by deuterium, CN, $CF_3$, or F;

$C_2$-$C_5$-alkynyl, wherein one or more hydrogen atoms are optionally, independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)_2$;

$N(C_3$-$C_{17}$-heteroaryl$)_2$; and $N(C_3$-$C_{17}$-heteroaryl)($C_6$-$C_{18}$-aryl).

15. An optoelectronic device comprising the organic molecule according to claim 14.

16. The optoelectronic device according to claim 15, wherein the optoelectronic device is selected from the group consisting of:

organic light-emitting diodes (OLEDs),
light-emitting electrochemical cells,
OLED sensors,
organic diodes,
organic solar cells,
organic transistors,
organic field-effect transistors,
organic lasers, and
down-conversion elements.

17. The optoelectronic device according to claim 16, wherein the optoelectronic device is an OLED and comprises the organic molecule in a light-emitting layer (EML) and/or in a layer that is directly adjacent to the light-emitting layer (EML).

18. A composition, comprising:
the organic molecule according to claim 14, and
a host material $H^B$, which differs from the organic molecule.

19. The composition according to claim 18, further comprising a fluorescence emitter F, which differs from the organic molecule, wherein a fraction of the organic molecule in % by weight is higher than a fraction of the fluorescence emitter F in % by weight, based on a total weight of the organic molecule and the fluorescence emitter.

* * * * *